US012628549B2

(12) United States Patent
Lee et al.

(10) Patent No.: US 12,628,549 B2
(45) Date of Patent: May 12, 2026

(54) COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

(71) Applicant: SAMSUNG SDI CO., LTD., Yongin-si (KR)

(72) Inventors: Byoungkwan Lee, Suwon-si (KR); Dong Min Kang, Suwon-si (KR); Jiyun Kwon, Suwon-si (KR); Junmo Park, Suwon-si (KR); Hansol Seo, Suwon-si (KR); Kipo Jang, Suwon-si (KR); Seungin Park, Suwon-si (KR); Sung-Hyun Jung, Suwon-si (KR); Ho Kuk Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 980 days.

(21) Appl. No.: 17/858,290

(22) Filed: Jul. 6, 2022

(65) Prior Publication Data

US 2023/0083506 A1 Mar. 16, 2023

(30) Foreign Application Priority Data

Jul. 7, 2021 (KR) ........................ 10-2021-0089278
Jun. 20, 2022 (KR) ........................ 10-2022-0075164

(51) Int. Cl.
*H10K 85/40* (2023.01)
*C07F 7/08* (2006.01)
(Continued)

(52) U.S. Cl.
CPC ........... *H10K 85/40* (2023.02); *C07F 7/0814* (2013.01); *H10K 85/636* (2023.02); *H10K 50/11* (2023.02);
(Continued)

(58) Field of Classification Search
CPC ........... H10K 2101/10; H10K 2101/90; H10K 50/11; H10K 85/40; H10K 85/636;
(Continued)

(56) References Cited

U.S. PATENT DOCUMENTS 5,061,569 A 10/1991 VanSlyke et al.
11,482,682 B2 * 10/2022 Shin ........................ C09K 11/06
(Continued)

FOREIGN PATENT DOCUMENTS

CN 104829626 A 8/2015
CN 105473684 A 4/2016
(Continued)

OTHER PUBLICATIONS

Chinese Office action dated May 17, 2024.
Korean Notice of Allowance dated Jun. 18, 2025.

*Primary Examiner* — Golam Mowla
(74) *Attorney, Agent, or Firm* — Lee IP Law, P.C.

(57) ABSTRACT

A compound for an organic optoelectronic device, a composition for an organic optoelectronic device including the same, an organic optoelectronic device, and a display device, the compound being represented by Chemical Formula 1:
(Continued)

[Chemical Formula 1]

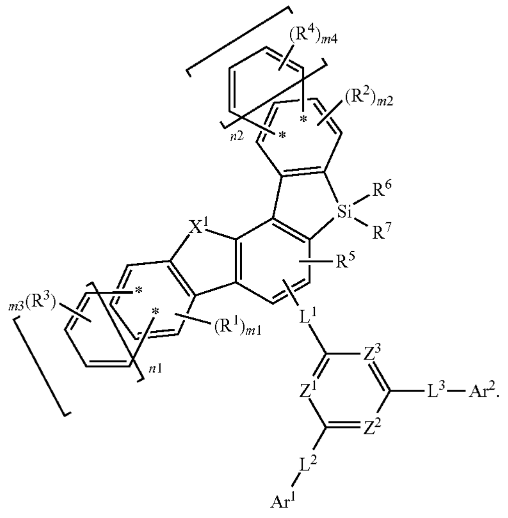

18 Claims, 1 Drawing Sheet

(51) Int. Cl.

| | |
|---|---|
| ***H10K 50/11*** | (2023.01) |
| ***H10K 85/60*** | (2023.01) |
| *H10K 101/10* | (2023.01) |

(52) U.S. Cl.
CPC ..... *H10K 85/6572* (2023.02); *H10K 2101/10* (2023.02)

(58) Field of Classification Search
CPC ............... H10K 85/653; H10K 85/657; H10K 85/6572; H10K 85/6574; C07F 7/0814; C07F 7/0816
See application file for complete search history.

(56) References Cited

U.S. PATENT DOCUMENTS

| | | | |
|---|---|---|---|
| 2015/0228909 | A1 | 8/2015 | Kim et al. |
| 2016/0133851 | A1 | 5/2016 | Jo et al. |
| 2017/0342318 | A1 | 11/2017 | Kim et al. |

FOREIGN PATENT DOCUMENTS

| | | | |
|---|---|---|---|
| CN | 110872313 | A | 3/2020 |
| JP | 1993-009471 | A | 1/1993 |
| JP | 1995-126615 | A | 5/1995 |
| JP | 1998-095973 | A | 4/1998 |
| JP | 2020-068383 | A | 4/2020 |
| KR | 10-1423066 | B1 | 7/2014 |
| KR | 10-2016-0081531 | A | 7/2016 |
| KR | 10-1648142 | B1 | 8/2016 |
| KR | 10-2017-0056425 | A | 5/2017 |
| KR | 10-2017-0056431 | A | 5/2017 |
| KR | 10-2019-0038108 | A | 9/2017 |
| KR | 10-2018-0057522 | A | 5/2018 |
| KR | 10-2019-0110775 | A | 10/2019 |
| KR | 10-2020-0069445 | A | 6/2020 |
| KR | 10-2155961 | B1 | 9/2020 |
| WO | WO 95/009147 | A1 | 4/1995 |

* cited by examiner

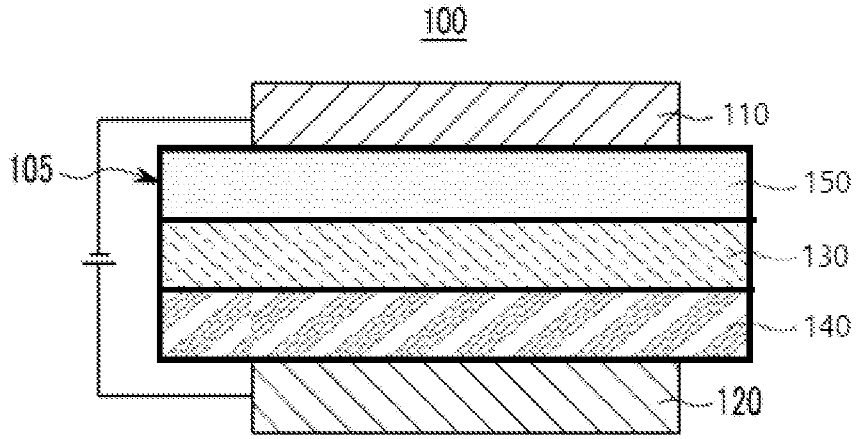
100
110
105
150
130
140
120

COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

CROSS-REFERENCE TO RELATED APPLICATION

This application claims priority to and the benefit of Korean Patent Application No. 10-2021-0089278 filed in the Korean Intellectual Property Office on Jul. 7, 2021, and Korean Patent Application No. 10-2022-0075164 filed in the Korean Intellectual Property Office on Jun. 20, 2022, the entire contents of which are incorporated herein by reference.

BACKGROUND

1. Field

Embodiments relate to a compound for an organic optoelectronic device, a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

Organic optoelectronic devices may be largely divided into two types according to a principle of operation. One is a photoelectric device that generates electrical energy by separating excitons formed by light energy into electrons and holes, and transferring the electrons and holes to different electrodes, respectively and the other is light emitting device that generates light energy from electrical energy by supplying voltage or current to the electrodes.

Examples of the organic optoelectronic device may include an organic photoelectric device, an organic light emitting diode, an organic solar cell, and an organic photo conductor drum.

SUMMARY

The embodiments may be realized by providing a compound for an organic optoelectronic device, the compound being represented by Chemical Formula 1:

[Chemical Formula 1]

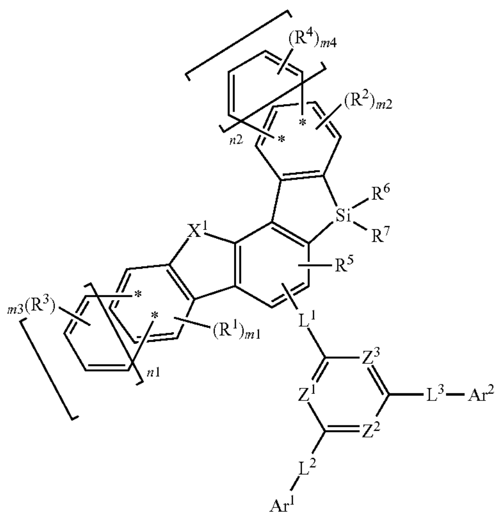

wherein, in Chemical Formula 1, $X^1$ is O or S, $Z^1$ to $Z^3$ are each independently N or $CR^a$, at least two of $Z^1$ to $Z^3$ being N, $L^1$ to $L^3$ are each independently a single bond or a substituted or unsubstituted C6 to C30 arylene group, $Ar^1$ and $Ar^2$ are each independently a substituted or unsubstituted C6 to C30 aryl group or a substituted or unsubstituted C2 to C30 heterocyclic group, $R^a$ and $R^1$ to $R^5$ are each independently hydrogen, deuterium, a substituted or unsubstituted C1 to C20 alkyl group, or a substituted or unsubstituted C6 to C20 aryl group, $R^6$ and $R^7$ are each independently a substituted or unsubstituted C1 to C20 alkyl group or a substituted or unsubstituted C6 to C20 aryl group, m1 and m2 are each independently an integer of 2 to 4, m3 and m4 are each independently an integer of 1 to 4, and n1 and n2 are each independently 0 or 1.

The embodiments may be realized by providing a composition for an organic optoelectronic device, the composition including a first compound; and a second compound, wherein the first compound is the compound for the organic optoelectronic device according to an embodiment, and the second compound is a compound for an organic optoelectronic device represented by Chemical Formula 2:

[Chemical Formula 2]

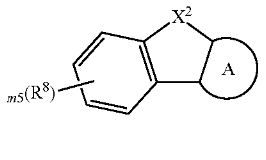

in Chemical Formula 2, $X^2$ is O, S, $NR^b$, $CR^cR^d$, or $SiR^eR^f$, $R^b$, $R^c$, $R^d$, $R^e$, $R^f$, and $R^8$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, m5 is an integer of 1 to 4, and ring A is a ring of Group II,

[Group II]

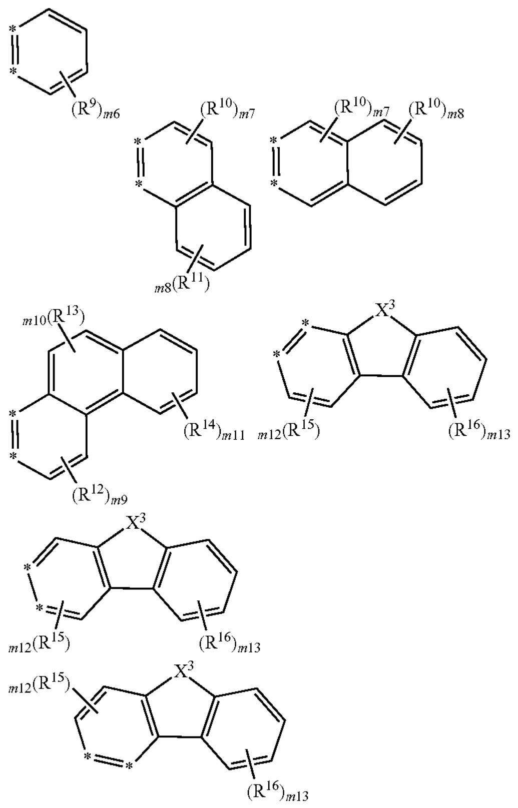

in Group II, * is a linking carbon, $X^3$ is O, S, $NR^g$, $CR^hR^i$, or $SiR^jR^k$, $R^g$, $R^h$, $R^i$, $R^j$, $R^k$, and $R^9$ to $R^{16}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, m6, m8, m11, and m13 are each independently an integer of 1 to 4, m7, m9, m10, and m12 are each independently 1 or 2, and at least one of $R^8$ to $R^{16}$ is a substituted amine group represented by Chemical Formula a,

[Chemical Formula a]

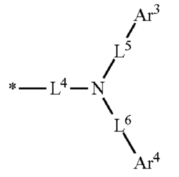

in Chemical Formula a, $L^4$ to $L^6$ are each independently a single bond or a substituted or unsubstituted C6 to C30 arylene group, $Ar^3$ and $Ar^4$ are each independently a substituted or unsubstituted amine group, a substituted or unsubstituted C6 to C30 aryl group, or a substituted or unsubstituted C2 to C30 heterocyclic group, and * is a linking point.

The embodiments may be realized by providing an organic optoelectronic device including an anode and a cathode facing each other, and at least one organic layer between the anode and the cathode, wherein the at least one organic layer includes a light emitting layer, and the light emitting layer includes the compound for the organic optoelectronic device according to an embodiment.

The embodiments may be realized by providing an organic optoelectronic device including an anode and a cathode facing each other, and at least one organic layer between the anode and the cathode, wherein the at least one organic layer includes a light emitting layer, and the light emitting layer includes the composition for the organic optoelectronic device according to an embodiment.

The embodiments may be realized by providing a display device including the organic optoelectronic device according to an embodiment.

BRIEF DESCRIPTION OF THE DRAWING

Features will be apparent to those of skill in the art by describing in detail exemplary embodiments with reference to the attached drawing in which:

the FIGURE is a cross-sectional view of an organic light emitting diode according to embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURES, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., "A or B" would include A, B, or A and B.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example of the present invention, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In addition, in specific examples of the present invention, "substituted" refers to replacement of at least one hydrogen of a substituent or a compound by deuterium, a C1 to C20 alkyl group, a C6 to C30 aryl group, or a cyano group. In addition, in specific examples of the present invention, "substituted" refers to replacement of at least one hydrogen of a substituent or a compound by deuterium, a C1 to C5 alkyl group, a C6 to C18 aryl group, or a cyano group. In addition, in specific examples of the present invention, "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

"Unsubstituted" refers to non-replacement of a hydrogen atom by another substituent and remaining of the hydrogen atom.

In the present specification, "hydrogen substitution (—H)" may include "deuterium substitution (-D)" or "tritium substitution (-T)."

As used herein, when a definition is not otherwise provided, "hetero" refers to one including one to three heteroatoms selected from N, O, S, P, and Si, and remaining carbons in one functional group.

As used herein, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quarterphenyl group, and the like, and a group in which two or more hydrocarbon aromatic moieties are fused directly or indirectly to provide a non-aromatic fused ring, for example, a fluorenyl group, and the like.

The aryl group may include a monocyclic, polycyclic or fused ring polycyclic (i.e., rings sharing adjacent pairs of carbon atoms) functional group.

As used herein, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, a substituted or unsubstituted dibenzothiophenyl group, a substituted or unsubstituted benzonaphthofuranyl group, a substituted or unsubstituted benzonaphthothiophenyl group, a substituted or unsubstituted dibenzosilolyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to the highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to the lowest unoccupied molecular orbital (LUMO) level.

Hereinafter, a compound for an organic optoelectronic device according to an embodiment is described.

The compound for the organic optoelectronic device according to an embodiment may be represented by, e.g., Chemical Formula 1.

[Chemical Formula 1]

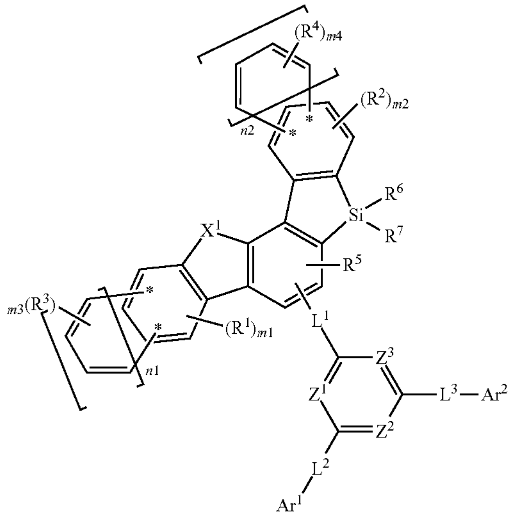

In Chemical Formula 1, $X^1$ may be, e.g., O or S.

$Z^1$ to $Z^3$ may each independently be, e.g., N or $CR^a$. In an implementation, at least two of $Z^1$ to $Z^3$ may be N.

$L^1$ to $L^3$ may each independently be or include, e.g., a single bond or a substituted or unsubstituted C6 to C30 arylene group.

$Ar^1$ and $Ar^2$ may each independently be or include, e.g., a substituted or unsubstituted C6 to C30 aryl group or a substituted or unsubstituted C2 to C30 heterocyclic group.

$R^a$ and $R^1$ to $R^5$ may each independently be or include, e.g., hydrogen, deuterium, a substituted or unsubstituted C1 to C20 alkyl group, or a substituted or unsubstituted C6 to C20 aryl group.

$R^6$ and $R^7$ may each independently be or include, e.g., a substituted or unsubstituted C1 to C20 alkyl group or a substituted or unsubstituted C6 to C20 aryl group.

m1 and m2 may each independently be, e.g., an integer of 2 to 4.

m3 and m4 may each independently be, e.g., an integer of 1 to 4.

n1 and n2 may each independently be, e.g., 0 or 1.

* is a linking carbon. As used herein, the term "linking carbon" refers to a shared carbon at which fused rings are linked. For example, the *s may be adjacent carbons of the $R^1$-containing ring to form a fused ring structure.

The compound represented by Chemical Formula 1 may have a structure in which a benzene ring is in the center in the backbone in which benzosilole is further fused at 3rd and 4th positions of dibenzofuran (or dibenzothiophene) and is substituted with pyrimidine or triazine.

The polyfused ring formed by further fusing benzosilole may have a twisted structure rather than a completely planar state, crystallinity may be reduced, and Tg may be improved. In an implementation, crystallinity may be reduced, and processability during deposition may be improved.

In an implementation, the compound may be substituted with pyrimidine or triazine, may have high electron mobility, and thus the driving voltage may be lowered.

In an implementation, the benzene ring in the center may be substituted with the pyrimidine or triazine, and LUMO phores may smoothly expand to the left and right to help improve stability to electrons, thereby improving life-span of the device.

In an implementation, the compound may include a silicon-containing fused ring, and heat resistance may be improved, compared to a carbon fused ring.

In an implementation, Chemical Formula 1 may be represented by Chemical Formula 1A or Chemical Formula 1B, according to a specific substitution position of triazine.

[Chemical Formula 1A]

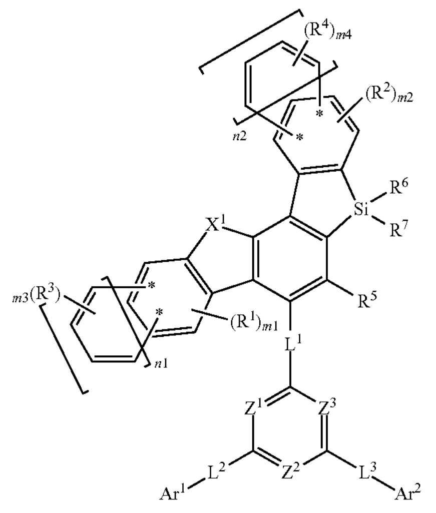

[Chemical Formula 1B]

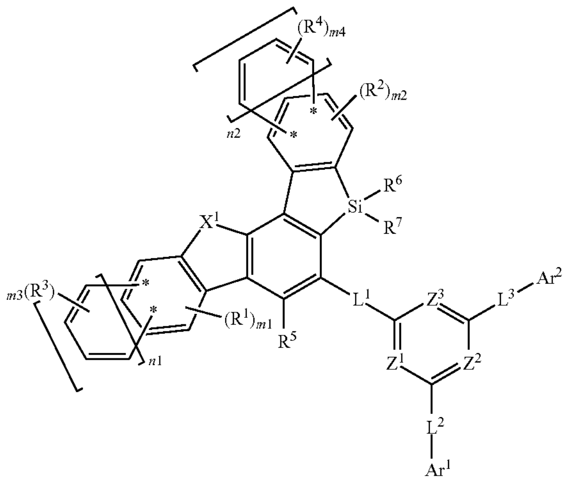

In Chemical Formula 1A and Chemical Formula 1B, $X^1$, $Z^1$ to $Z^3$, $L^1$ to $L^1$, $Ar^1$, $Ar^2$, $R^1$ to $R^7$, m1 to m4, n1, and n2 may be defined the same as those described above.

In an implementation, depending on whether the end of the fused ring is further fused, the compound may be represented by, e.g., one of Chemical Formula 1-1 to Chemical Formula 1-7.

-continued
[Chemical Formula 1-1]
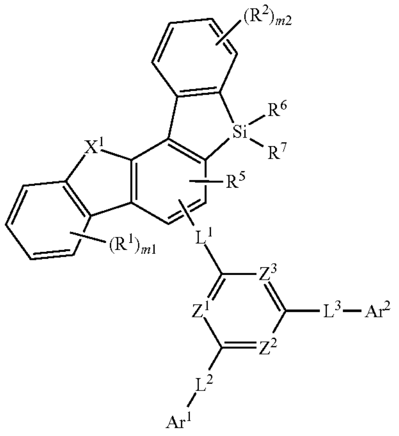
[Chemical Formula 1-2]
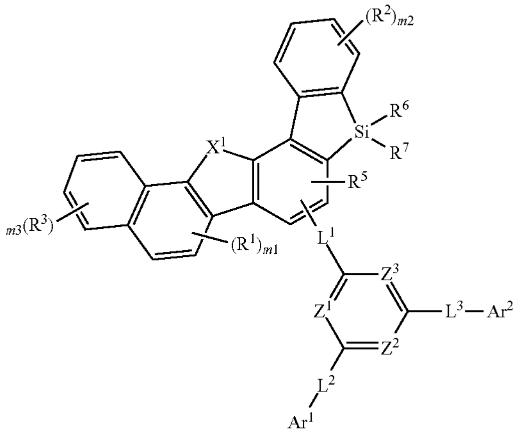
[Chemical Formula 1-3]
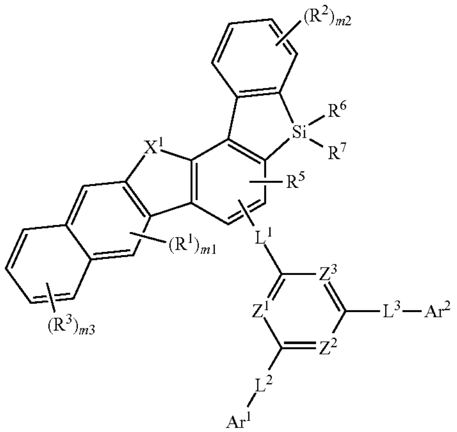
[Chemical Formula 1-4]
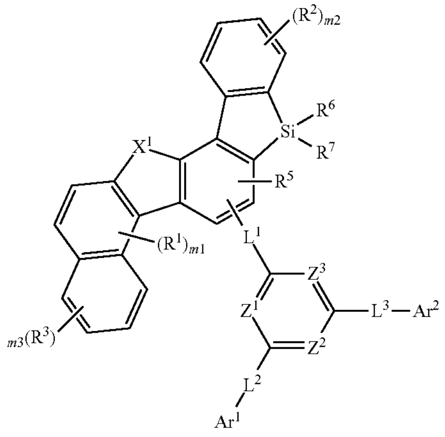
[Chemical Formula 1-5]
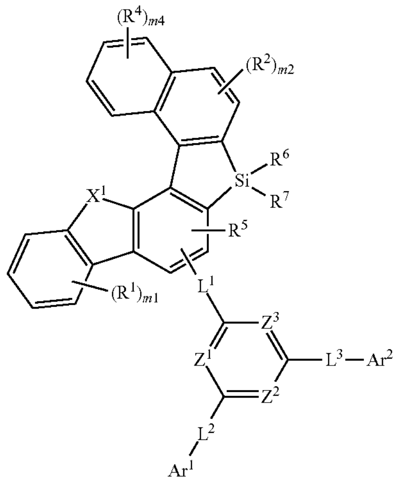
[Chemical Formula 1-6]
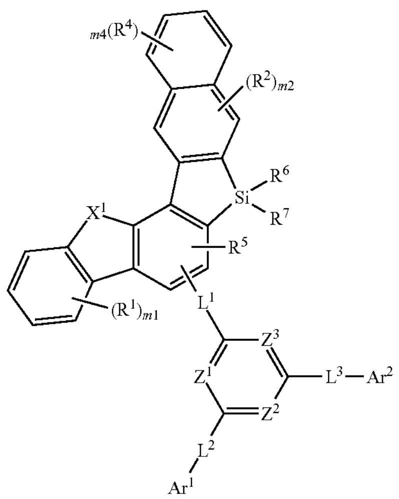

-continued

[Chemical Formula 1-7]

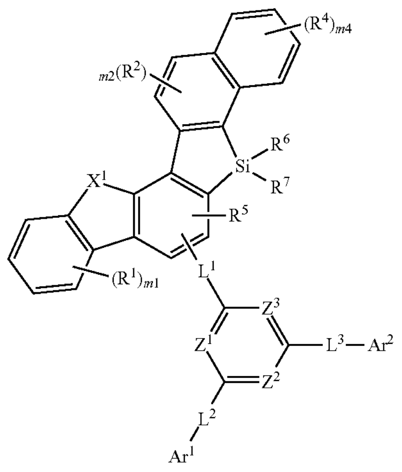

In Chemical Formula 1-1 to Chemical Formula 1-7, $X^1$, $Z^1$ to $Z^3$, $L^1$ to $L^3$, $Ar^1$, $Ar^2$, $R^1$ to $R^7$ and m1 to m4 may be the same as those described above.

In an implementation, $L^1$ to $L^3$ may each independently be, e.g., a single bond, a substituted or unsubstituted phenylene group, or a substituted or unsubstituted naphthylene group.

In an implementation, $L^1$ may be, e.g., a single bond, and $L^2$ and $L^3$ may each independently be, e.g., a single bond or a substituted or unsubstituted phenylene group.

In an implementation, $Ar^1$ and $Ar^2$ may each independently be, e.g., a substituted or unsubstituted phenyl group, a substituted or unsubstituted biphenyl group, a substituted or unsubstituted naphthyl group, a substituted or unsubstituted phenanthrenyl group, a substituted or unsubstituted carbazolyl group, a substituted or unsubstituted dibenzofuranyl group, a substituted or unsubstituted dibenzothiophenyl group, or a substituted or unsubstituted dibenzosilolyl group.

In an implementation, $Ar^1$ and $Ar^2$ may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, moieties $-L^2-Ar^1$ and $-L^3-Ar^2$ may each independently be, e.g., a moiety of Group I.

[Group I]

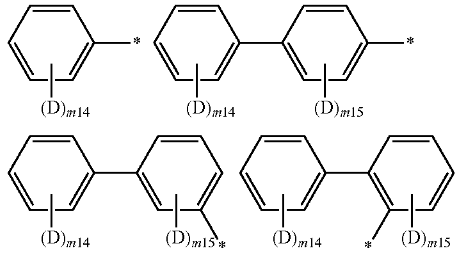

-continued

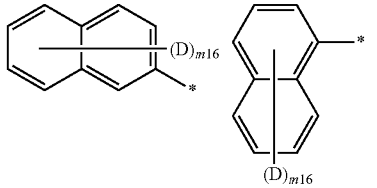

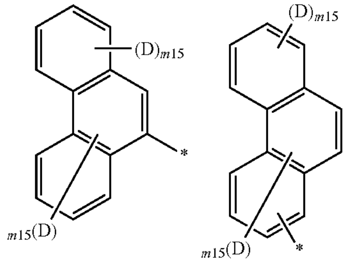

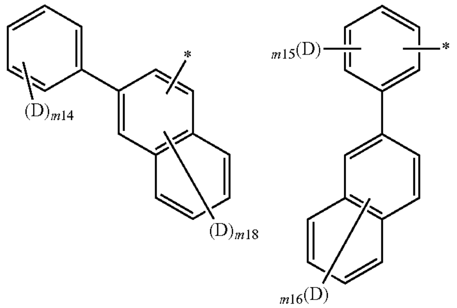

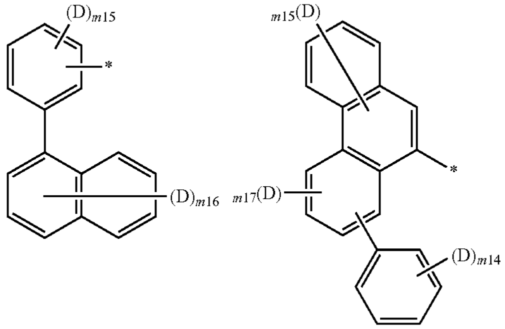

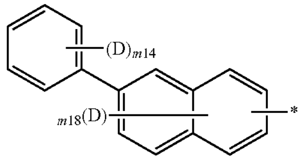

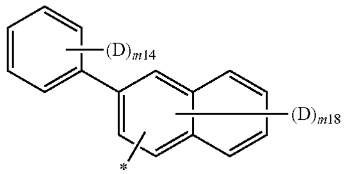

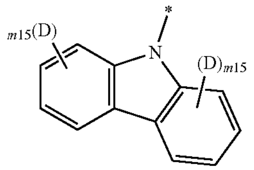

-continued

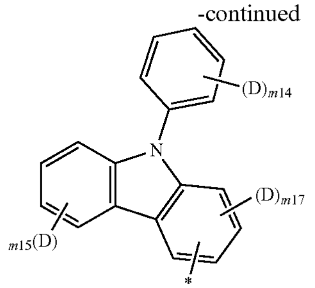

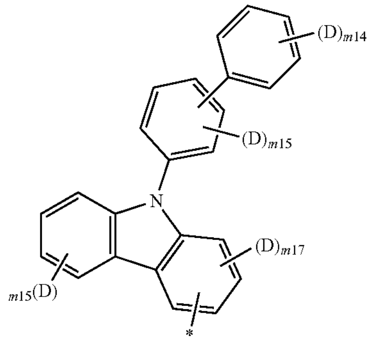

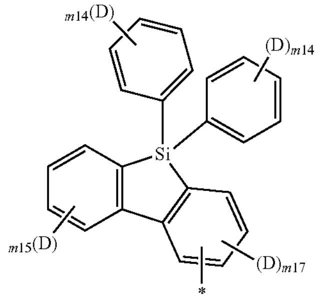

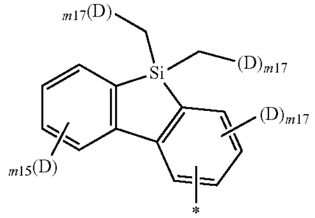

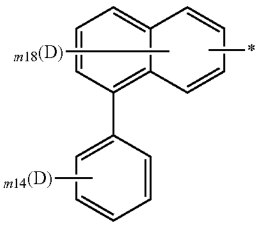

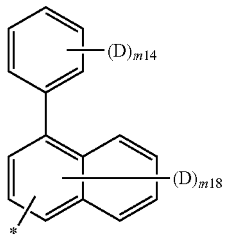

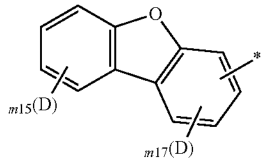

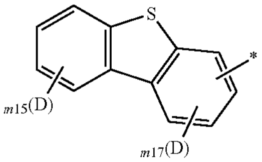

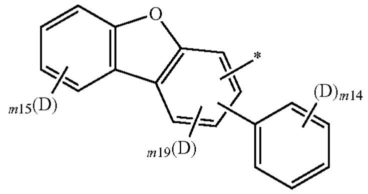

-continued

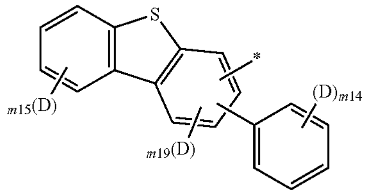

In Group I,

D is deuterium, m14 may be, e.g., an integer of 0 to 5, m19 may be, e.g., an integer of 0 to 4, m16 may be, e.g., an integer of 0 to 7, m17 may be, e.g., an integer of 0 to 3, m18 may be, e.g., an integer of 0 to 6, m19 may be, e.g., an integer of 0 to 2, and

* is a linking point.

In the definitions of m14 to m19, 0 means that all hydrogen atoms are not substituted with deuterium and remain as hydrogen atoms, e.g., "unsubstituted".

may be, e.g., an integer of, $R^1$ to $R^5$ may each independently be, e.g., hydrogen, deuterium, a substituted or unsubstituted C1 to C10 alkyl group, or a substituted or unsubstituted C6 to C12 aryl group.

may be, e.g., an integer of, $R^1$ to $R^5$ may each independently be, e.g., hydrogen or deuterium.

may be, e.g., an integer of, $R^6$ and $R^7$ may each independently be, e.g., a substituted or unsubstituted C1 to C10 alkyl group or a substituted or unsubstituted C6 to C12 aryl group.

may be, e.g., an integer of, $R^6$ and $R^7$ may each independently be, e.g., a substituted or unsubstituted methyl group or a substituted or unsubstituted phenyl group.

may be, e.g., an integer of, the compound for the organic optoelectronic device represented by Chemical Formula 1 may be, e.g., a compound of Group 1.

[Group 1]

[1]

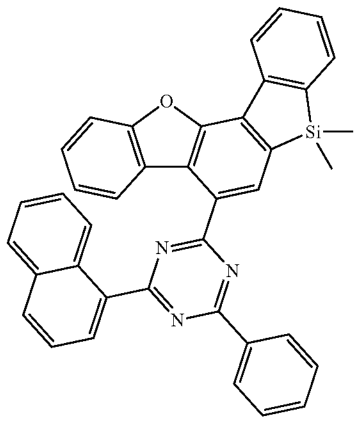

-continued
[2]
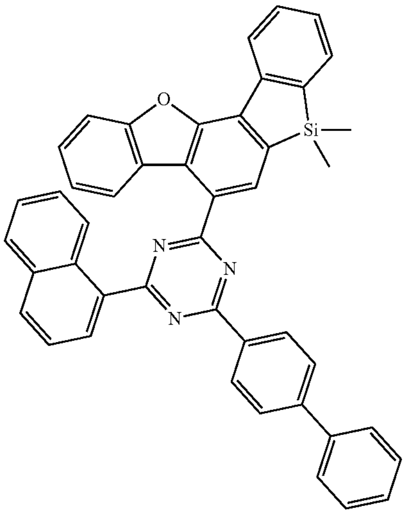
[3]
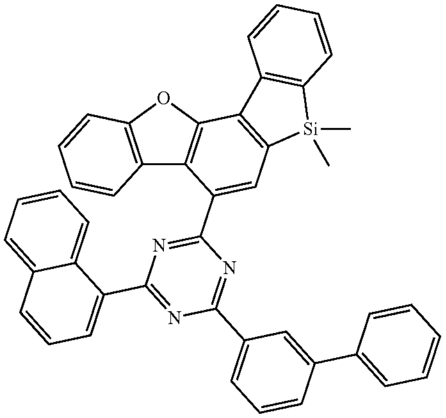
[4]
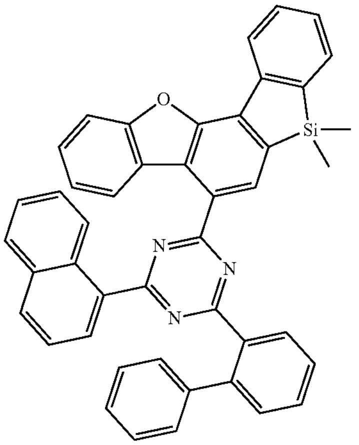
-continued
[5]
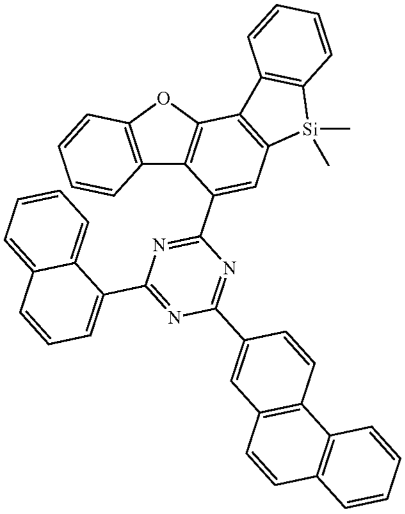
[6]
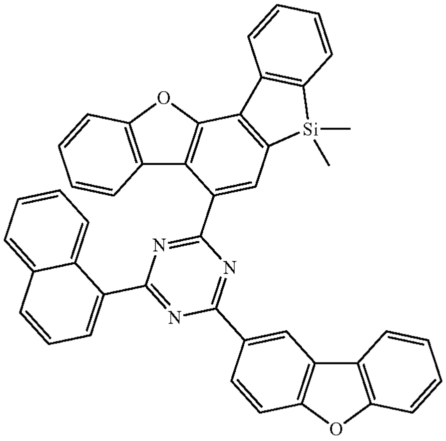
[7]
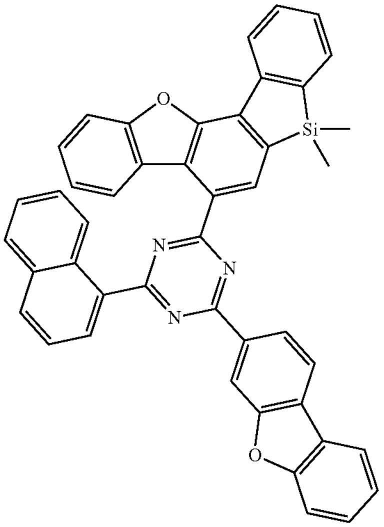

-continued
[8]
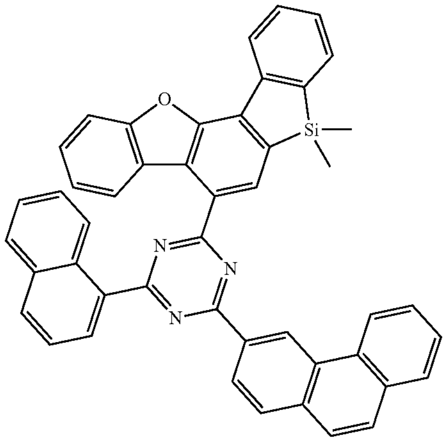
[9]
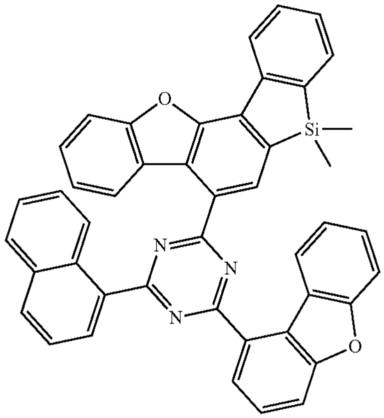
[10]
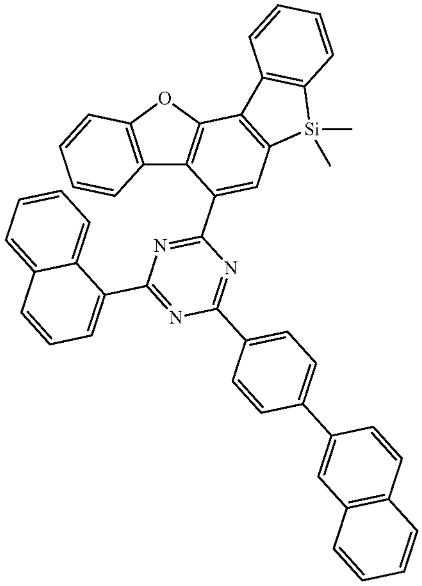
-continued
[11]
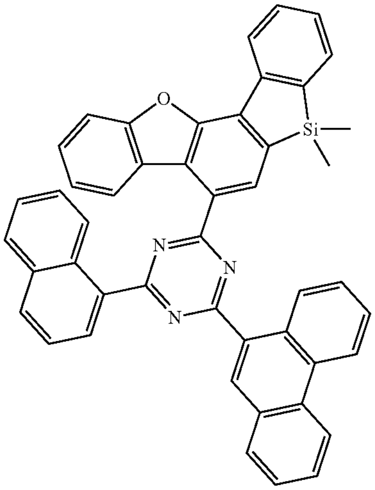
[12]
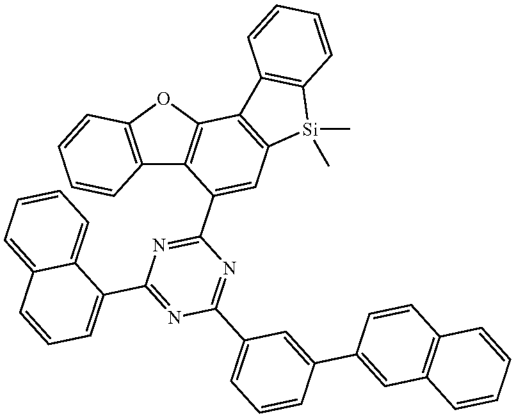
[13]
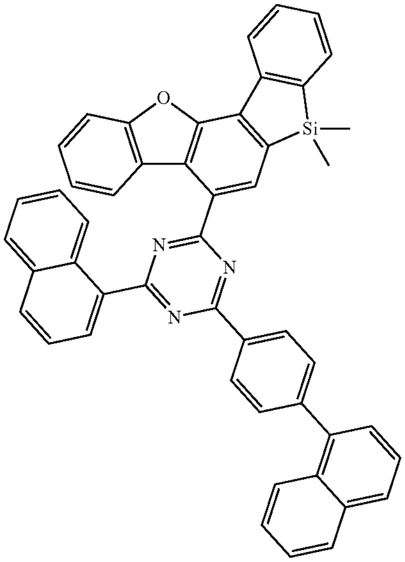

-continued
[14]
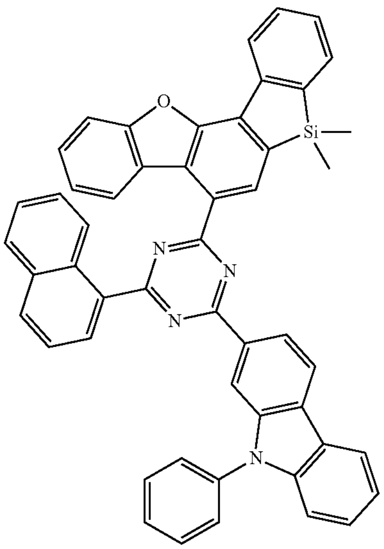
[15]
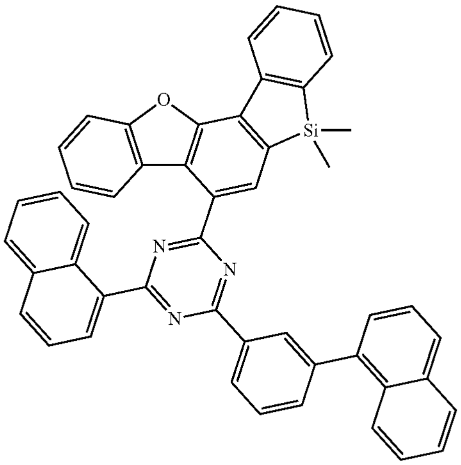
[16]
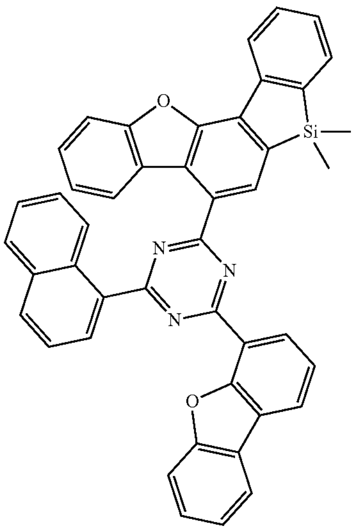
-continued
[17]
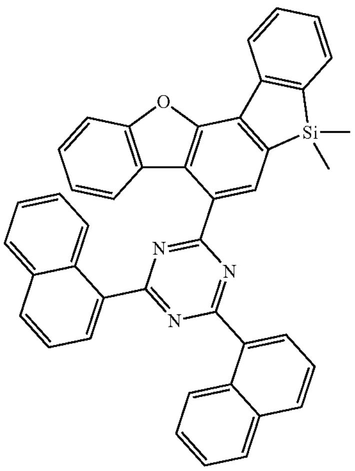
[18]
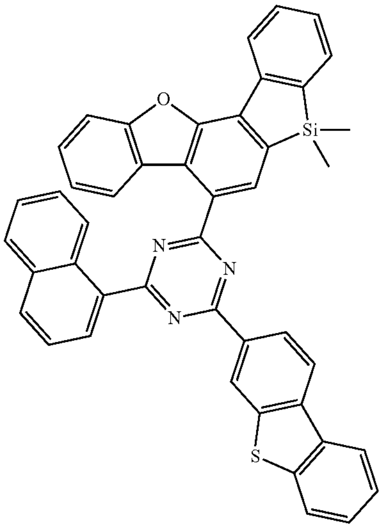
[19]
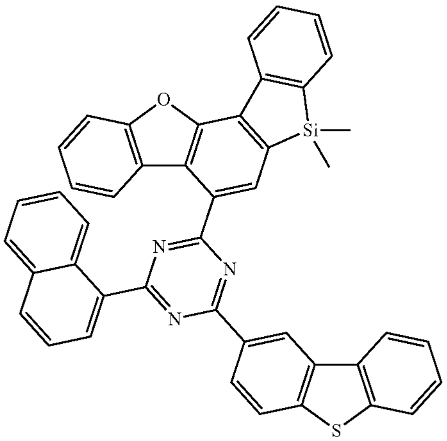

-continued
[20]
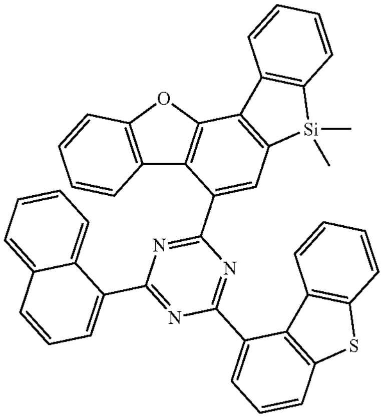
[21]
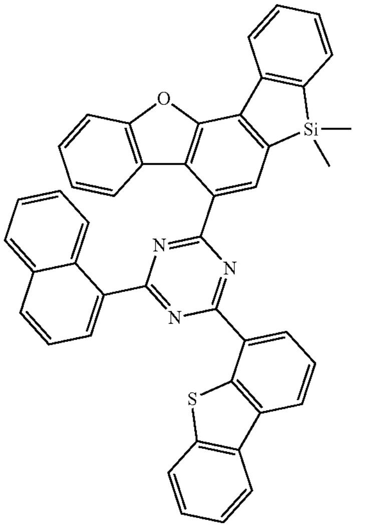
[22]
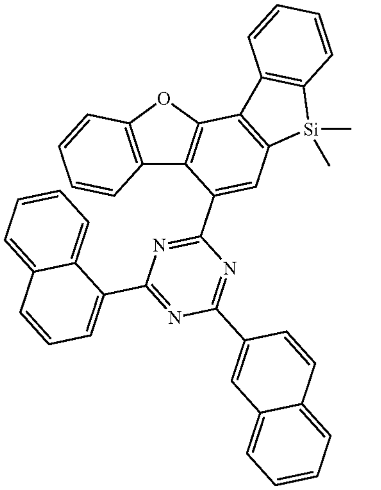
-continued
[23]
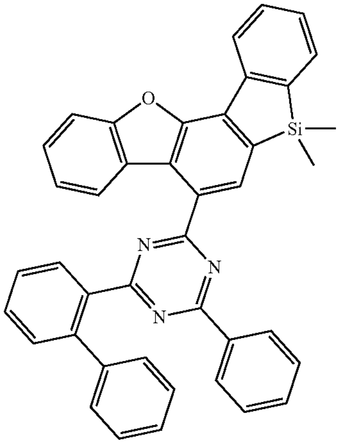
[24]
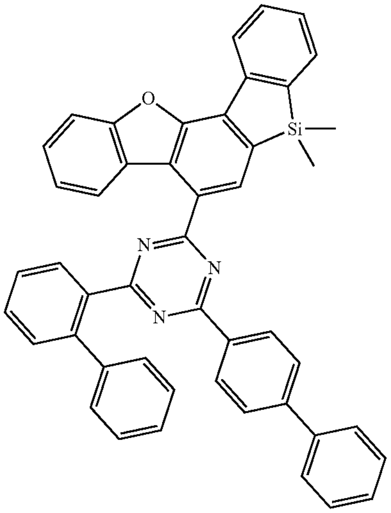
[25]
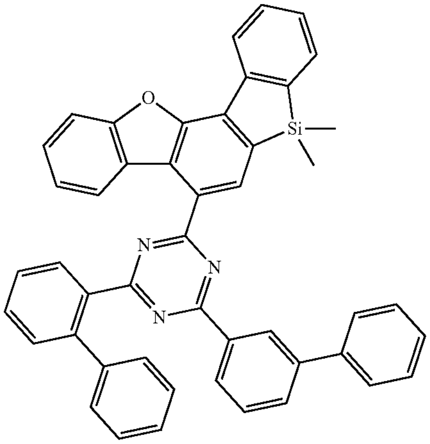

-continued
[26]
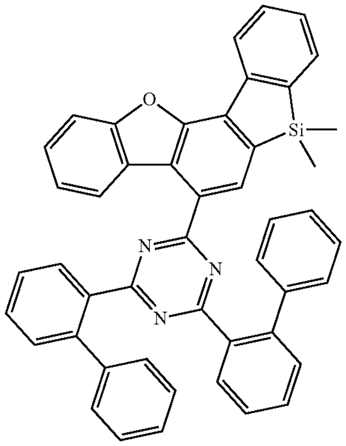
[27]
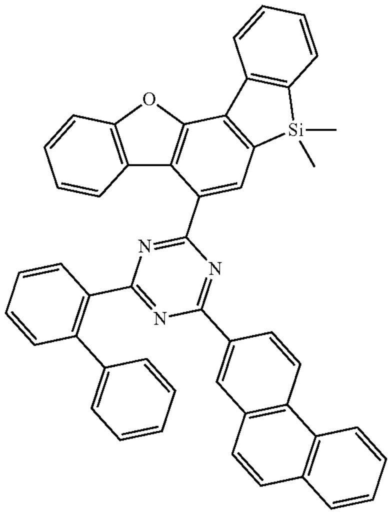
[28]
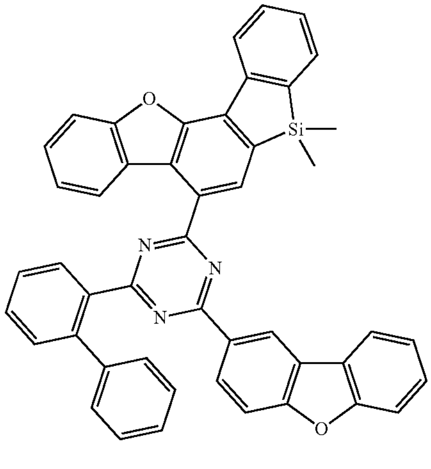
-continued
[29]
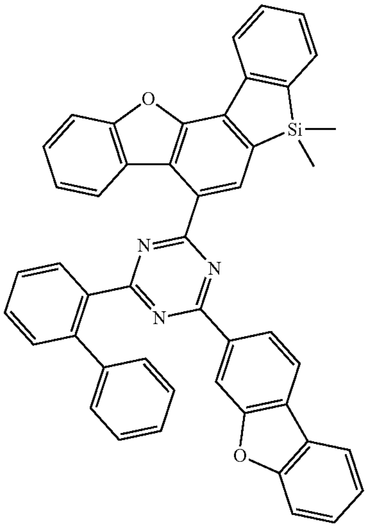
[30]
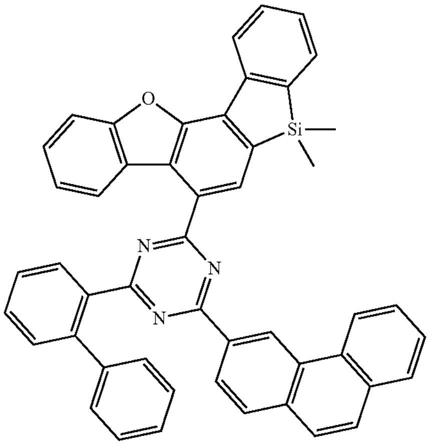
[31]
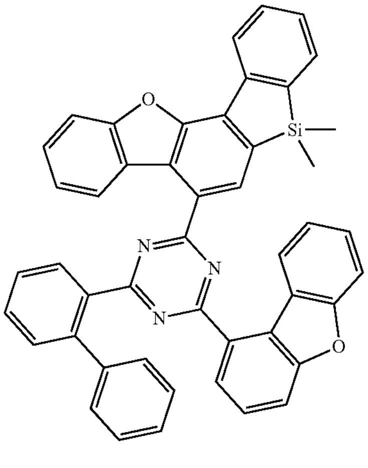

-continued
[32]
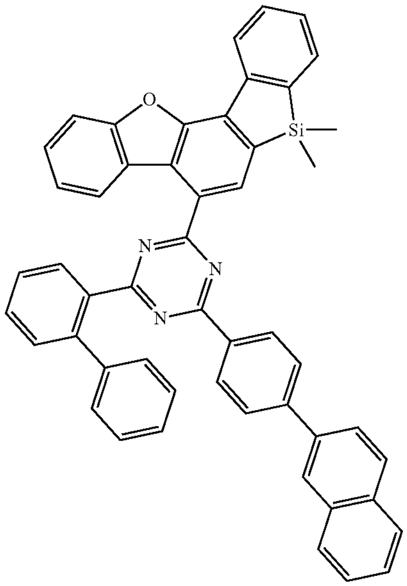
[33]
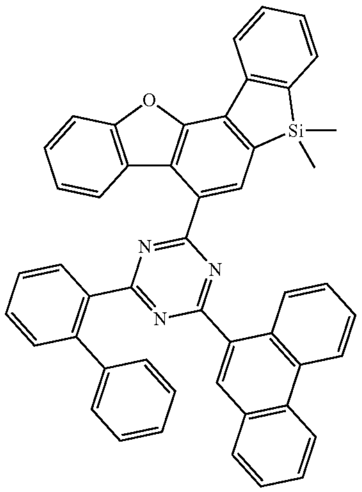
[34]
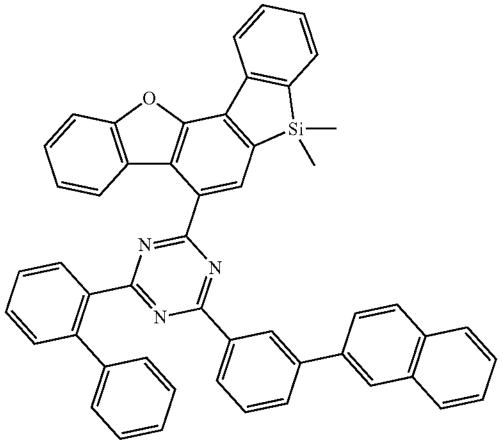
-continued
[35]
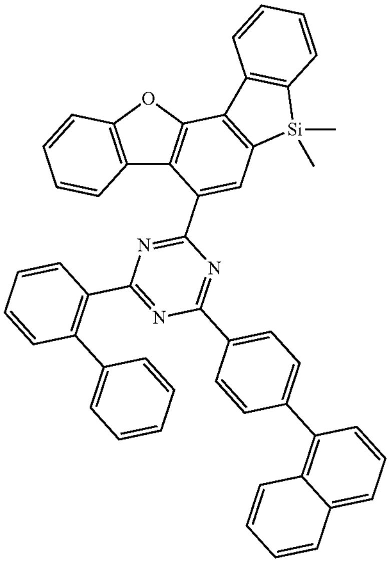
[36]
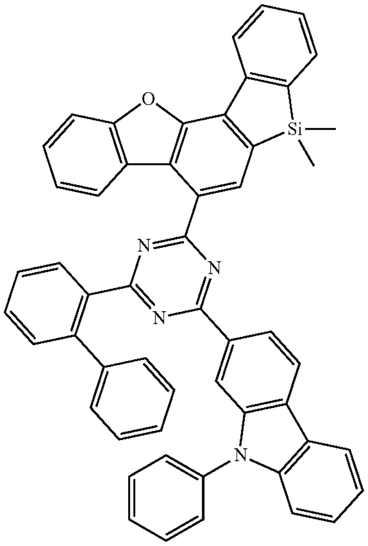
[37]
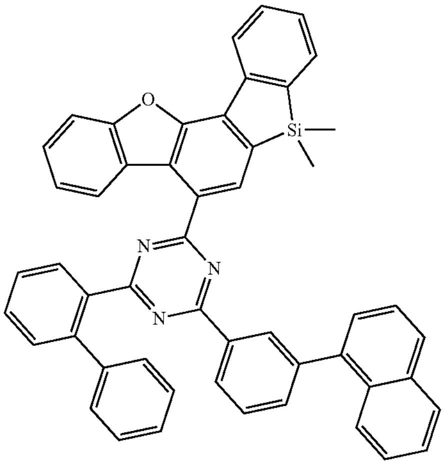

-continued
[38]
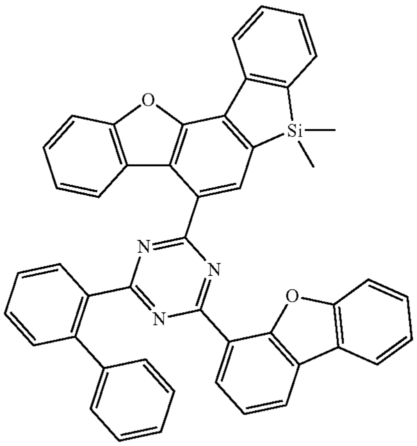
[39]
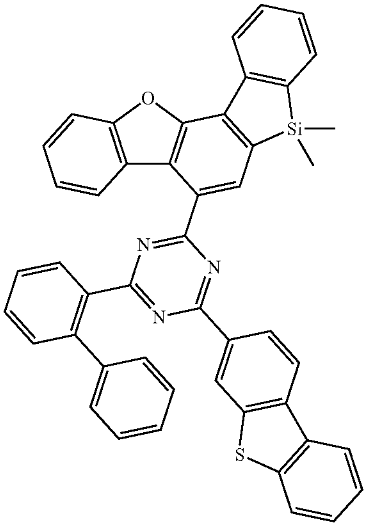
[40]
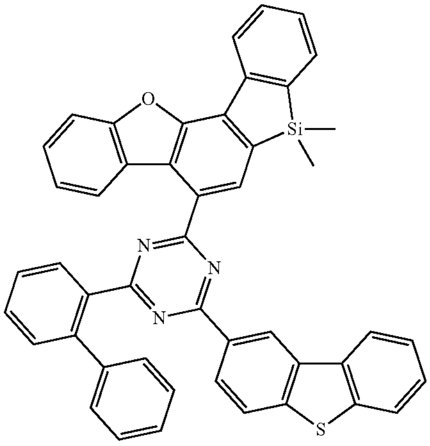
-continued
[41]
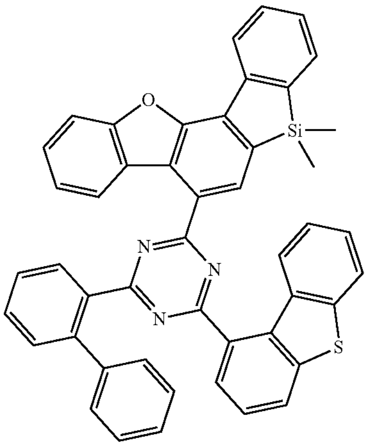
[42]
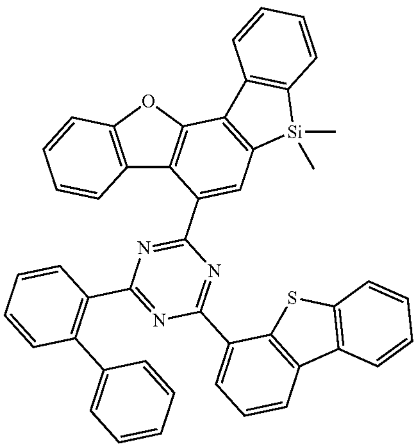
[43]
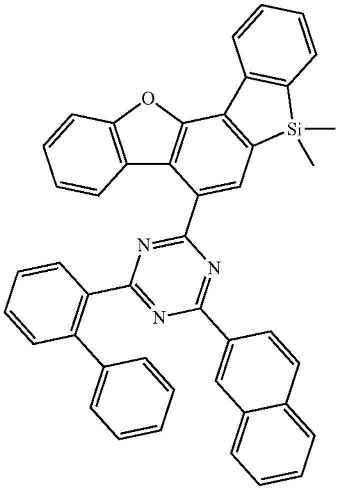

-continued
[44]
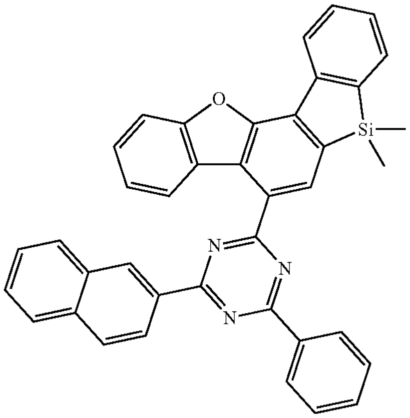
[45]
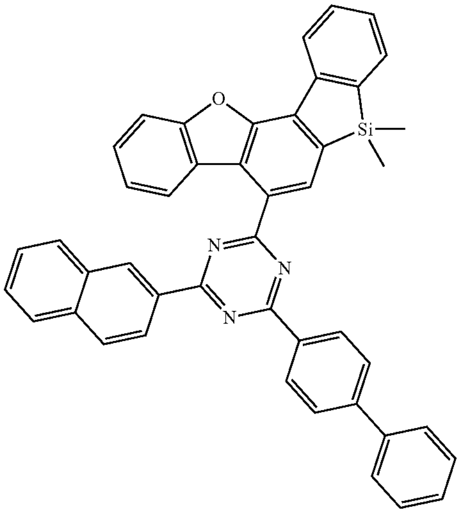
[46]
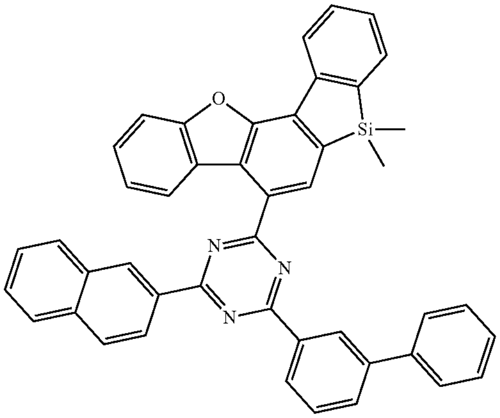
-continued
[47]
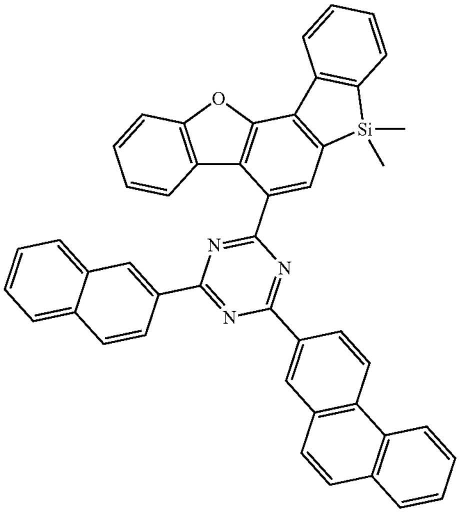
[48]
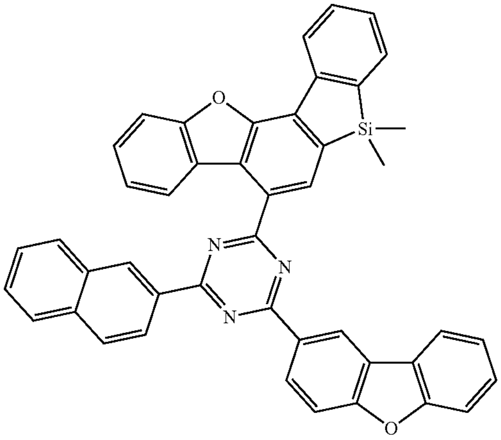
[49]
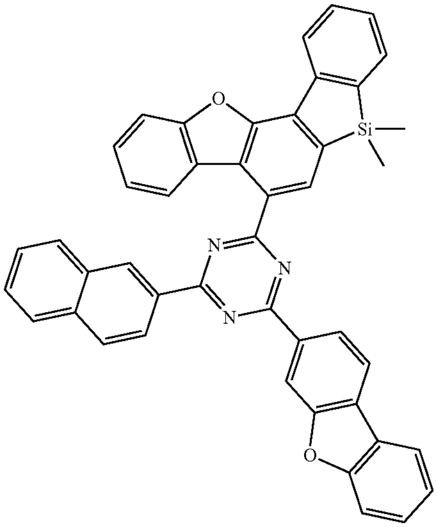

-continued
[50]
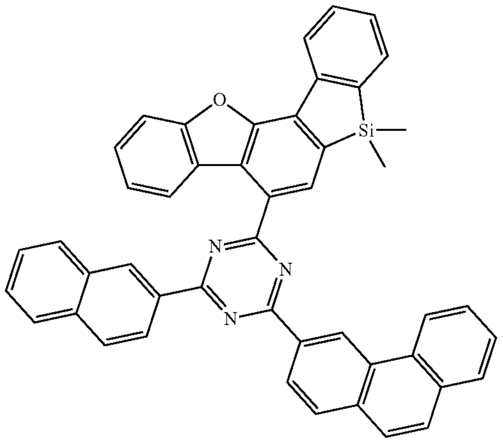
[51]
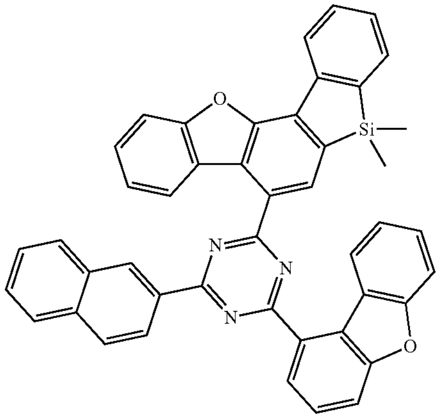
[52]
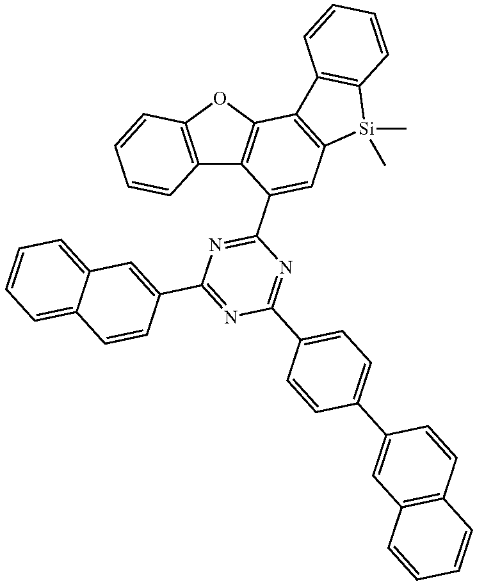
-continued
[53]
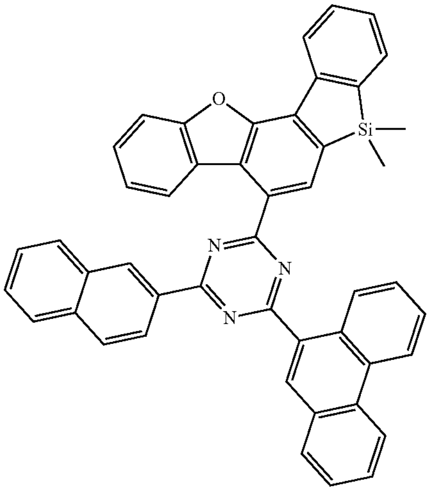
[54]
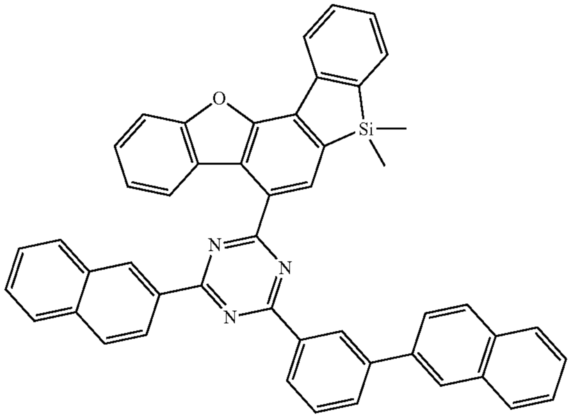
[55]
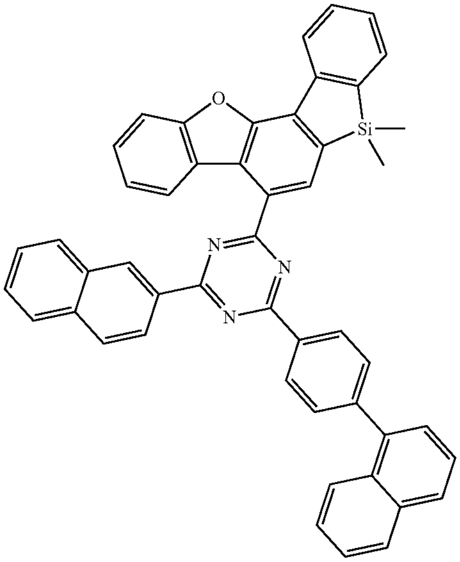

-continued
[56]
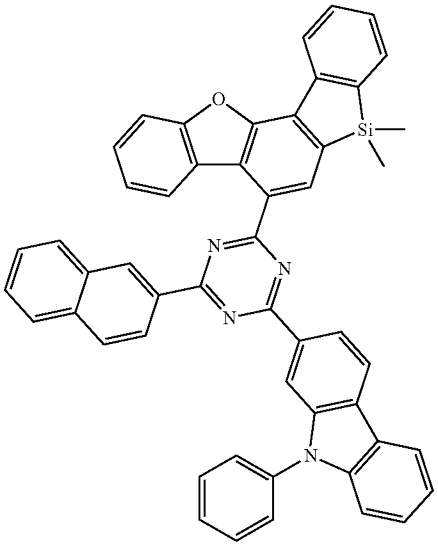
[57]
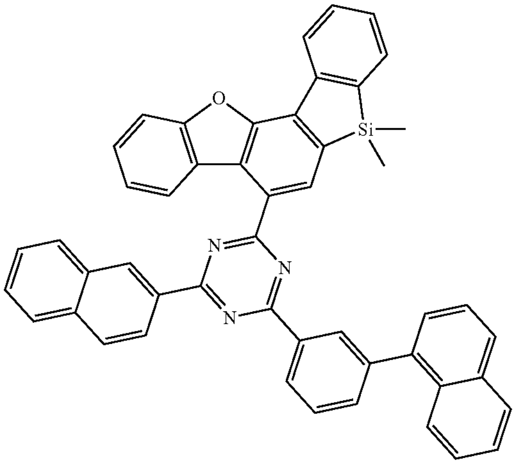
[58]
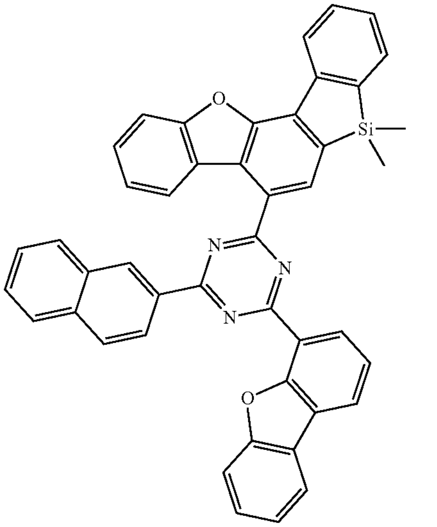
-continued
[59]
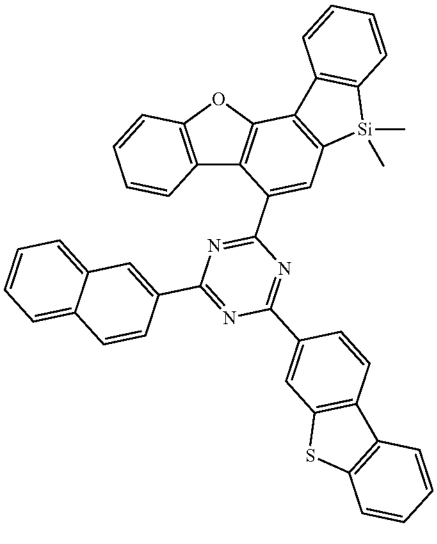
[60]
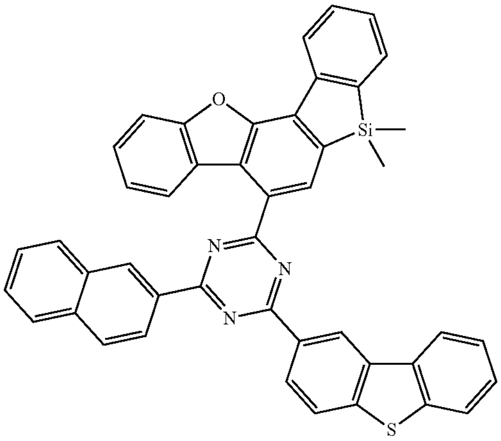
[61]
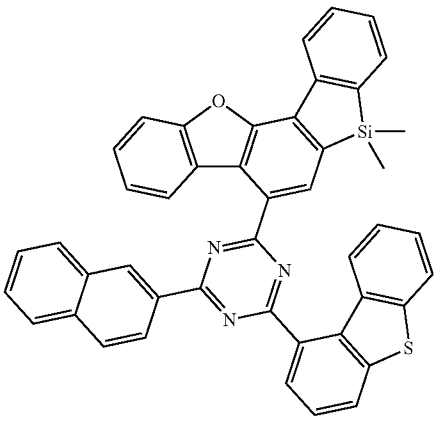

-continued
[62]
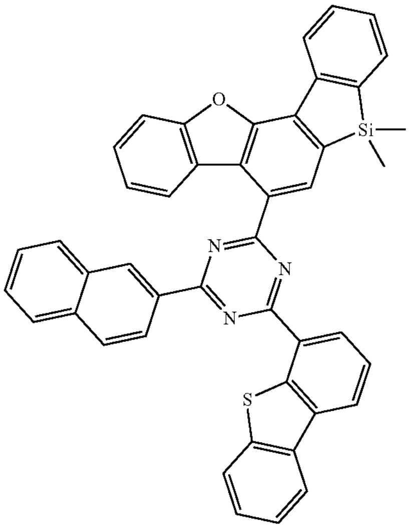
[63]
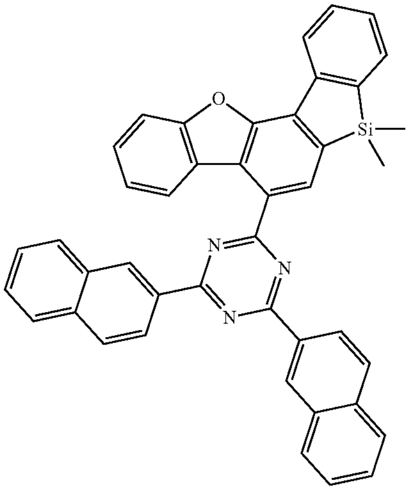
[64]
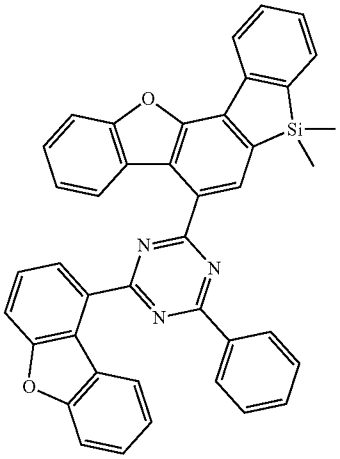
-continued
[65]
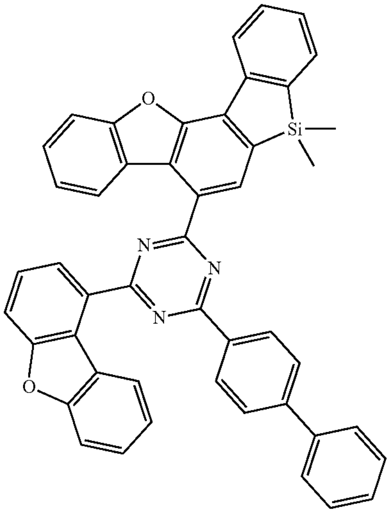
[66]
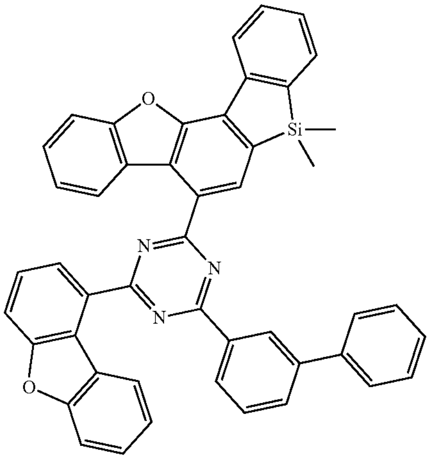
[67]
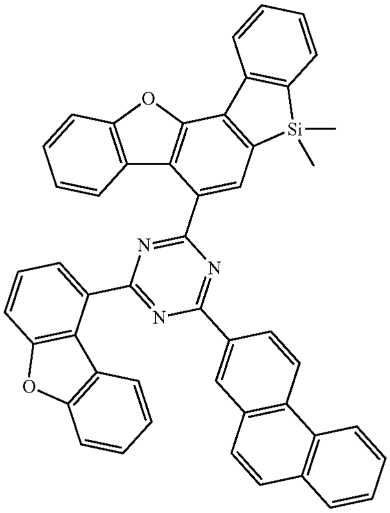

-continued
[68]
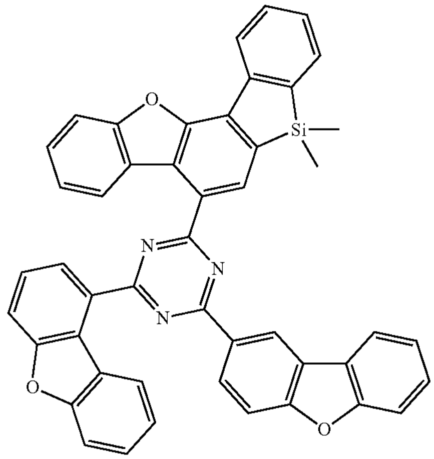
[69]
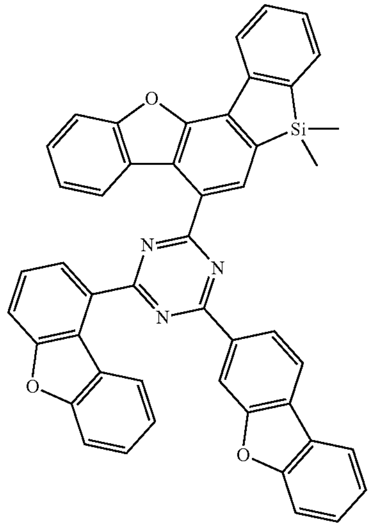
[70]
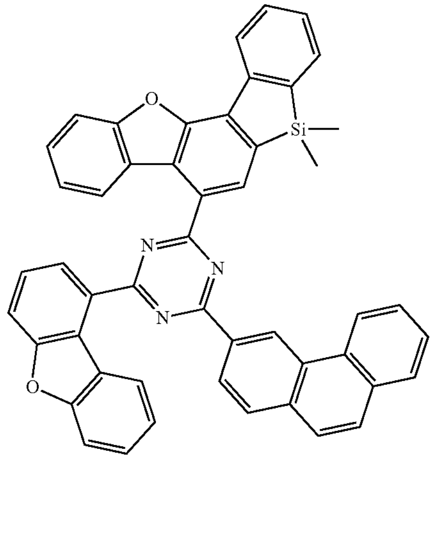
-continued
[71]
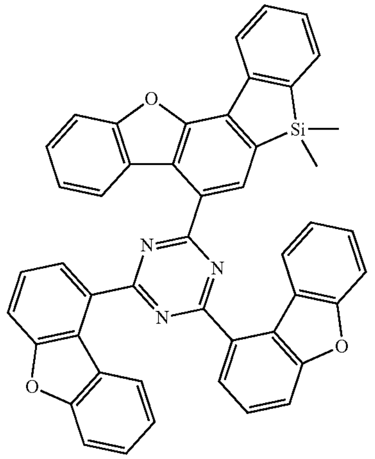
[72]
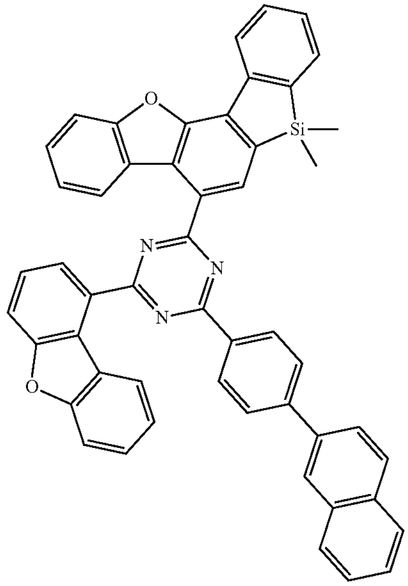
[73]
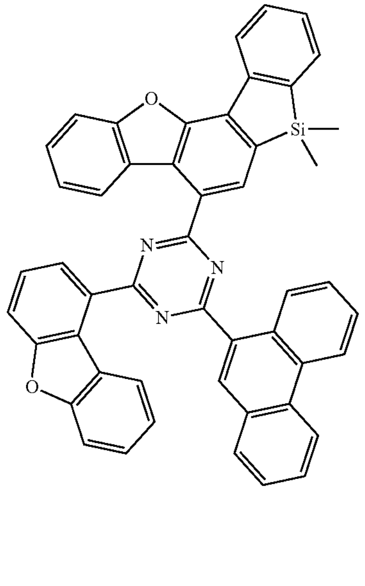

-continued
[74]
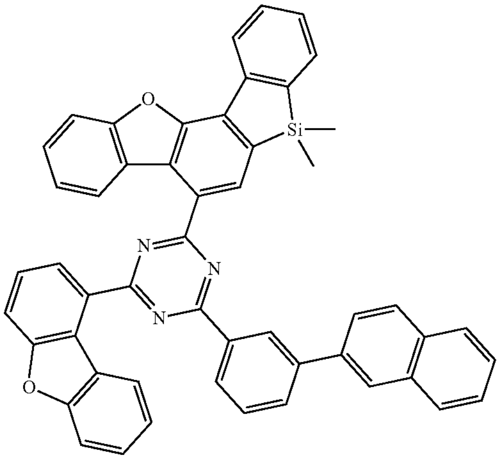
[75]
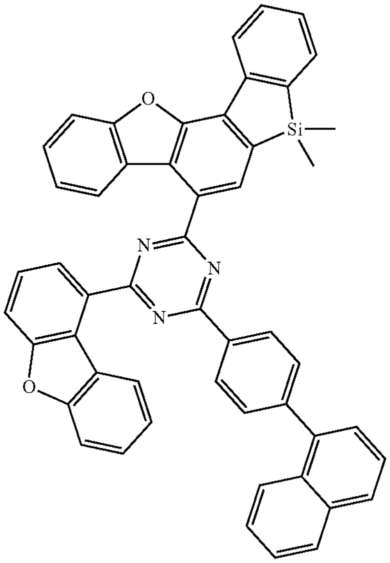
[76]
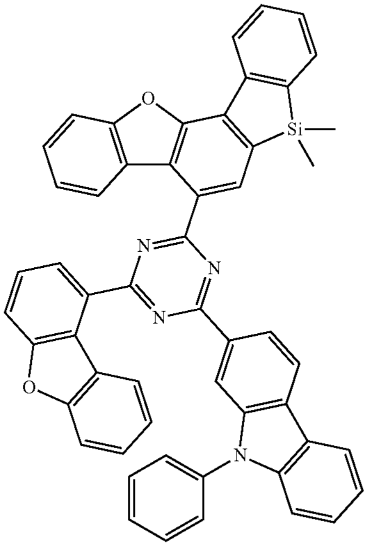
-continued
[77]
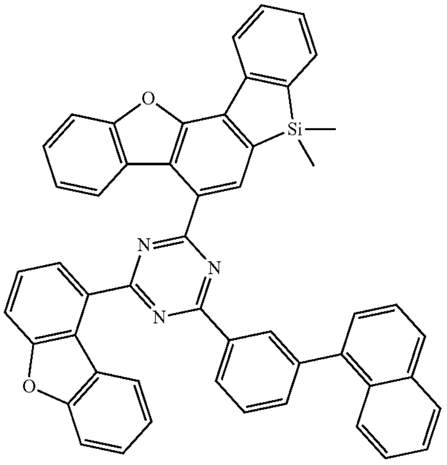
[78]
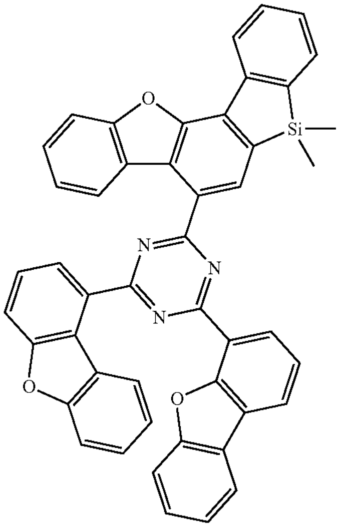
[79]
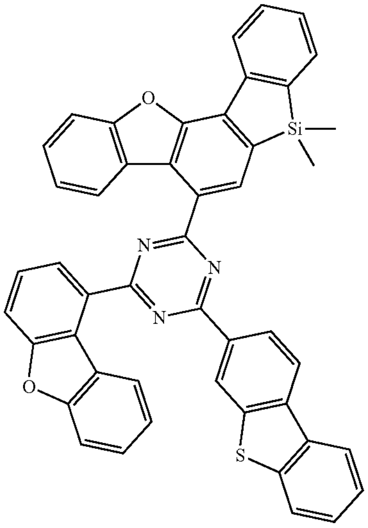

-continued
[80]
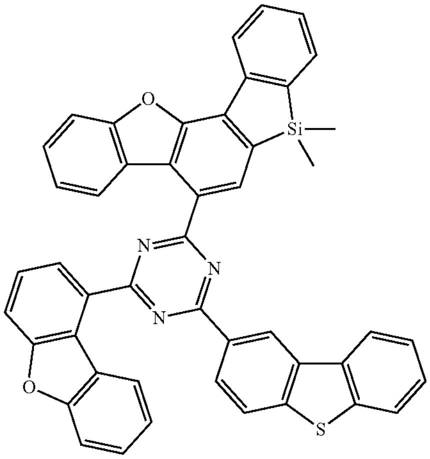
[81]
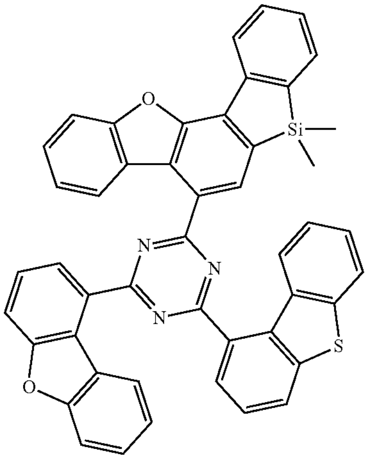
[82]
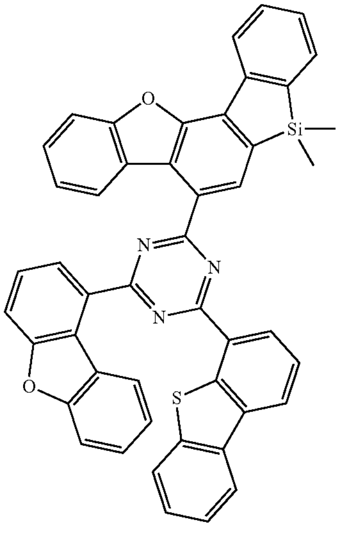
-continued
[83]
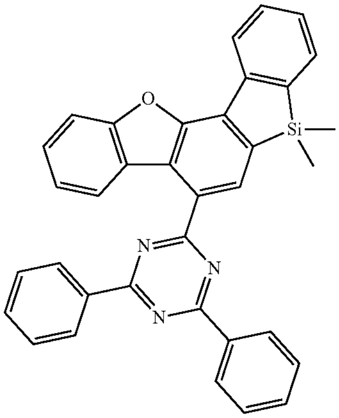
[84]
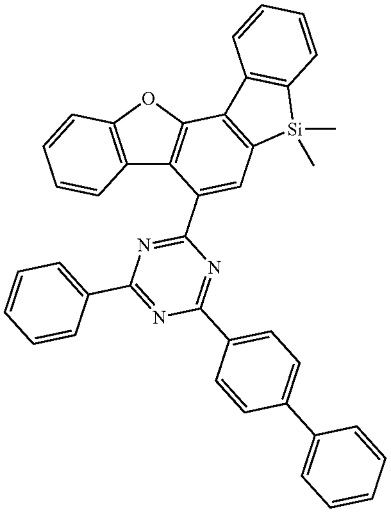
[85]
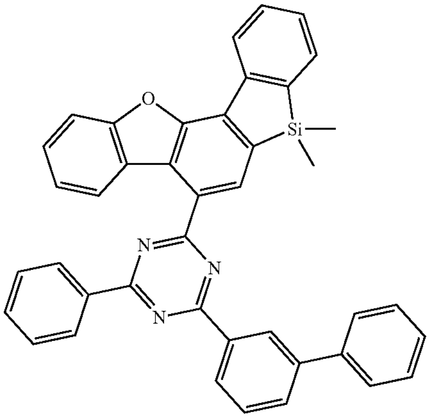

-continued
[86]
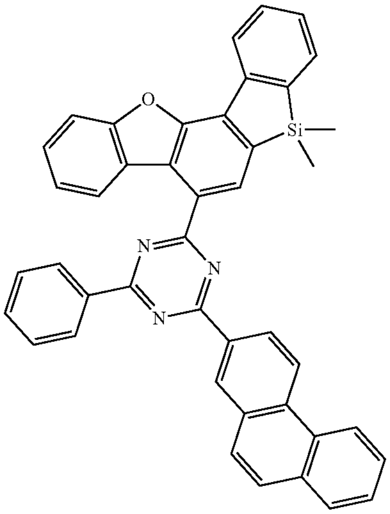
[87]
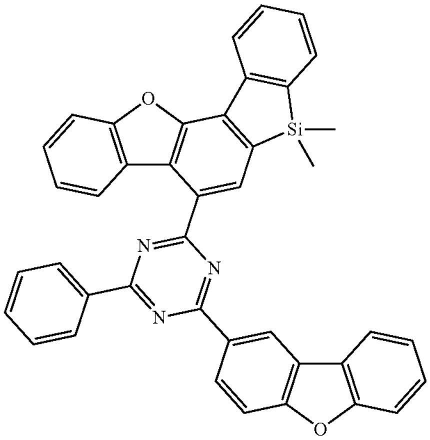
[88]
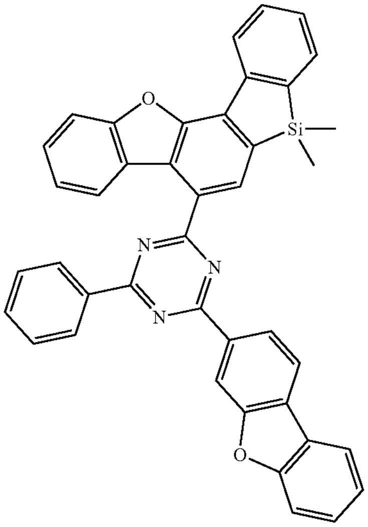
-continued
[89]
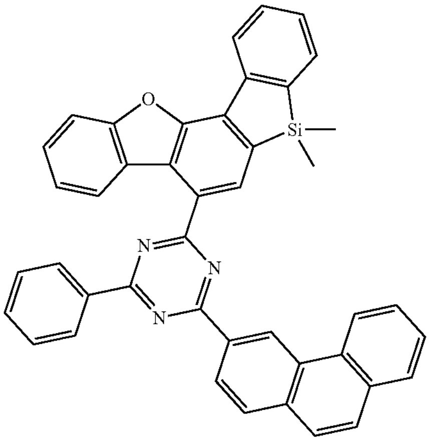
[90]
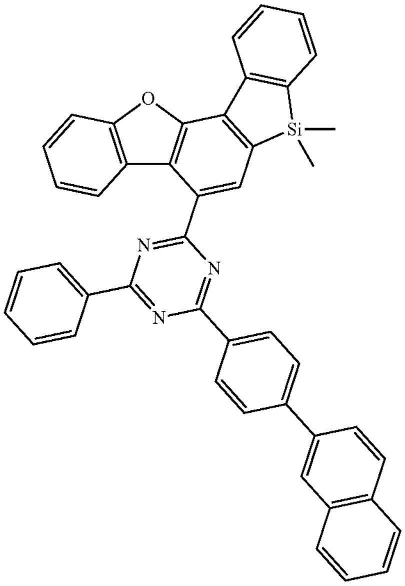
[91]
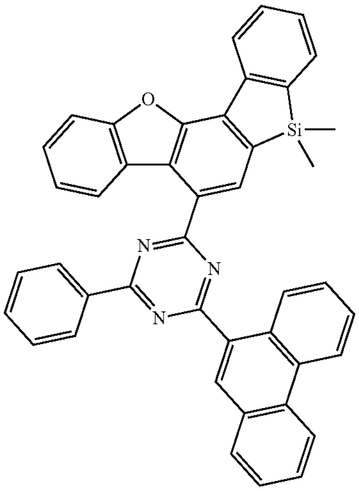

-continued
[92]
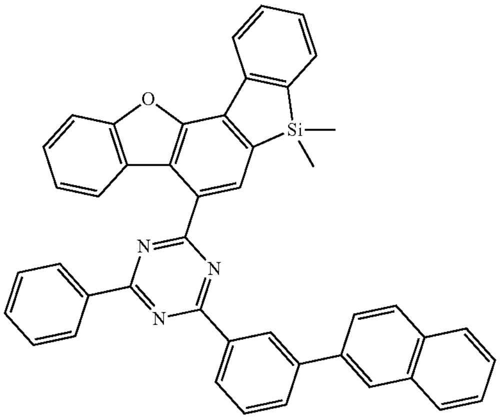
[93]
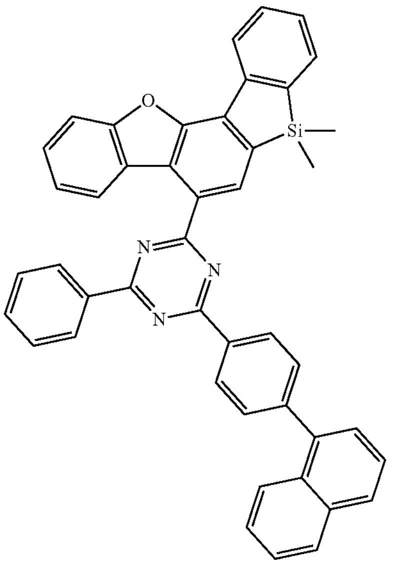
[94]
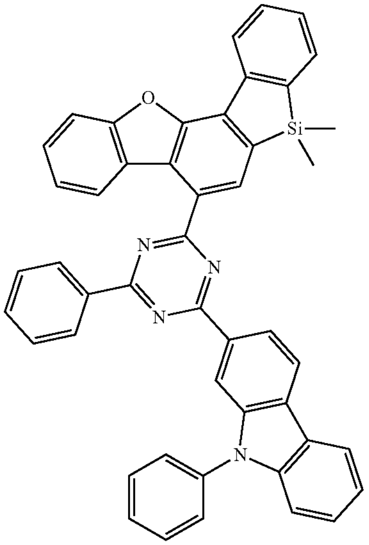
-continued
[95]
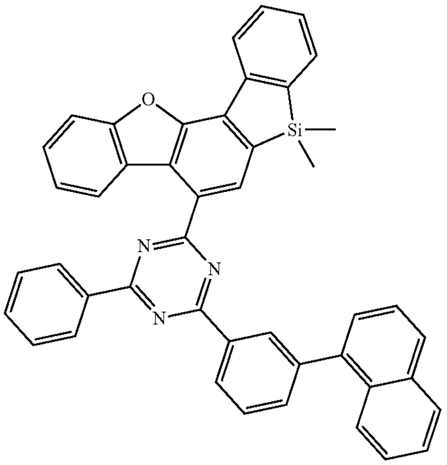
[96]
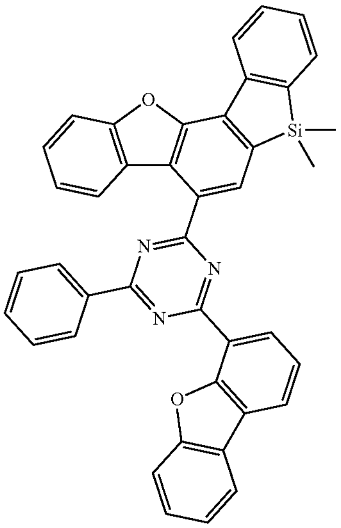
[97]
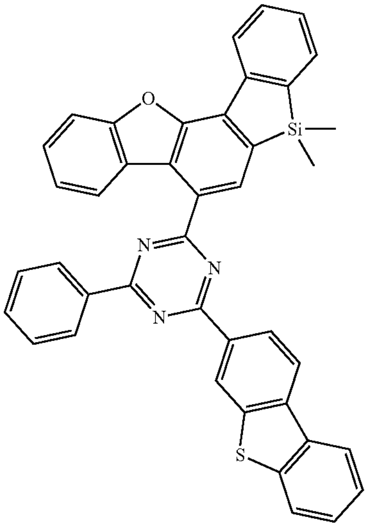

-continued
[98]
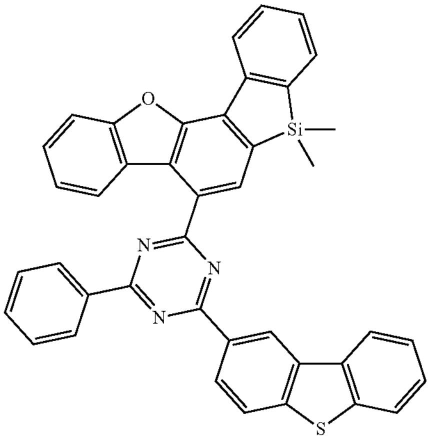
[99]
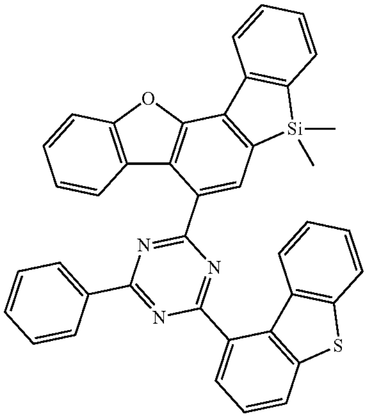
[100]
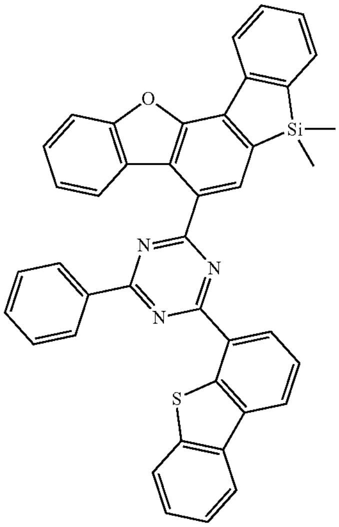
-continued
[101]
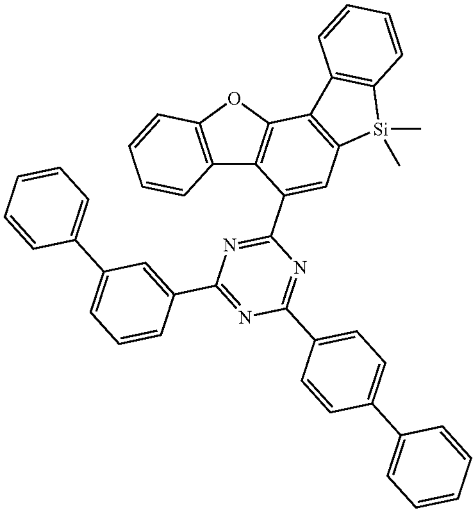
[102]
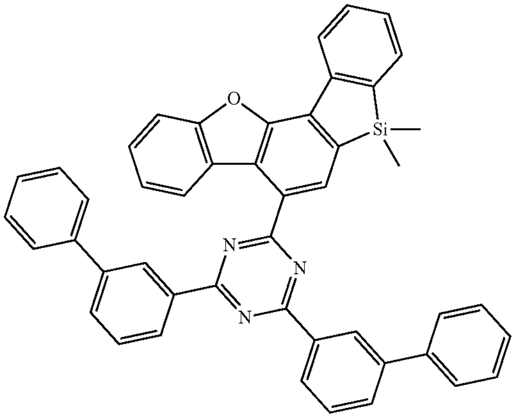
[103]
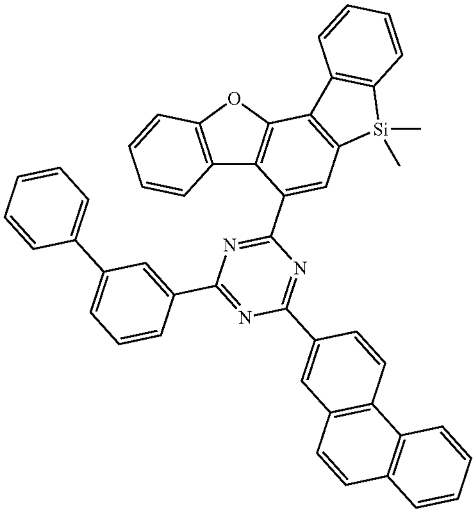

-continued
[104]
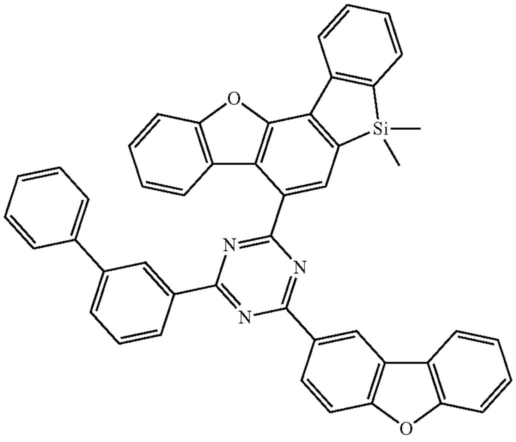
[105]
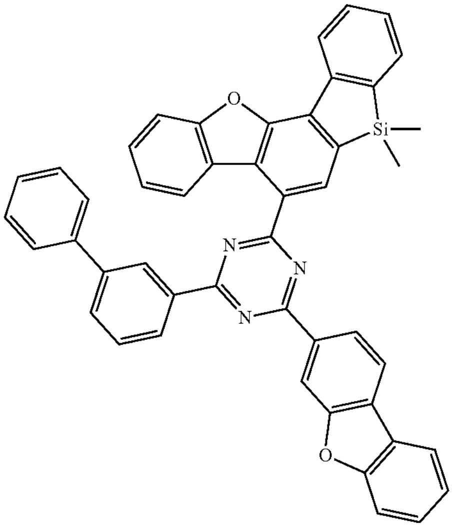
[106]
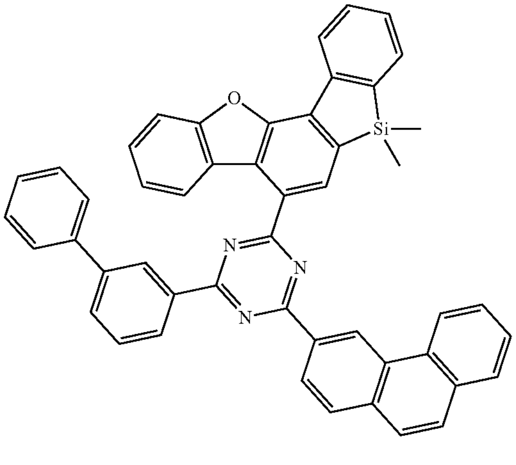
-continued
[107]
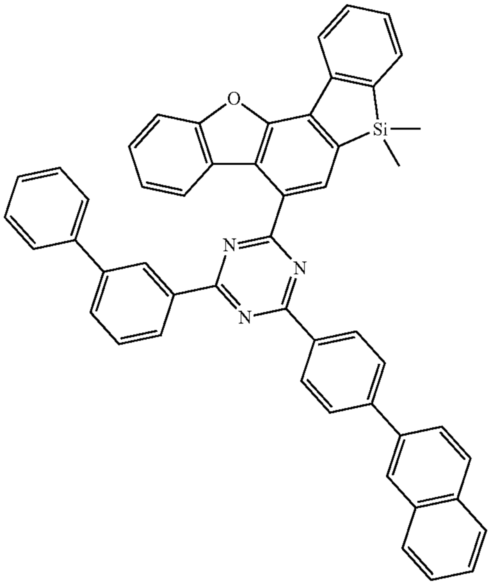
[108]
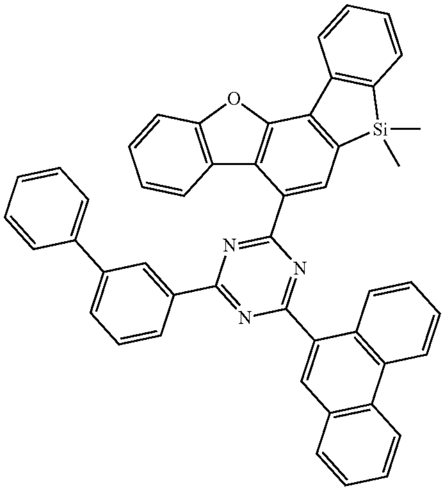
[109]
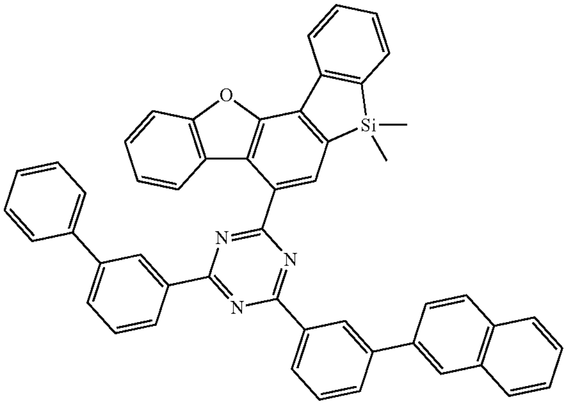

-continued
[110]
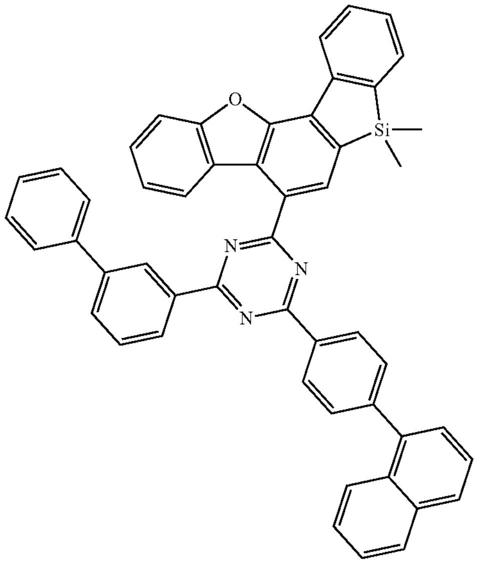
[111]
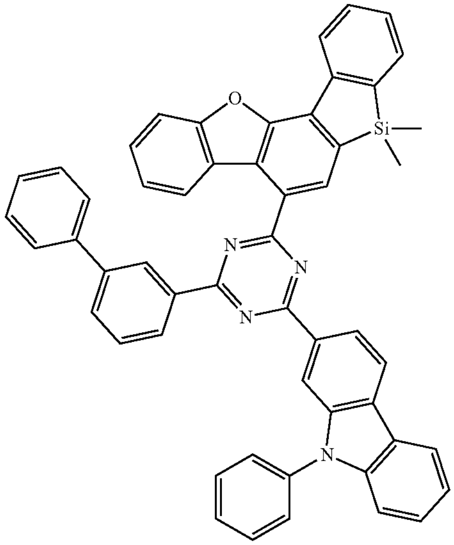
[112]
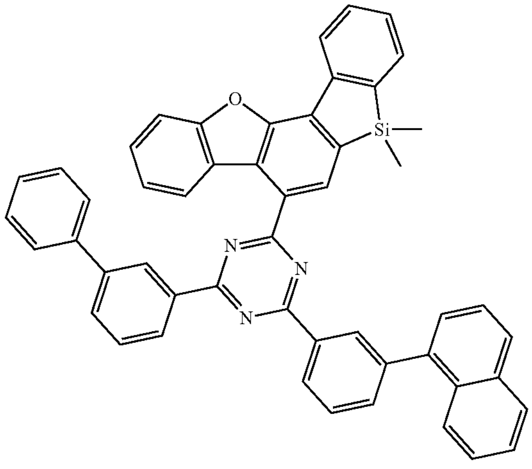
-continued
[113]
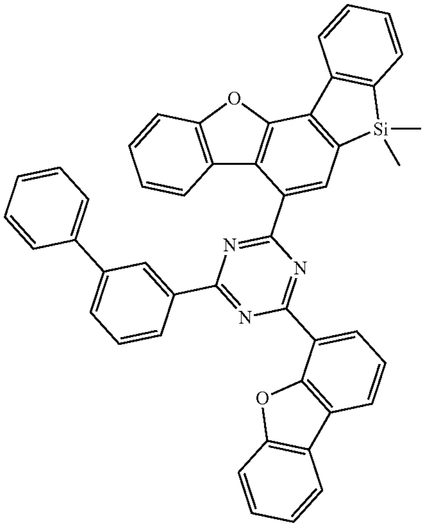
[114]
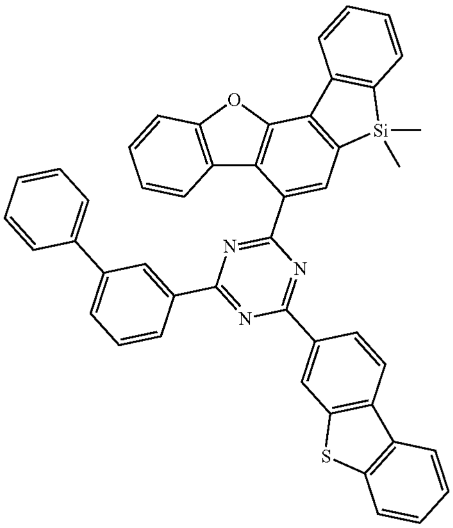
[115]
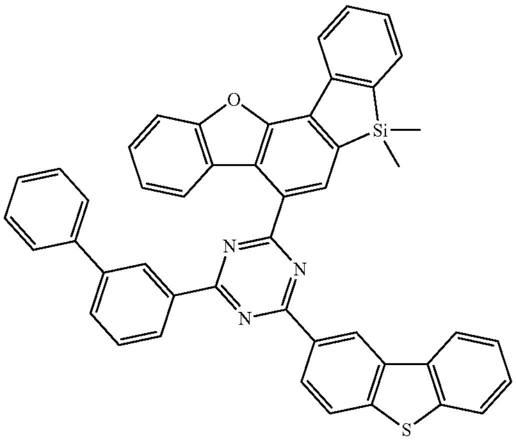

-continued
[116]
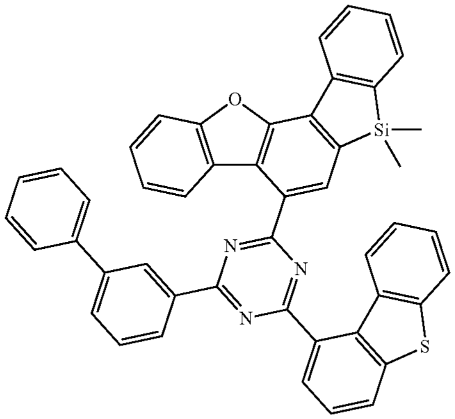
[117]
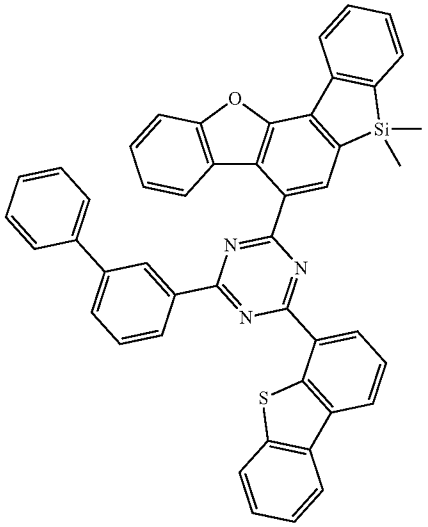
[118]
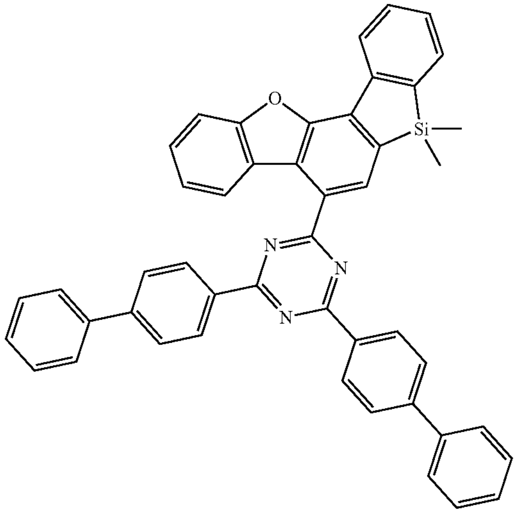
-continued
[119]
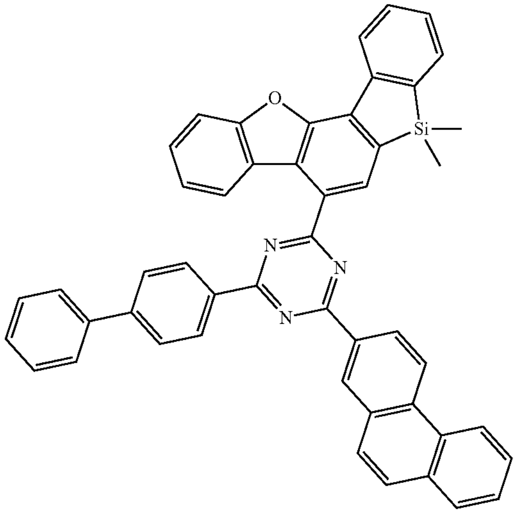
[120]
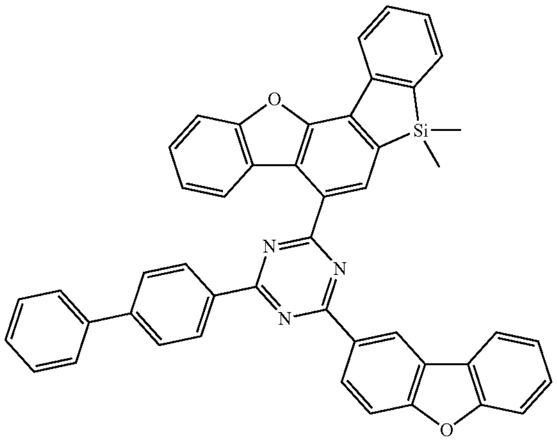
[121]
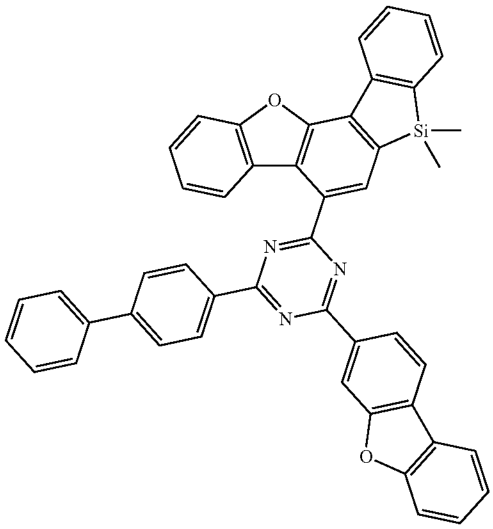

-continued
[122]
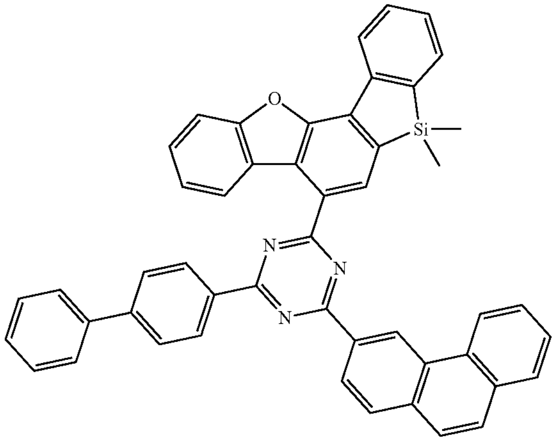
[123]
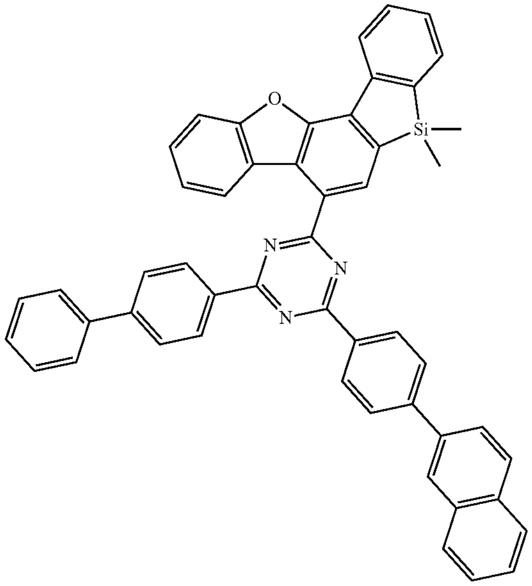
[124]
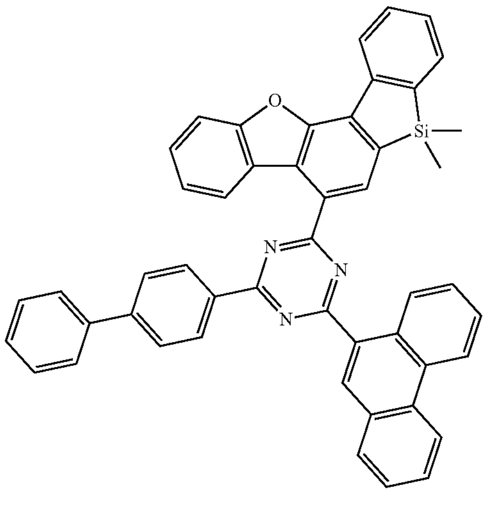
-continued
[125]
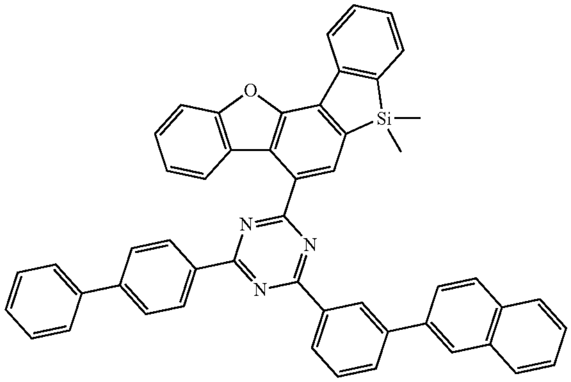
[126]
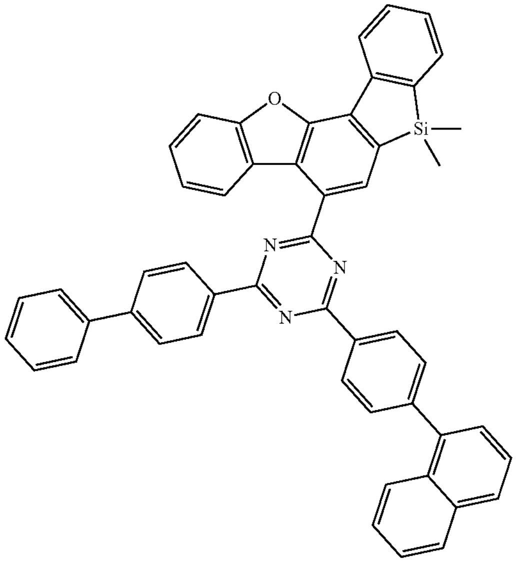
[127]
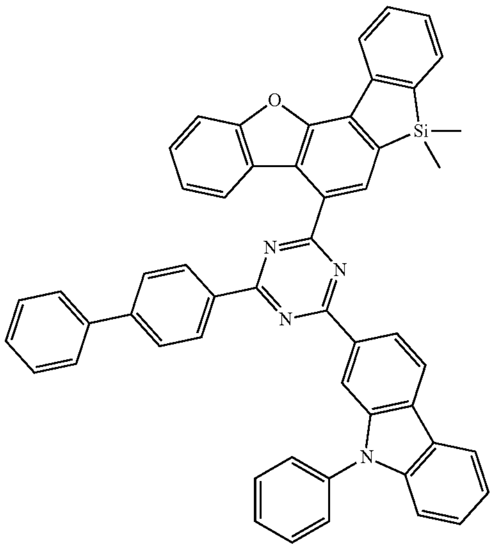

-continued
[128]
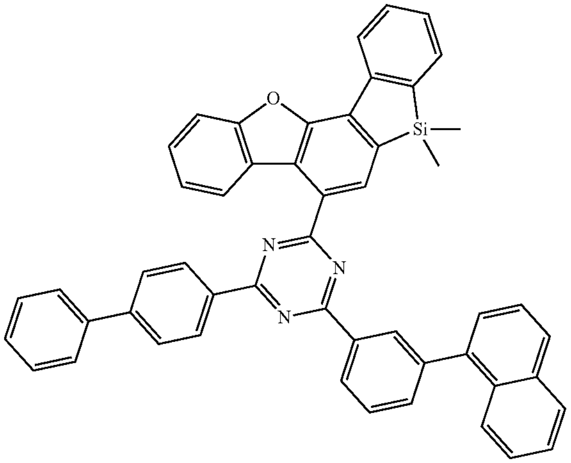
[129]
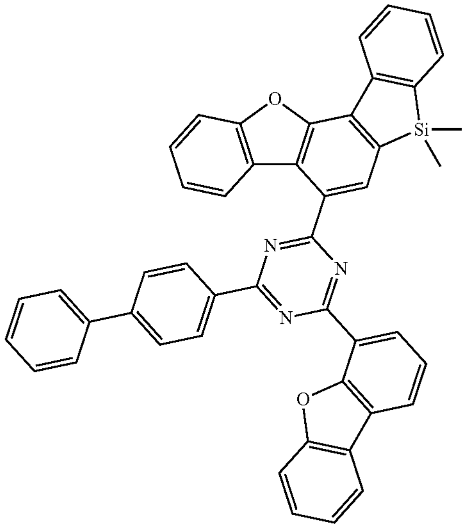
[130]
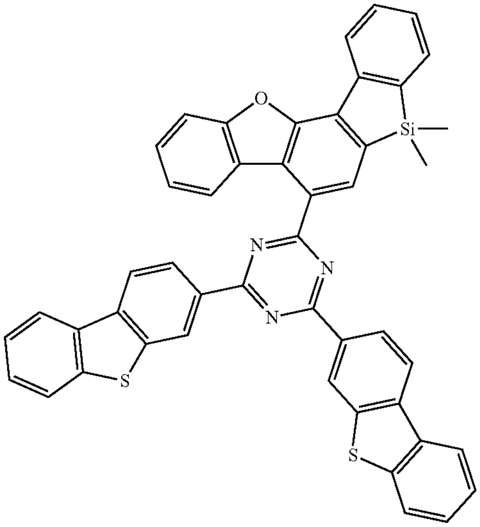
-continued
[131]
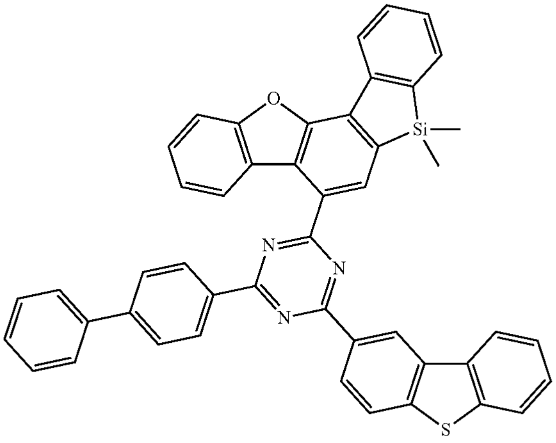
[132]
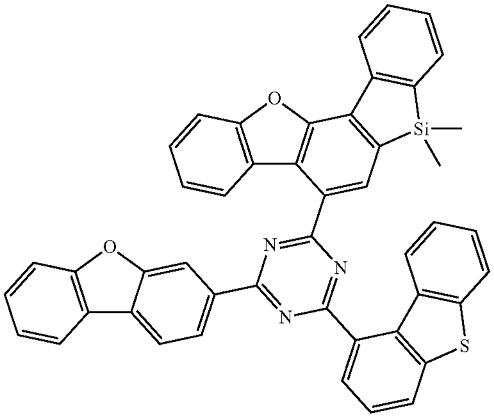
[133]
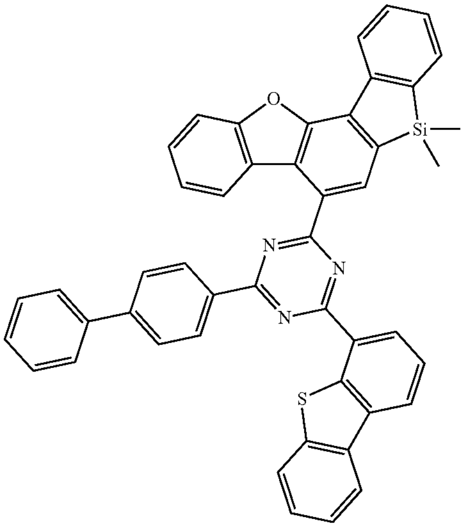

-continued
[134]
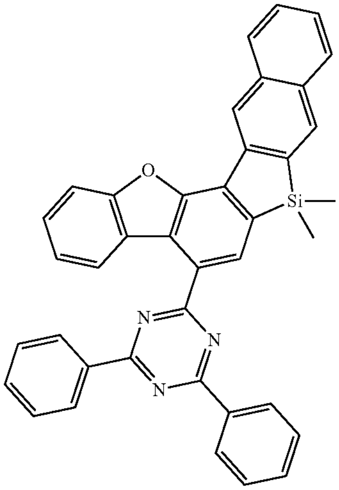
[135]
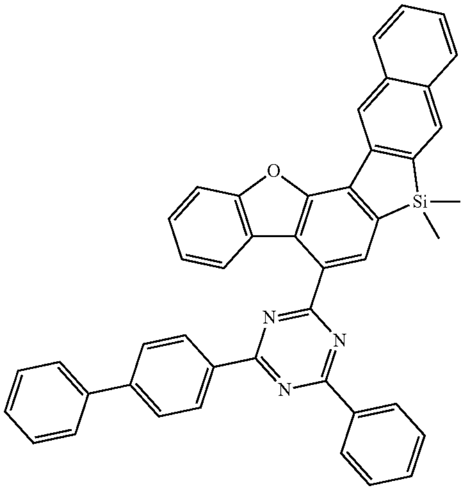
[136]
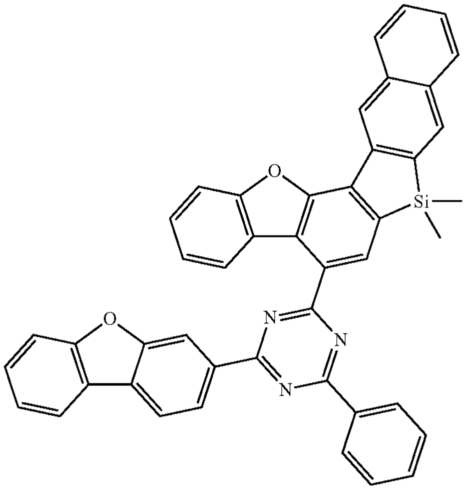
-continued
[137]
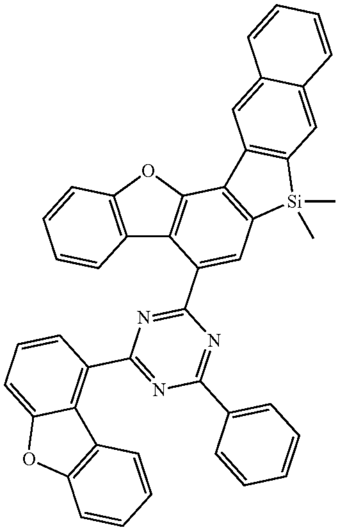
[138]
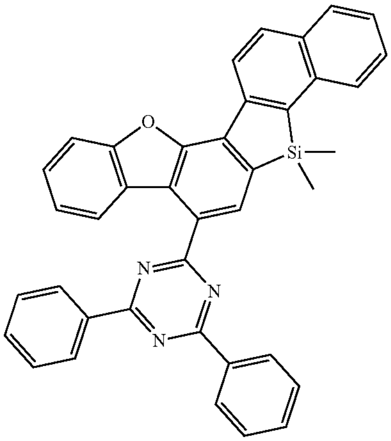
[139]
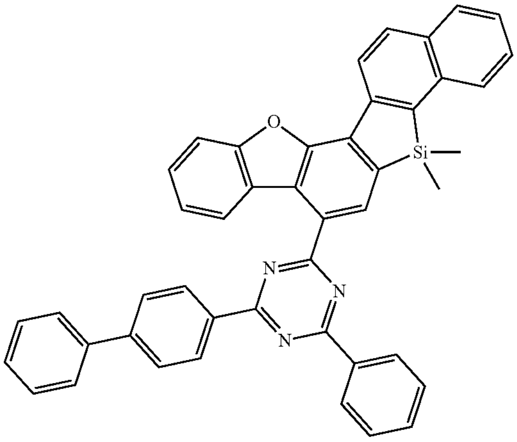

-continued
[140]
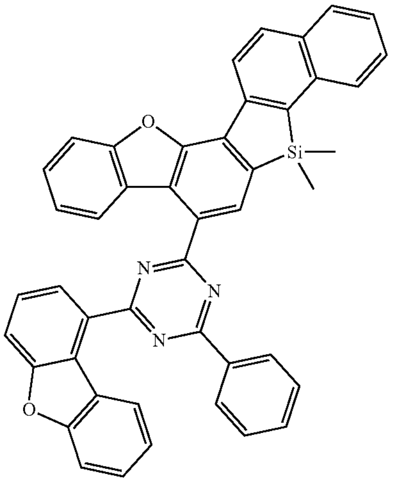
[141]
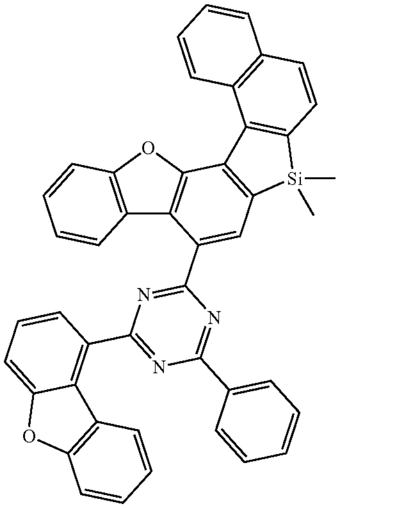
[142]
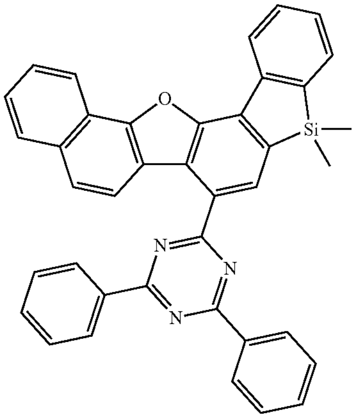
-continued
[143]
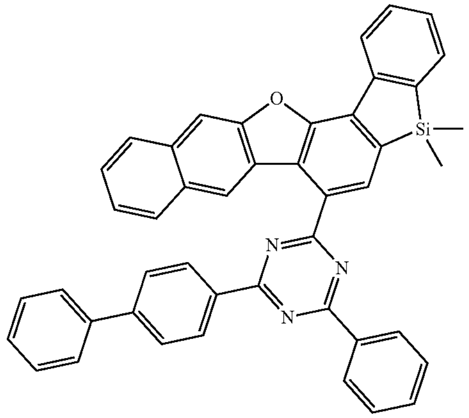
[144]
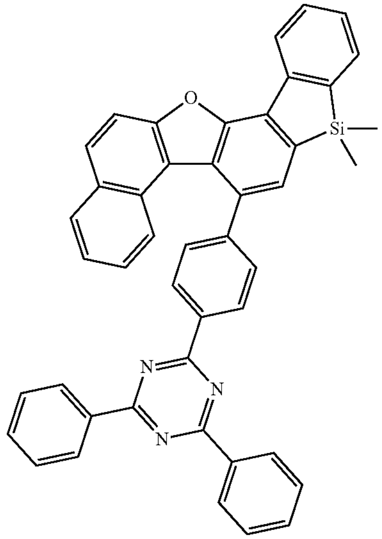
[145]
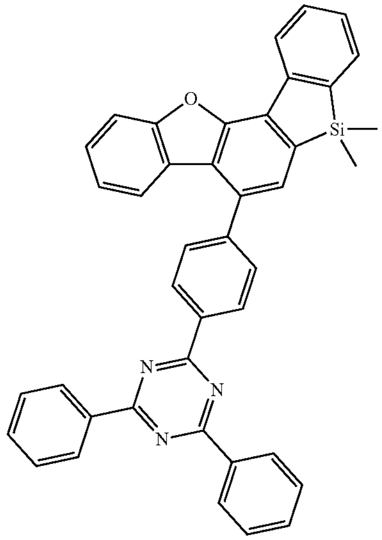

-continued
[146]
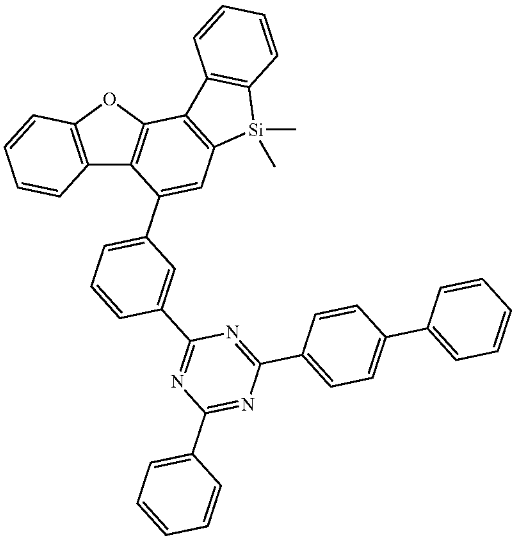
[147]
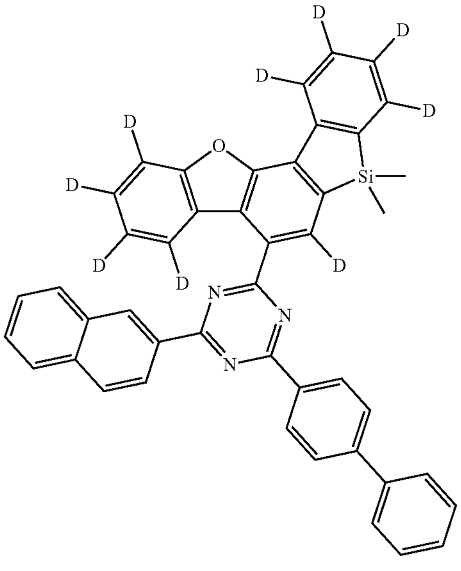
-continued
[148]
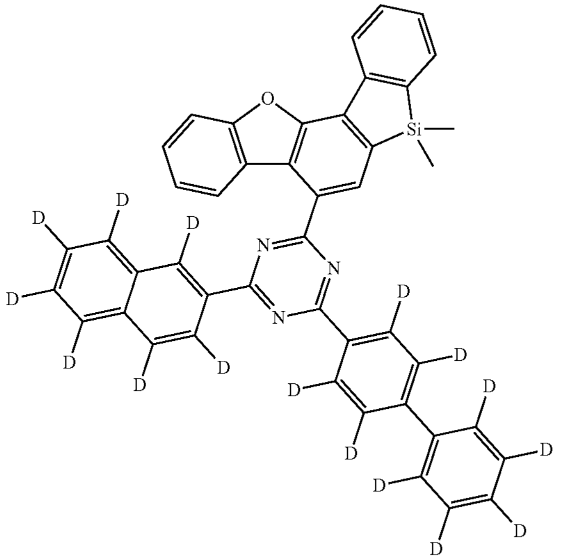
[149]
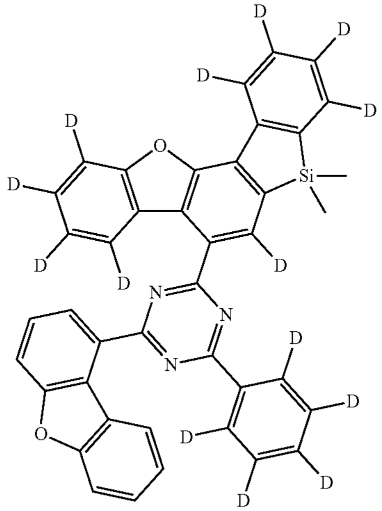
[150]
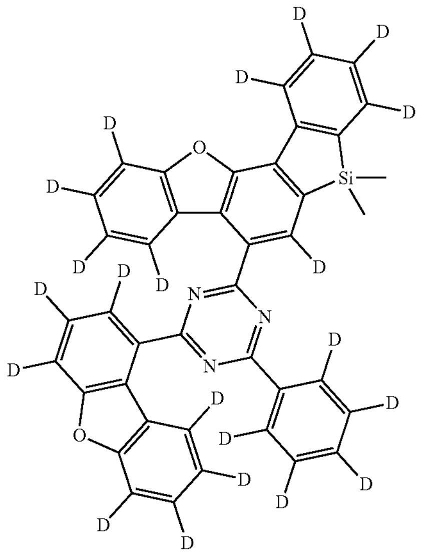

-continued
[151]
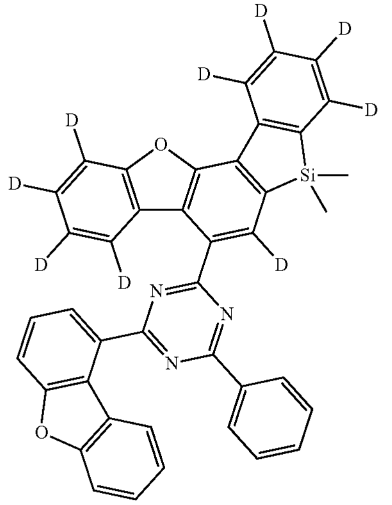
[152]
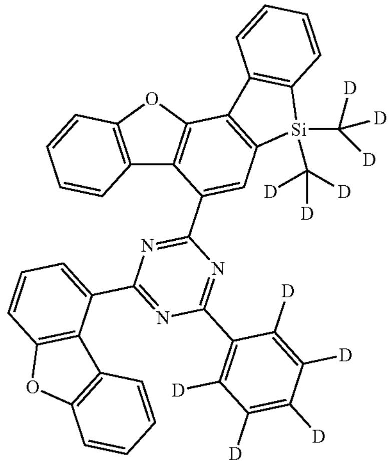
[153]
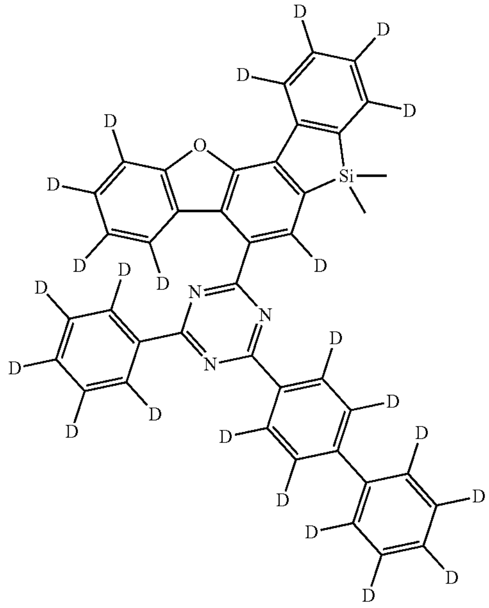
-continued
[154]
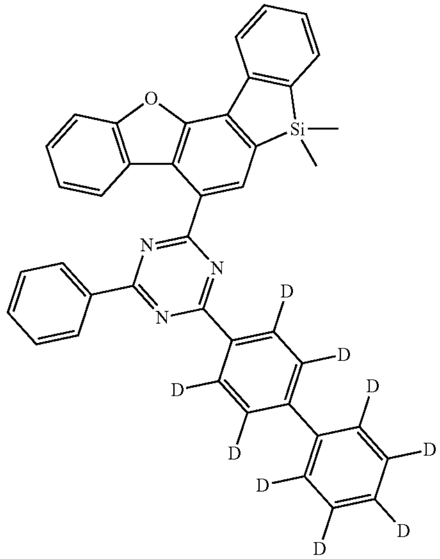
[155]
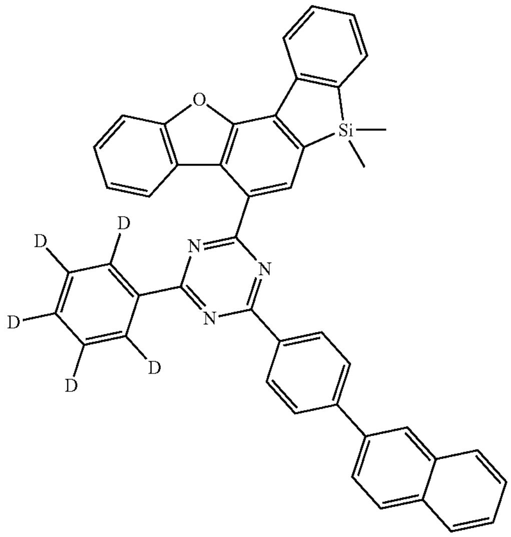

-continued
[156]
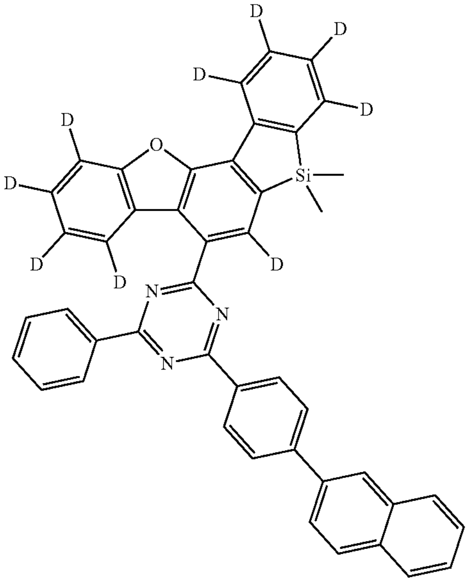
[157]
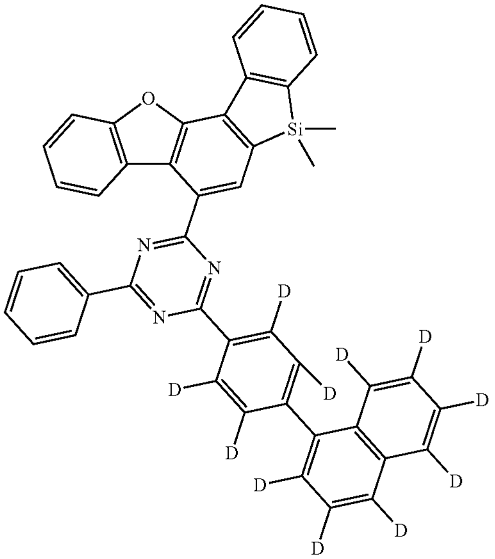
-continued
[158]
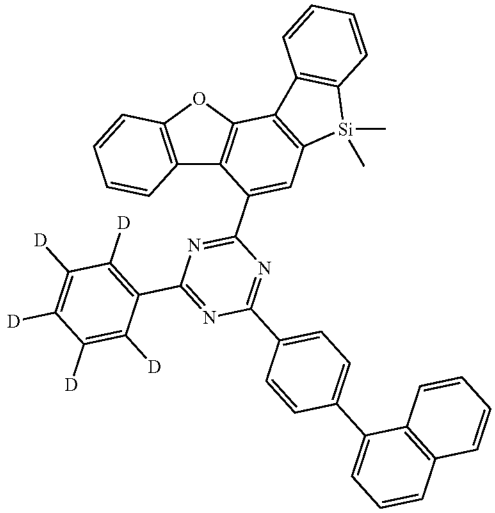
[159]
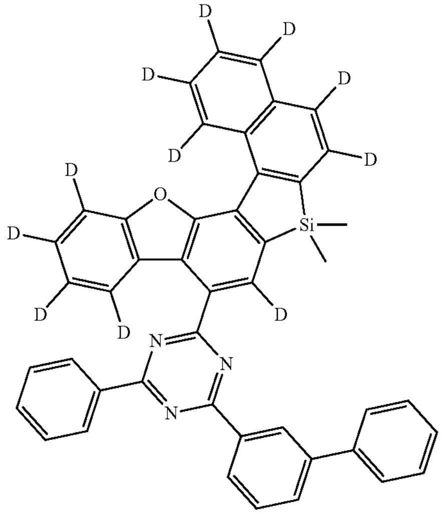
[160]
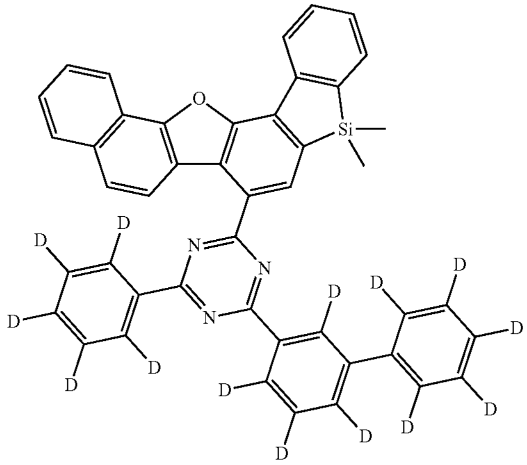

-continued

[161]

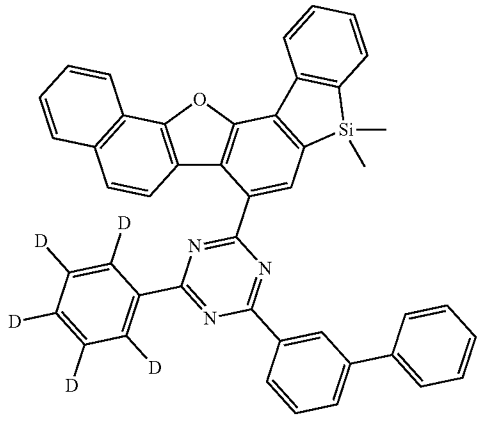

[162]

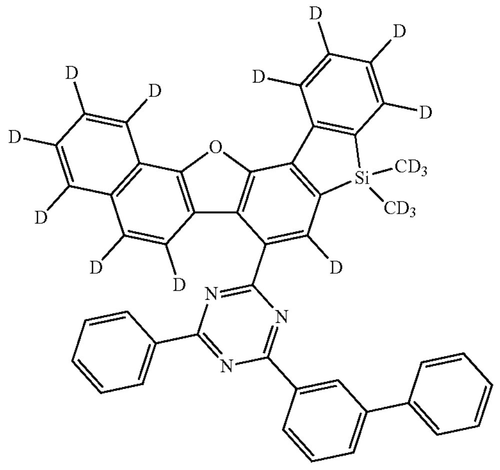

[163]

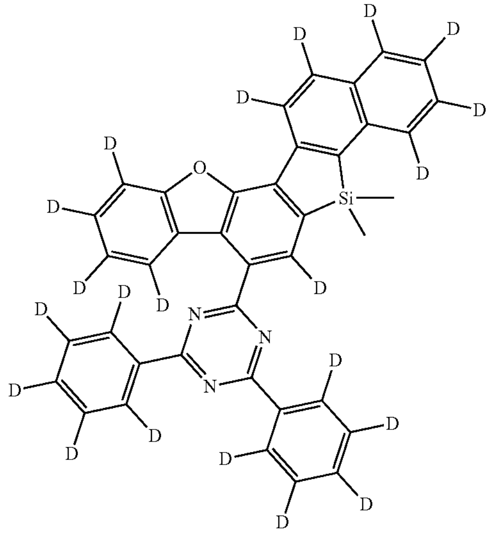

-continued

[164]

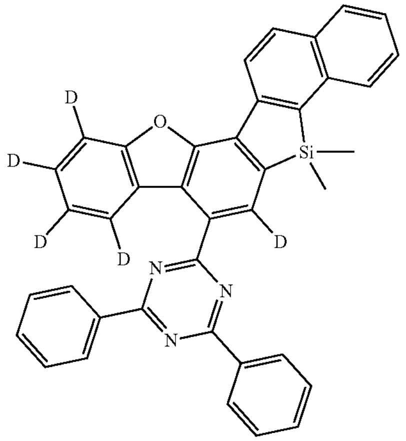

A composition for an organic optoelectronic device according to another embodiment may include, e.g., a first compound and a second compound. In an implementation, the first compound may be, e.g., the aforementioned compound for the organic optoelectronic device, and the second compound may be represented by, e.g., Chemical Formula 2.

[Chemical Formula 2]

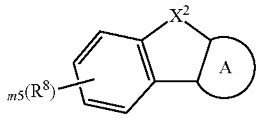

In Chemical Formula 2, $X^2$ may be, e.g., O, S, NR, $CR^cR^d$, or $SiR^eR^f$.

$R^b$, $R^c$, $R^d$, $R^e$, $R^f$, and $R^g$ may each independently be or include, e.g., hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

m5 may be, e.g., an integer of 1 to 4.

Ring A may be, e.g., a ring of Group II.

[Group II]

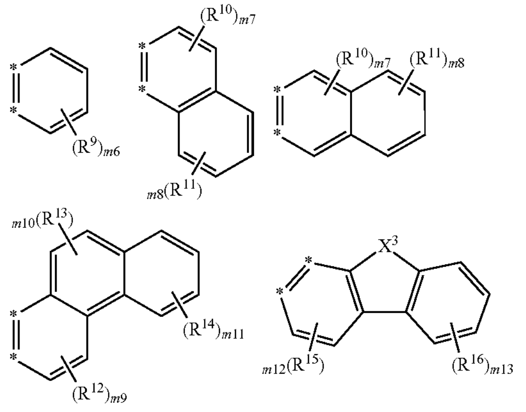

-continued

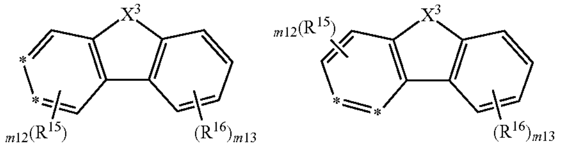

In Group II, * is a linking carbon.

$X^3$ may be, e.g., O, S, $NR^g$, $CR^hR^i$, or $SiR^jR^k$.

$R^g$, $R^h$, $R^i$, $R^j$, $R^k$, and $R^9$ to $R^{16}$ may each independently be or include, e.g., hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

m6, m8, m11, and m13 may each independently be, e.g., an integer of 1 to 4.

m7, m9, m10, and m12 may each independently be, e.g., 1 or 2.

In an implementation, at least one of $R^8$ to $R^{16}$ may be, e.g., a substituted amine group represented by Chemical Formula a,

[Chemical Formula a]

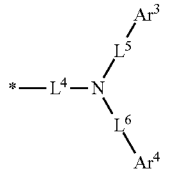

In Chemical Formula a, $L^4$ to $L^6$ may each independently be or include, e.g., a single bond or a substituted or unsubstituted C6 to C30 arylene group.

$Ar^3$ and $Ar^4$ may each independently be or include, e.g., a substituted or unsubstituted amine group, a substituted or unsubstituted C6 to C30 aryl group, or a substituted or unsubstituted C2 to C30 heterocyclic group.

* is a linking point.

In an implementation, the second compound may have a structure in which carbazole/fused carbazole/fused dibenzofuran/fused dibenzothiophene/fused dibenzosilole is substituted with an amine group. Depending on the type and fusion position of the additional benzene ring, e.g., the second compound may be represented by one of Chemical Formula 2-I to Chemical Formula 2-IX.

[Chemical Formula 2-I]

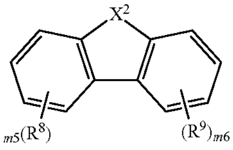

[Chemical Formula 2-II]

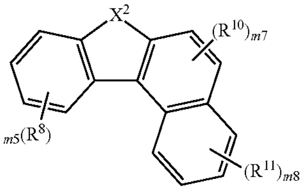

-continued

[Chemical Formula 2-III]

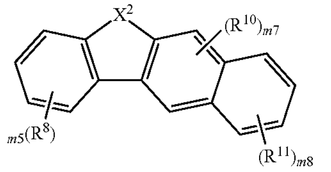

[Chemical Formula 2-IV]

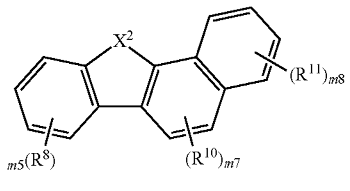

[Chemical Formula 2-V]

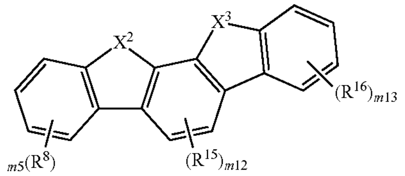

[Chemical Formula 2-VI]

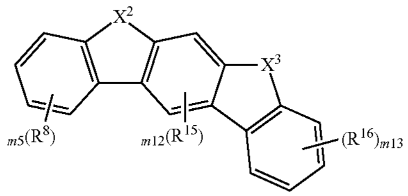

[Chemical Formula 2-VII]

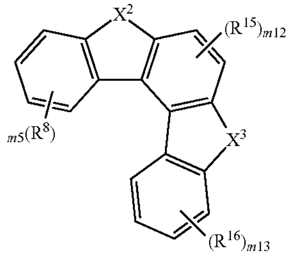

[Chemical Formula 2-VIII]

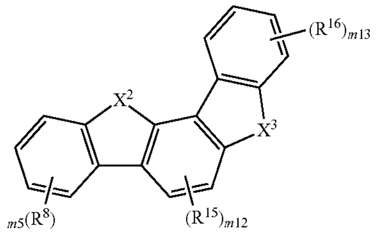

[Chemical Formula 2-IX]

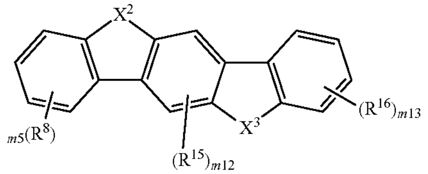

In Chemical Formula 2-I to Chemical Formula 2-IX, $X^2$, $X^3$, $R^8$ to $R^{11}$, $R^1$, $R^{16}$, m5 to m8, m12, and m13 may be defined the same as those described above.

In an implementation, depending on the fused rings, the second compound may be represented by, e.g., one of Chemical Formula 2-IA to Chemical Formula 2-IXA, Chemical Formula 2-IIB to Chemical Formula 2-IXB, and Chemical Formula 2-IIC to Chemical Formula 2-IXC.

[Chemical Formula 2-IA]

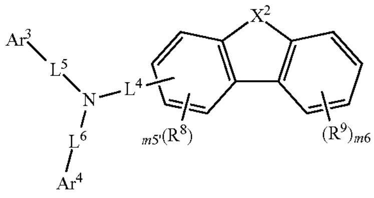

[Chemical Formula 2-IIA]

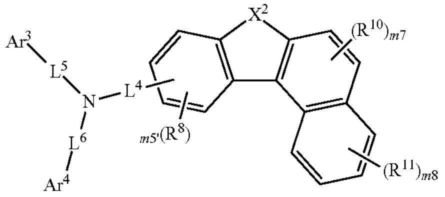

[Chemical Formula 2-IIIA]

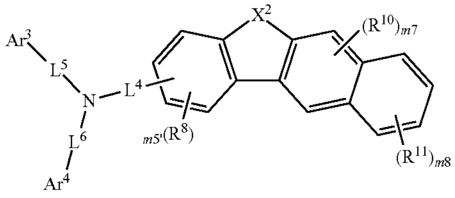

[Chemical Formula 2-IVA]

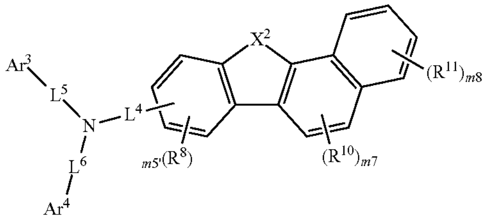

[Chemical Formula 2-VA]

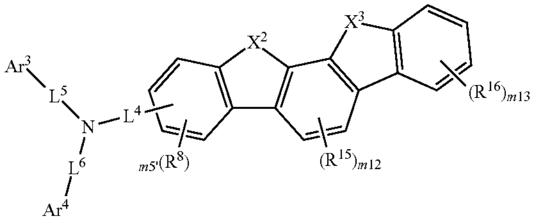

[Chemical Formula 2-VIA]

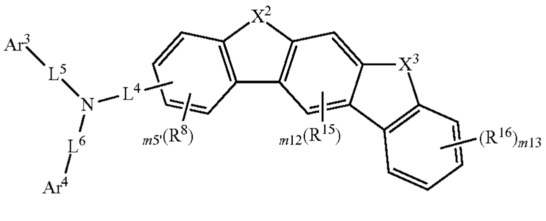

-continued

[Chemical Formula 2-VIIA]

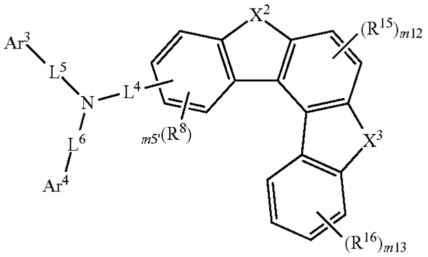

[Chemical Formula 2-VIIIA]

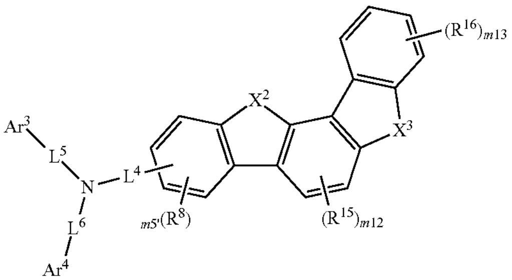

[Chemical Formula 2-IXA]

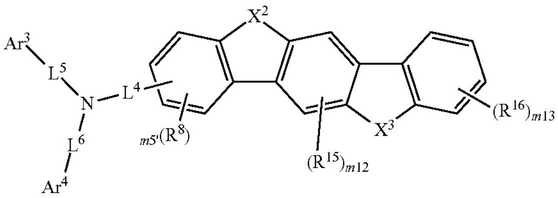

In Chemical Formula 2-IA to Chemical Formula 2-IXA, $X^2$, $X^3$, $L^4$ to $L^6$, $Ar^3$, $Ar^4$, $R^8$ to $R^{11}$, $R^{15}$, $R^{16}$, m6 to m8, m12, and m13 may be defined the same as those described above.

m5' may be, e.g., an integer of 1 to 3.

[Chemical Formula 2-IIB]

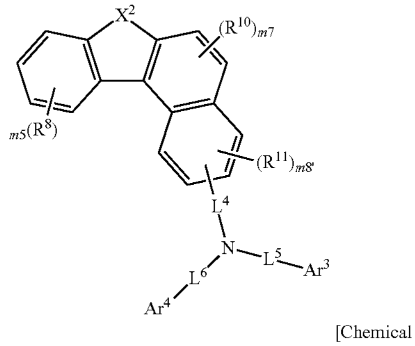

[Chemical Formula 2-IIIB]

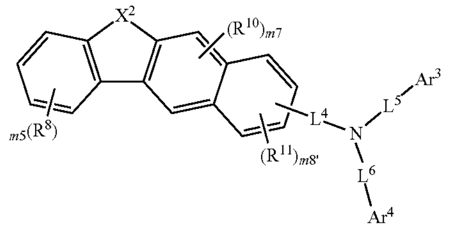

-continued

[Chemical Formula 2-IVB]

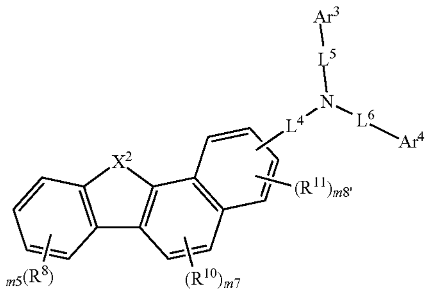

[Chemical Formula 2-VB]

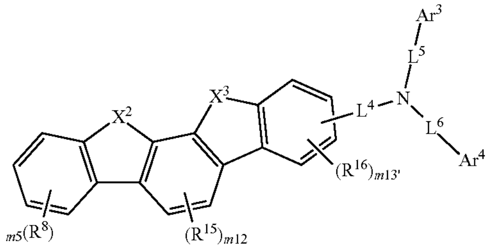

[Chemical Formula 2-VIB]

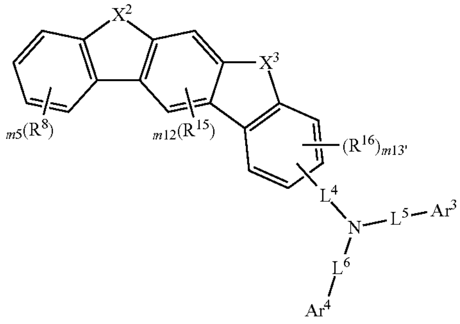

[Chemical Formula 2-VIIB]

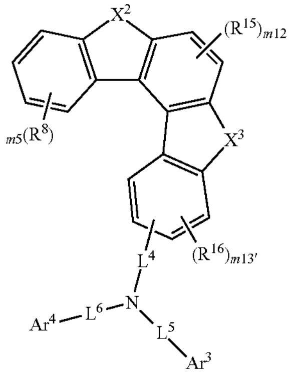

-continued

[Chemical Formula 2-VIIIB]

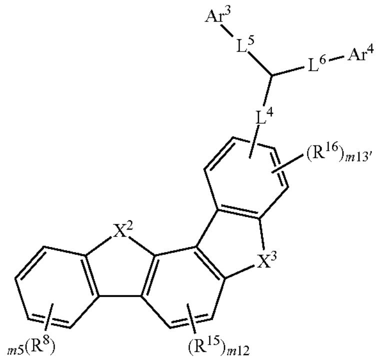

[Chemical Formula 2-IXB]

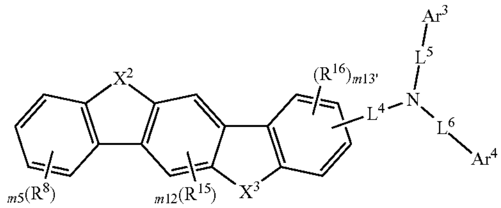

In Chemical Formula 2-IIB to Chemical Formula 2-IXB, $X^2$, $X^3$, $L^4$ to $L^6$, $R^8$, $R^{10}$, $R^{11}$, $R^1$, $R^{16}$, $Ar^3$, $Ar^4$, m5, m7, and m12 may be defined the same those as described above.

m8' and m13' may each independently be, e.g., an integer of 1 to 3.

[Chemical Formula 2-IIC]

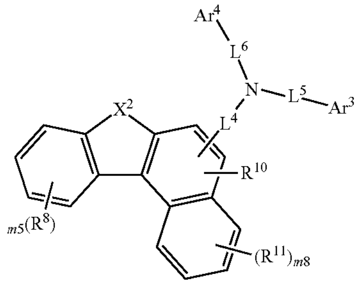

[Chemical Formula 2-IIIC]

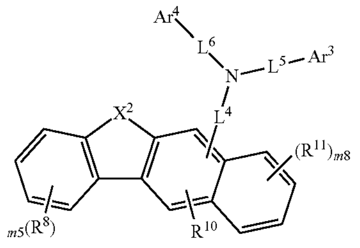

-continued

[Chemical Formula 2-IVC]

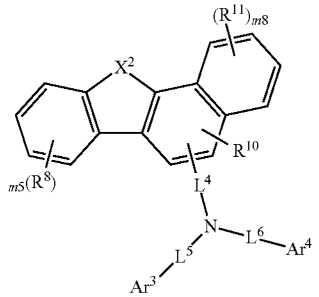

[Chemical Formula 2-VC]

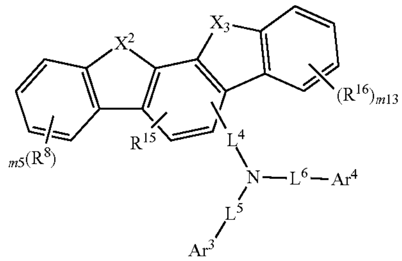

[Chemical Formula 2-VIC]

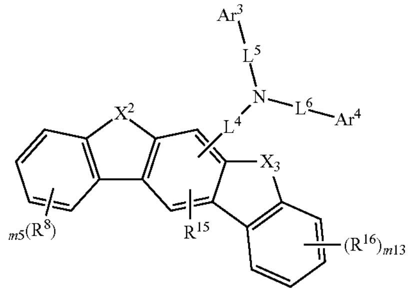

[Chemical Formula 2-VIIC]

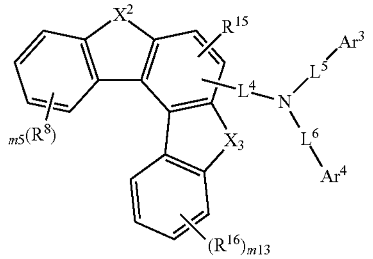

[Chemical Formula 2-VIIIC]

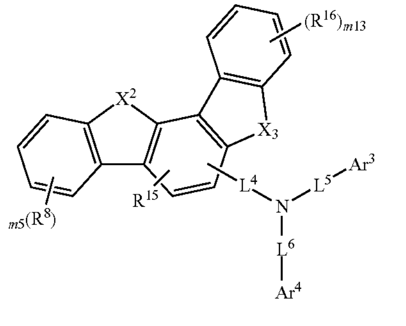

-continued

[Chemical Formula 2-IXC]

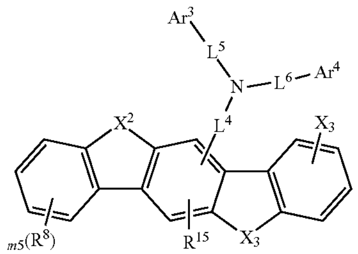

In Chemical Formula 2-IIC to Chemical Formula 2-IXC, $X^2$, $X^3$, $L^4$ to $L^6$, $Ar^3$, $Ar^4$, $R^8$, $R^{10}$, $R^{11}$, $R^5$, $R^{16}$, m5, m8, and m13 may be defined the same as those described above.

In an implementation, $R^8$ to $R^{16}$ may each independently be, e.g., hydrogen, deuterium, a substituted or unsubstituted amine group, a substituted or unsubstituted C1 to C30 alkyl group, or a substituted or unsubstituted C6 to C30 aryl group.

In an implementation, the second compound according to an embodiment may be represented by Chemical Formula 2-IVB or Chemical Formula 2-VITIB.

In an implementation, $X^2$ in Chemical Formula 2-IVB may be, e.g., $NR^b$.

In an implementation, in Chemical Formula 2-VIIIB, $X^2$ may be, e.g., O or S, and $X^3$ may be, e.g., $CR^hR^i$ or $SiR^jR^k$.

$R^b$, $R^h$, $R^i$, $R^j$, and $R^k$ may each independently be, e.g., a substituted or unsubstituted C1 to C10 alkyl group, or a substituted or unsubstituted C6 to C20 aryl group.

In an implementation second compound may be represented by, e.g., Chemical Formula 2-IVB-2 or Chemical Formula 2-VIIIB-2.

[Chemical Formula 2-IVB-2]

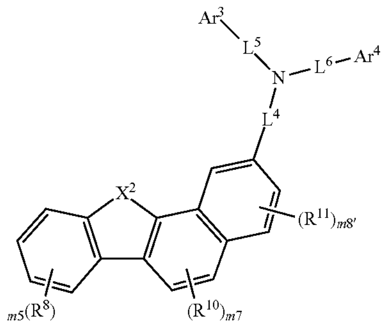

[Chemical Formula 2-VIIIB-2]

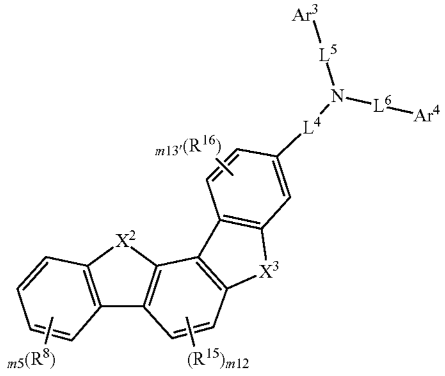

In Chemical Formula 2-IVB-2 and Chemical Formula 2-VIIIB-2, $L^4$ to $L^6$ may each independently be, e.g., a single bond or a substituted or unsubstituted phenylene group.

$Ar^3$ and $Ar^4$ may each independently be, e.g., a substituted or unsubstituted phenyl group, a substituted or unsubstituted biphenyl group, or a substituted or unsubstituted naphthyl group.

$X^2$ may be, e.g., NR, O, or S.

$X^3$ may be, e.g., $CR^hR^i$ or $SiR^jR^k$.

$R^b$, $R^h$, $R^i$, $R^j$, and $R^k$ may each independently be, e.g., a substituted or unsubstituted C1 to C10 alkyl group or a substituted or unsubstituted C6 to C20 aryl group.

$R^8$, $R^{10}$, R, $R^{15}$, and $R^{16}$ may each independently be, e.g., hydrogen, deuterium, a substituted or unsubstituted C1 to C30 alkyl group, or a substituted or unsubstituted C6 to C30 aryl group.

m5 may be, e.g., an integer of 1 to 4, m7 and m12 may each independently be, e.g., 1 or 2.

m8' and m13' may each independently be, e.g., an integer of 1 to 3.

In an implementation, $L^4$ to $L^6$ may each independently be, e.g., a single bond, a substituted or unsubstituted phenylene group, or a substituted or unsubstituted biphenylene group.

In an implementation, $Ar^3$ and $Ar^4$ may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrenyl group, a substituted or unsubstituted triphenylene group, a substituted or unsubstituted fluorenyl group, a substituted or unsubstituted carbazolyl group, a substituted or unsubstituted dibenzofuranyl group, a substituted or unsubstituted dibenzothiophenyl group, a substituted or unsubstituted benzofuranofluorenyl group, or a substituted or unsubstituted benzothiophenefluorenyl group.

In an implementation, the second compound may be, e.g., a compound of Group 2.

[Group 2]

A-1

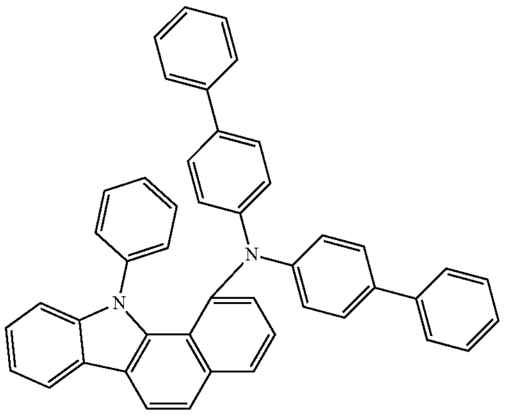

-continued

A-2

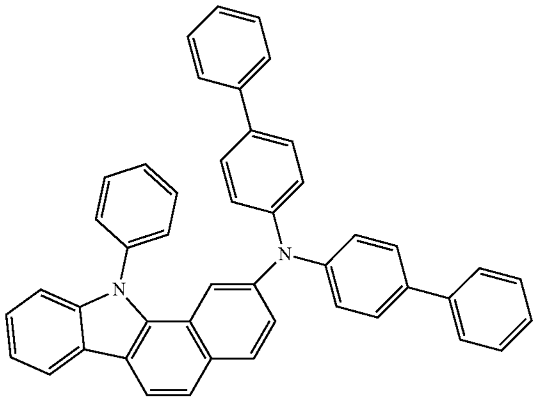

A-3

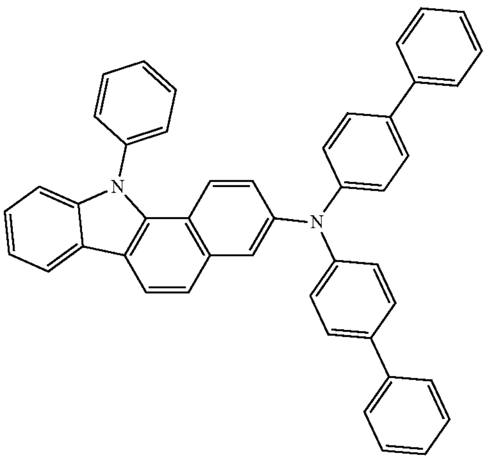

A-4

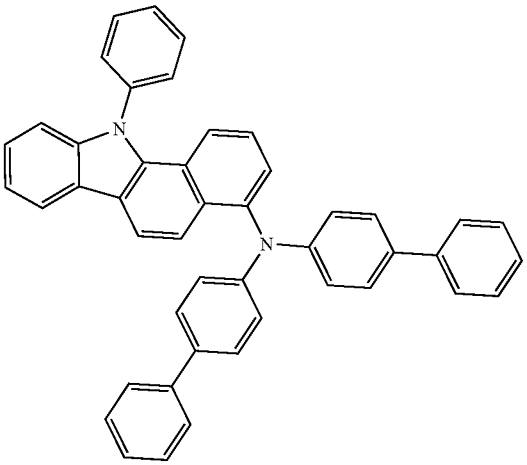

-continued
A-5
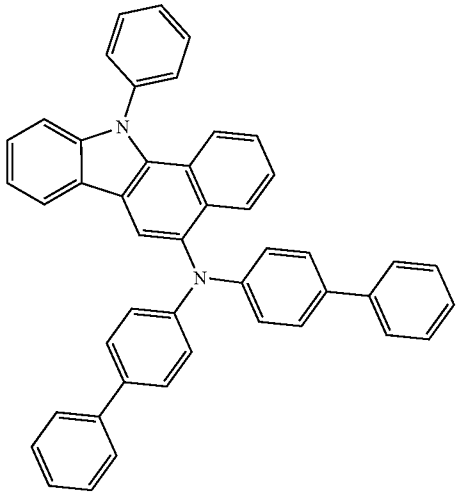
A-6
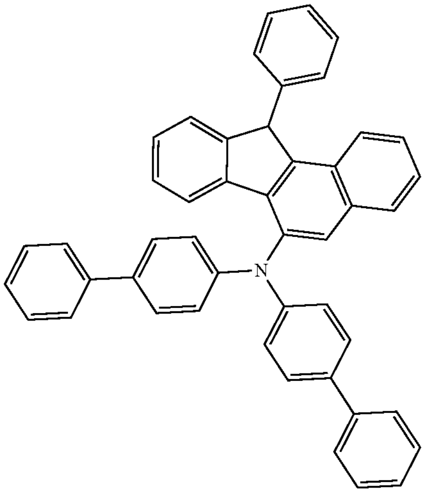
A-7
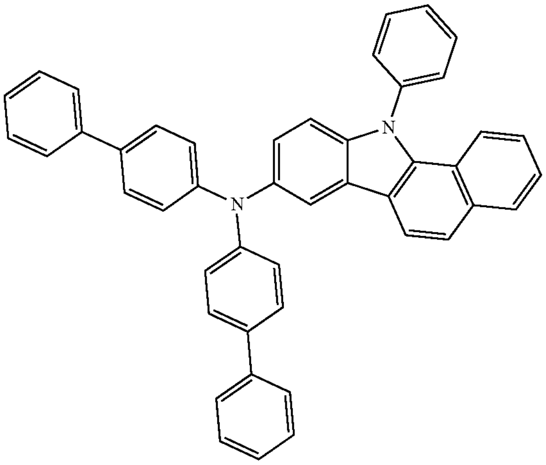
-continued
A-8
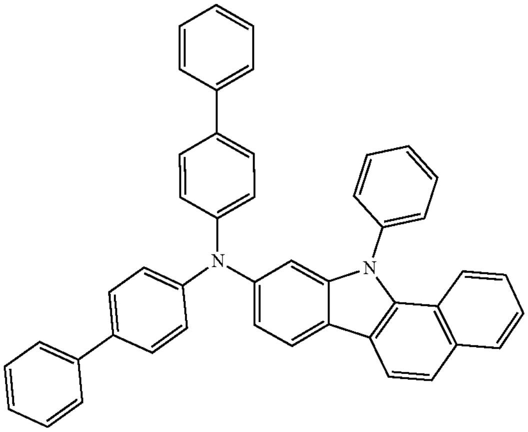
A-9
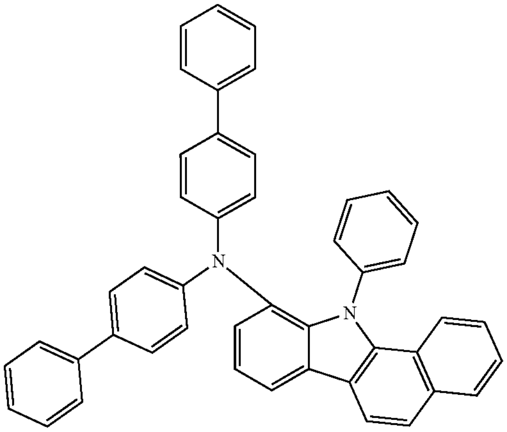
A-10
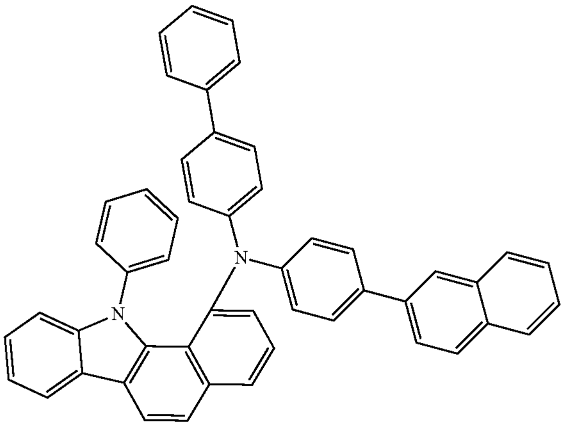

-continued
A-11
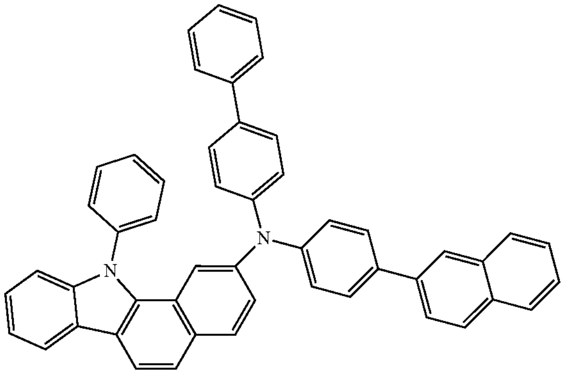
A-12
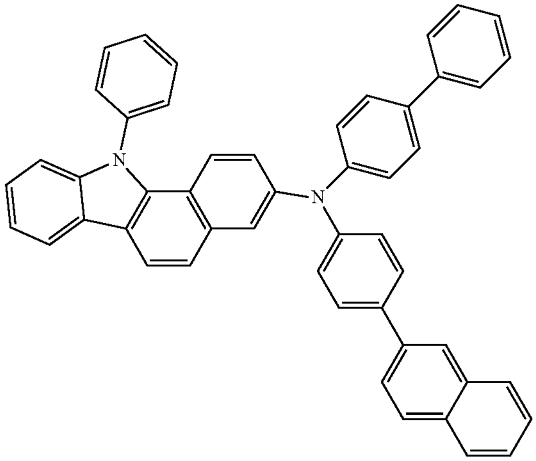
A-13
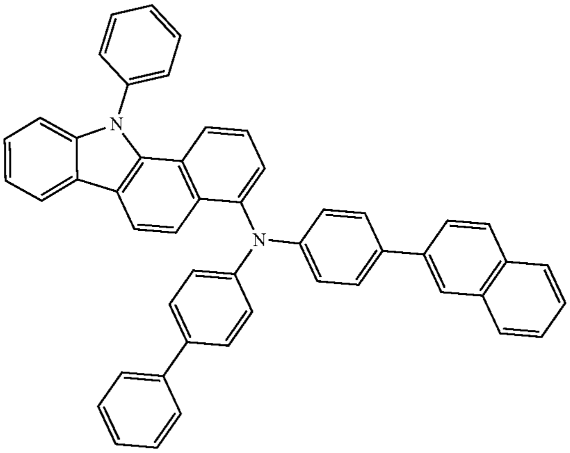
-continued
A-14
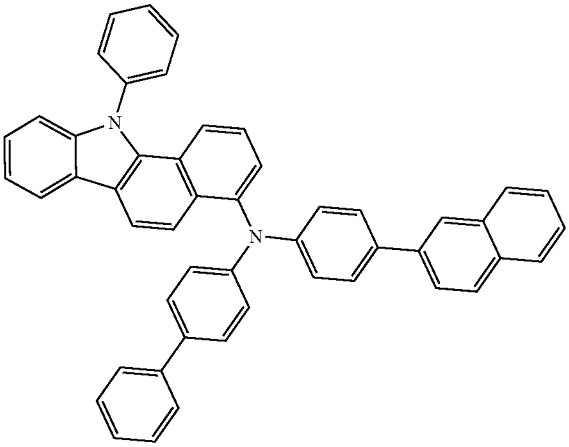
A-15
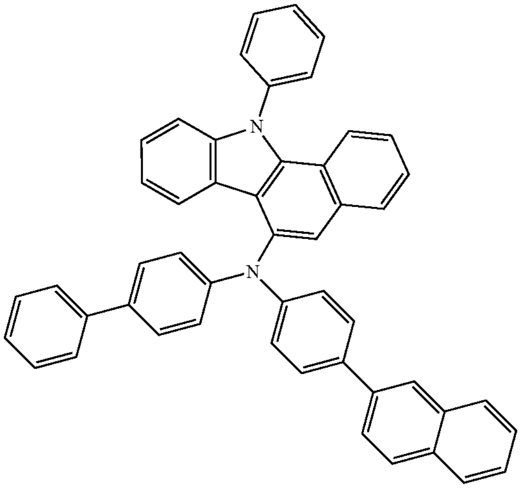
A-16
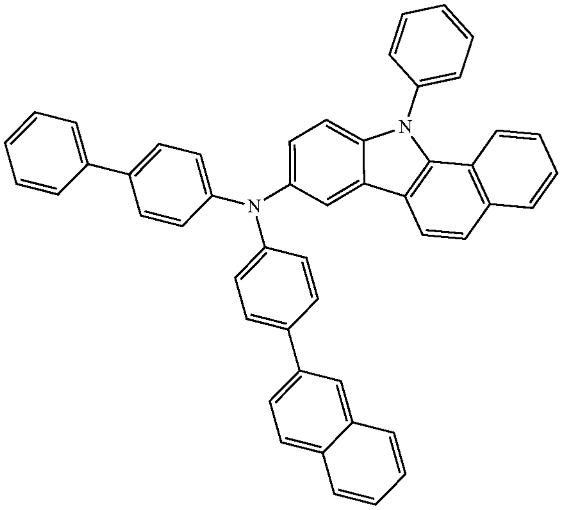

-continued
A-17
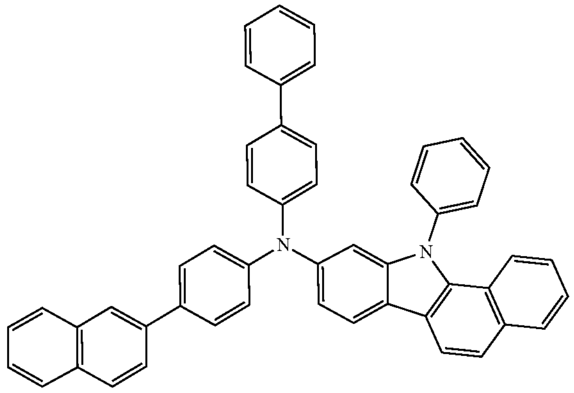
A-18
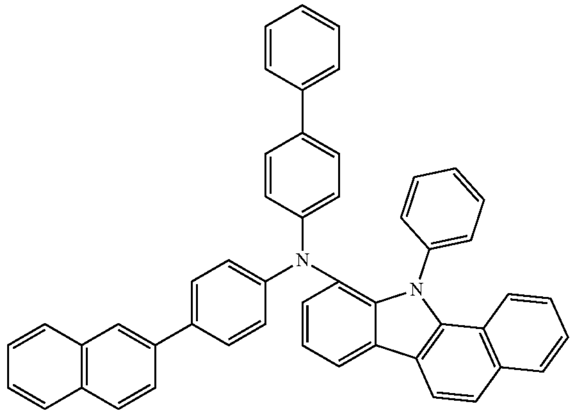
A-19
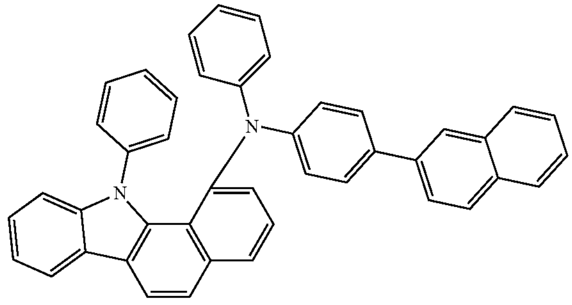
A-20
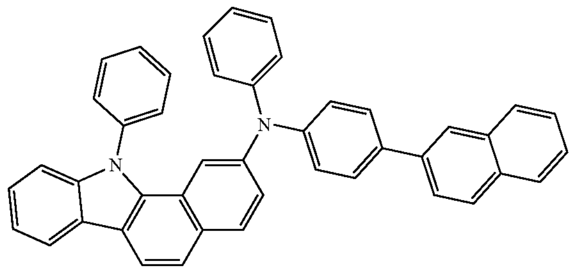
-continued
A-21
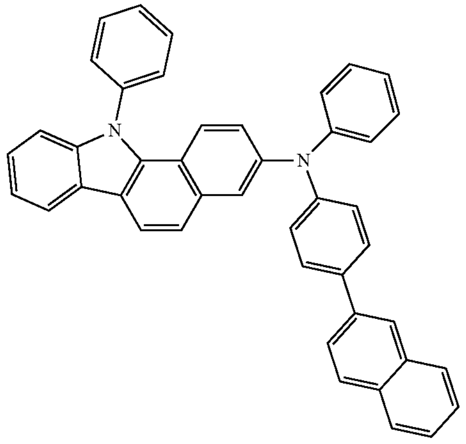
A-22
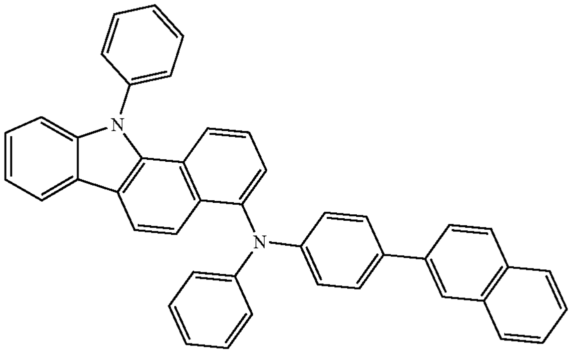
A-23
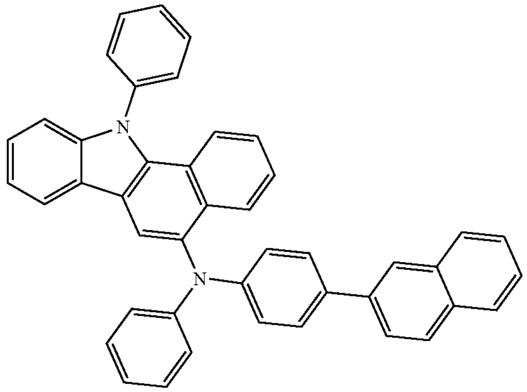

-continued
A-24
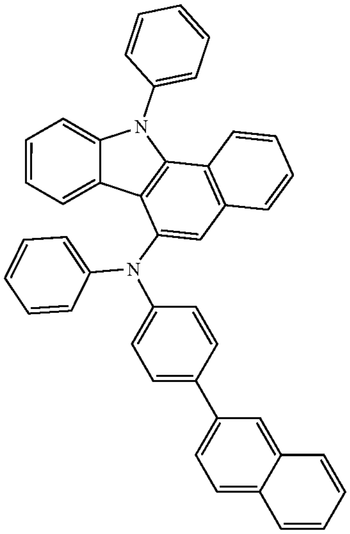
A-25
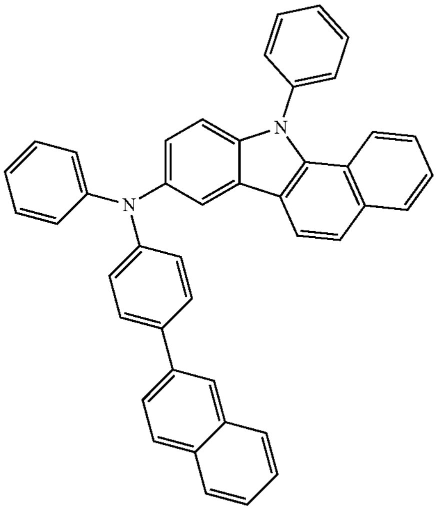
A-26
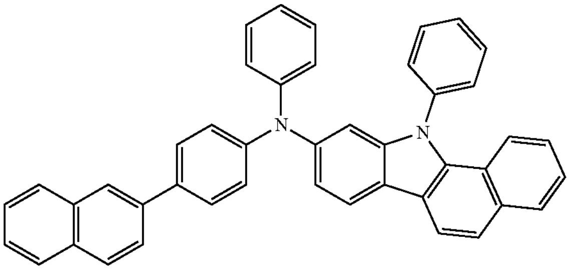
A-27
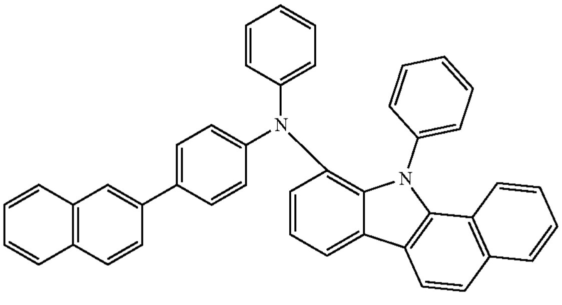
-continued
A-28
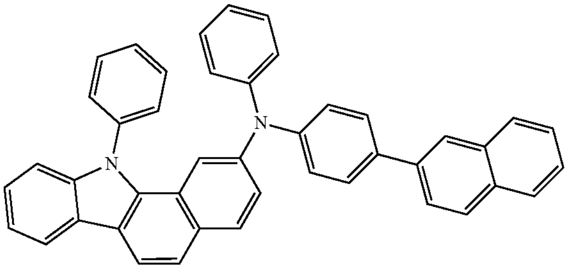
A-45
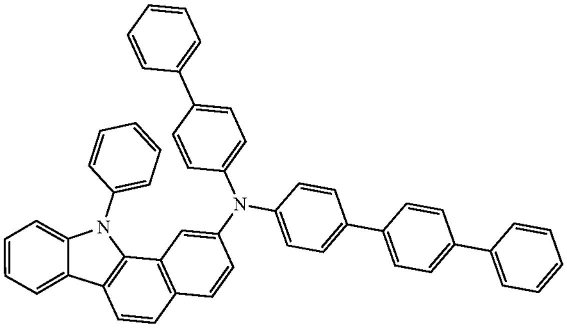
A-46
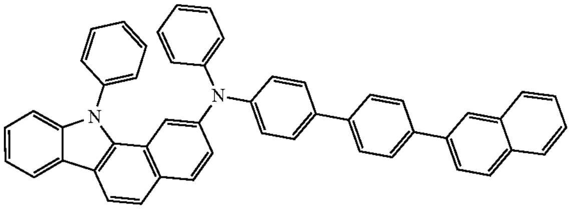
A-47
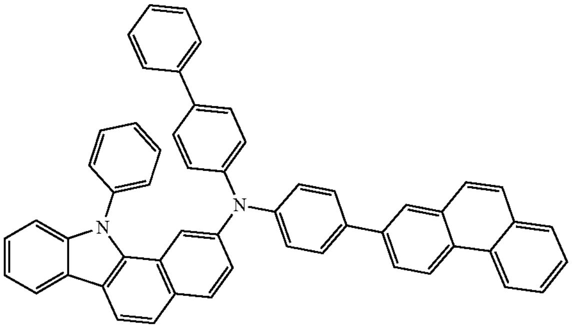
A-48
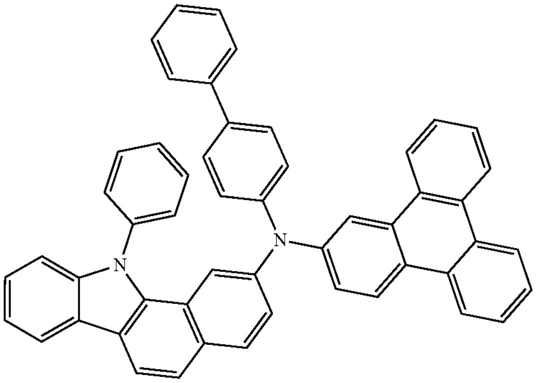

-continued
A-49
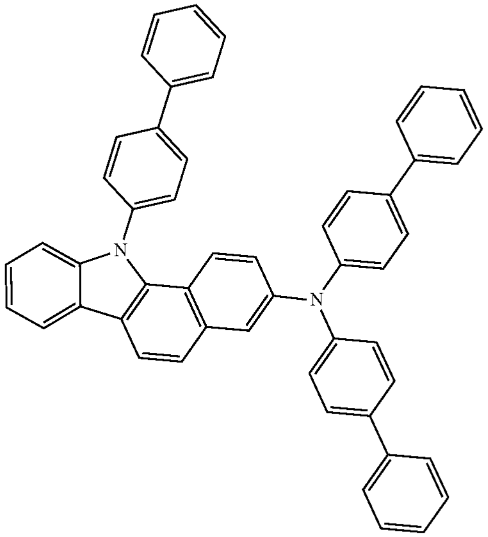
A-50
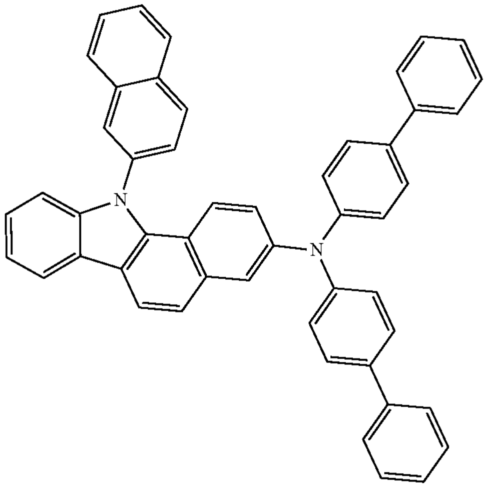
A-51
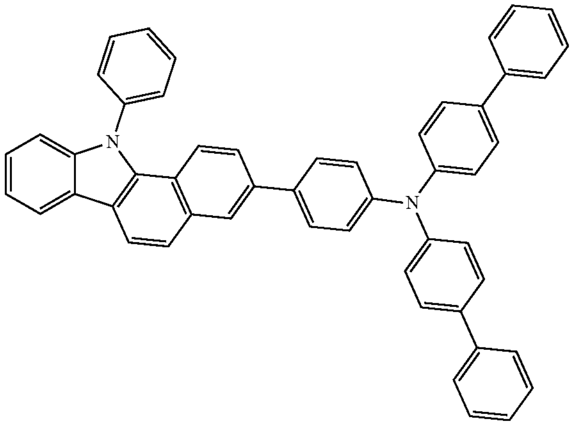
-continued
A-52
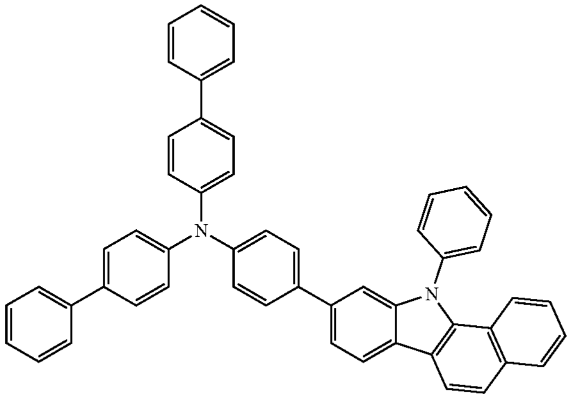
A-53
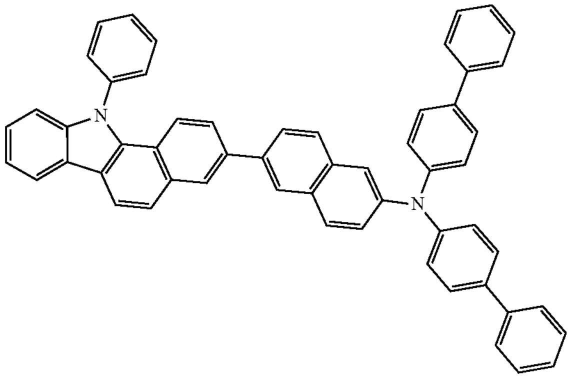
A-54
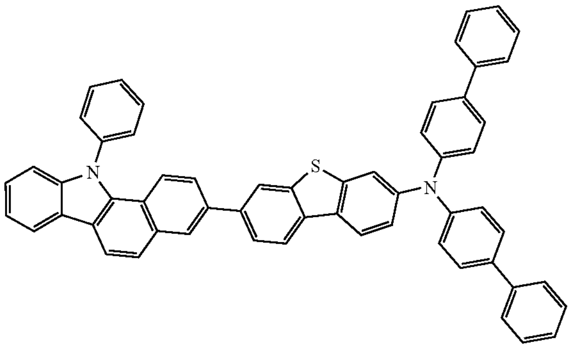
A-55
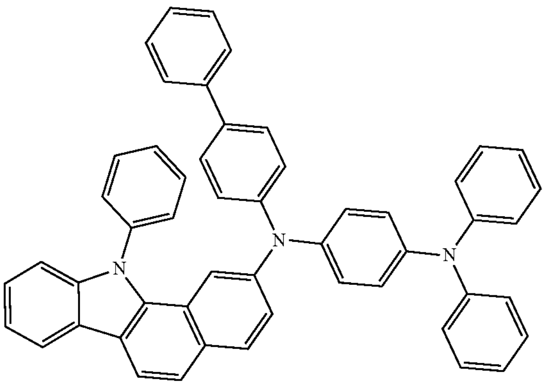

-continued
A-56
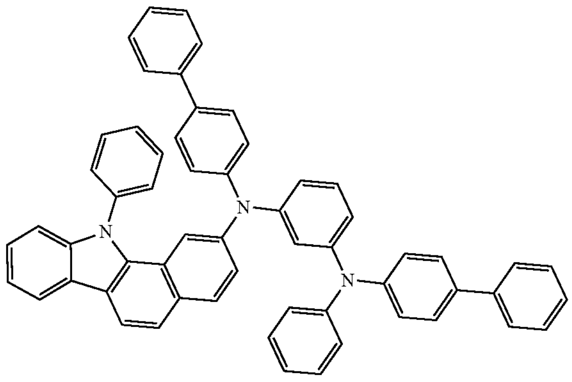
A-57
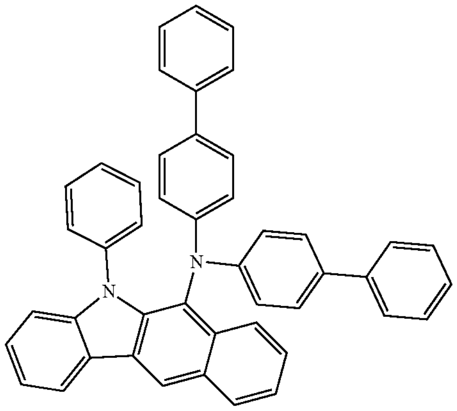
A-58
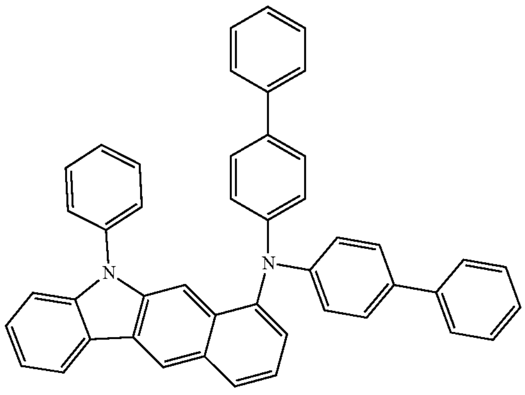
-continued
A-59
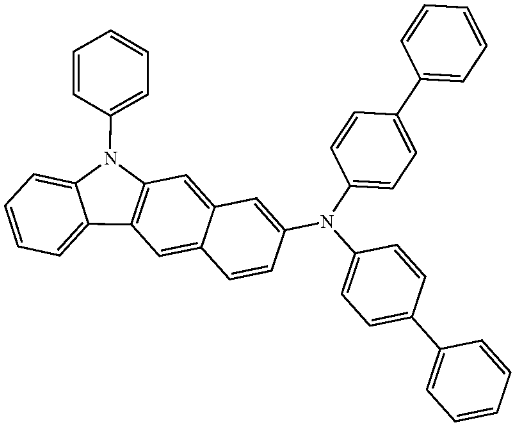
A-60
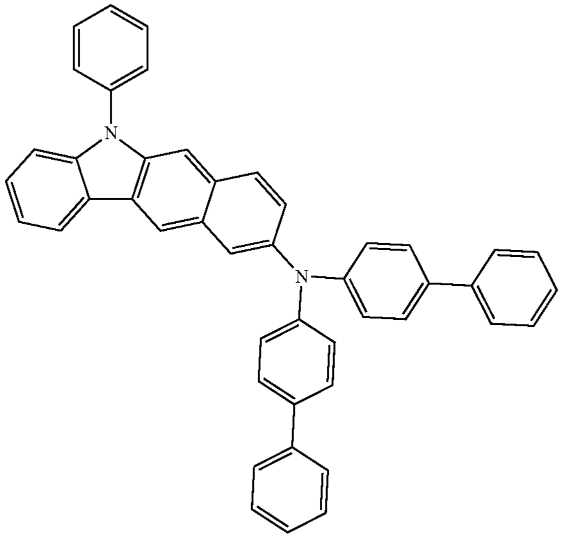
A-61
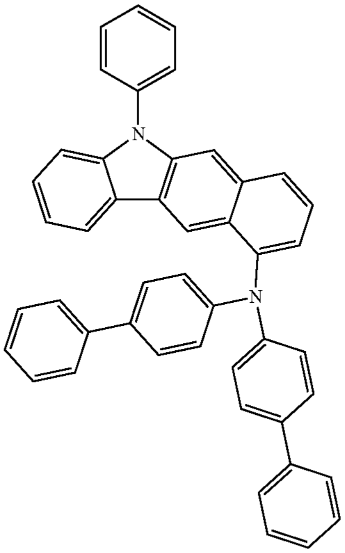

-continued
A-62
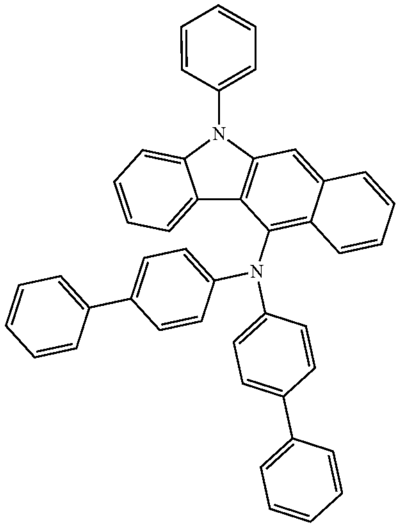
A-63
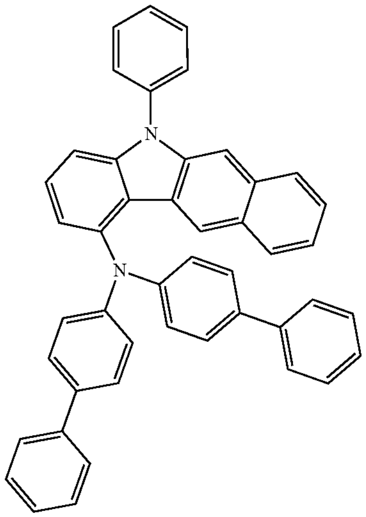
A-64
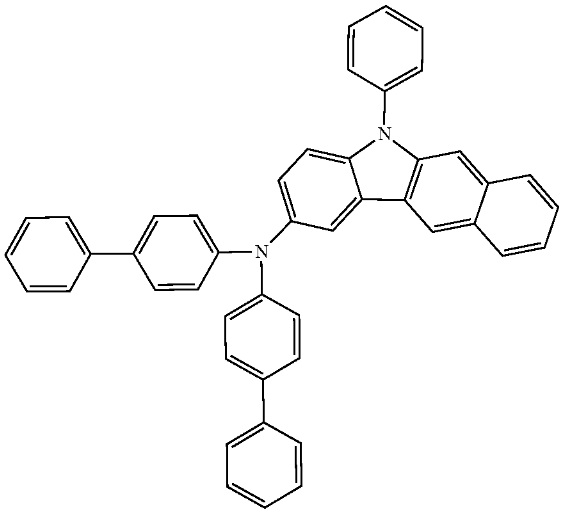
-continued
A-65
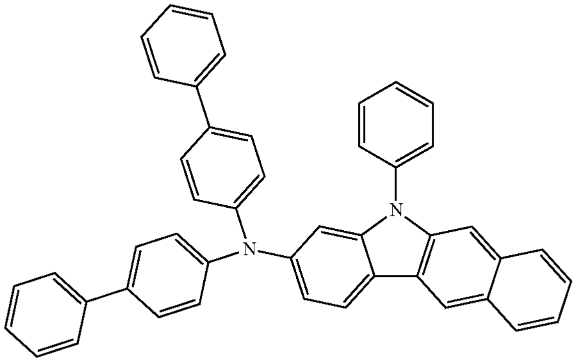
A-66
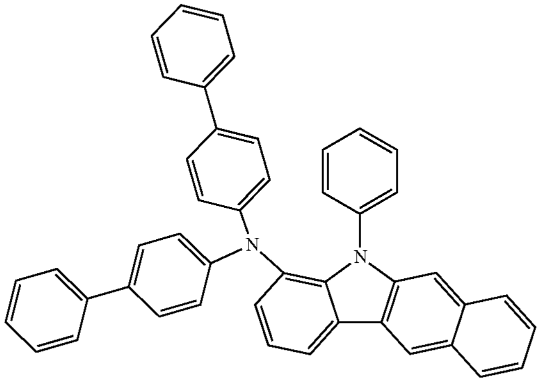
A-67
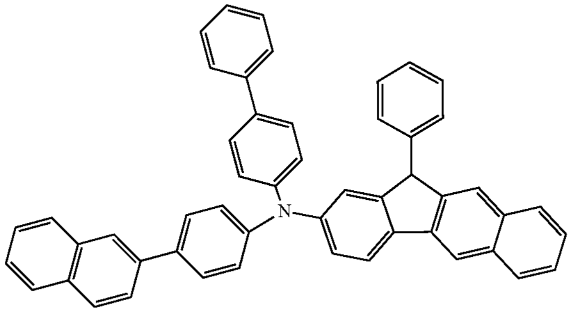
A-68
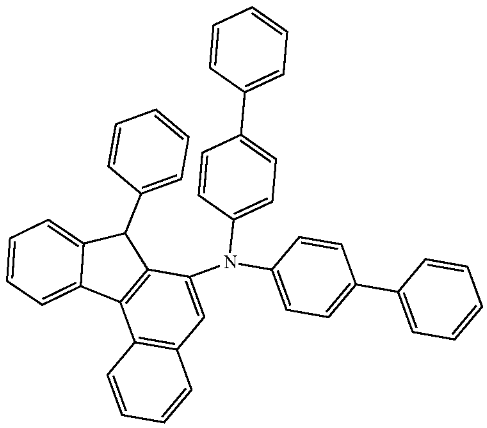

-continued
A-69
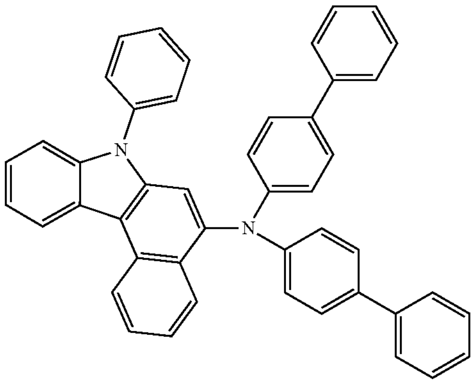
A-70
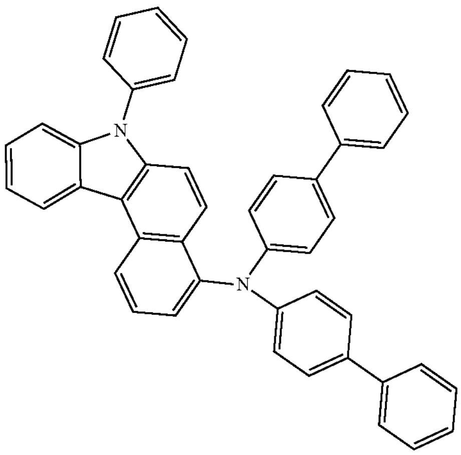
A-71
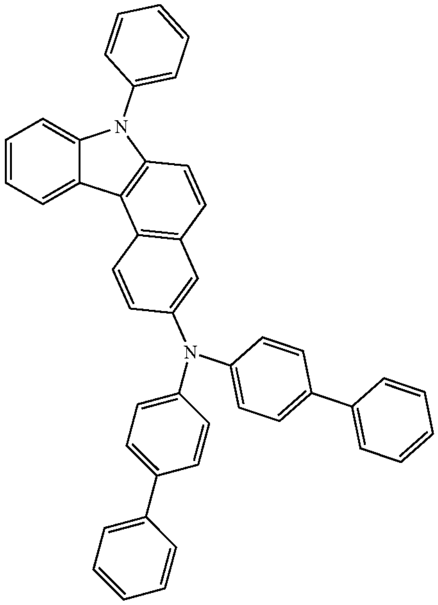
-continued
A-72
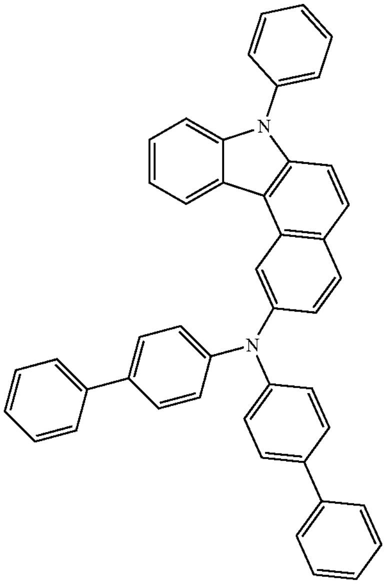
A-73
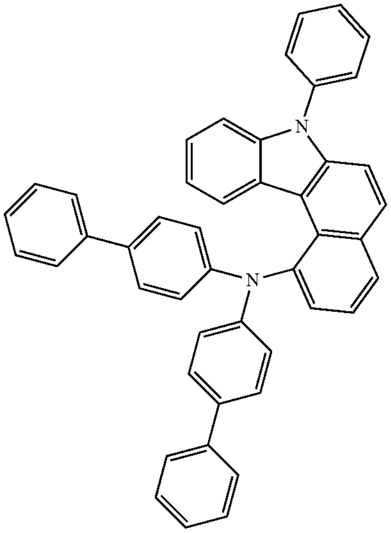
A-74
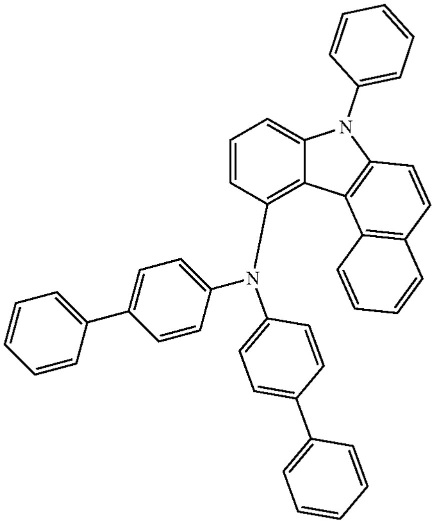

-continued
A-75
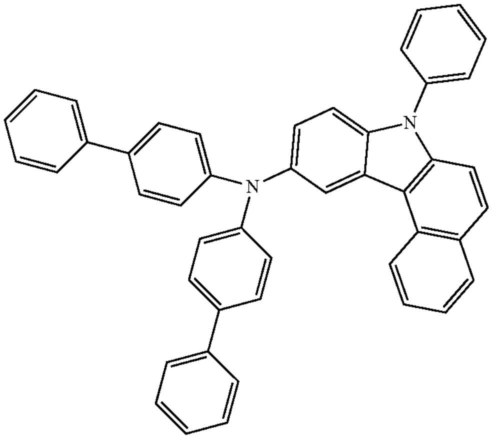
A-76
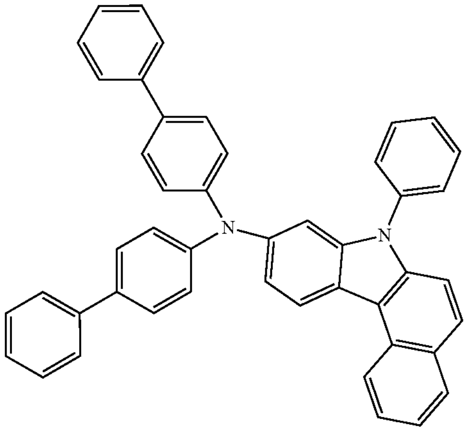
A-77
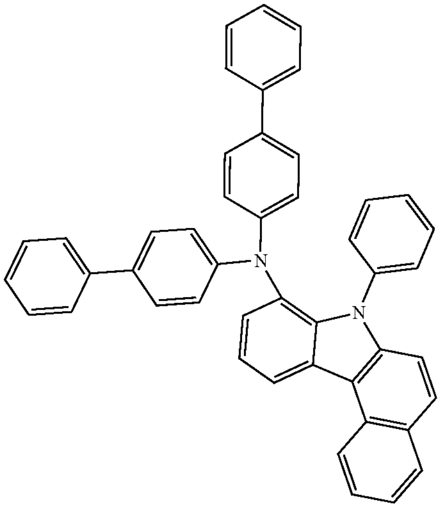
-continued
A-78
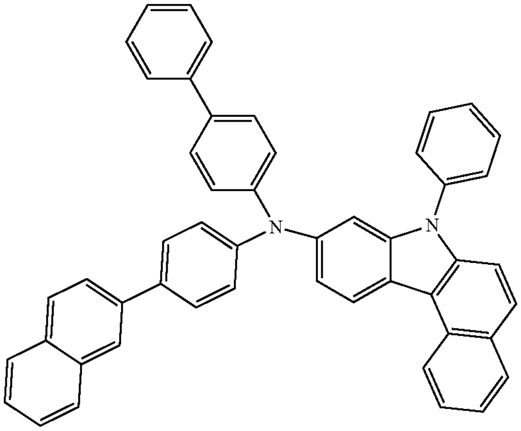
A-79
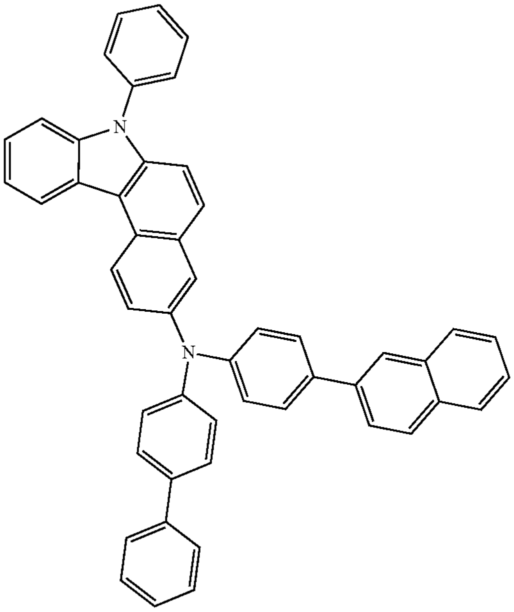
A-80
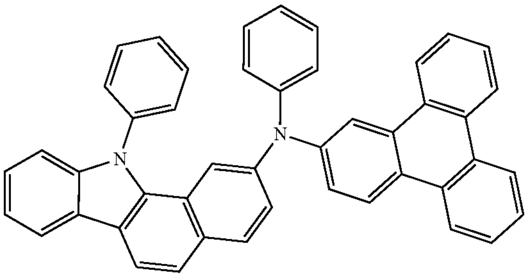

-continued
A-81
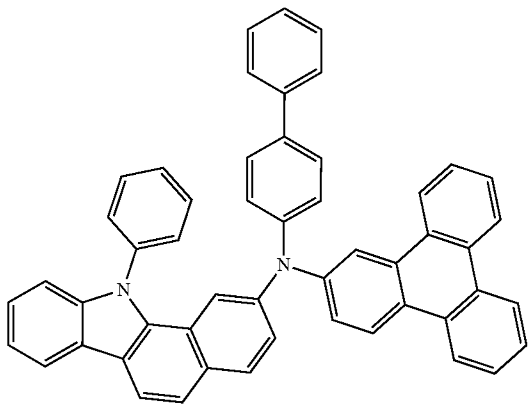
A-82
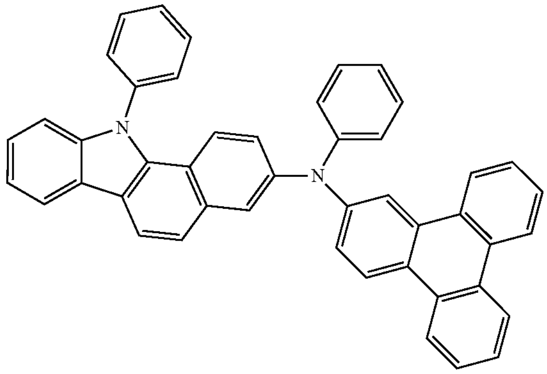
A-83
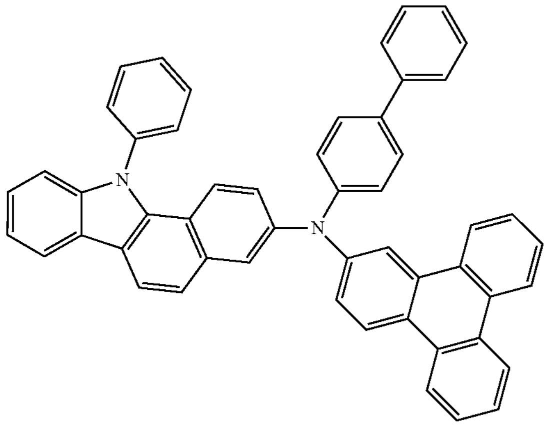
-continued
A-84
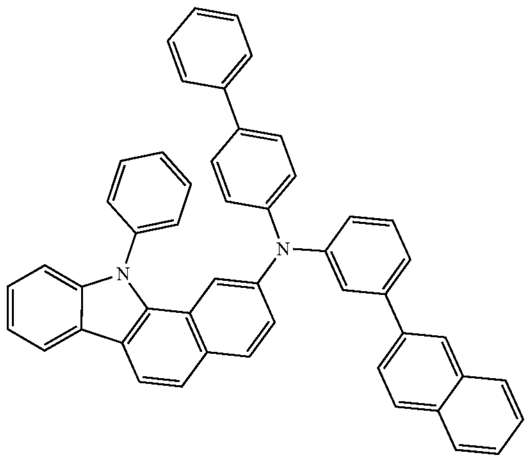
A-85
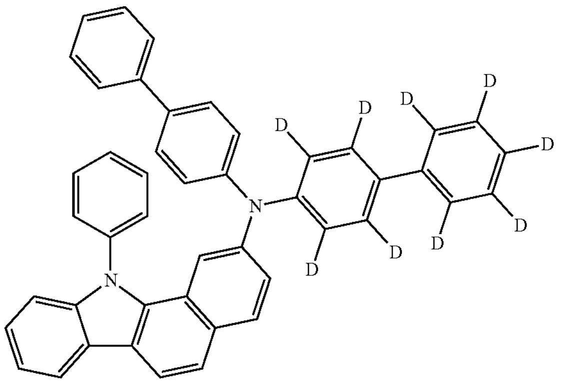
A-86
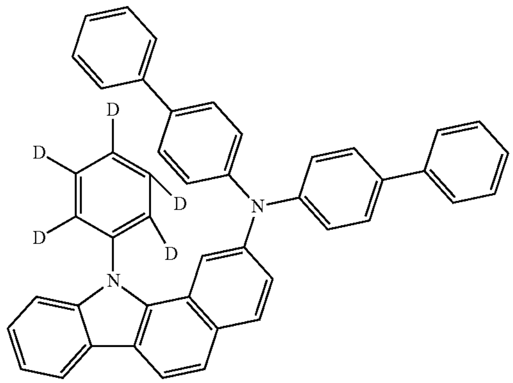

-continued
A-87
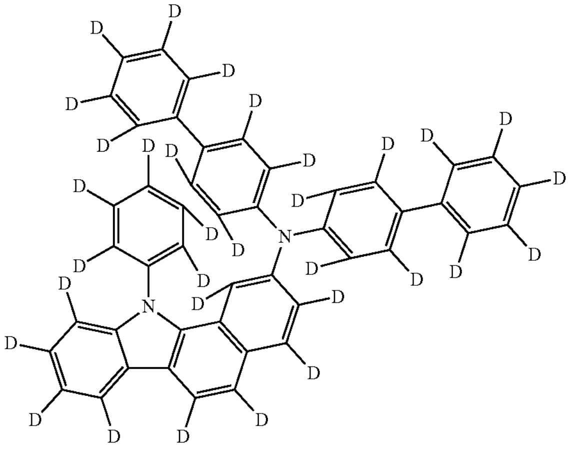
A-88
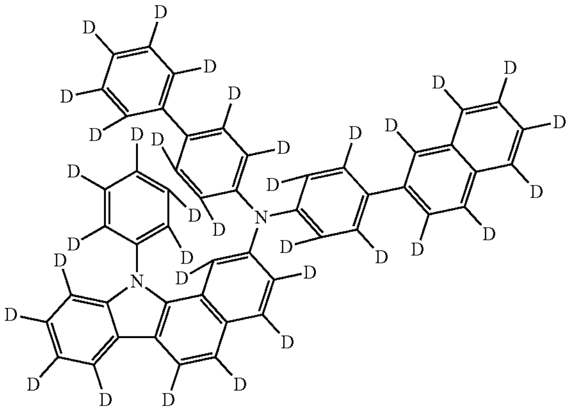
A-89
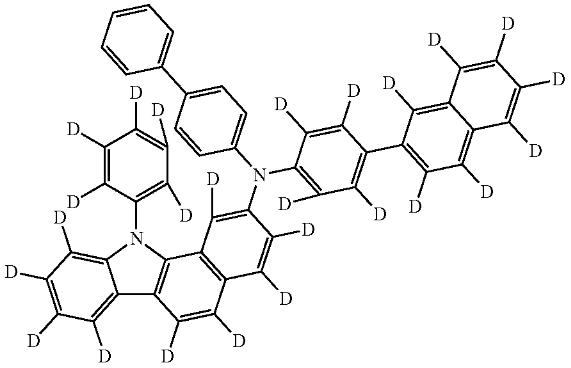
-continued
A-90
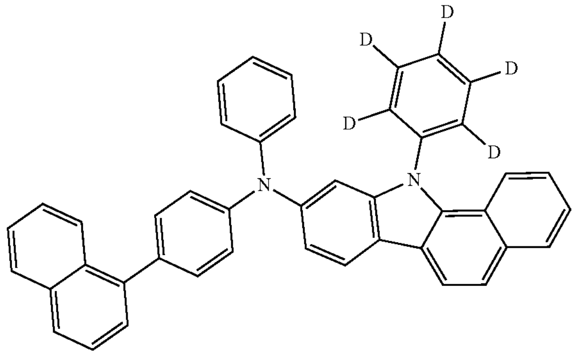
A-91
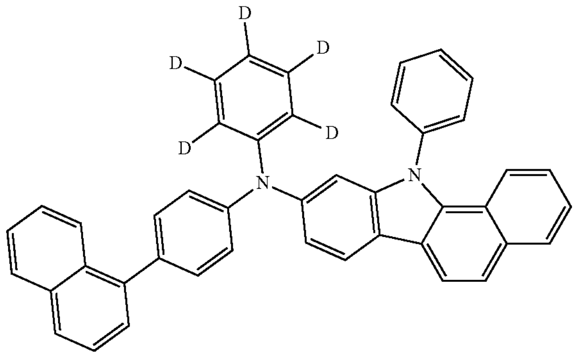
2-1
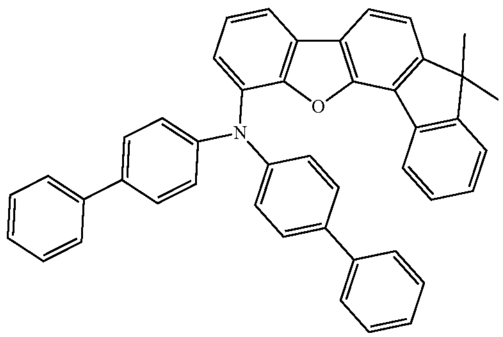
2-2
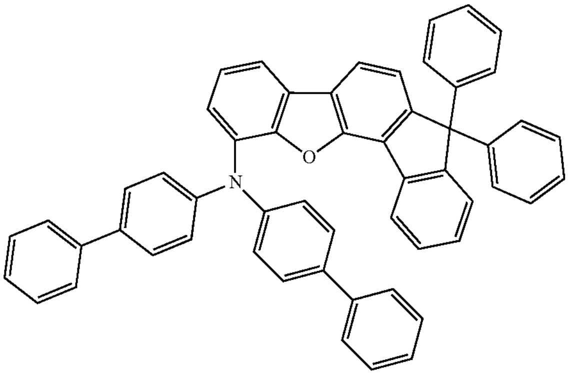

-continued
2-3
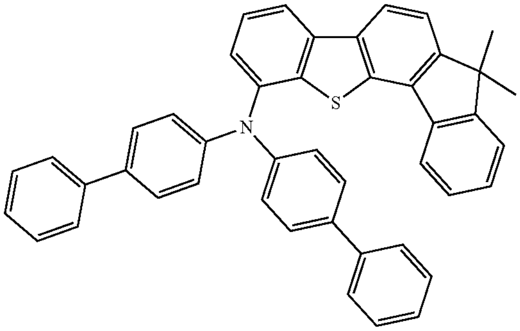
2-4
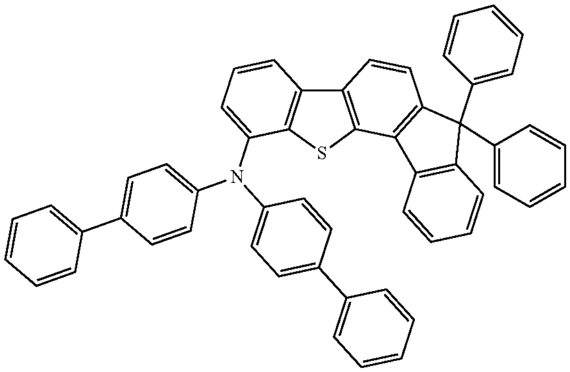
2-5
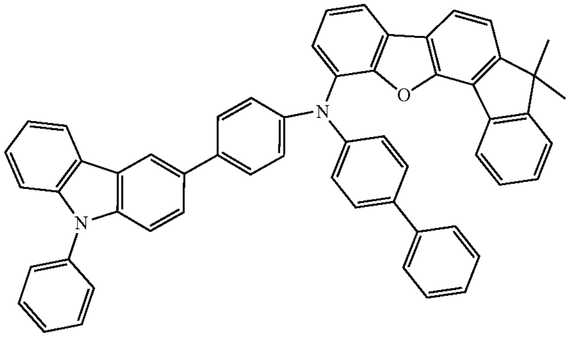
2-6
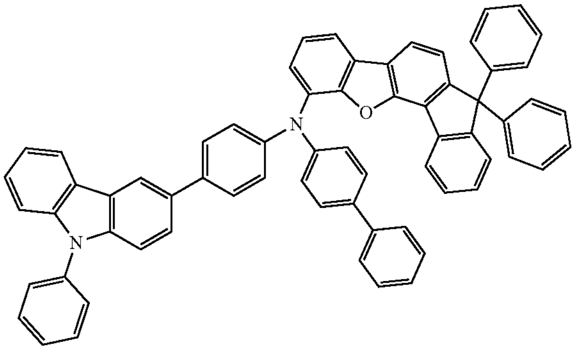
-continued
2-7
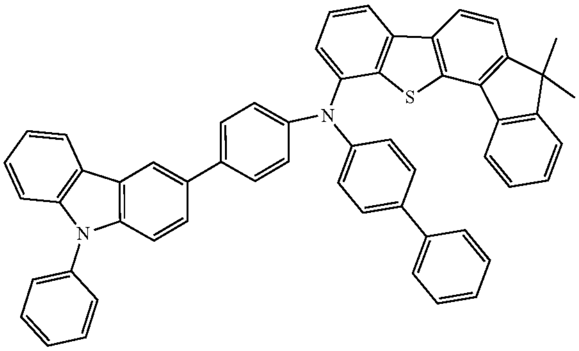
2-8
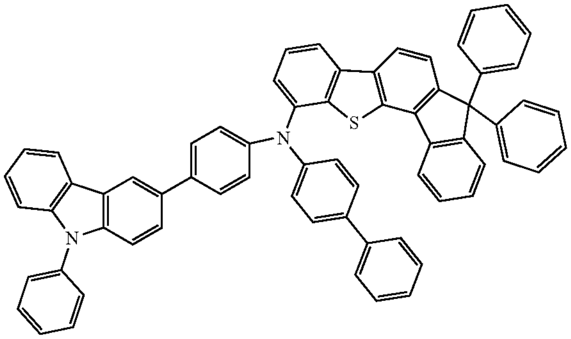
2-9
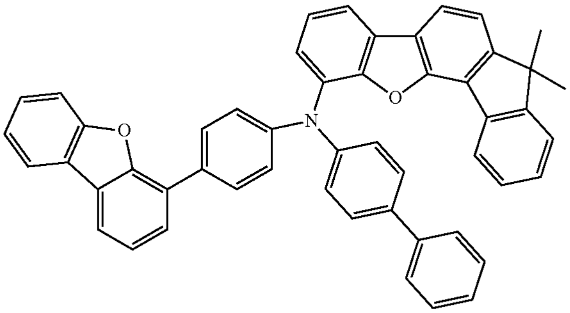
2-10
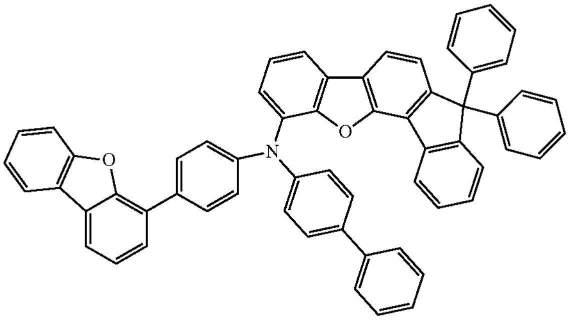

-continued
2-11
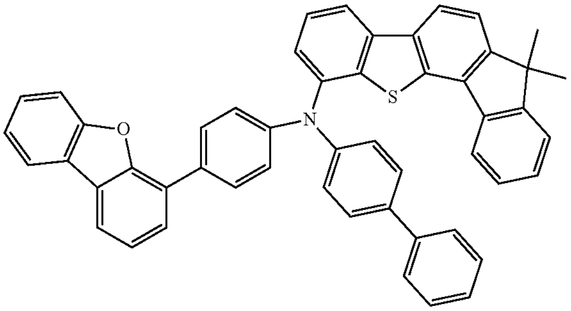
2-12
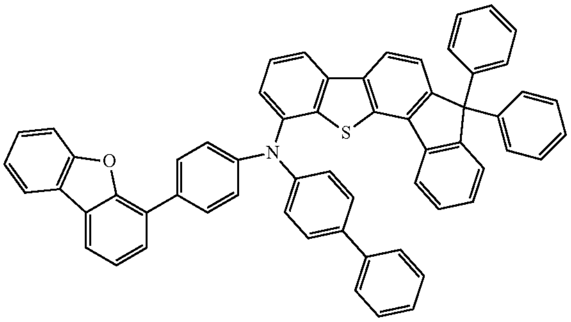
2-13
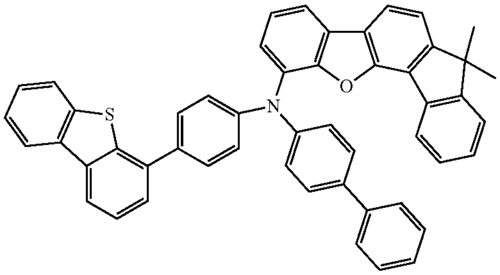
2-14
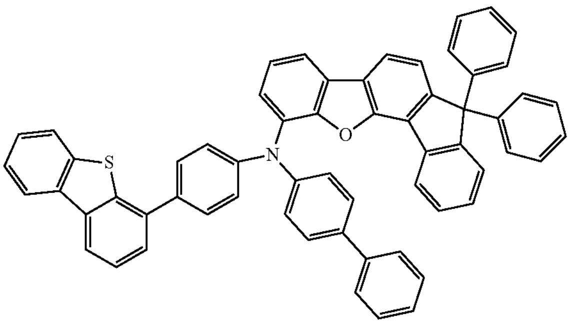
-continued
2-15
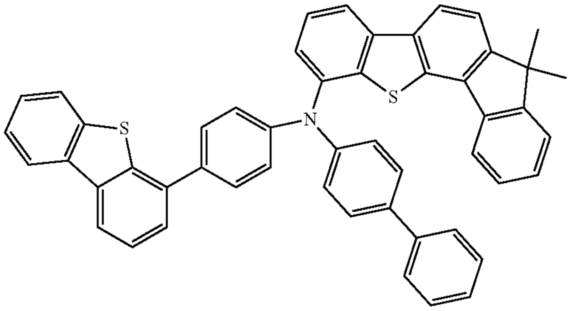
2-16
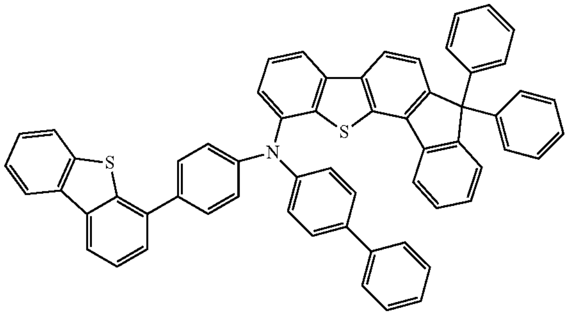
2-17
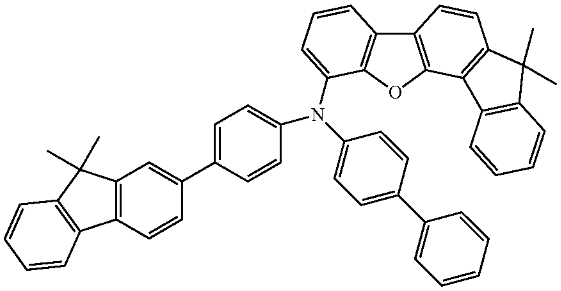
2-18
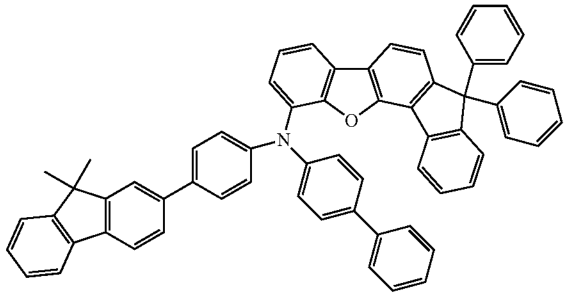

-continued
2-19
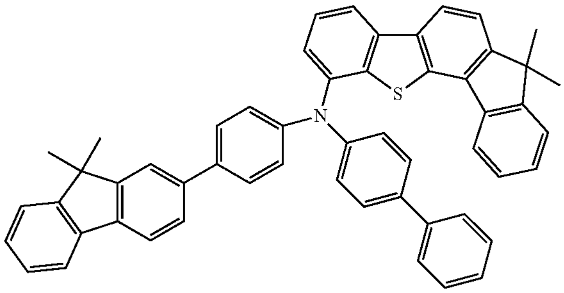
2-20
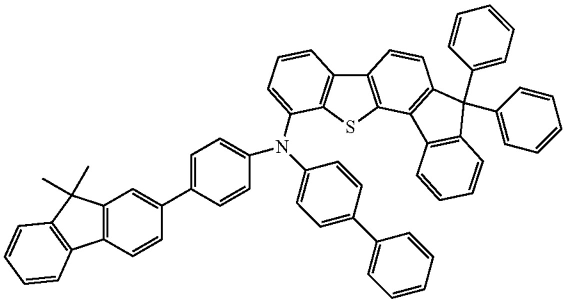
2-21
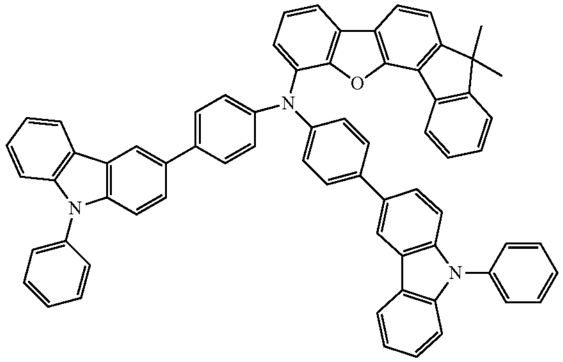
2-22
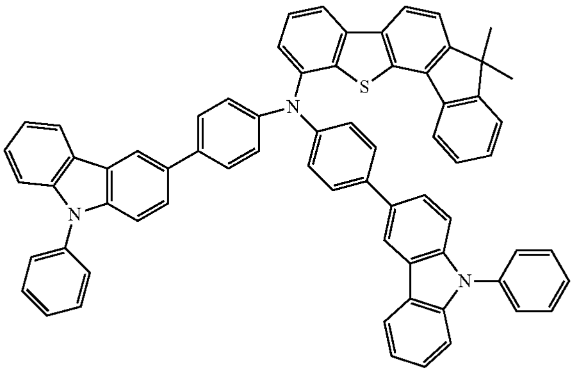
-continued
2-23
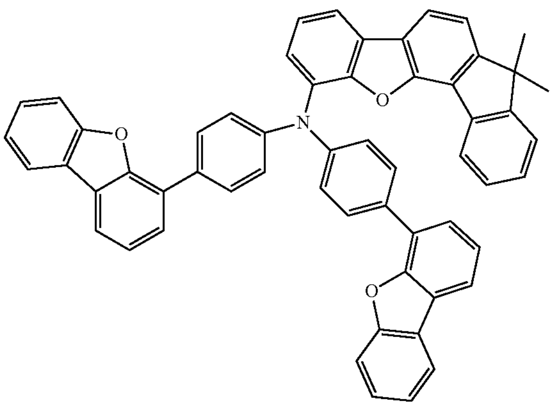
2-24
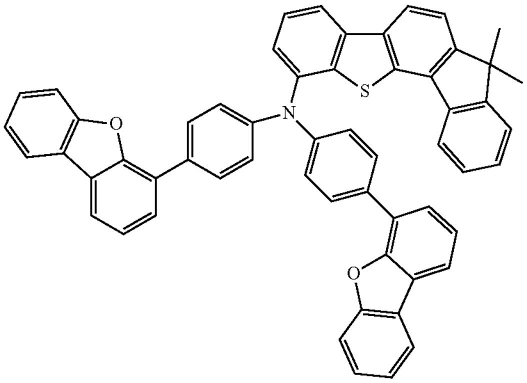
2-25
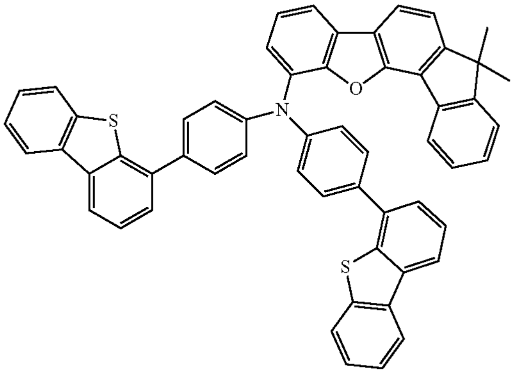
2-26
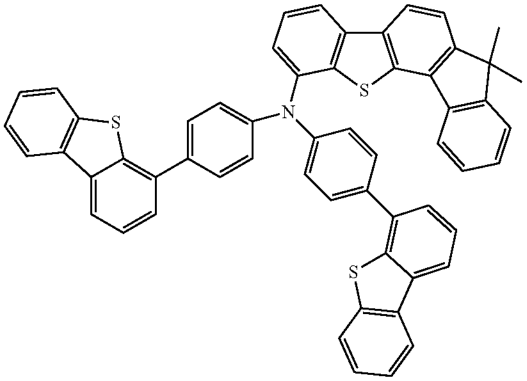

-continued
2-27
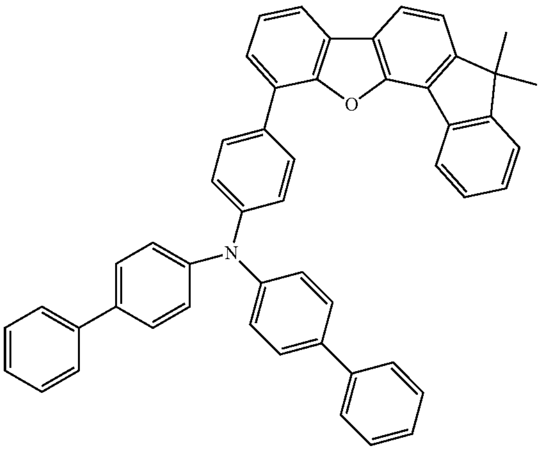
2-28
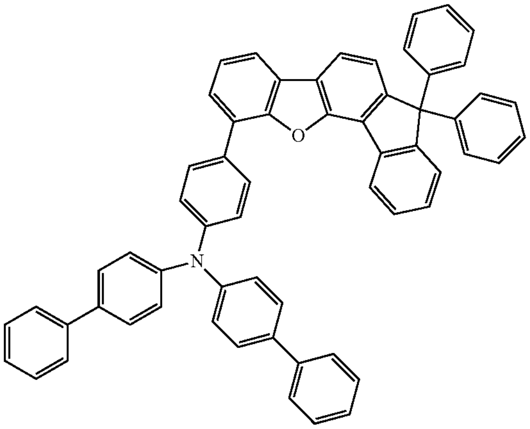
2-29
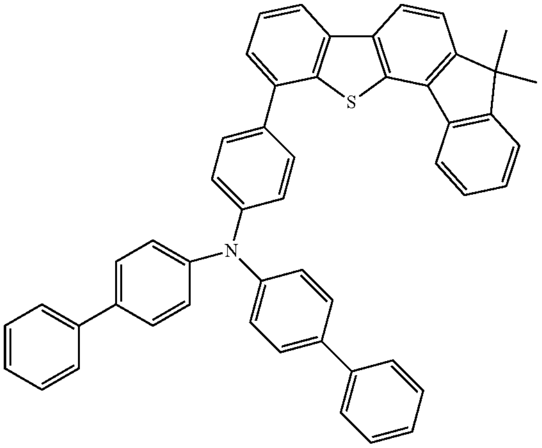
-continued
2-30
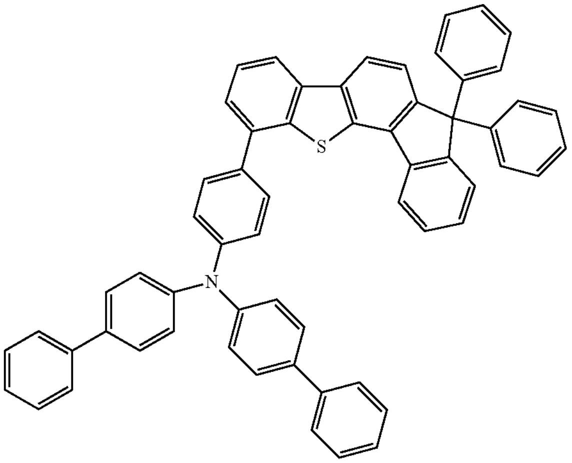
2-31
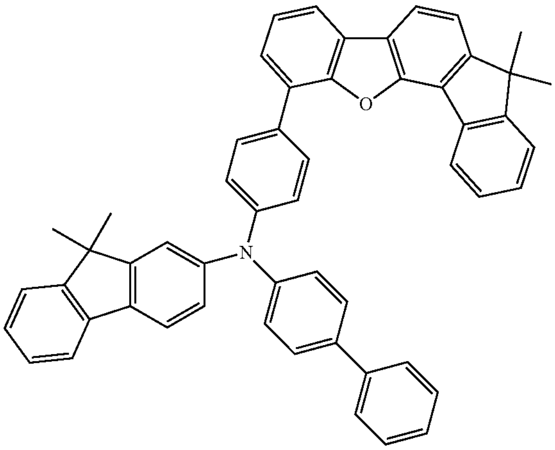
2-32
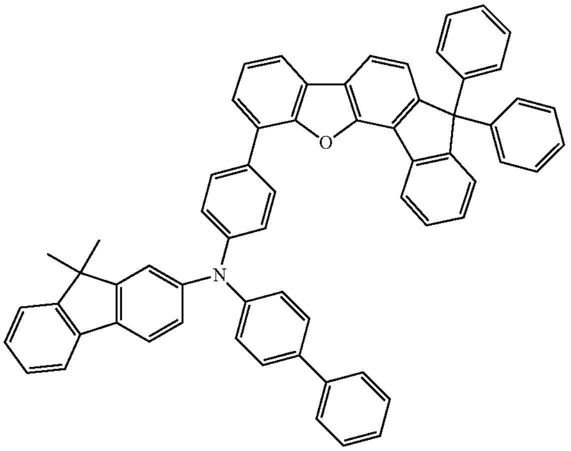

-continued
2-33
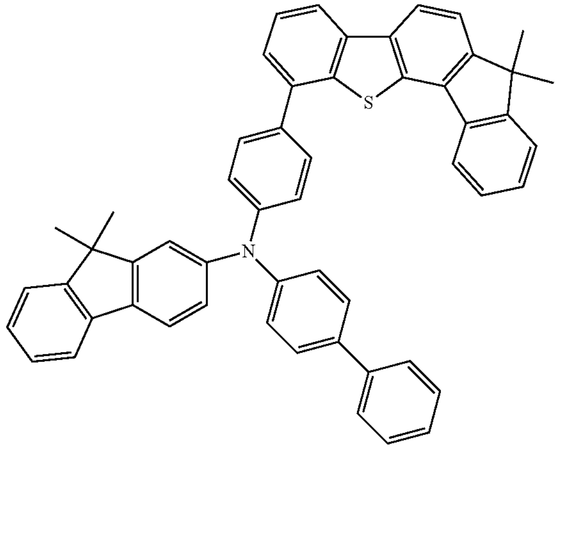
2-34
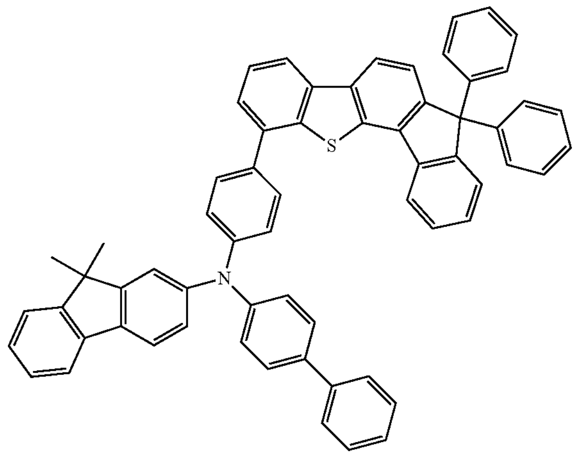
2-35
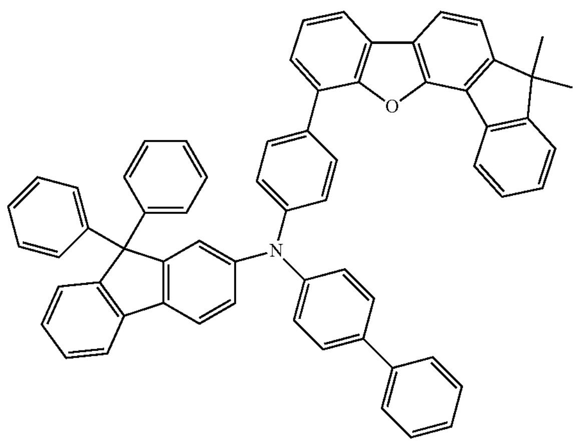
-continued
2-36
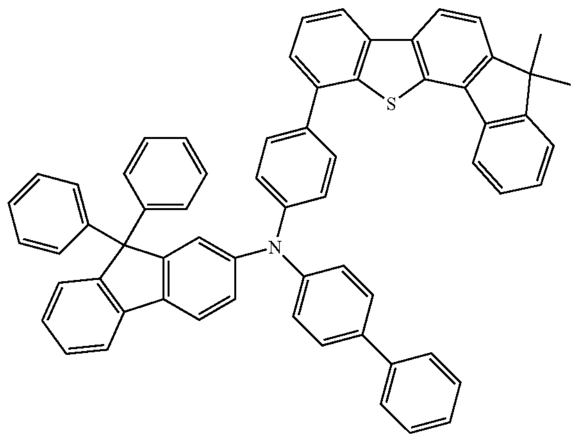
2-37
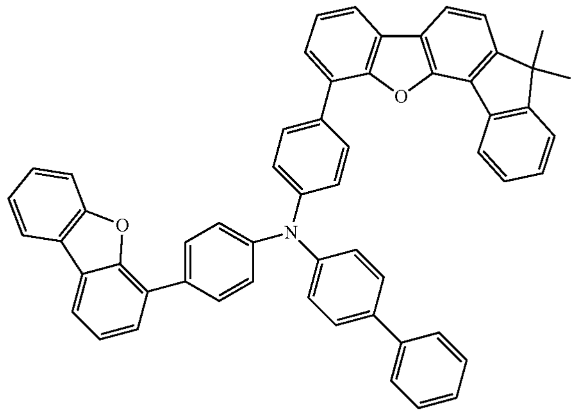
2-38
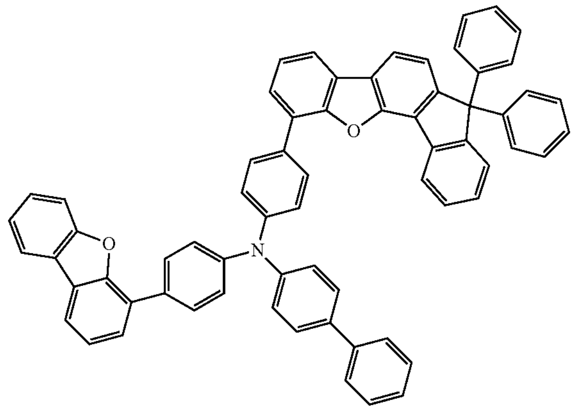

-continued
2-39
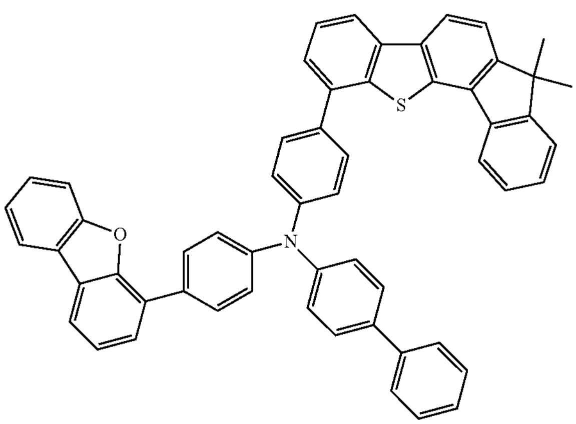
2-40
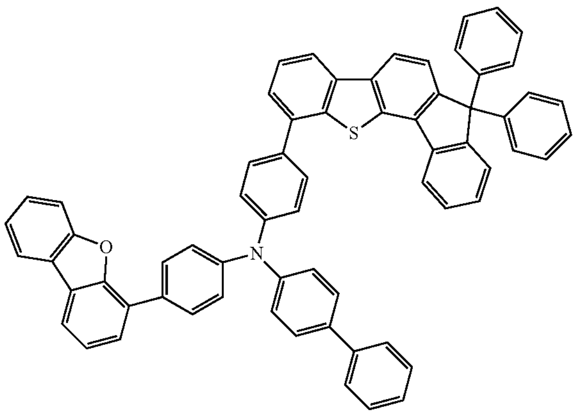
2-40
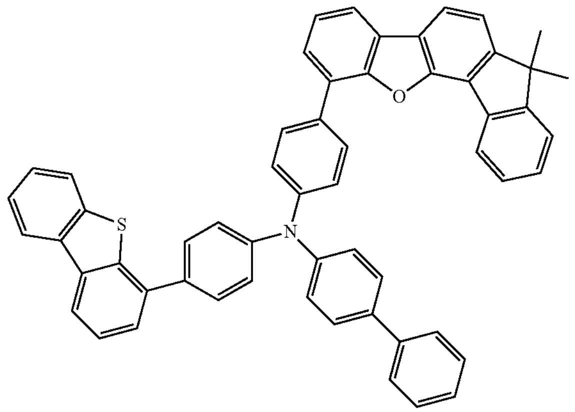
-continued
2-42
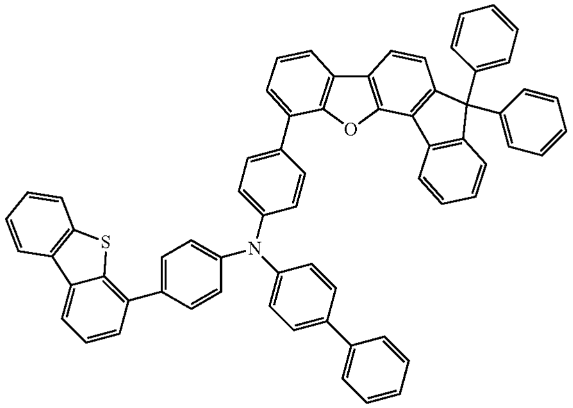
2-43
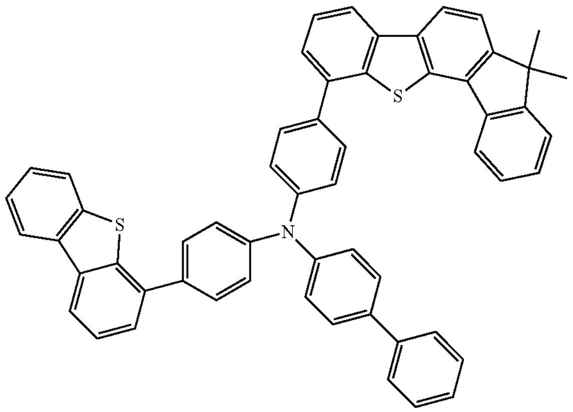
2-44
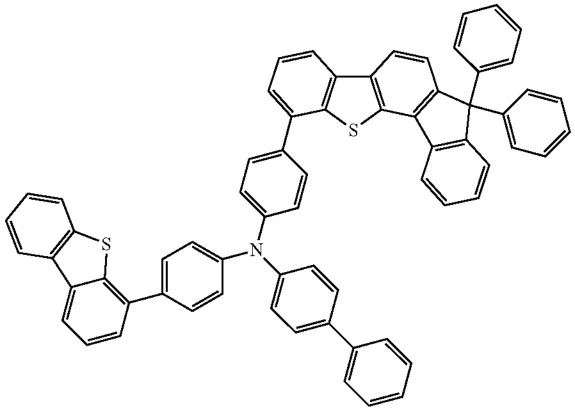

-continued
2-45
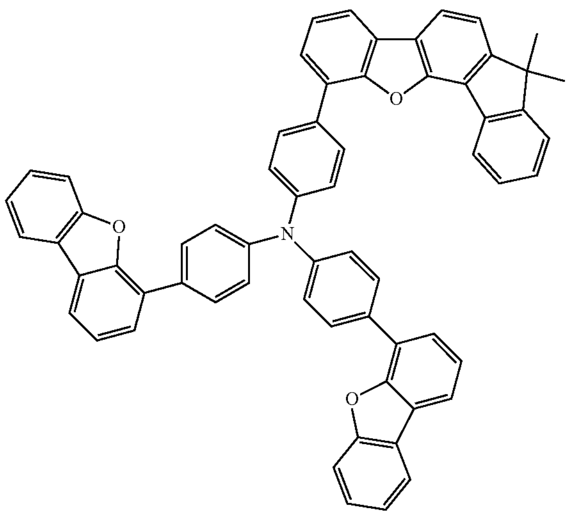
2-46
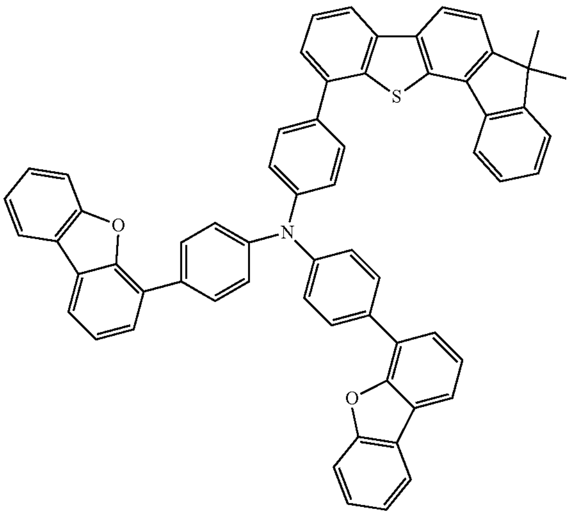
2-47
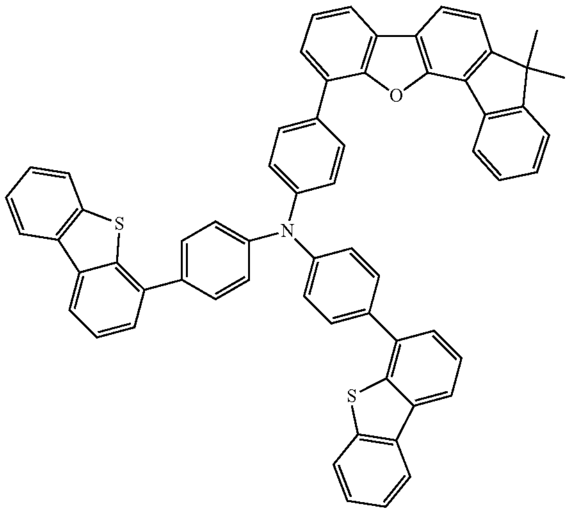
-continued
2-48
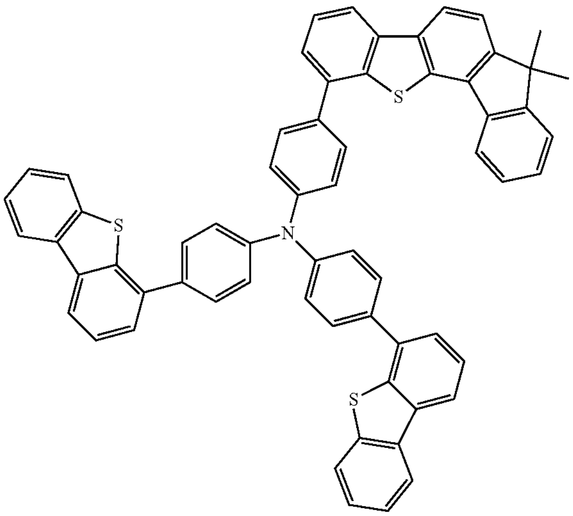
2-49
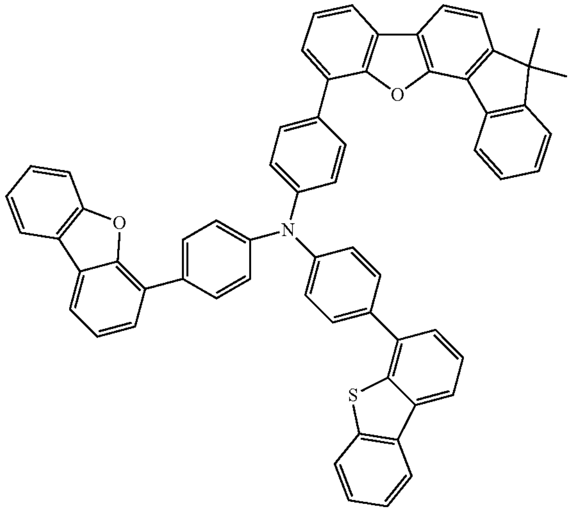
2-50
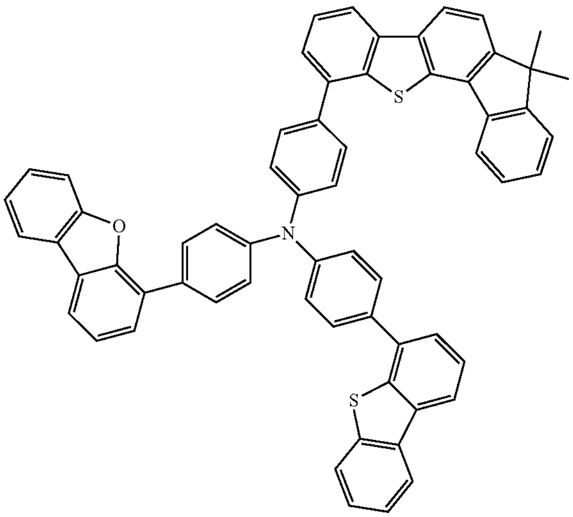

-continued
2-51
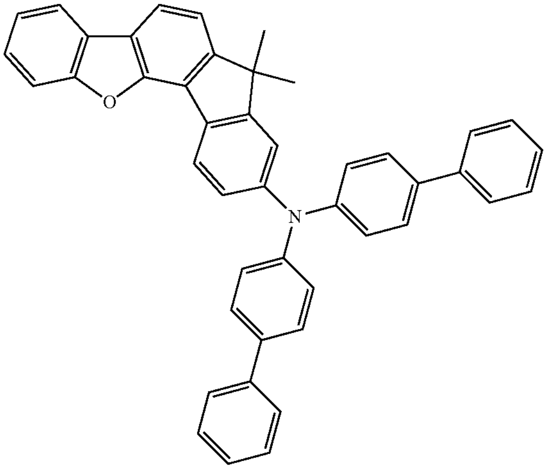
2-52
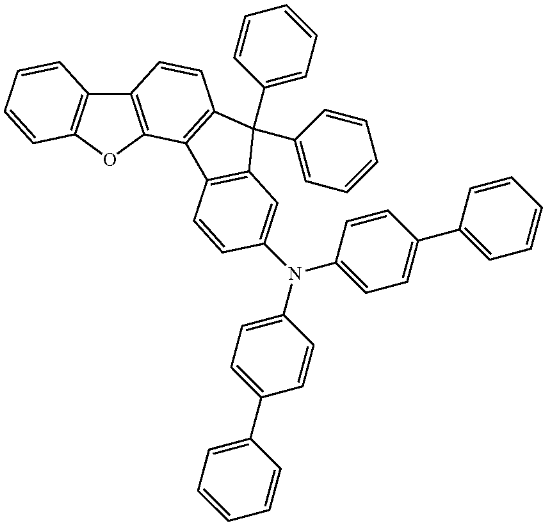
2-53
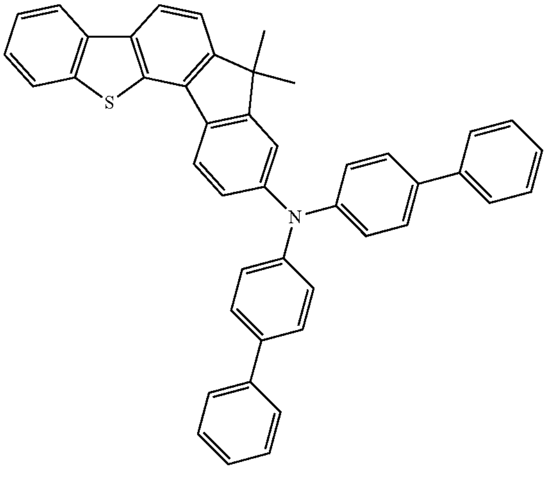
-continued
2-54
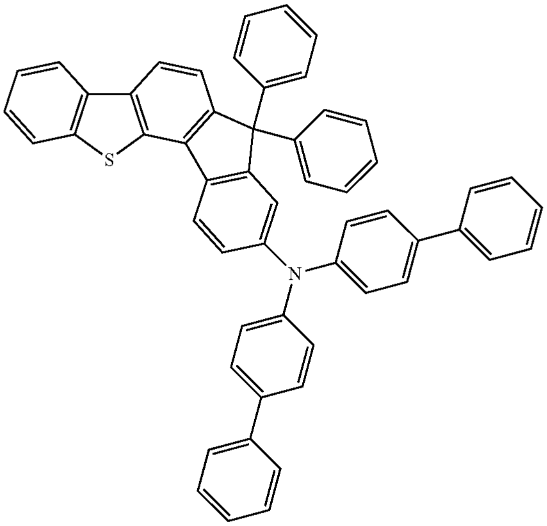
2-55
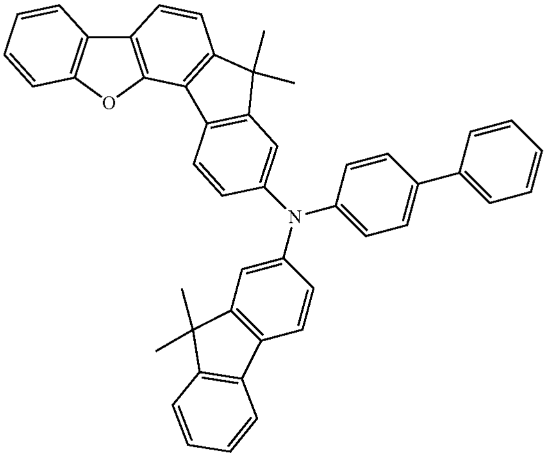
2-56
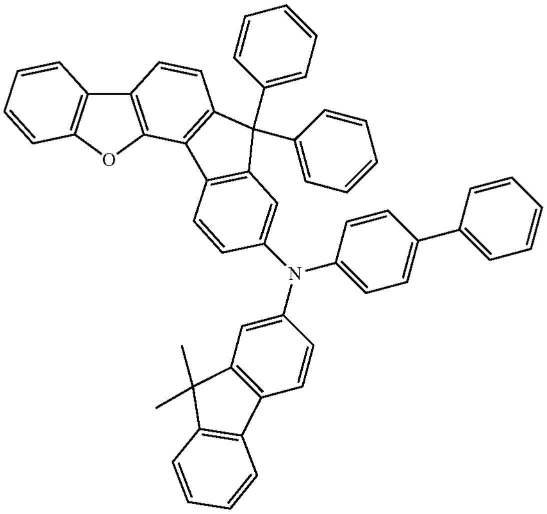

2-57
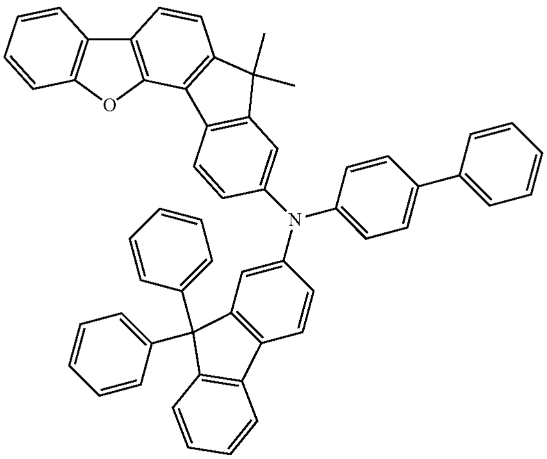
2-58
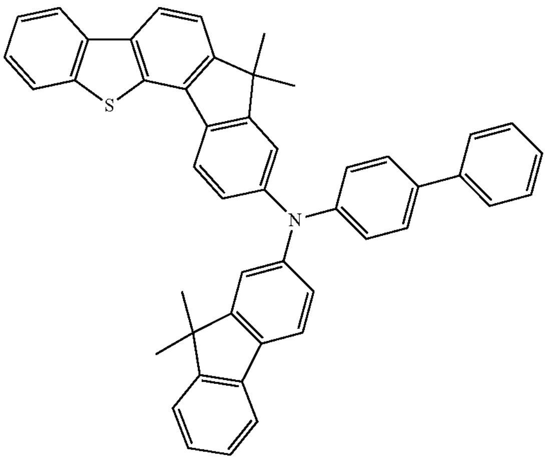
2-59
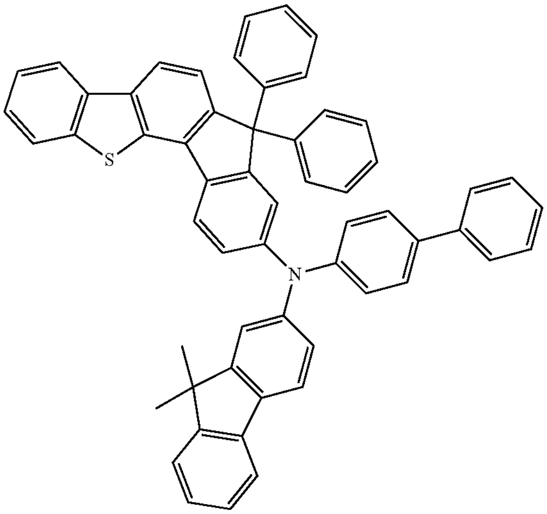
2-60
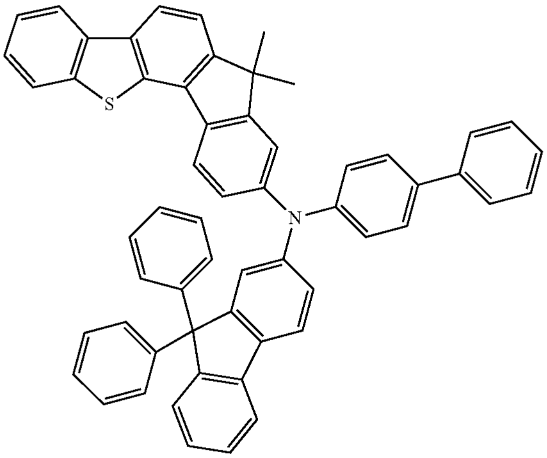
2-61
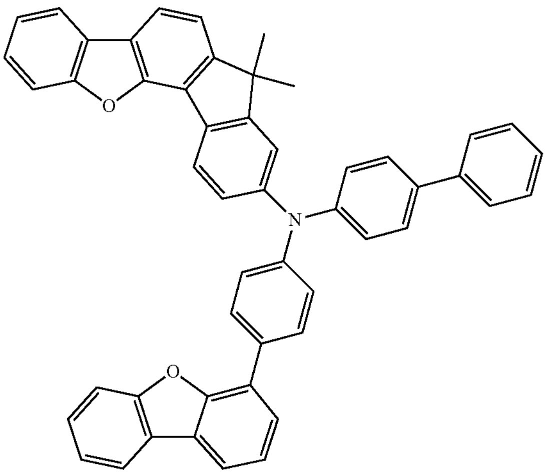
2-62
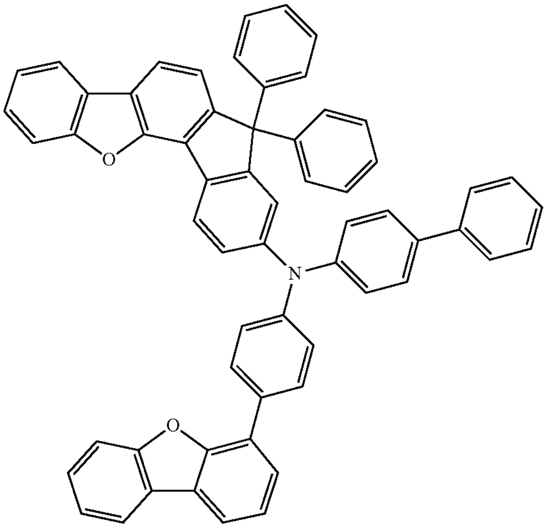

-continued
2-63
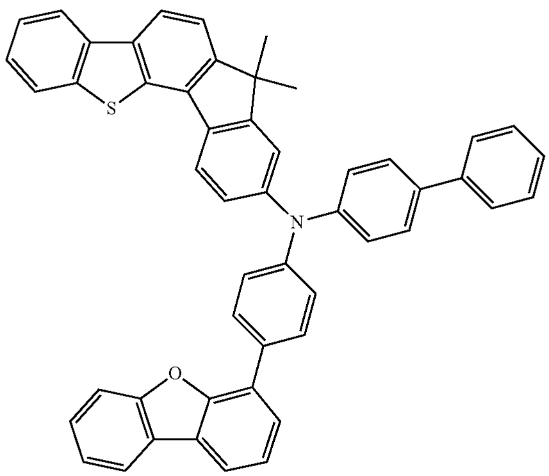
2-64
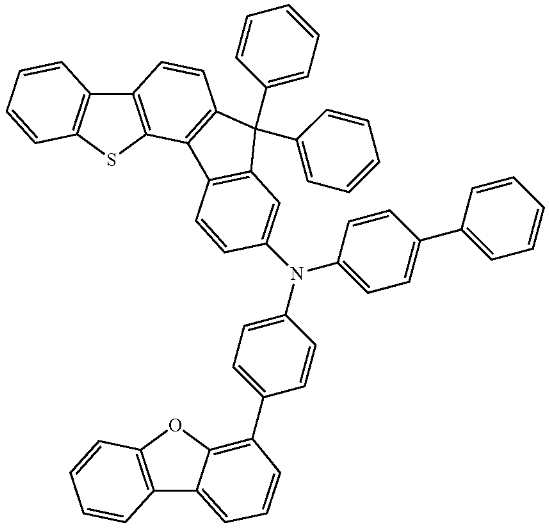
2-65
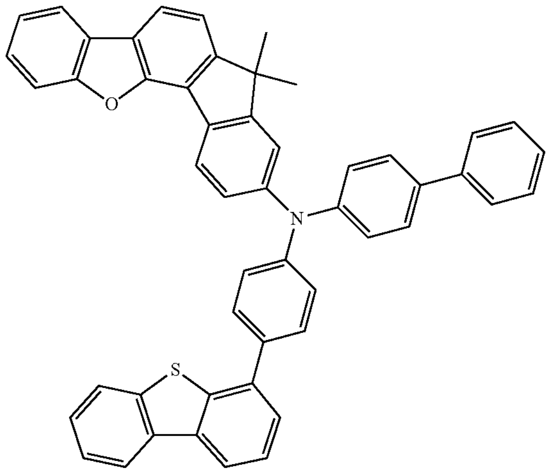
-continued
2-66
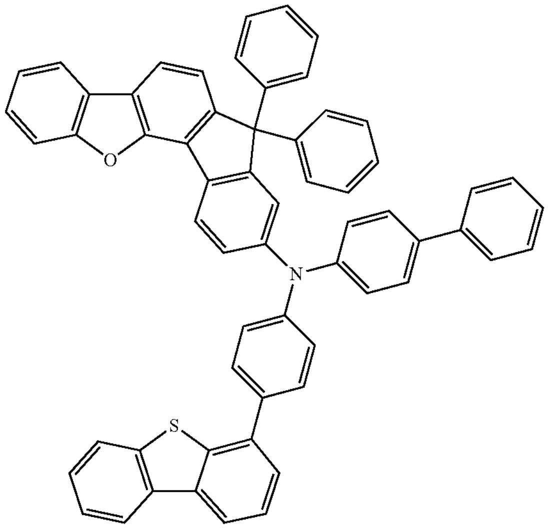
2-67
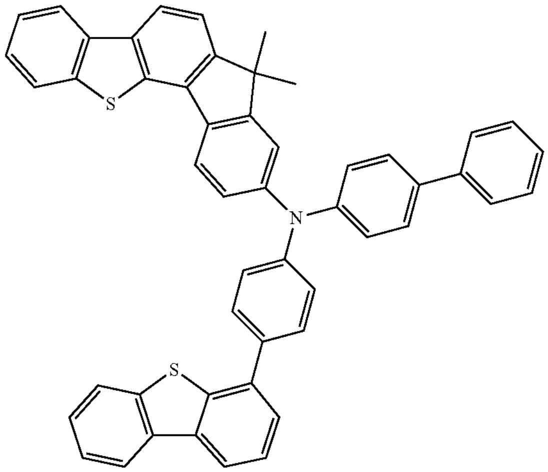
2-68
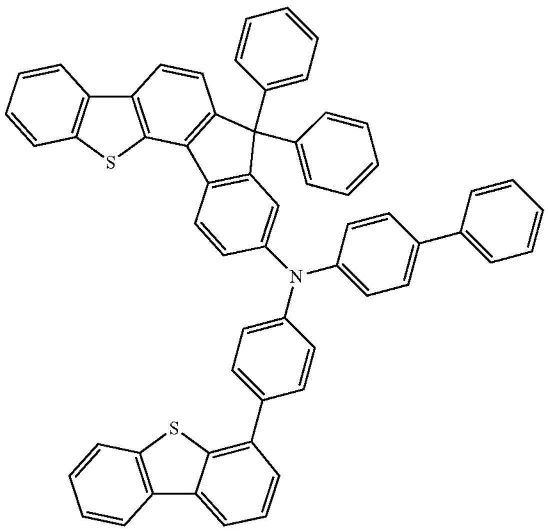

-continued
2-69
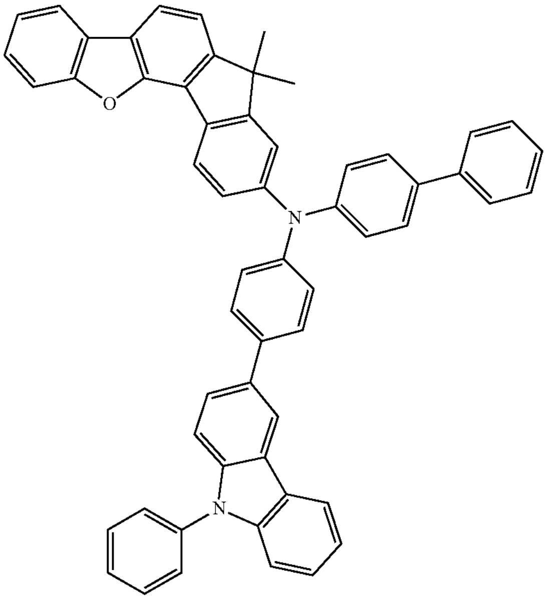
2-70
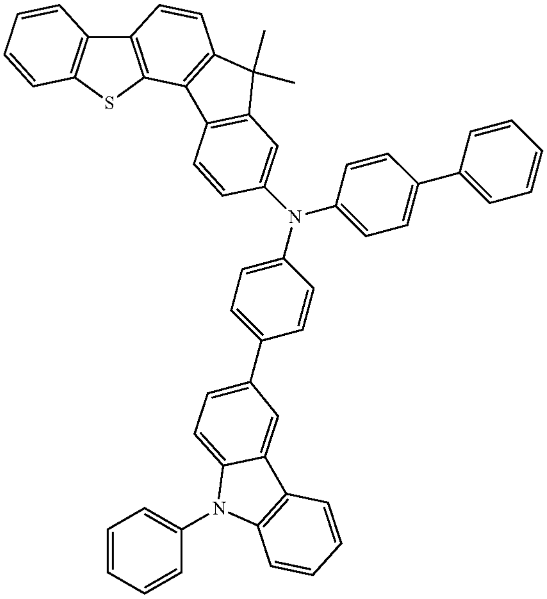
-continued
2-71
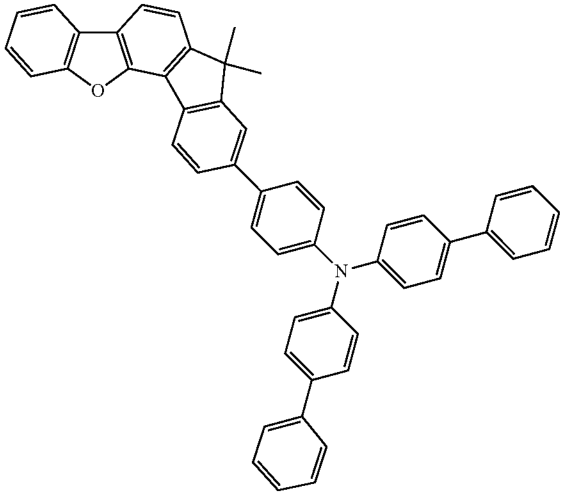
2-72
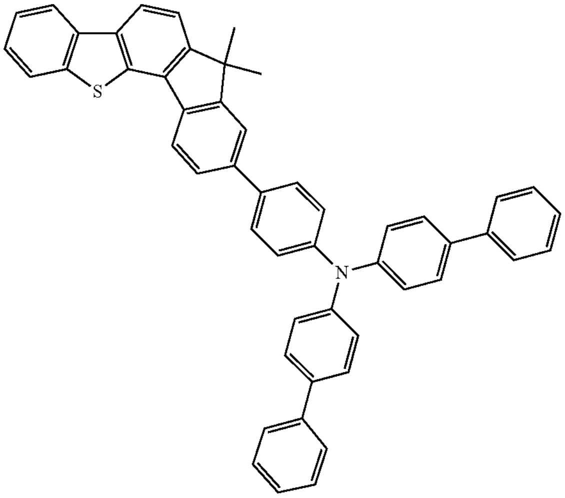
2-73
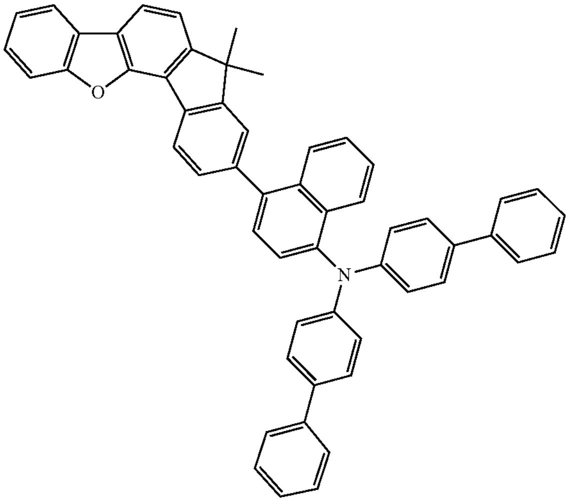

-continued
2-74
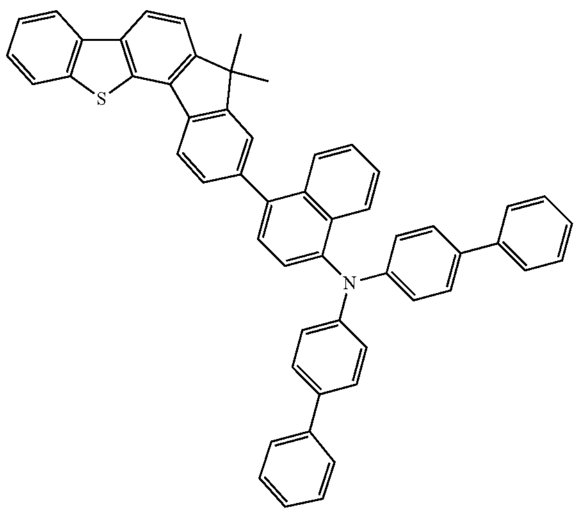
2-75
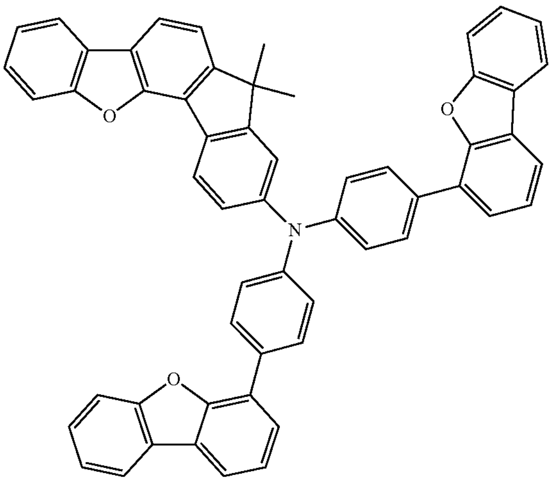
2-76
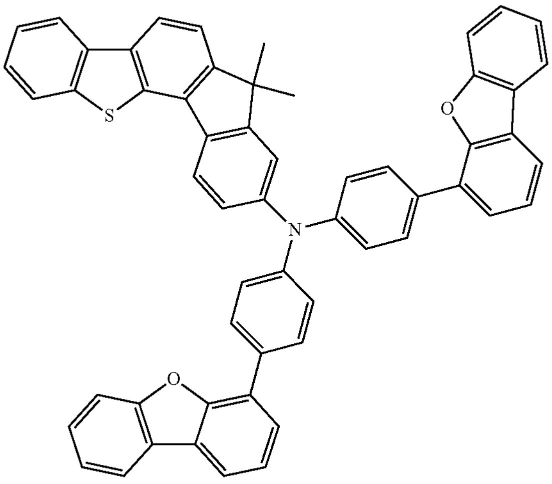
-continued
2-77
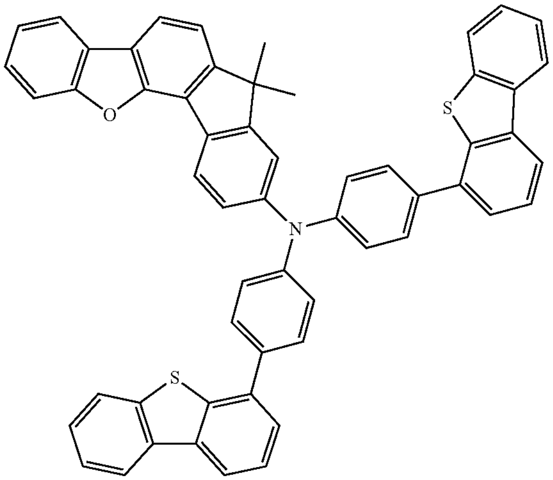
2-78
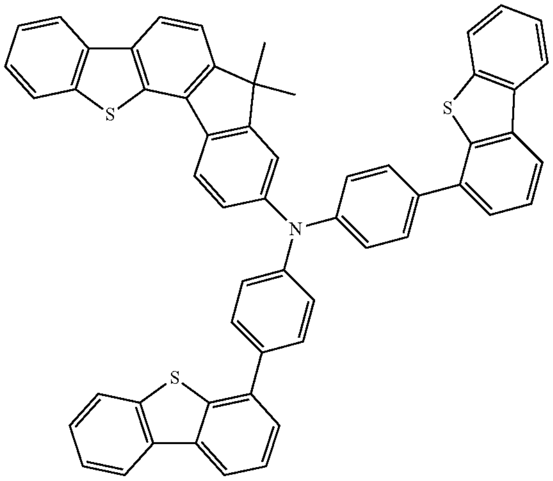
2-79
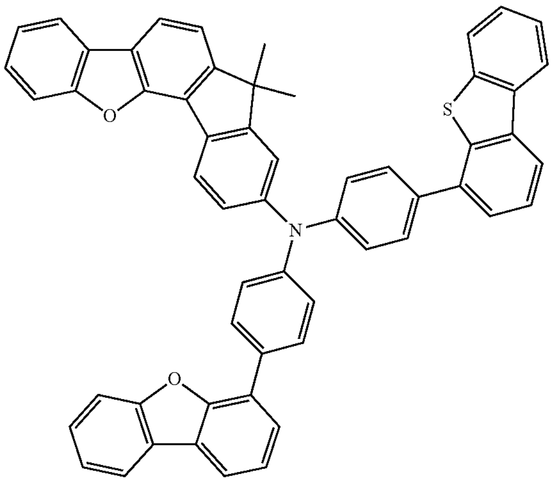

-continued
2-80
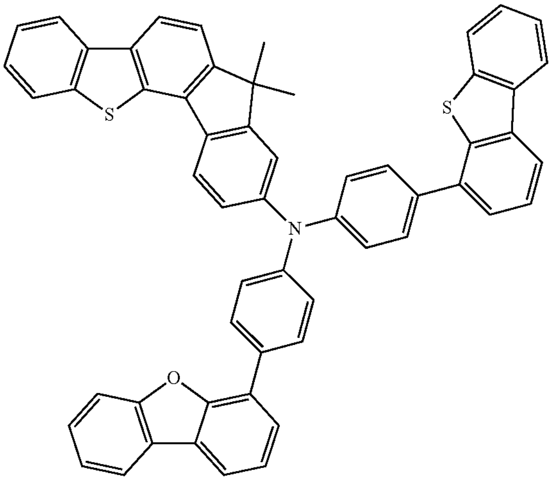
2-81
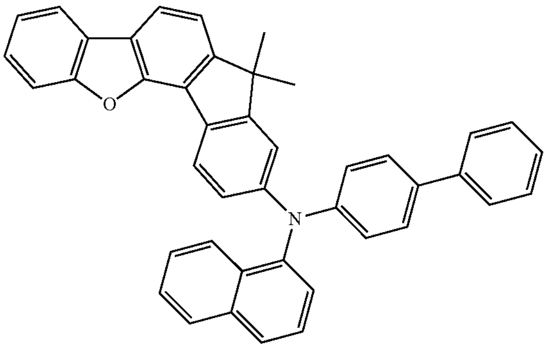
2-82
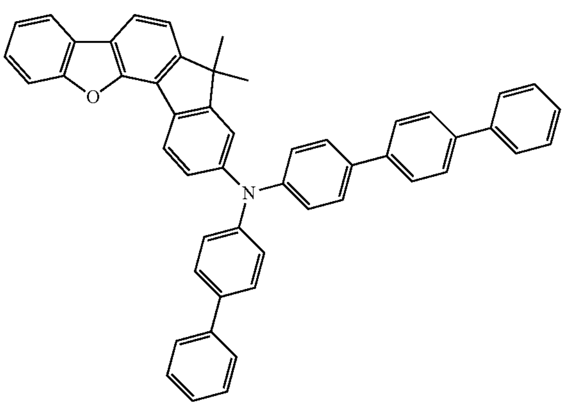
-continued
2-83
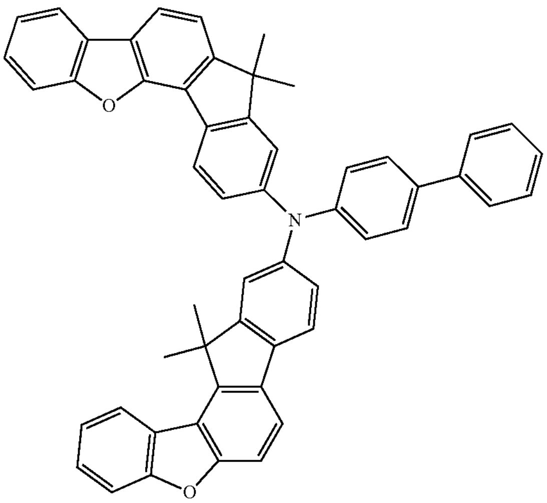
2-84
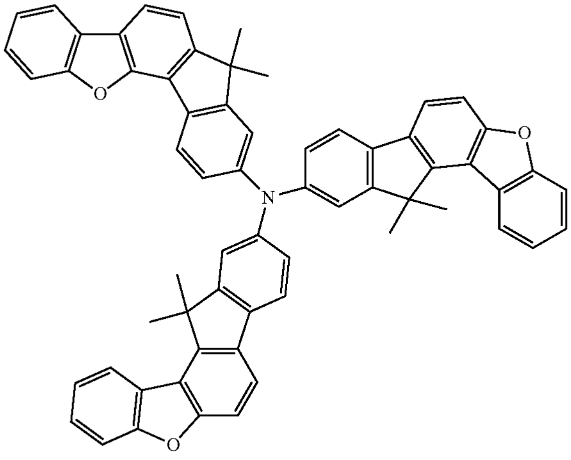
2-85
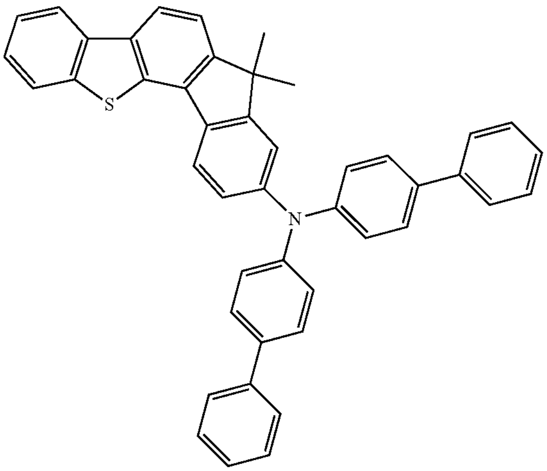

-continued
2-86
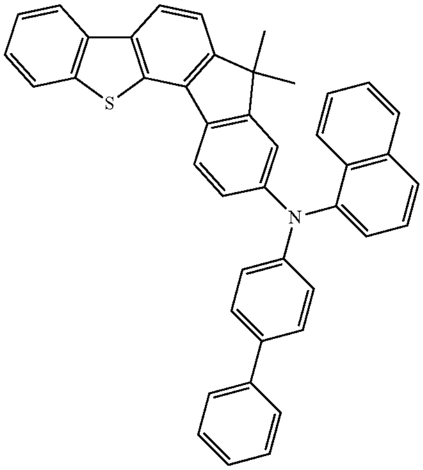
2-87
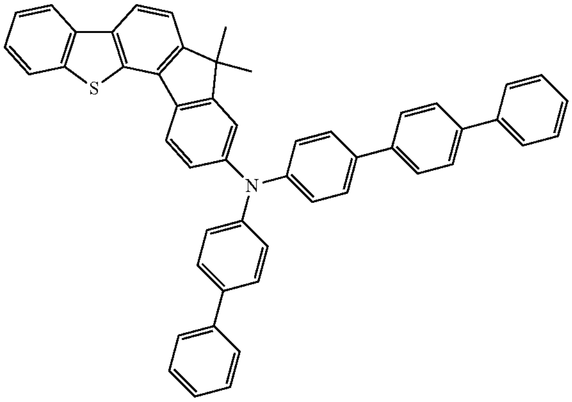
2-88
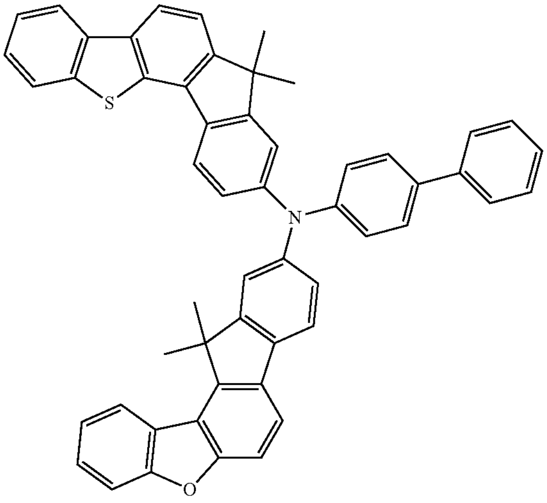
-continued
2-89
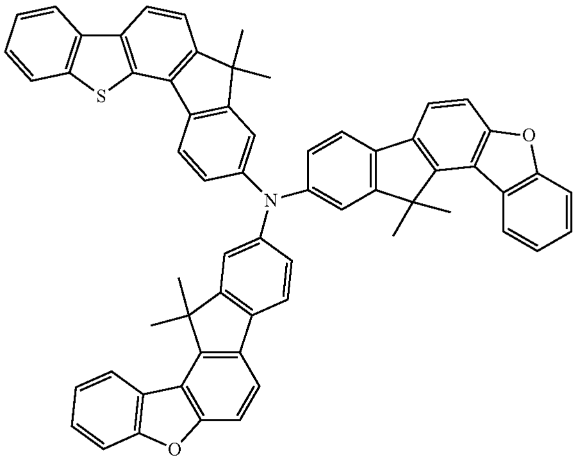
2-90
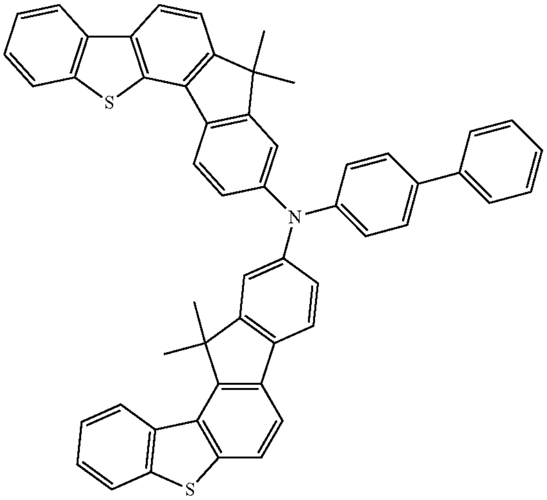
2-91
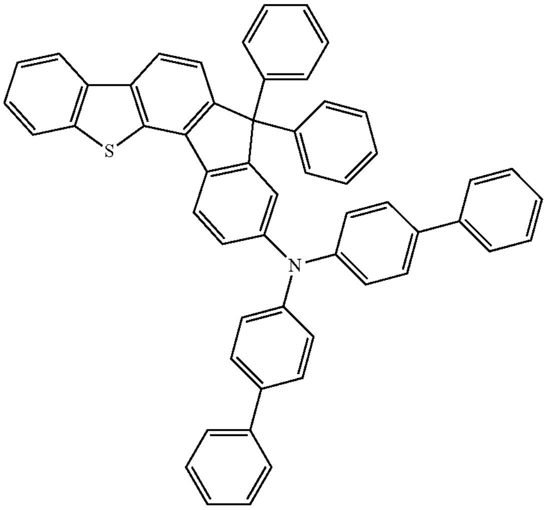

-continued
2-92
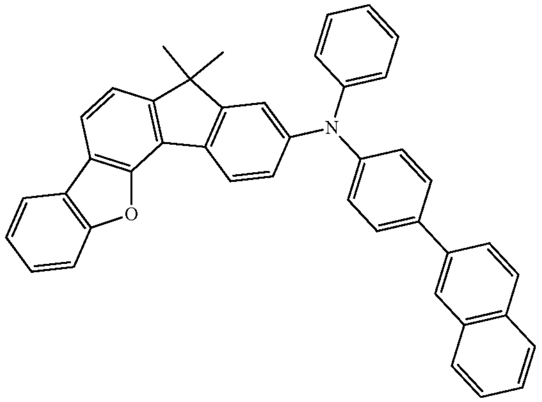
2-93
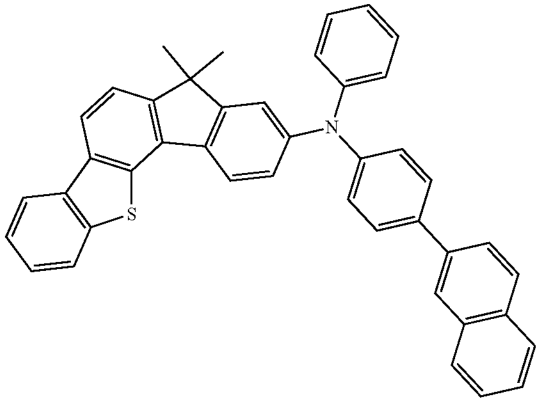
2-94
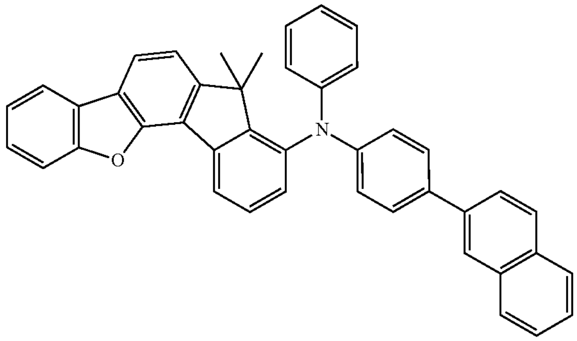
2-95
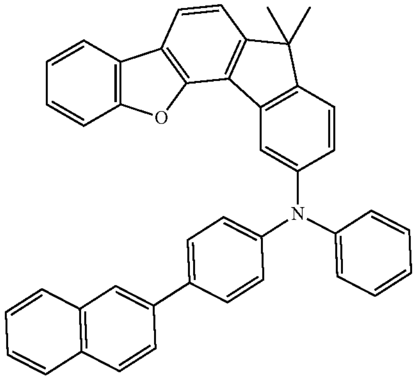
-continued
2-96
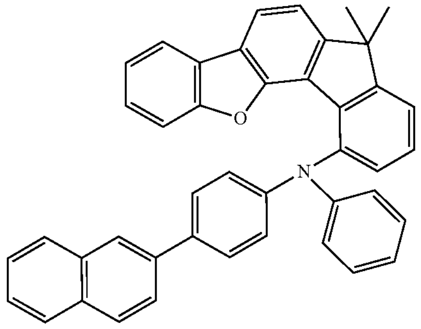
2-97
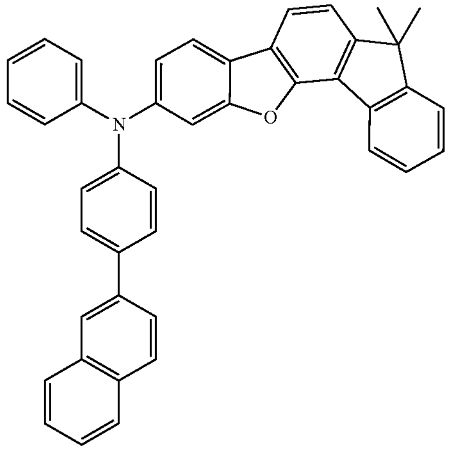
2-98
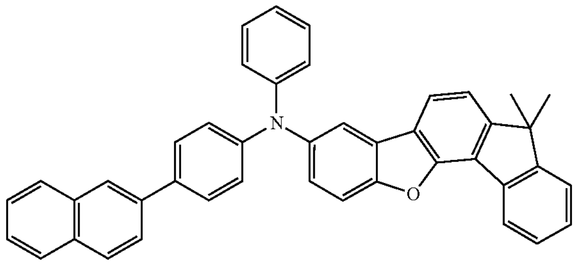
2-99
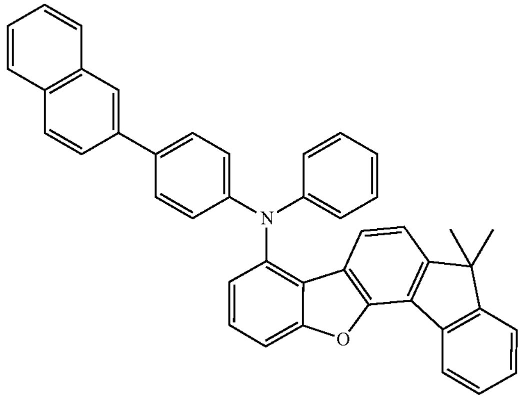

-continued
2-100
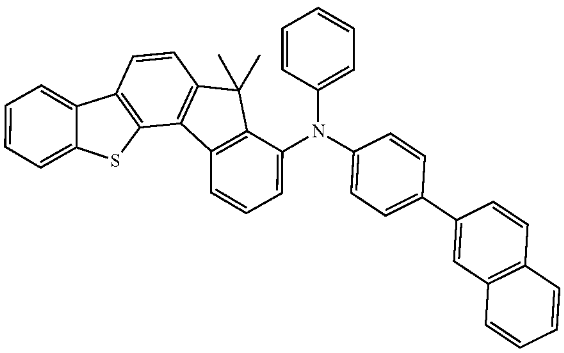
2-101
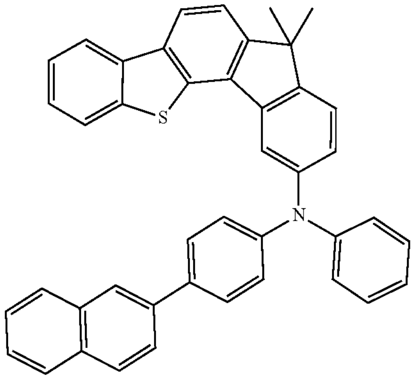
2-102
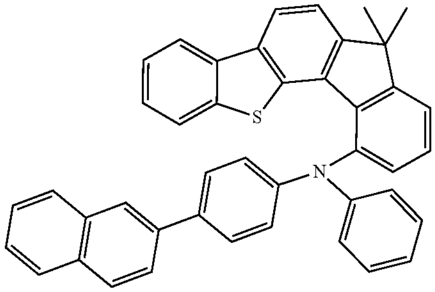
2-103
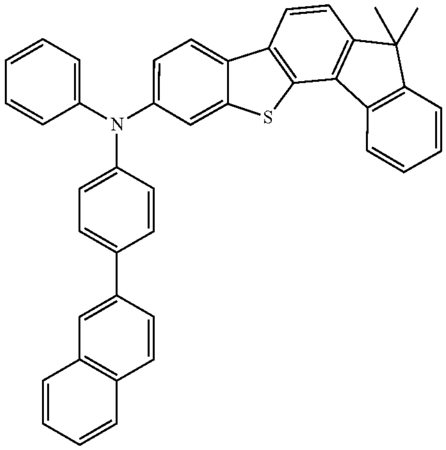
-continued
2-104
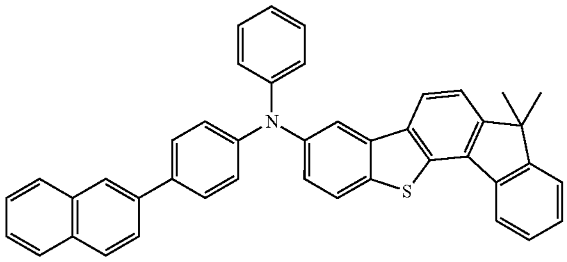
2-105
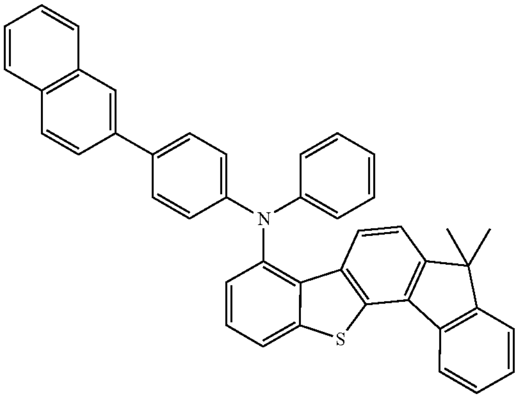
2-106
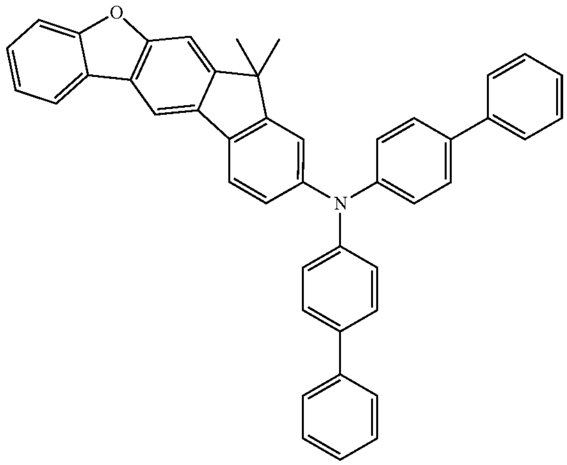

-continued
2-107
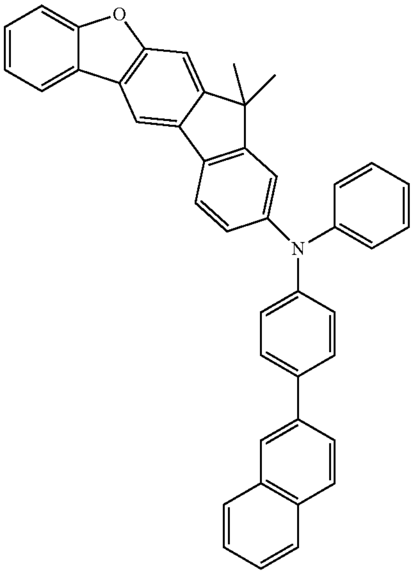
2-108
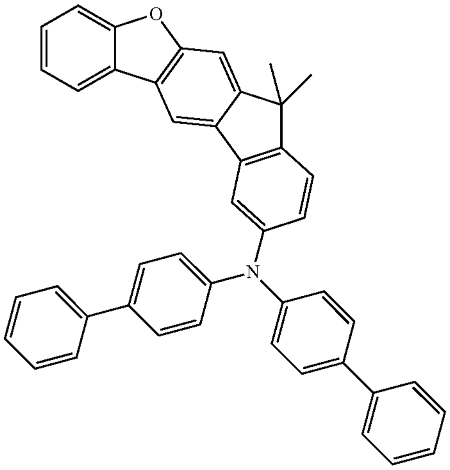
2-109
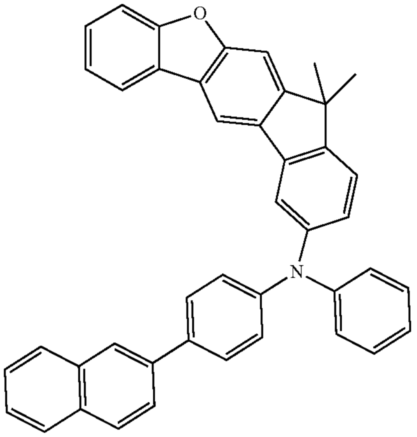
-continued
2-110
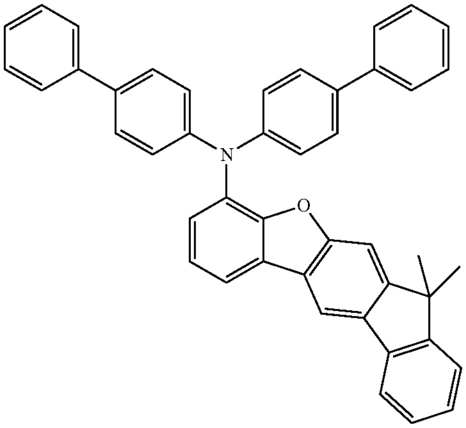
2-111
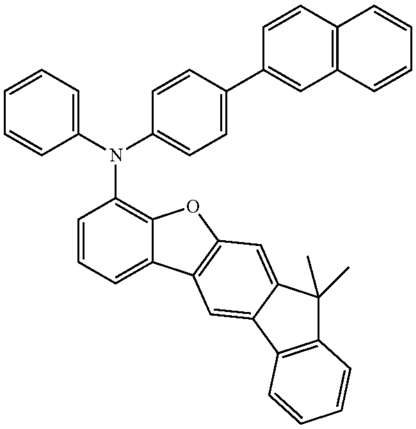
2-112
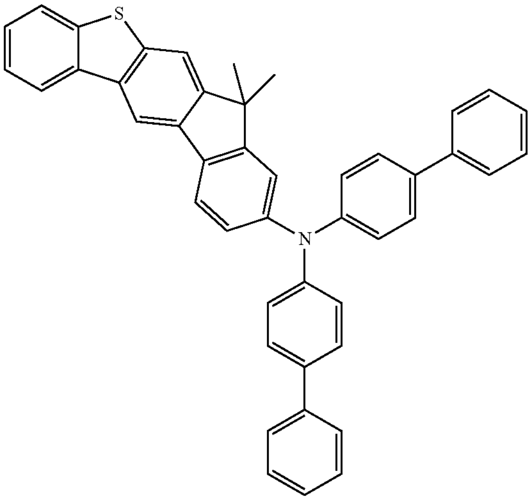

-continued
2-113
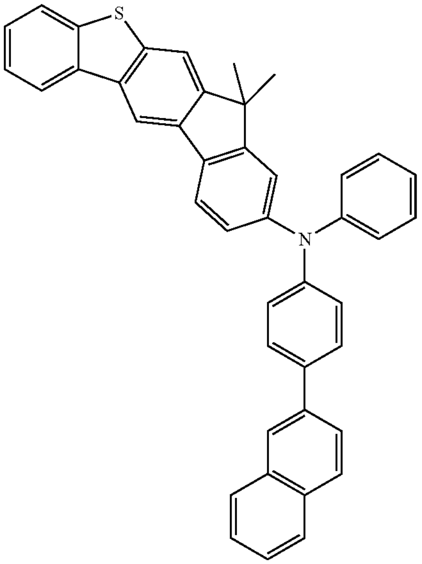
2-114
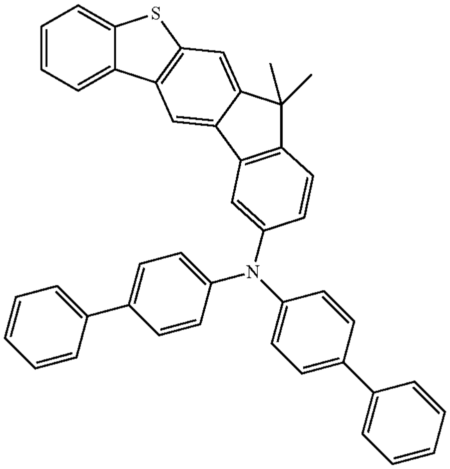
2-115
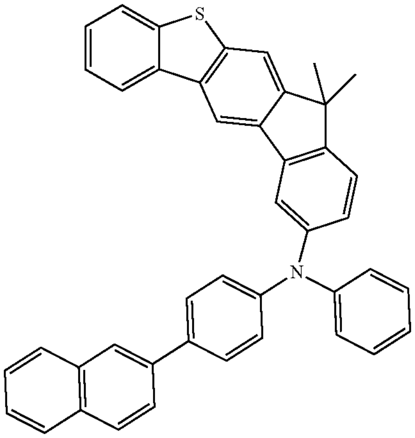
-continued
2-116
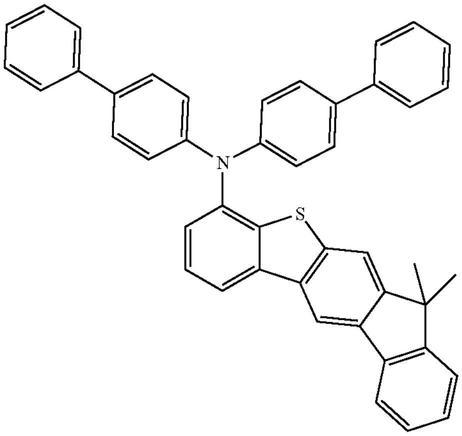
2-117
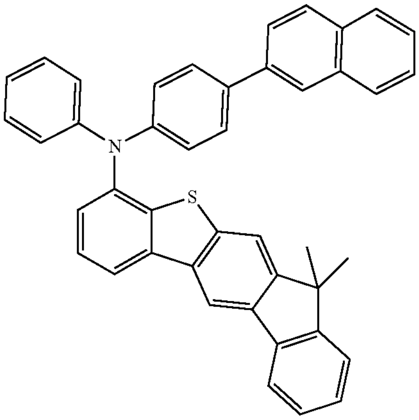
2-118
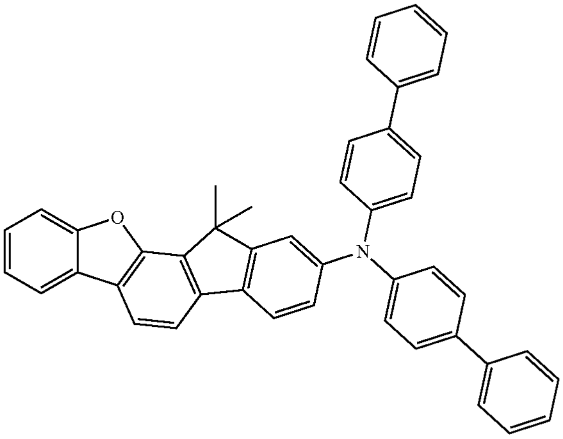

-continued
2-119
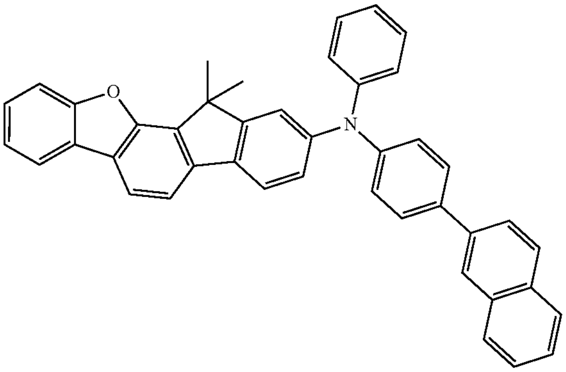
2-120
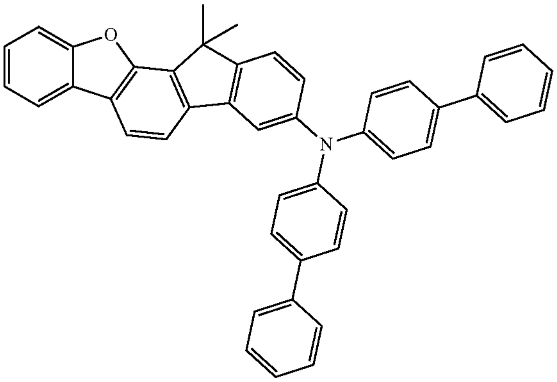
2-121
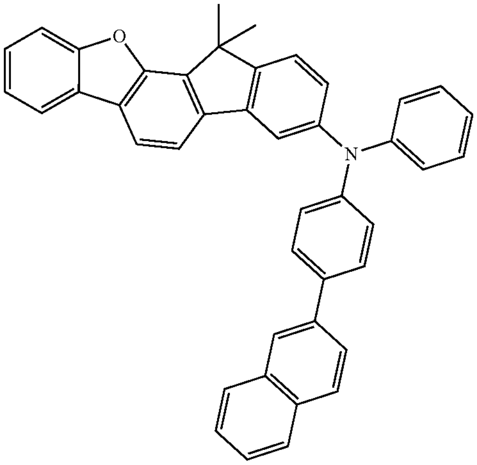
2-122
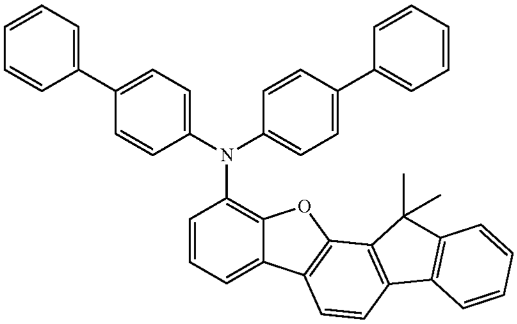
-continued
2-123
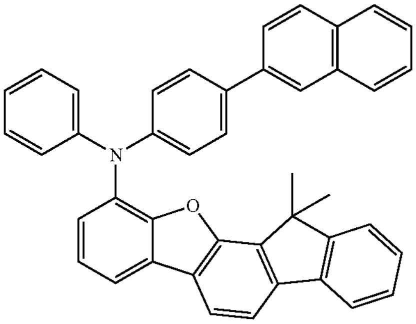
2-124
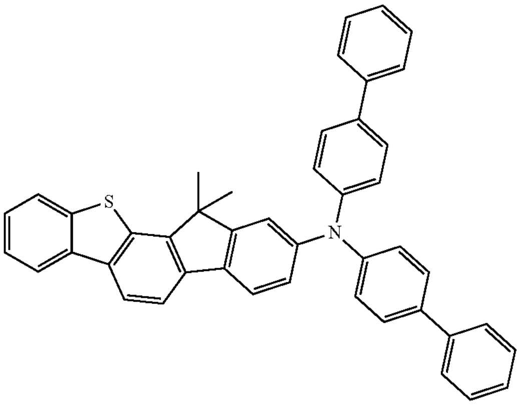
2-125
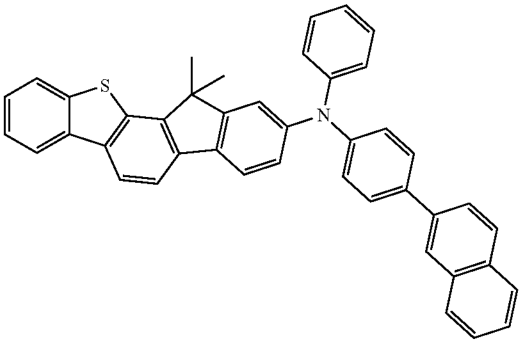
2-126
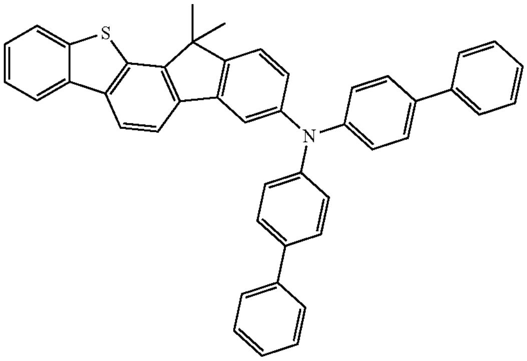

-continued
2-127
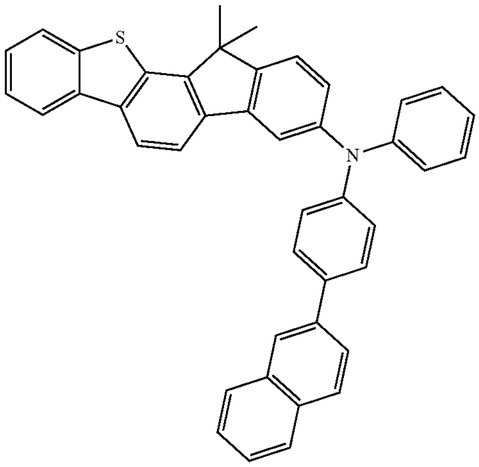
2-128
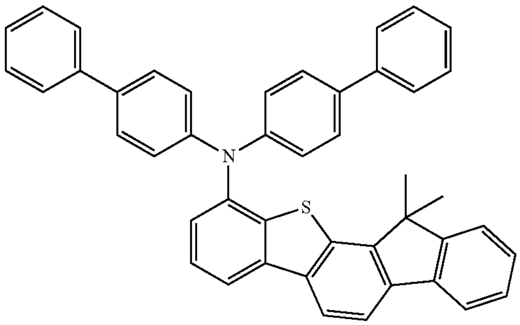
2-129
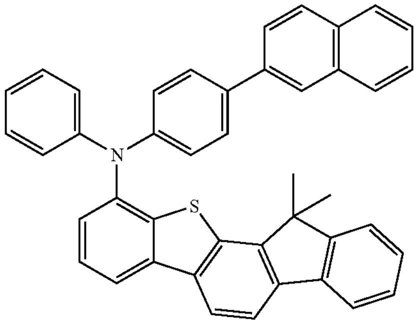
2-130
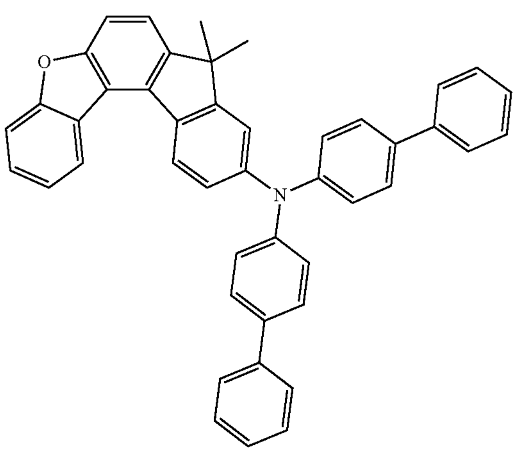
-continued
2-131
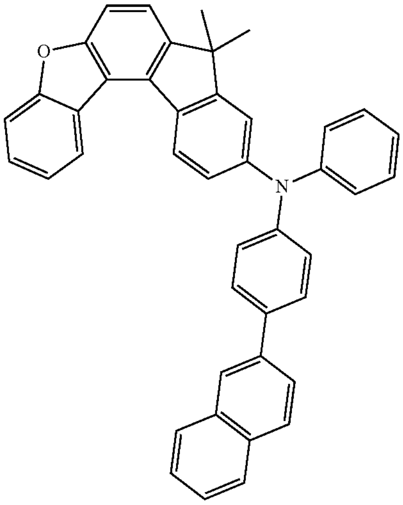
2-132
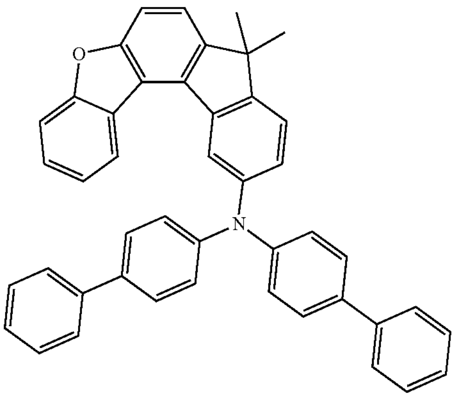
2-133
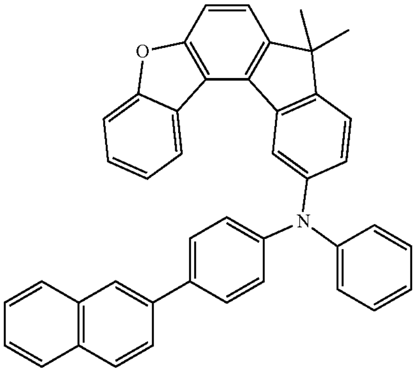

-continued
2-134
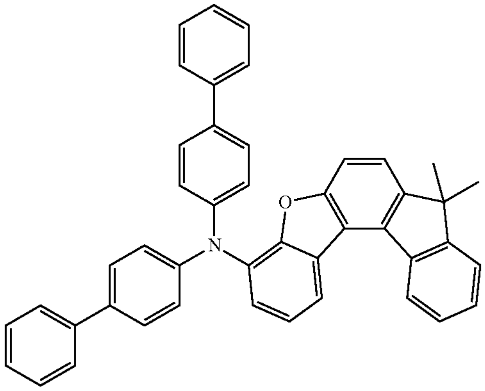
2-135
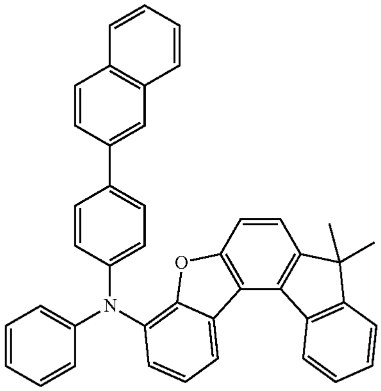
2-136
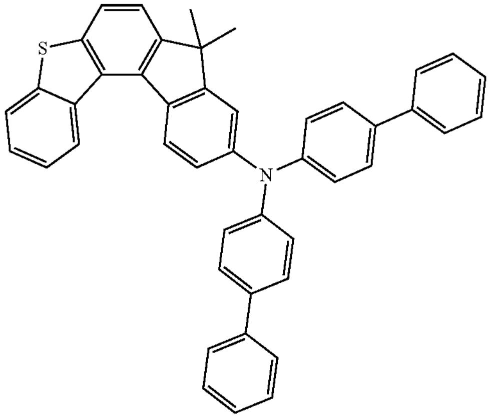
-continued
2-137
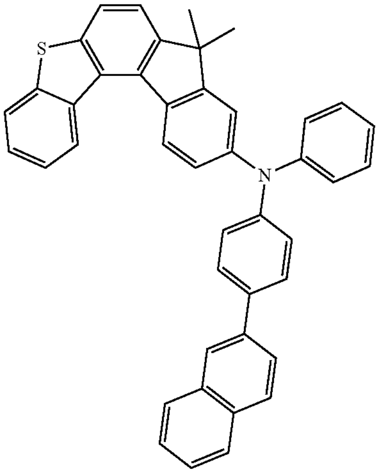
2-138
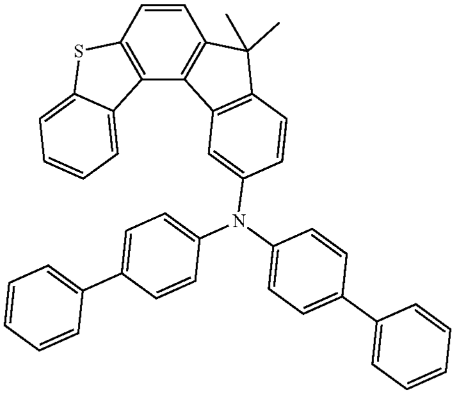
2-139
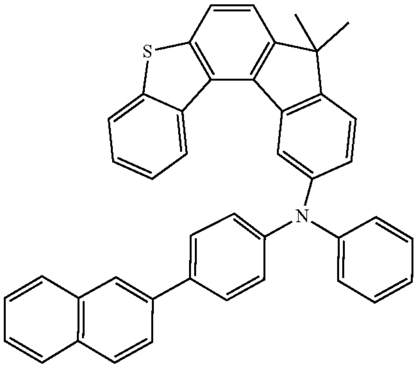

-continued
2-140
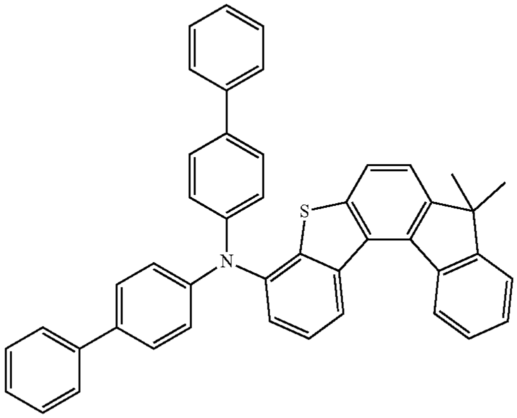
2-141
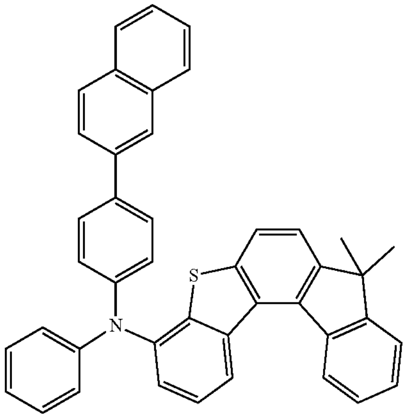
2-142
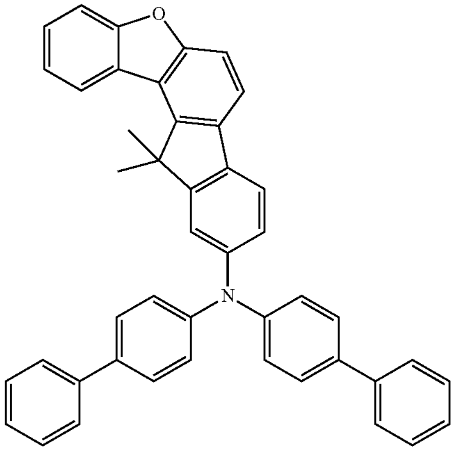
-continued
2-143
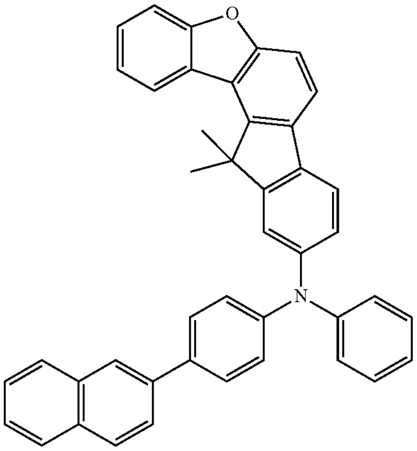
2-144
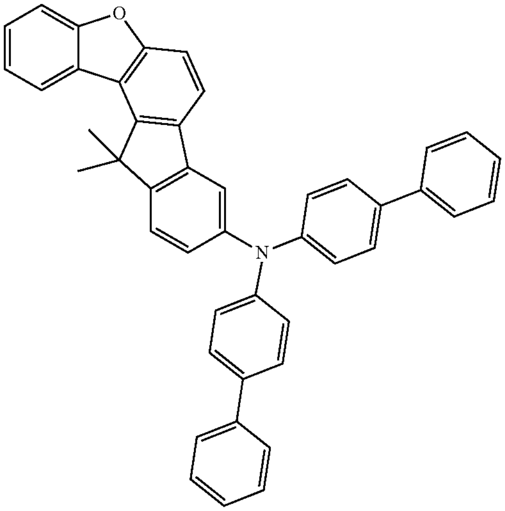
2-145
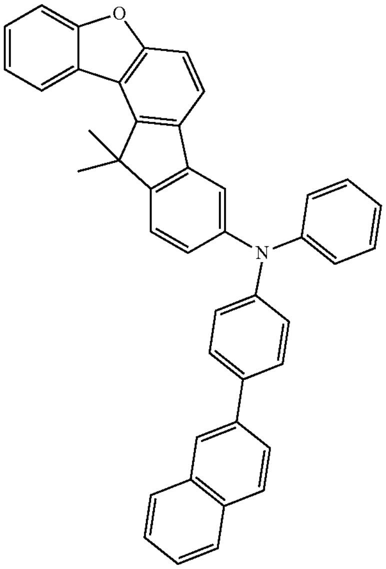

-continued
2-146
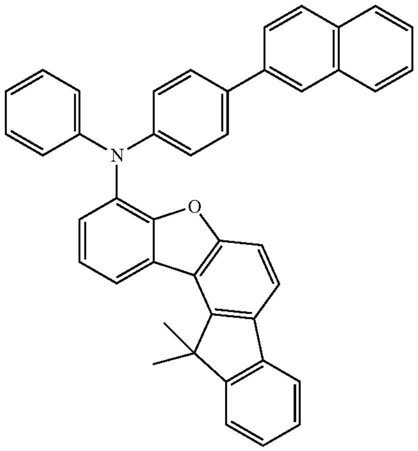
2-147
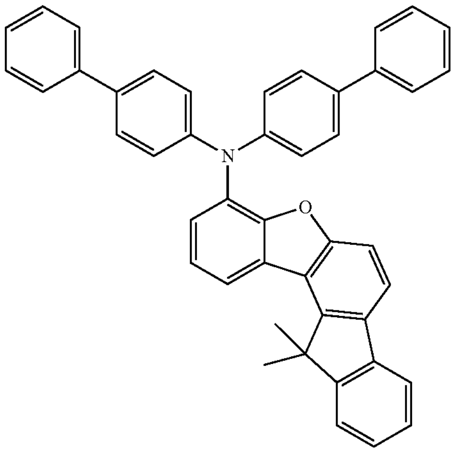
2-148
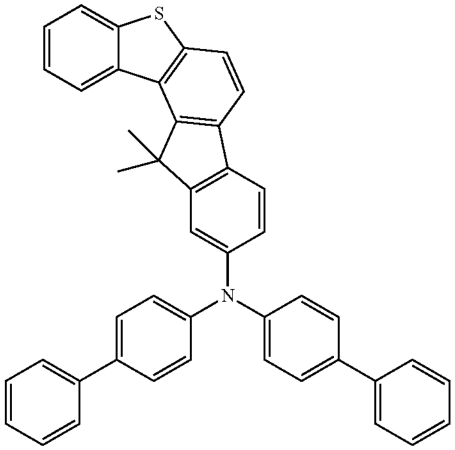
-continued
2-149
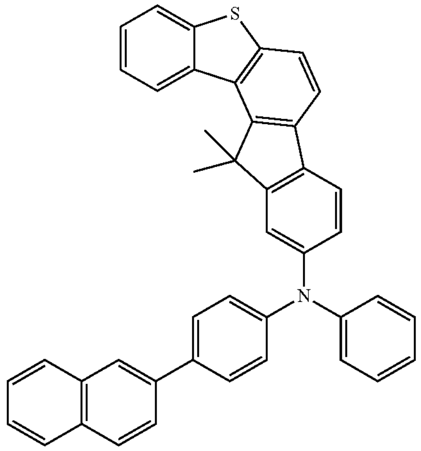
2-150
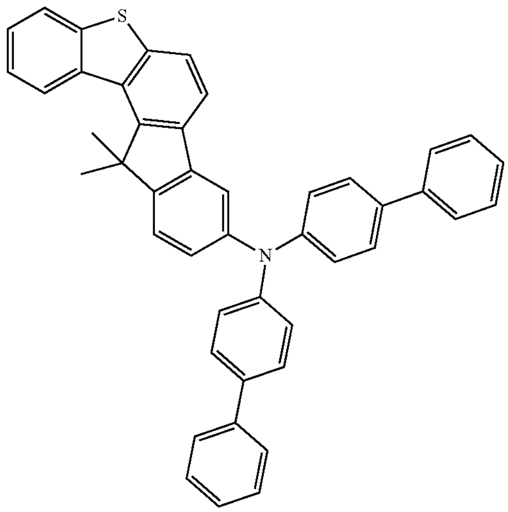
2-151
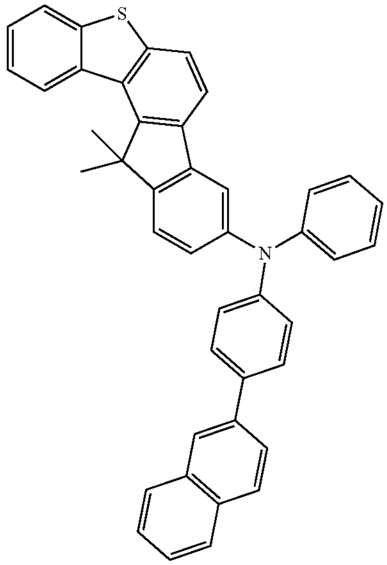

-continued
2-152
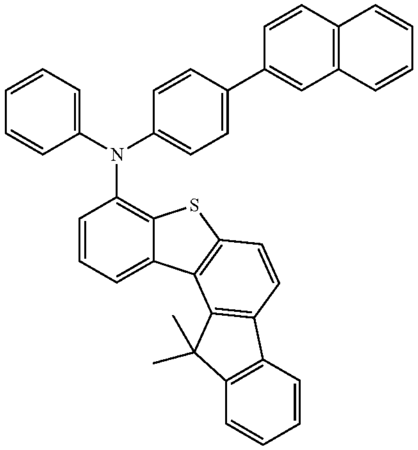
2-153
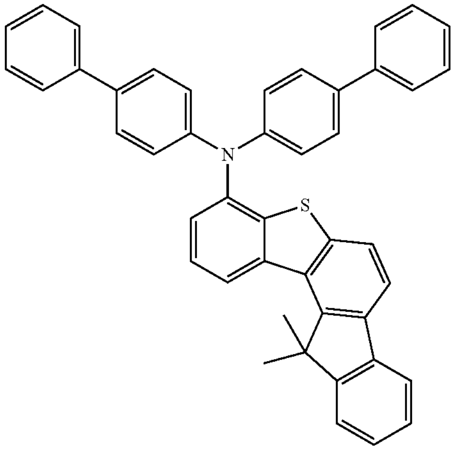
2-154
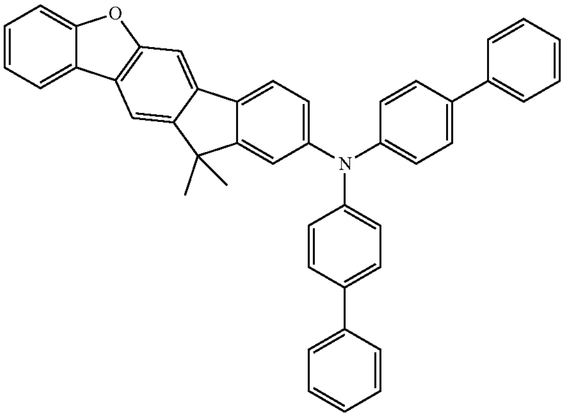
-continued
2-155
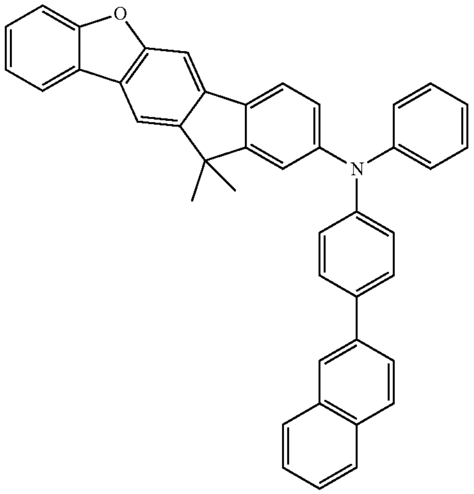
2-156
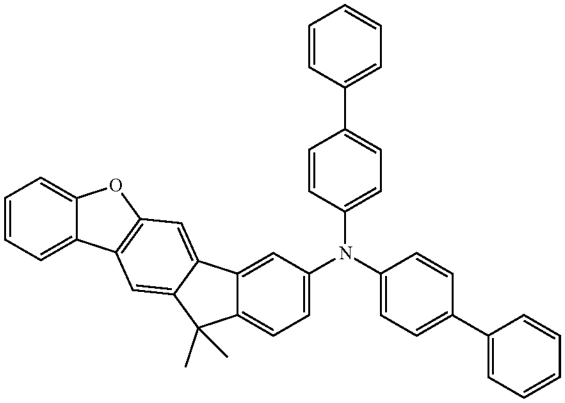
2-157
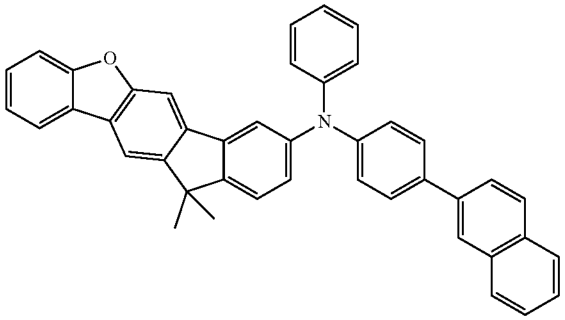

-continued
2-158
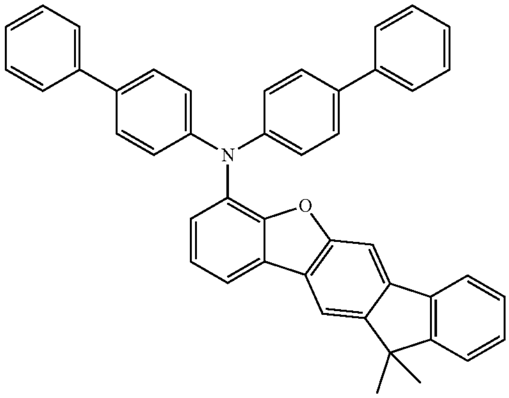
2-159
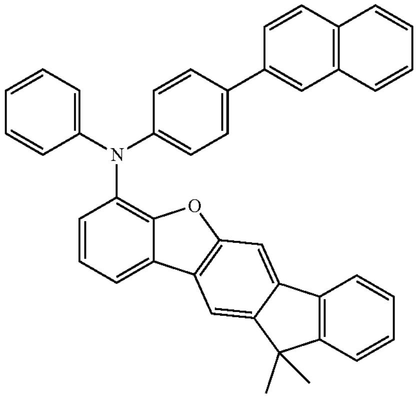
2-160
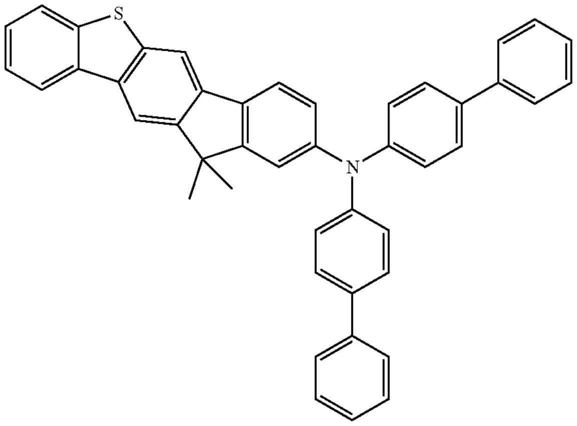
-continued
2-161
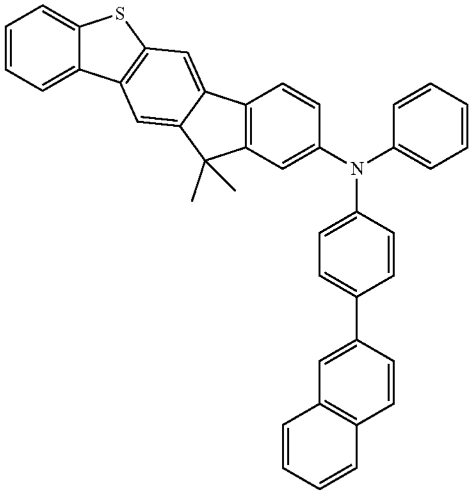
2-162
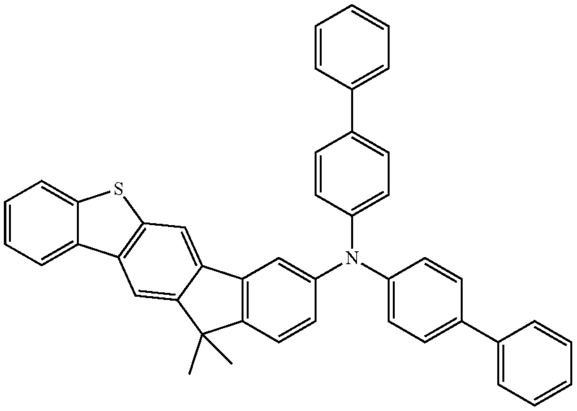
2-163
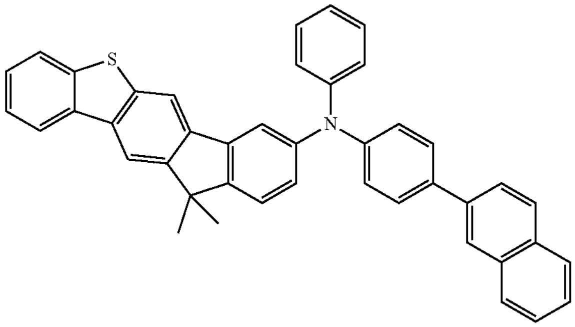

-continued
2-164
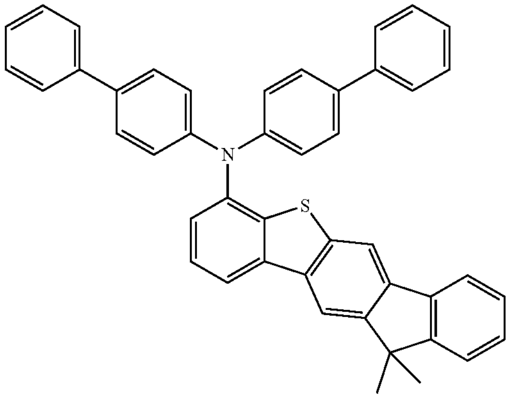
2-165
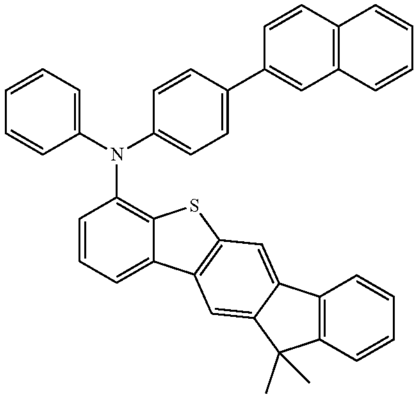
2-166
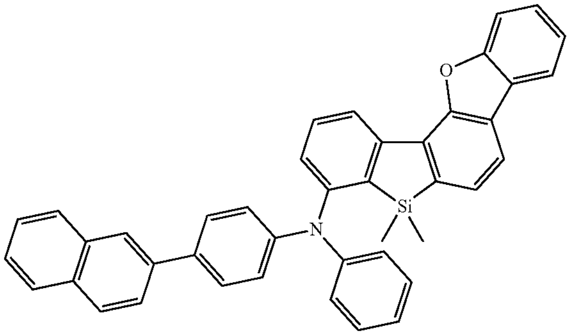
2-167
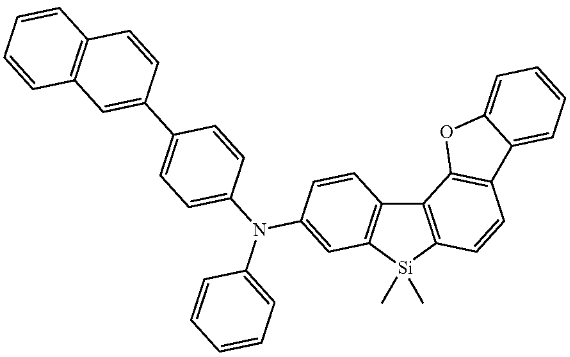
-continued
2-168
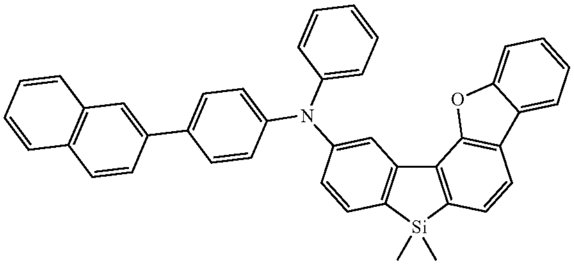
2-169
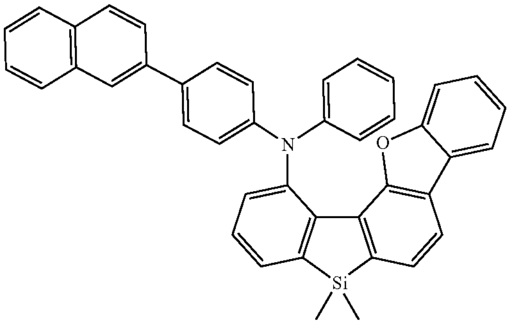
2-170
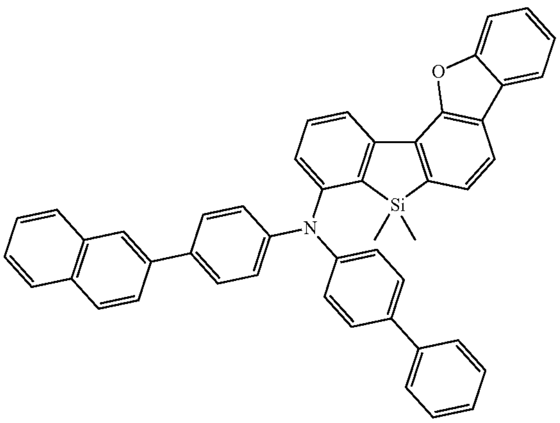
2-171
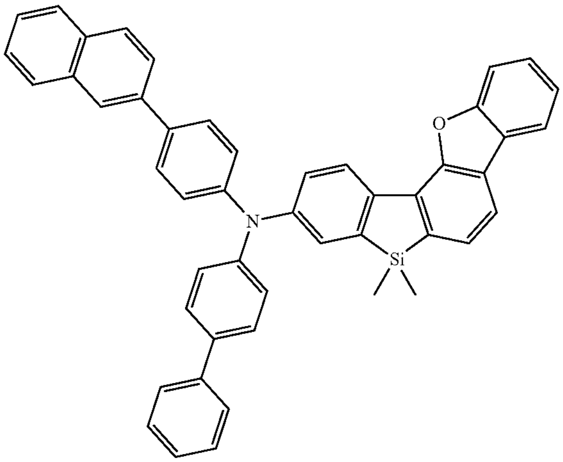

2-172
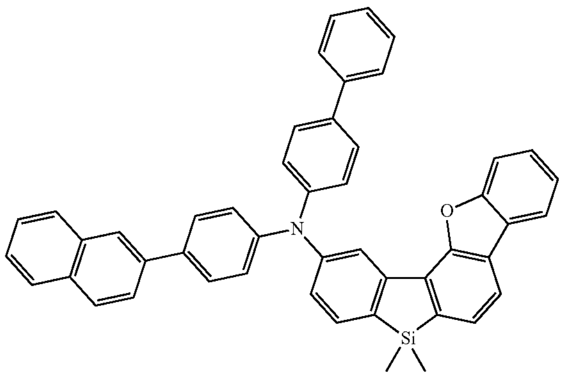
2-173
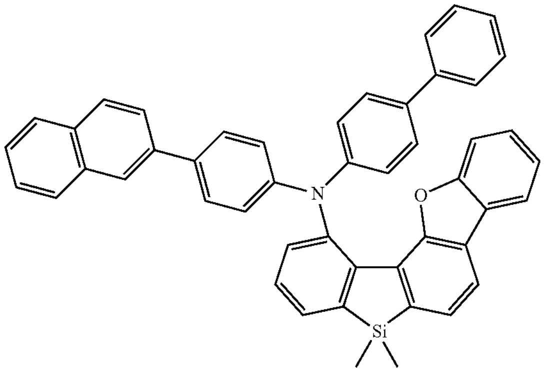
2-174
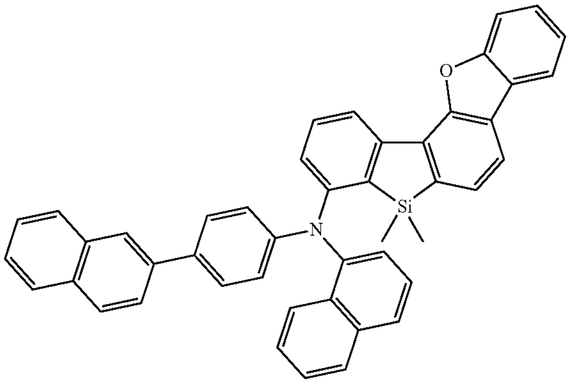
2-175
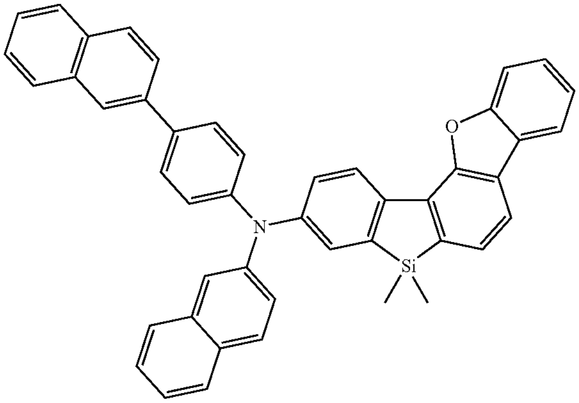
2-176
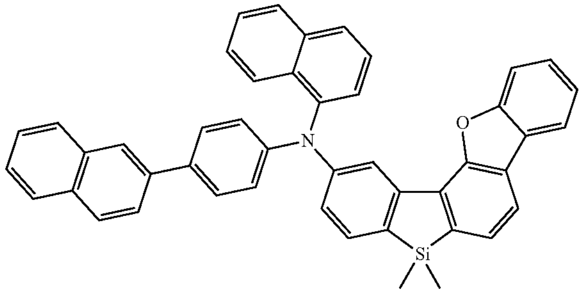
2-177
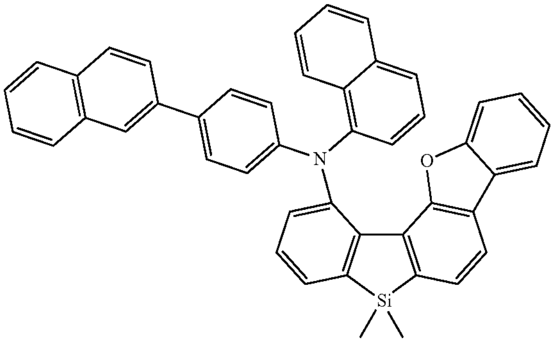
2-178
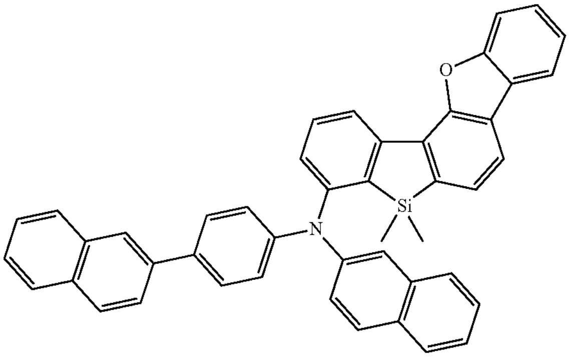
2-179
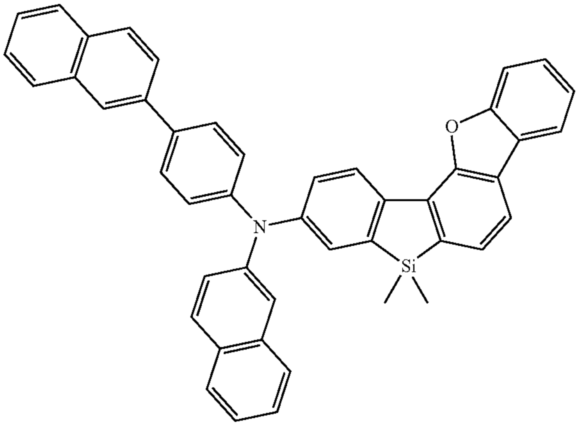

-continued
2-180
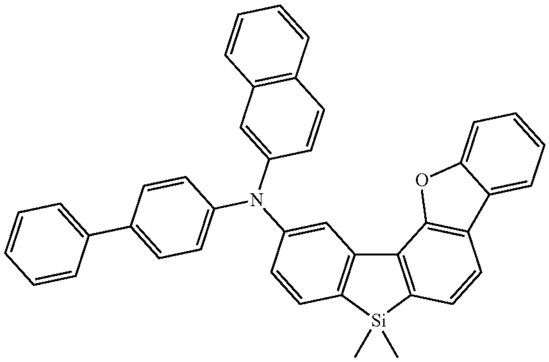
2-181
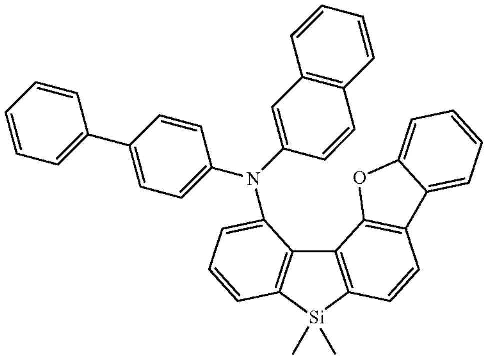
2-182
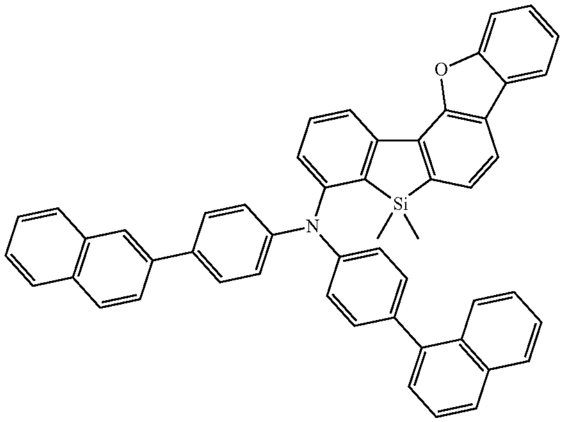
-continued
2-183
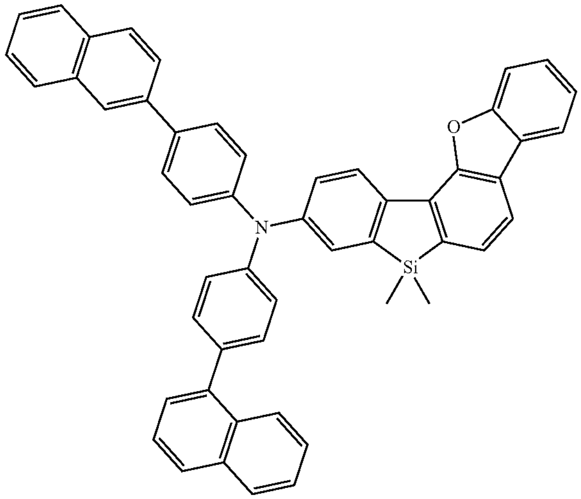
2-184
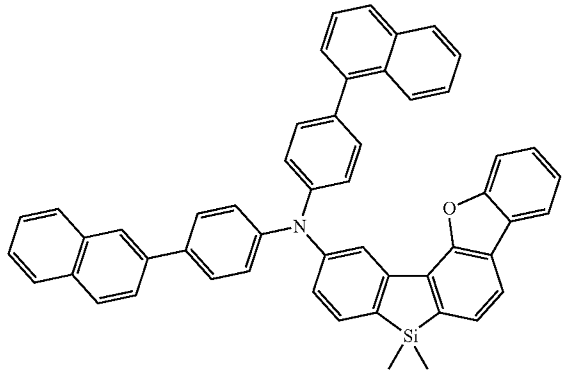
2-185
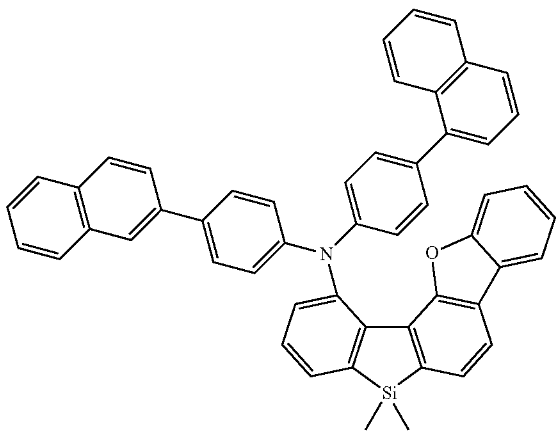

-continued
2-186
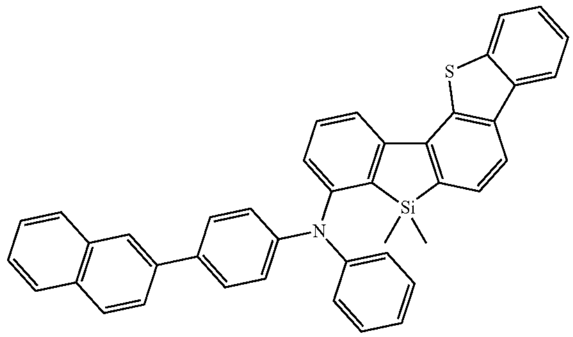
2-187
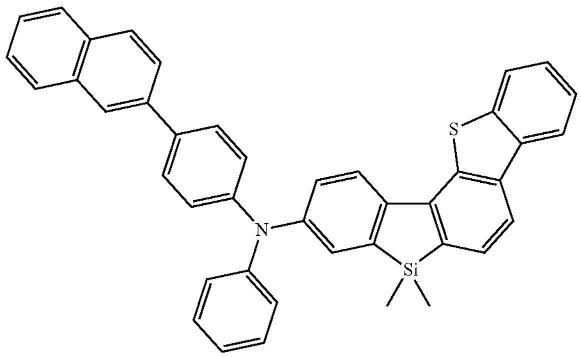
2-188
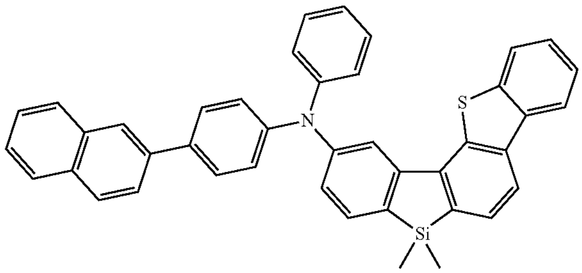
2-189
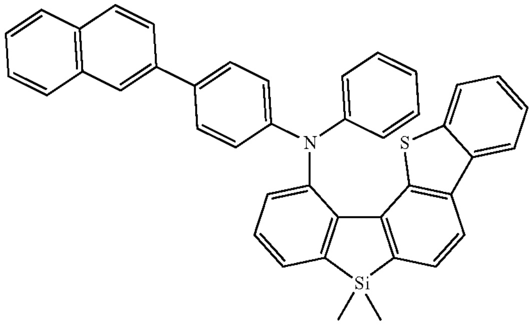
-continued
2-190
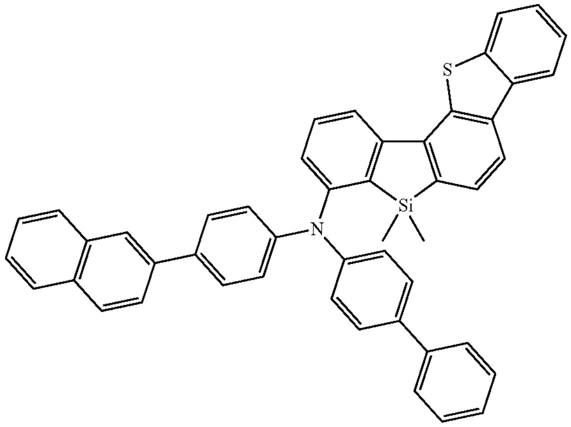
2-191
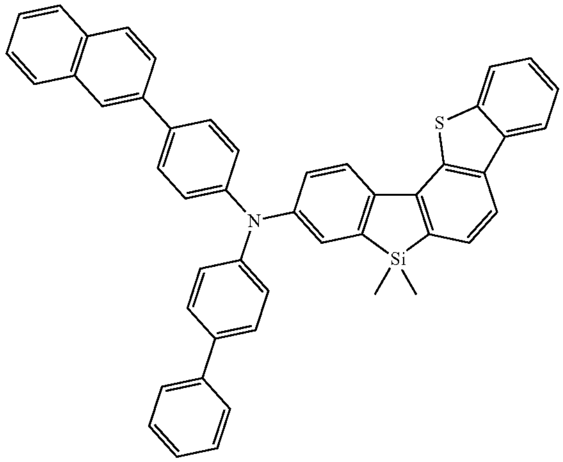
2-192
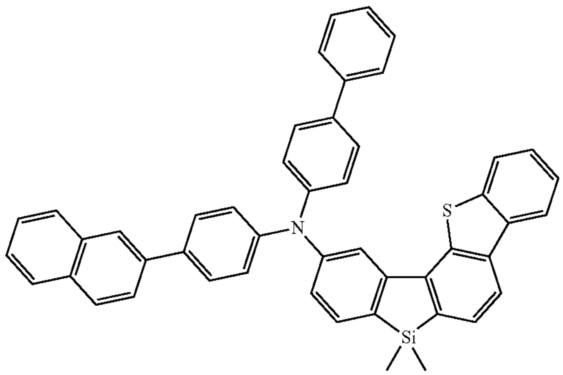

-continued
2-193
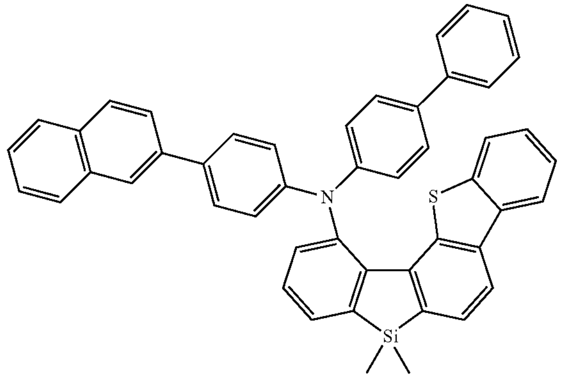
2-194
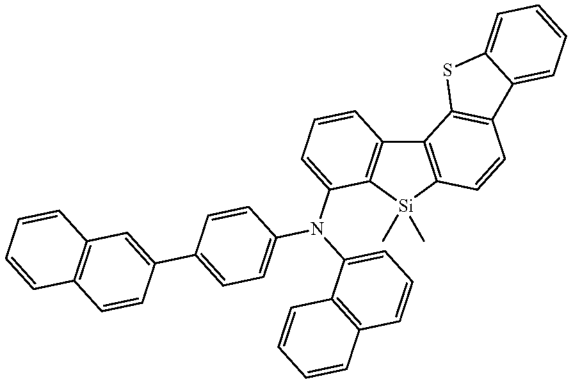
2-195
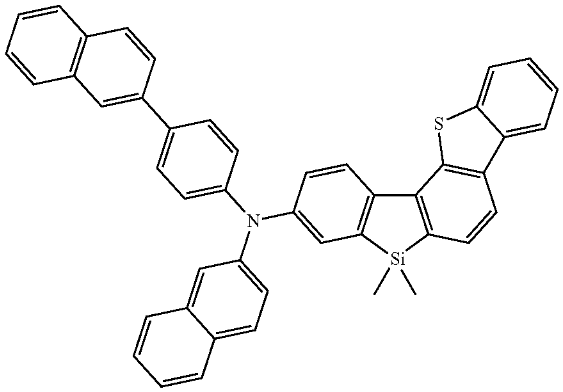
2-196
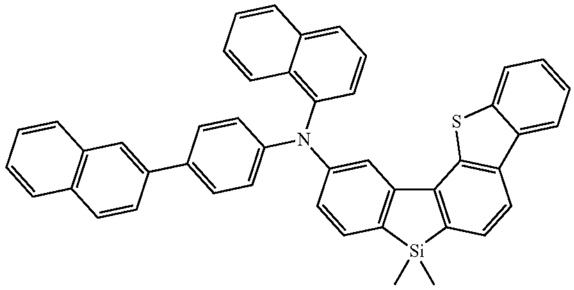
-continued
2-197
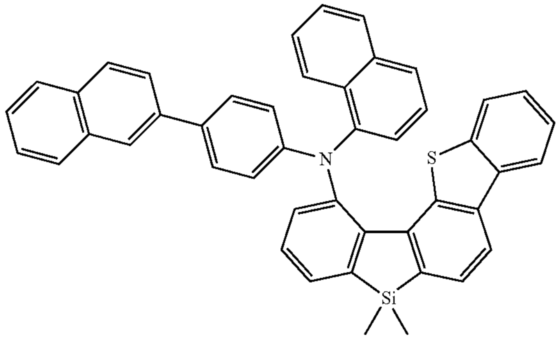
2-198
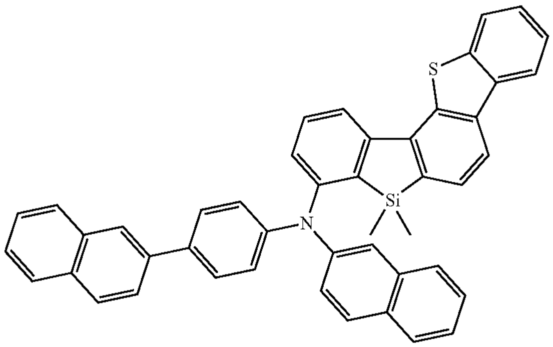
2-199
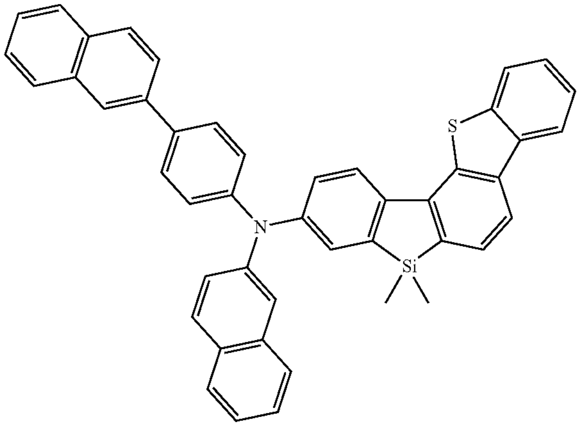
2-200
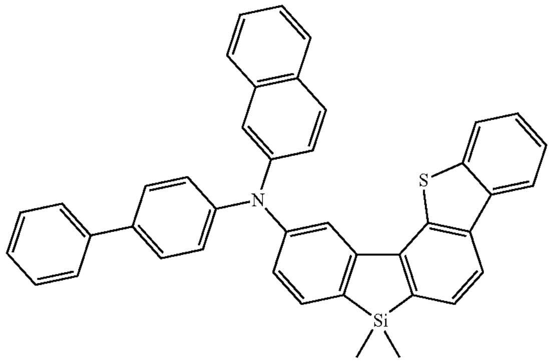

-continued
2-201
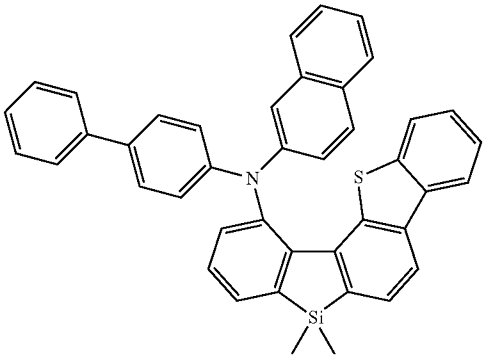
2-202
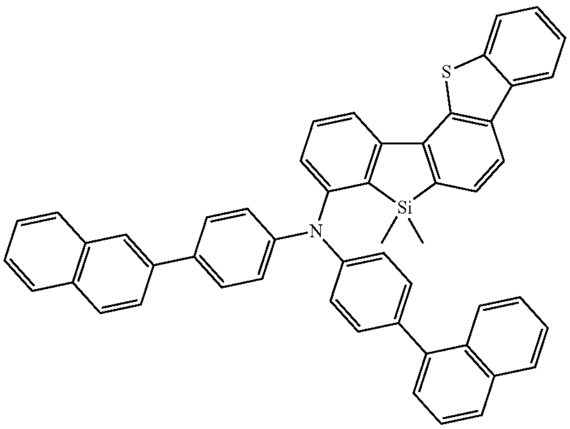
2-203
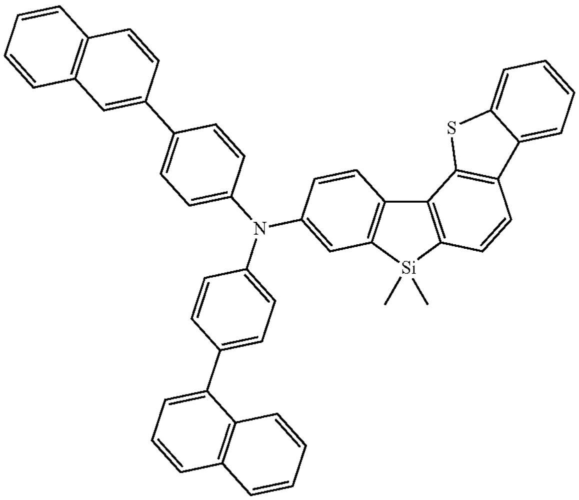
-continued
2-204
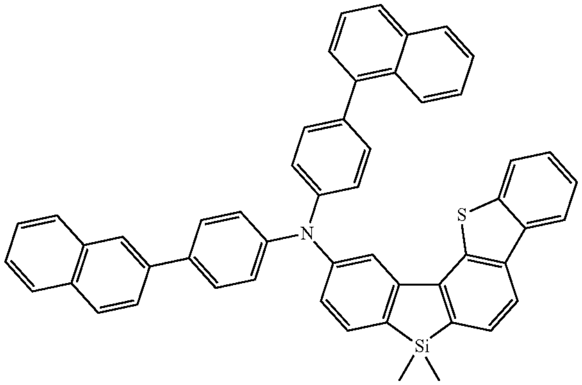
2-205
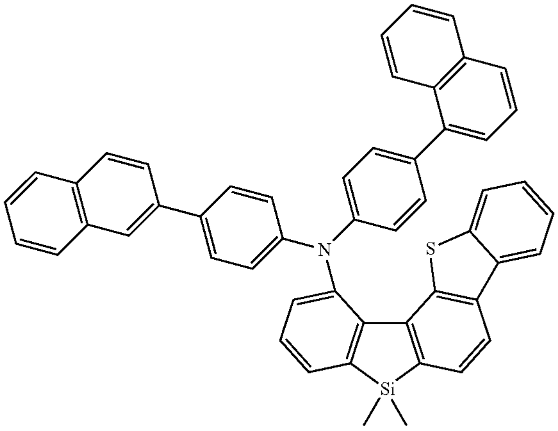
2-206
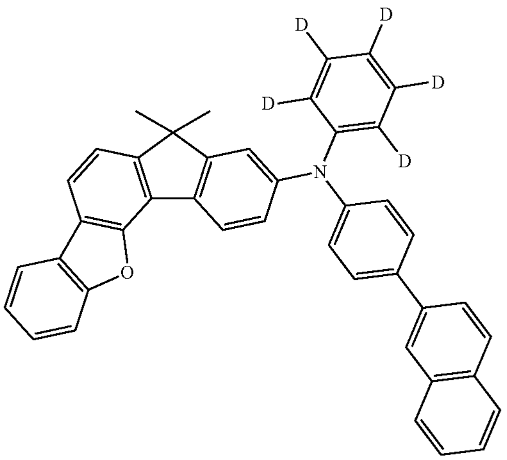

-continued
2-207
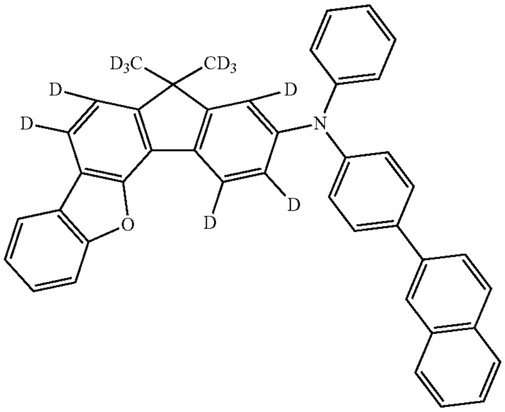
2-208
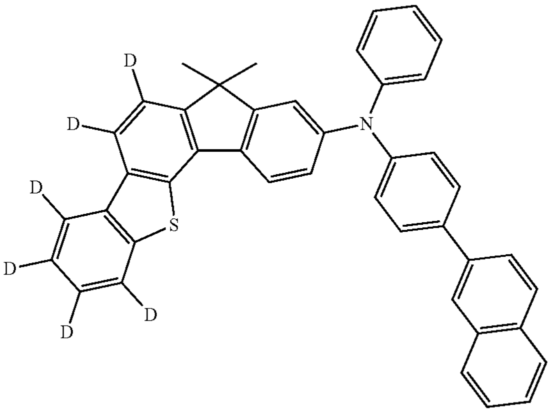
2-209
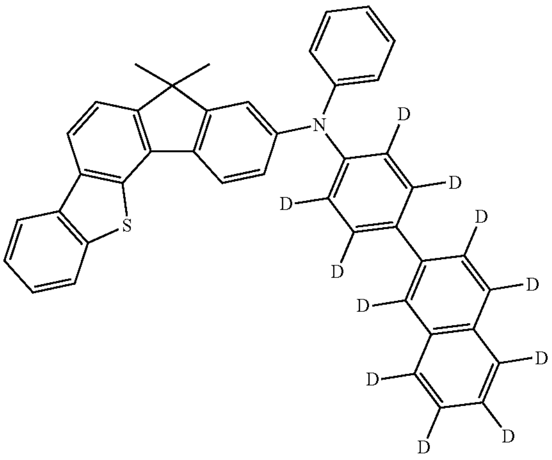
-continued
2-210
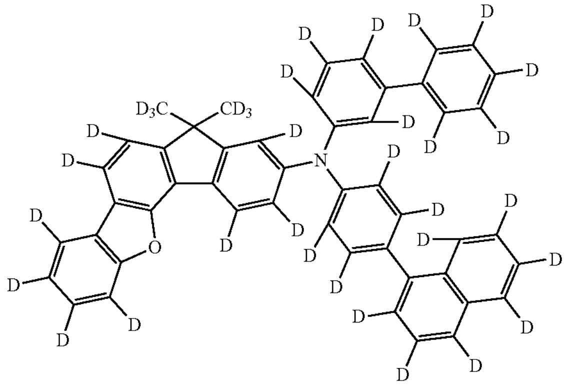
2-211
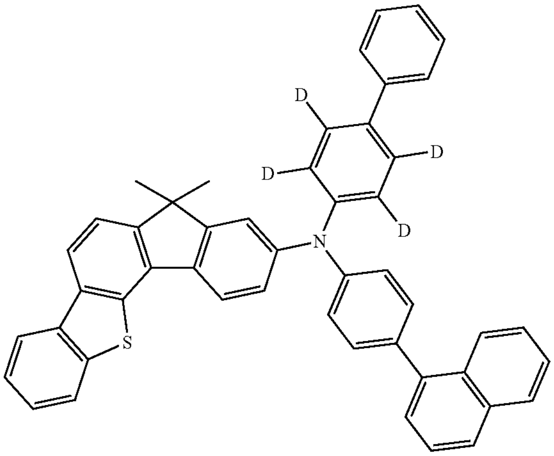
2-212
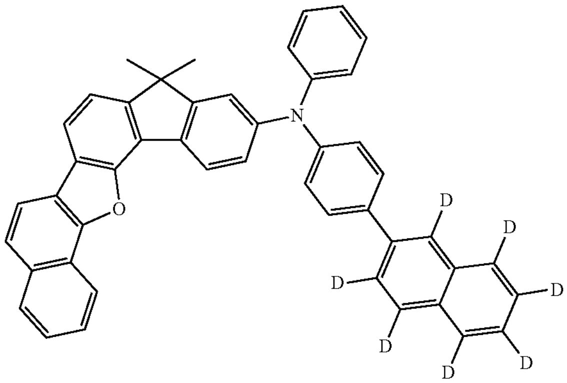

-continued 2-213

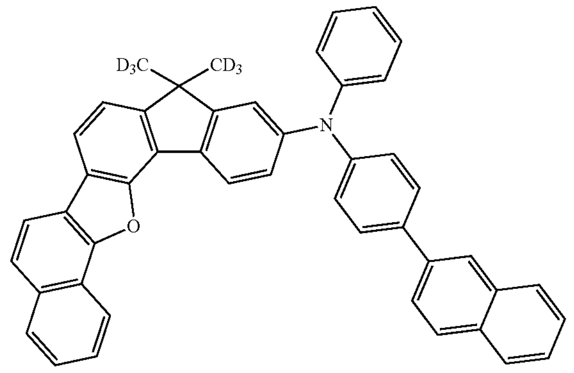

The first compound and the second compound may be included (e.g., mixed) in a weight ratio of about 1:99 to about 99:1. Within the range, a desirable weight ratio may be adjusted using an electron transport capability of the first compound and a hole transport capability of the second compound to realize bipolar characteristics and thus to improve efficiency and life-span. Within the range, they may be, e.g., included in a weight ratio of about 10:90 to about 90:10, or about 20:80 to about 80:20, e.g., a weight ratio of about 20:80 to about 70:30, about 20:80 to about 60:40, or about 30:70 to about 60:40. In an implementation, they may be included in a weight ratio of about 40:60, about 50:50, or about 60:40.

One or more compounds may be further included in addition to the aforementioned first and second compounds.

The aforementioned compound for the organic optoelectronic device or composition for the organic optoelectronic device may be a composition that further includes a dopant.

The dopant may be, e.g., a phosphorescent dopant, such as a red, green, or blue phosphorescent dopant, and may be, e.g., a red or green phosphorescent dopant.

The dopant is a material mixed with the compound or composition for an organic optoelectronic device in a small amount to cause light emission and may be generally a material such as a metal complex that emits light by multiple excitation into a triplet or more. The dopant may be, e.g., an inorganic, organic, or organic-inorganic compound, and one or more types thereof may be used.

Examples of the dopant may include a phosphorescent dopant and examples of the phosphorescent dopant may be an organic metal compound including Ir, Pt, Os, Ti, Zr, Hf, Eu, Tb, Tm, Fe, Co, Ni, Ru, Rh, Pd, or a combination thereof. The phosphorescent dopant may be, e.g., a compound represented by Chemical Formula Z.

$L^7MX^4$ [Chemical Formula Z]

In Chemical Formula Z, M may be a metal, and $L^7$ and $X^4$ may each independently be ligands forming a complex compound with M.

M may be, e.g., Ir, Pt, Os, Ti, Zr, Hf, Eu, Tb, Tm, Fe, Co, Ni, Ru, Rh, Pd, or a combination thereof, and $L^7$ and $X^4$ may be, e.g., a bidentate ligand.

The ligands represented by $L^7$ and $X^4$ may include, e.g., a ligand of Group A.

[Group A]

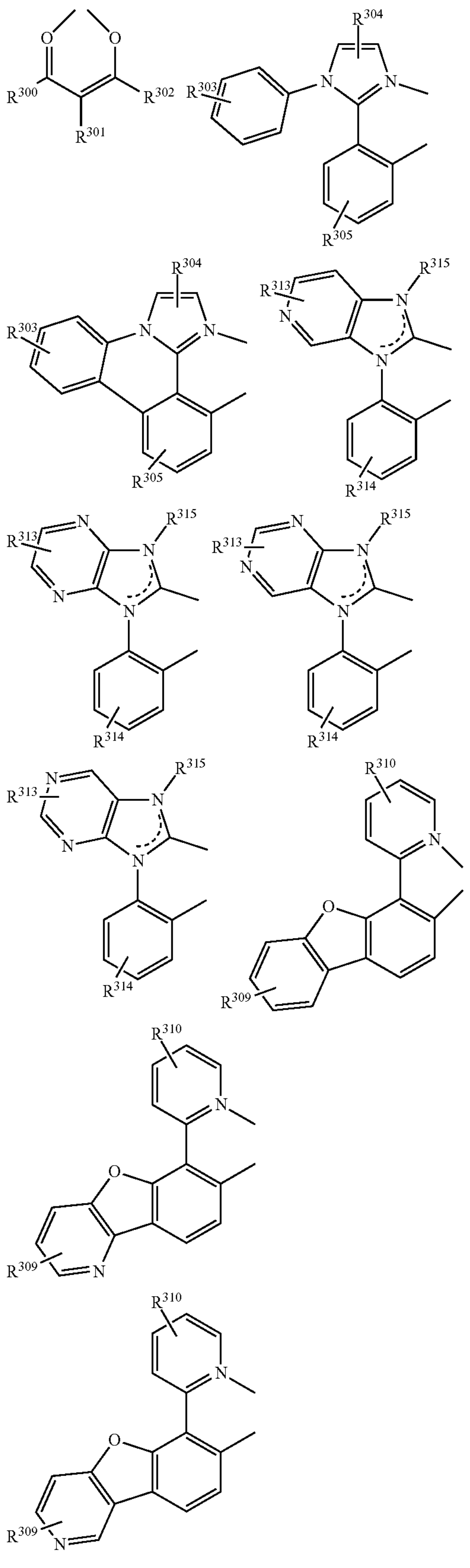

-continued

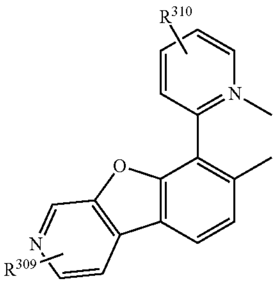

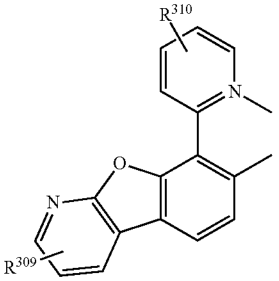

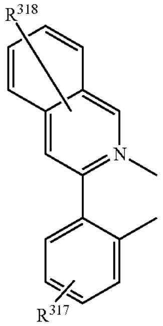

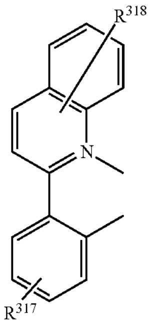

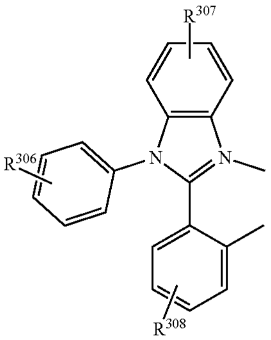

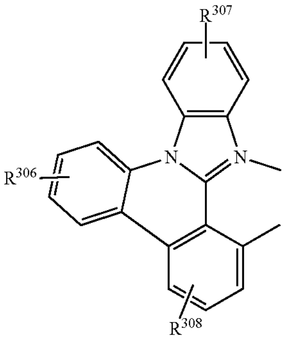

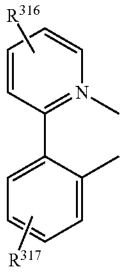

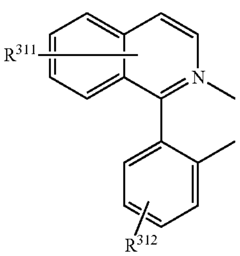

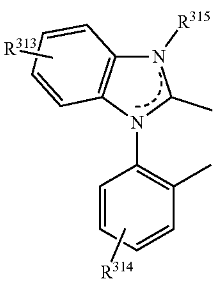

-continued

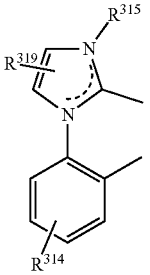

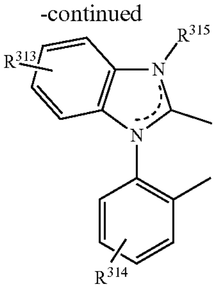

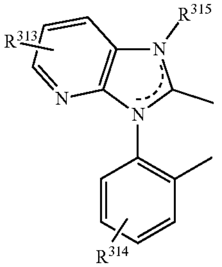

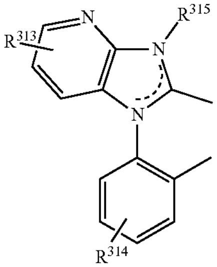

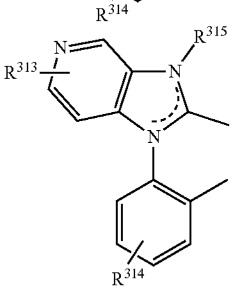

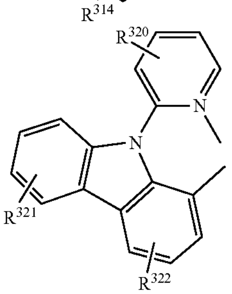

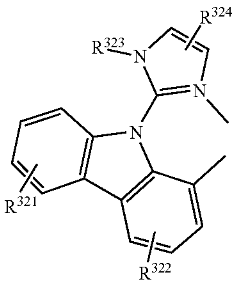

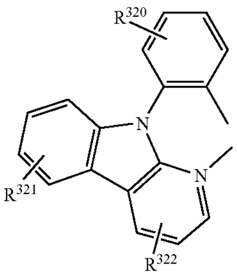

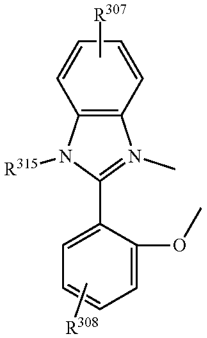

In Group A, $R^{300}$ to $R^{302}$ may each independently be, e.g., hydrogen, deuterium, a C1 to C30 alkyl group that is substituted or unsubstituted with a halogen, a C6 to C30 aryl group that is substituted or unsubstituted with a C1 to C30 alkyl, or a halogen, and $R^{303}$ to $R^{324}$ may each independently be, e.g., hydrogen, deuterium, halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, a substituted or unsubstituted C6 to C30 arylamino group, $SF_5$, a trialkylsilyl group having a substituted or unsubstituted C1 to C30 alkyl group, a dialkylarylsilyl group having a substituted or unsubstituted C1 to C30 alkyl group and a C6 to C30 aryl group, or a triarylsilyl group having a substituted or unsubstituted C6 to C30 aryl group.

In an implementation, the dopant may be represented by Chemical Formula V.

[Chemical Formula V]

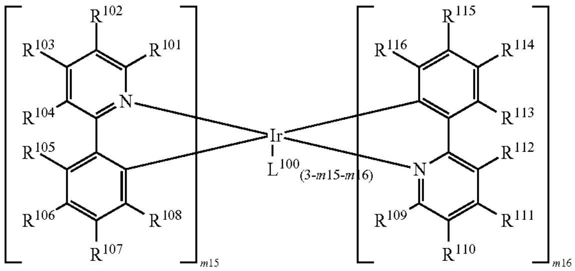

In Chemical Formula V, $R^{101}$ to $R^{116}$ may each independently be, e.g., hydrogen, deuterium, a substituted or unsubstituted C1 to C10 alkyl group, a substituted or unsubstituted C6 to C20 aryl group, or $-SiR^{132}R^{133}R^{134}$, $R^{132}$ to $R^{14}$ may each independently be, e.g., a C1 to C6 alkyl group, at least one of $R^{101}$ to $R^{116}$ may be, e.g., a functional group represented by Chemical Formula V-1, $L^{100}$ may be, e.g., a bidentate ligand of a monovalent anion, and is a ligand that coordinates to iridium through a lone pair of electrons of carbon or heteroatom, m15 and m16 may each independently be, e.g., an integer of 0 to 3, and m15+m16 may be, e.g., an integer of 1 to 3,

[Chemical Formula V-1]

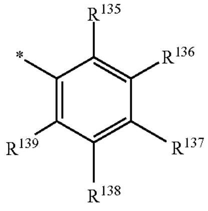

In Chemical Formula V-1, $R^{135}$ to $R^{139}$ may each independently be, e.g., hydrogen, deuterium, a substituted or unsubstituted C1 to C10 alkyl group, a substituted or unsubstituted C6 to C20 aryl group, or $-SiR^{132}R^{133}R^{134}$, $R^{132}$ to $R^{134}$ may each independently be, e.g., a C1 to C6 alkyl group, and

* means a portion linked to a carbon atom.

In an implementation, a dopant represented by Chemical Formula Z-1 may be included.

[Chemical Formula Z-1]

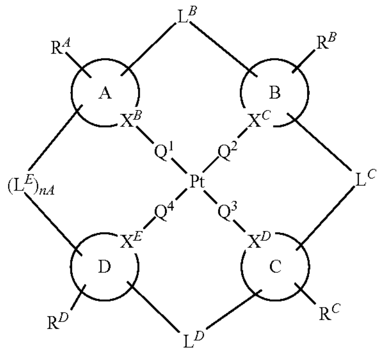

In Chemical Formula Z-1, rings A, B, C, and D may each independently be, e.g., a 5-membered or 6-membered carbocyclic or heterocyclic ring;

$R^A$, $R^B$, $R^C$, and $R^D$ may each independently be, e.g., mono-, di-, tri-, or tetra-substitution, or unsubstitution;

$L^B$, $L^C$, and $L^D$ may each independently be, e.g., a direct bond, BR, NR, PR, O, S, Se, C=O, S=O, $SO_2$, CRR', SiRR', GeRR', and a combination thereof, when nA is 1, $L^E$ may be a direct bond, BR, NR, PR, O, S, Se, C=O, S=O, $SO_2$, CRR', SiRR', GeRR', or a combination thereof, when nA is 0, $L^E$ does not exist; and $R^A$, $R^B$, $R^C$, $R^D$, R, and R' may each independently be, e.g., hydrogen, deuterium, a halogen, an alkyl group, a cycloalkyl group, a heteroalkyl group, an arylalkyl group, an alkoxy group, an aryloxy group, an amino group, a silyl group, an alkenyl group, a cycloalkenyl group, a heteroalkenyl group, an alkynyl group, an aryl group, a heteroaryl group, an acyl group, a carbonyl group, a carboxylic acid group, an ester group, a nitrile group, an isonitrile group, a sulfanyl group, a sulfinyl group, a sulfonyl group, a phosphino group, and a combination thereof, any adjacent $R^A$, $R^B$, $R^C$, $R^D$, R, and R' are optionally linked to each other to provide a ring; $X^B$, $X^C$, $X^D$, and $X^E$ may each independently be, e.g., carbon and nitrogen; and $Q^1$, $Q^2$, $Q^3$, and $Q^4$ may each independently be, e.g., oxygen or a direct bond.

The dopant according to an embodiment may be a platinum complex, and may be, e.g., represented by Chemical Formula VI.

[Chemical Formula VI]

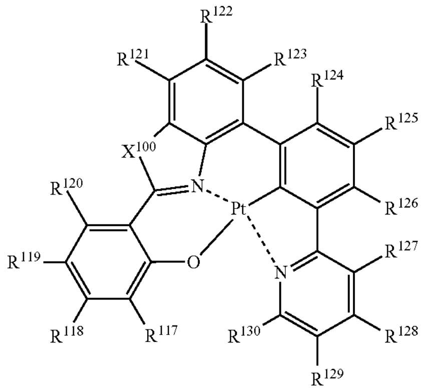

In Chemical Formula VI, $X^{100}$ may be, e.g., O, S, or $NR^{131}$, $R^{117}$ to $R^{131}$ may each independently be, e.g., hydrogen, deuterium, a substituted or unsubstituted C1 to C10 alkyl group, a substituted or unsubstituted C6 to C20 aryl group, or —$SiR^{132}R^{133}R^{134}$, $R^{132}$ to $R^{134}$ may each independently be, e.g., a C1 to C6 alkyl group, and at least one of $R^{117}$ to $R^{131}$ may be, e.g., —$SiR^{132}R^{133}R^{134}$ or a tert-butyl group.

Hereinafter, an organic optoelectronic device including the aforementioned compound for the organic optoelectronic device or composition for the organic optoelectronic device is described.

The organic optoelectronic device may be a suitable device to convert electrical energy into photoenergy and vice versa, and may be, e.g., an organic photoelectric device, an organic light emitting diode, an organic solar cell, and an organic photo-conductor drum.

Herein, an organic light emitting diode as one example of an organic optoelectronic device is described referring to the drawing.

The FIGURE is a cross-sectional view illustrating an organic light emitting diode according to an embodiment.

Referring to the FIGURE, an organic light emitting diode 100 according to an embodiment may include an anode 120 and a cathode 110 facing each other and an organic layer 105 between the anode 120 and cathode 110.

The anode 120 may be made of a conductor having a large work function to help hole injection, and may be e.g., a metal, a metal oxide, or a conductive polymer. The anode 120 may be, e.g., a metal such as nickel, platinum, vanadium, chromium, copper, zinc, gold, or the like or an alloy thereof; a metal oxide such as zinc oxide, indium oxide, indium tin oxide (ITO), indium zinc oxide (IZO), or the like; a combination of a metal and an oxide such as ZnO and Al or $SnO_2$ and Sb; a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be, e.g., a metal such as magnesium, calcium, sodium, potassium, titanium, indium, yttrium, lithium, gadolinium, aluminum silver, tin, lead, cesium, barium, or the like, or an alloy thereof; or a multi-layer structure material such as LiF/Al, $LiO_2$/Al, LiF/Ca, and $BaF_2$/Ca.

The organic layer 105 may include the aforementioned compound for the organic optoelectronic device or composition for the organic optoelectronic device.

The organic layer 105 may include a light emitting layer 130 and the light emitting layer 130 may include the aforementioned compound for the organic optoelectronic device or composition for the organic optoelectronic device.

The composition for the organic optoelectronic device further including the dopant may be, e.g., a red light emitting composition.

The light emitting layer 130 may include, e.g., the aforementioned first compound and second compound as a phosphorescent host, respectively.

The organic layer may further include a charge transport region in addition to the light emitting layer.

The charge transport region may be, e.g., a hole transport region 140.

The hole transport region 140 may further increase hole injection or hole mobility between the anode 120 and the light emitting layer 130 and block electrons. In an implementation, the hole transport region 140 may include a hole transport layer between the anode 120 and the light emitting layer 130, and a hole transport auxiliary layer between the light emitting layer 130 and the hole transport layer and a compound of Group B may be included in at least one of the hole transport layer and the hole transport auxiliary layer.

[Group B]

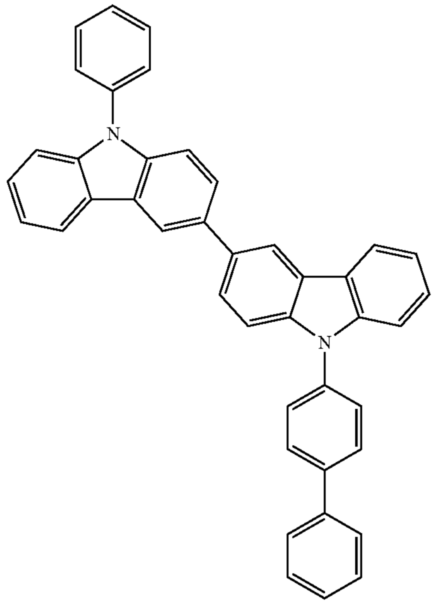

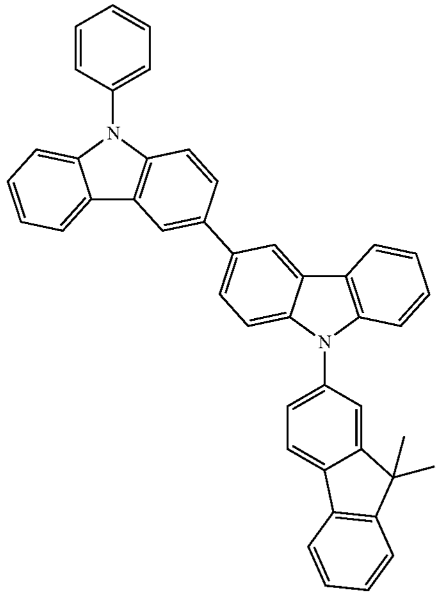

-continued
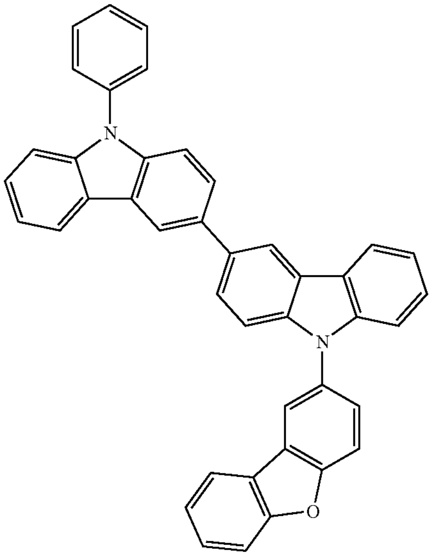
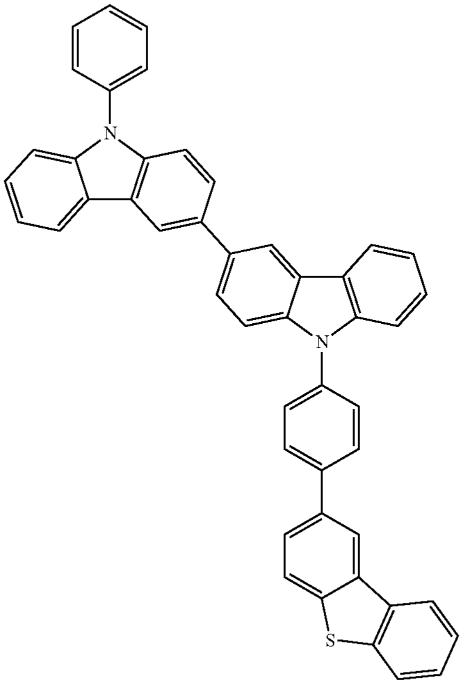
-continued
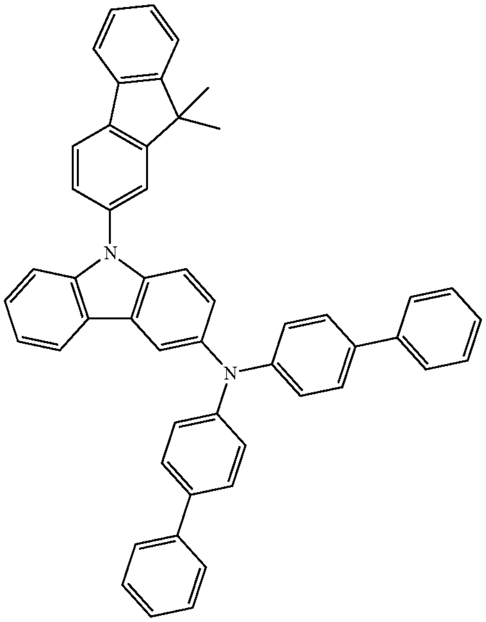
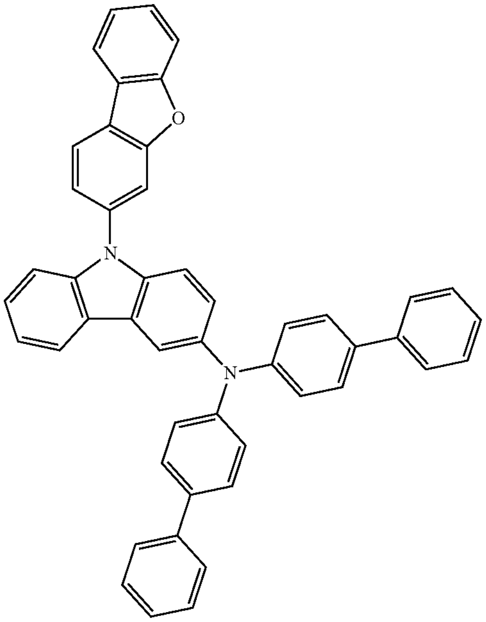

-continued
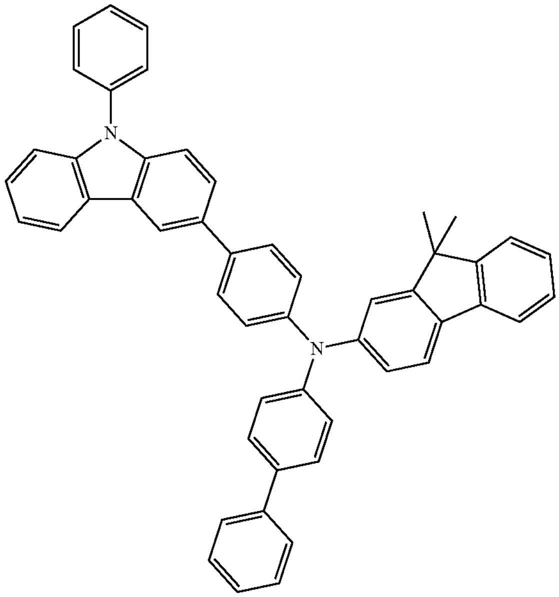
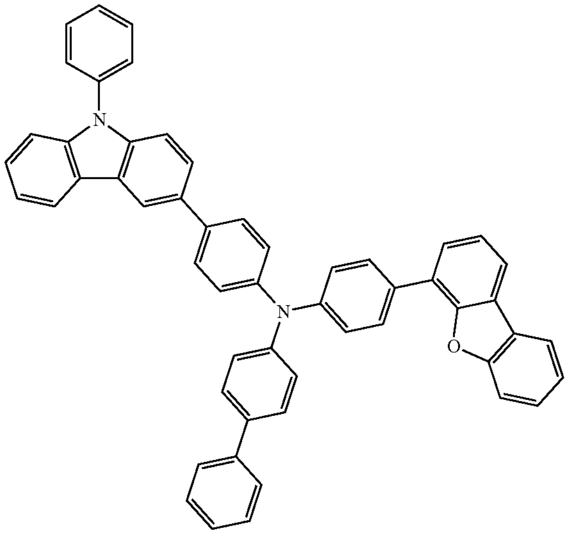
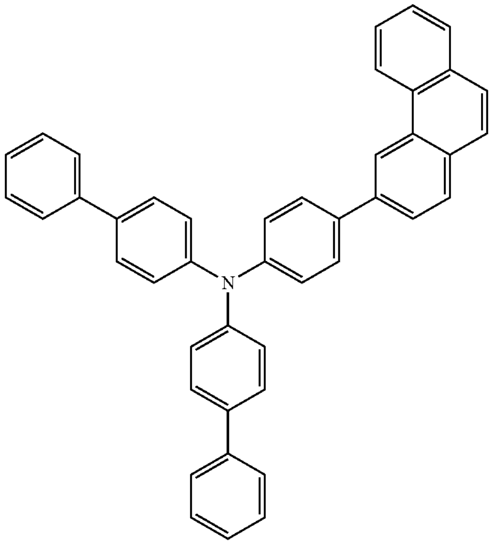
-continued
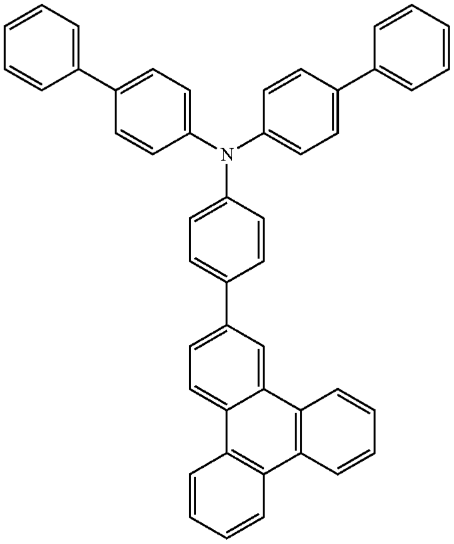
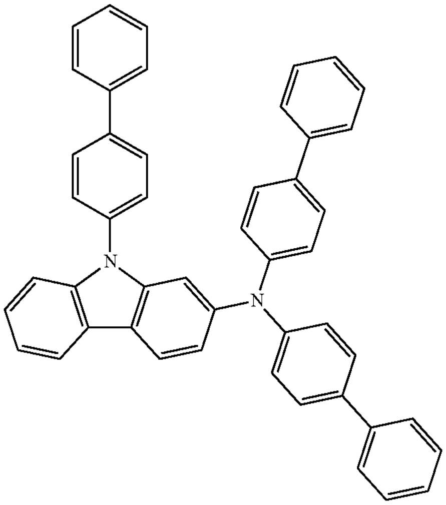
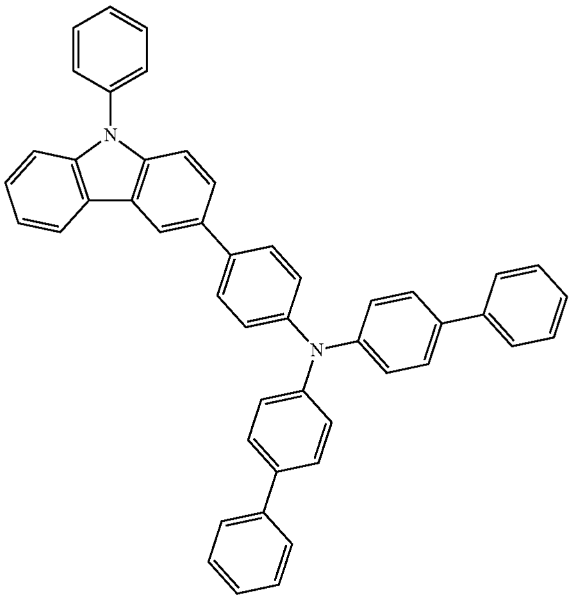

-continued
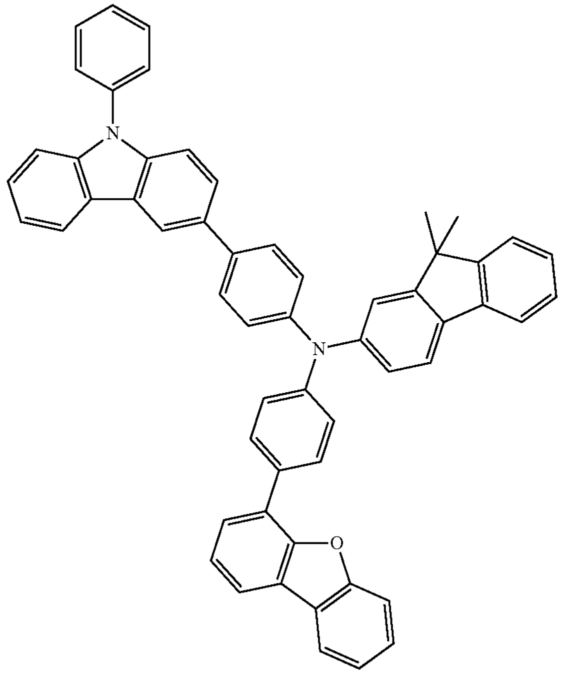
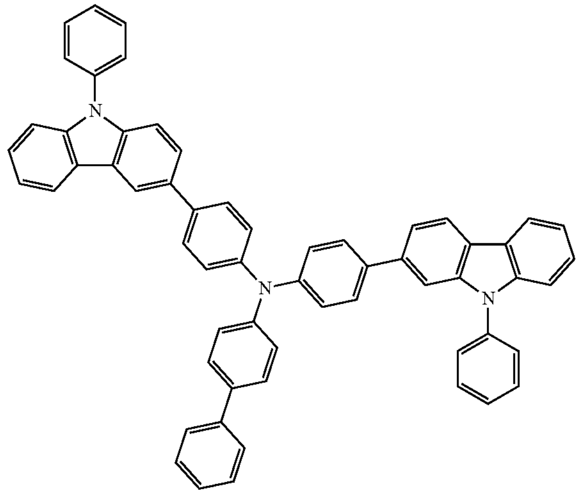
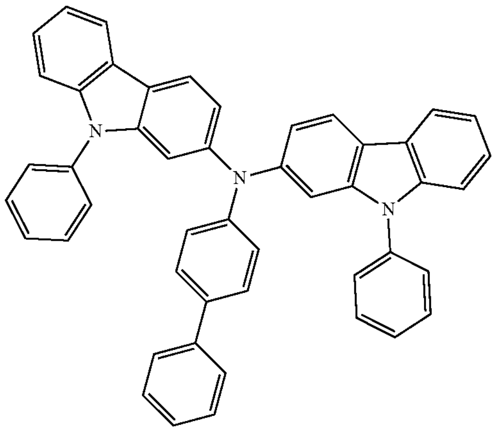
-continued
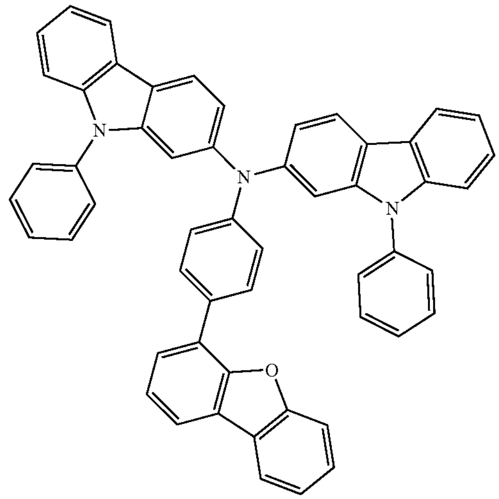
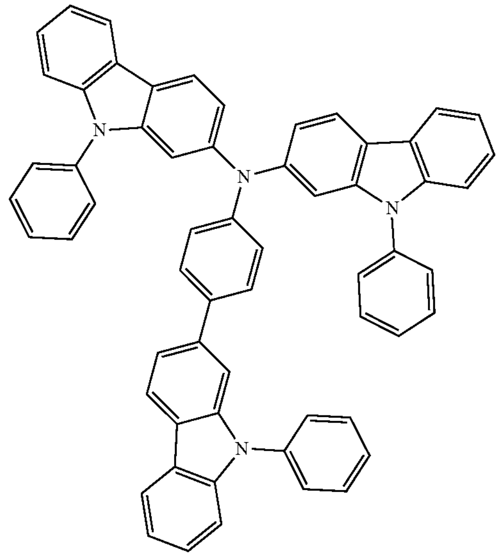
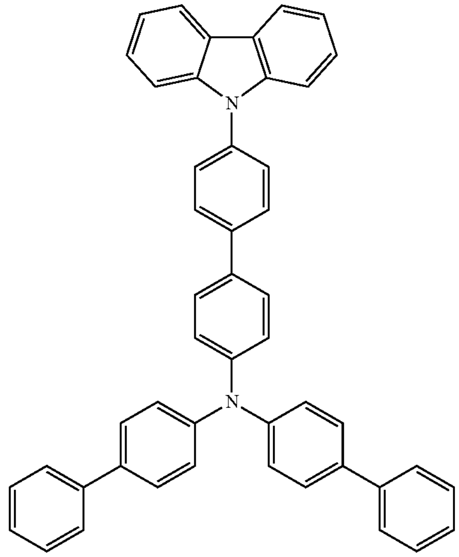

-continued
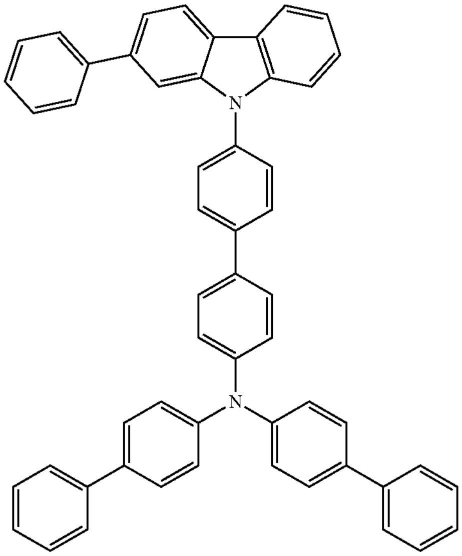
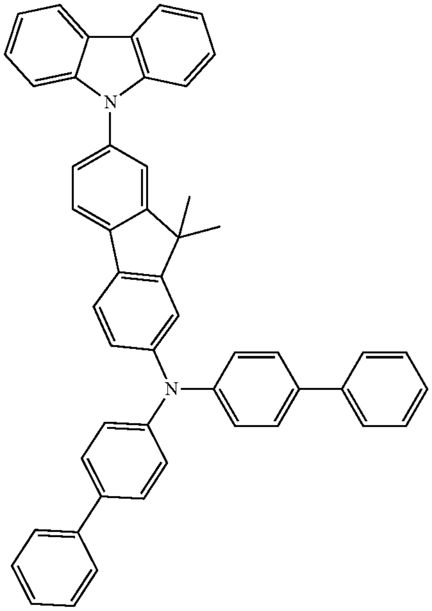
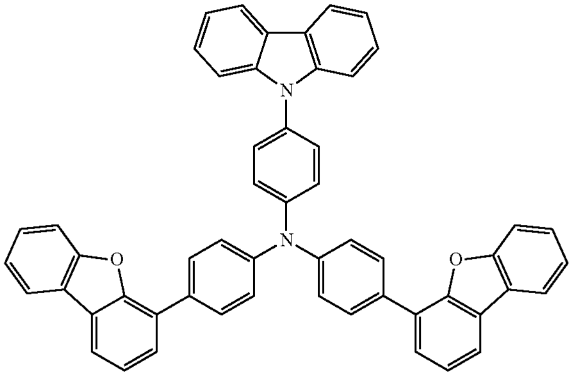
-continued
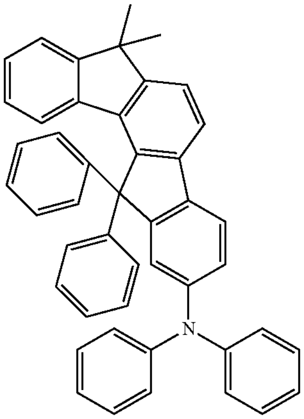
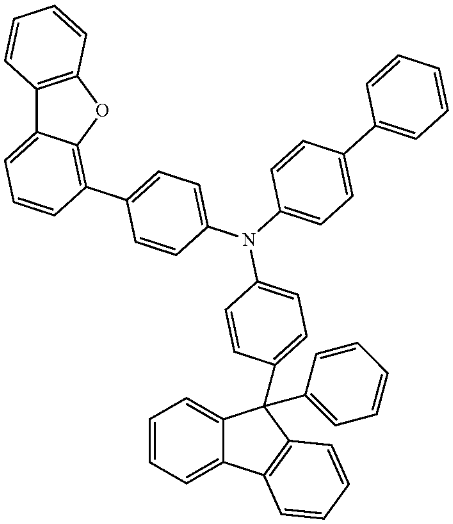
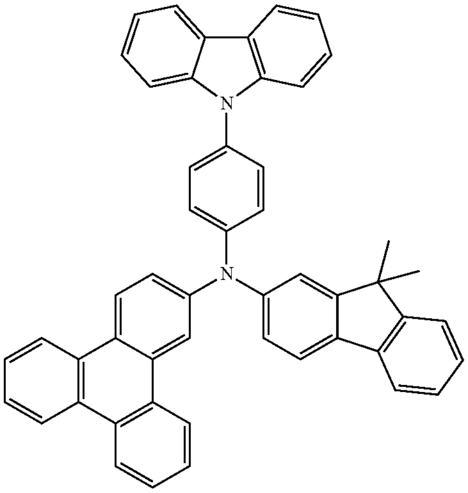

-continued
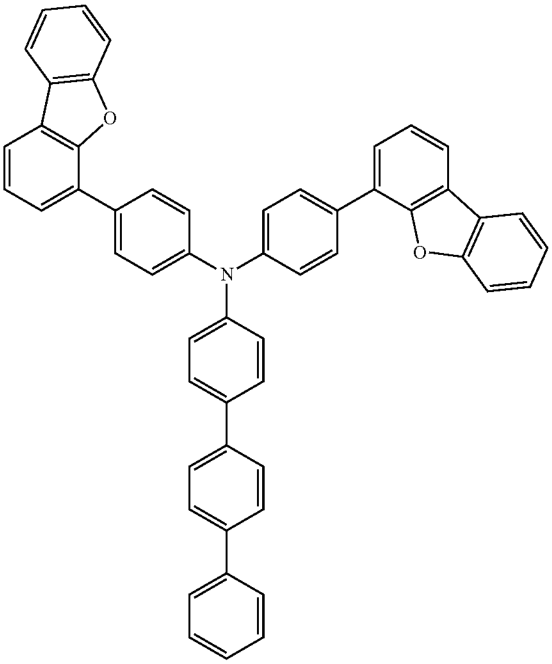
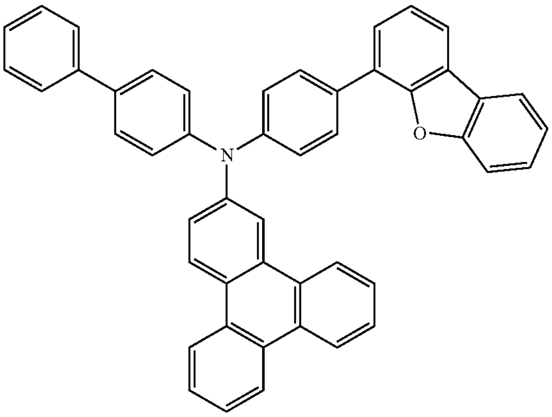
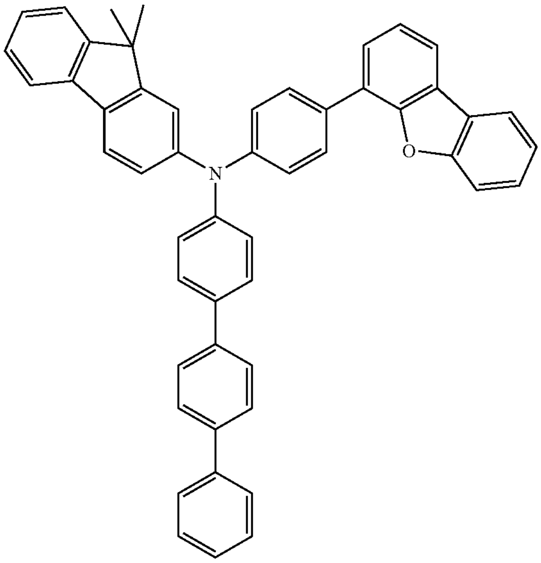
-continued
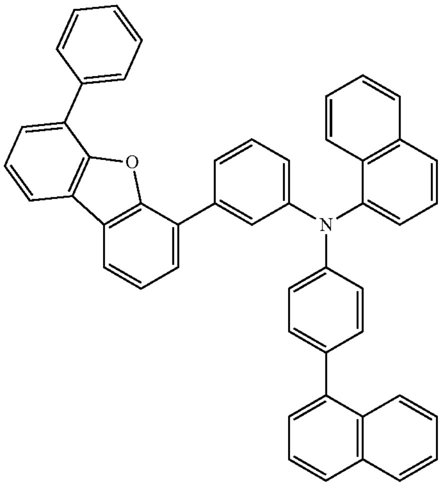
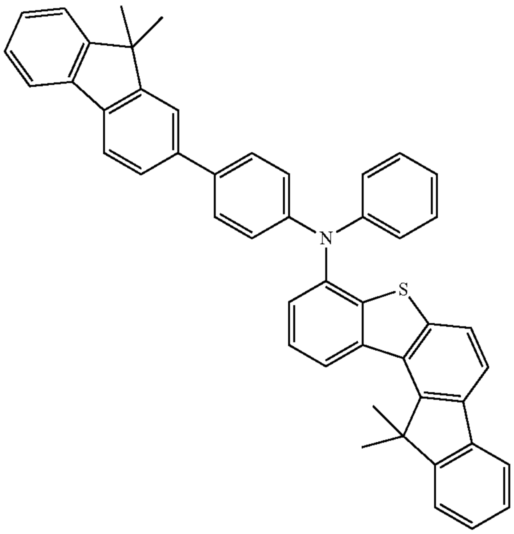
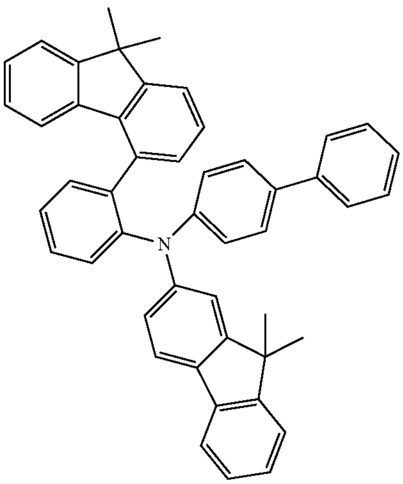

-continued
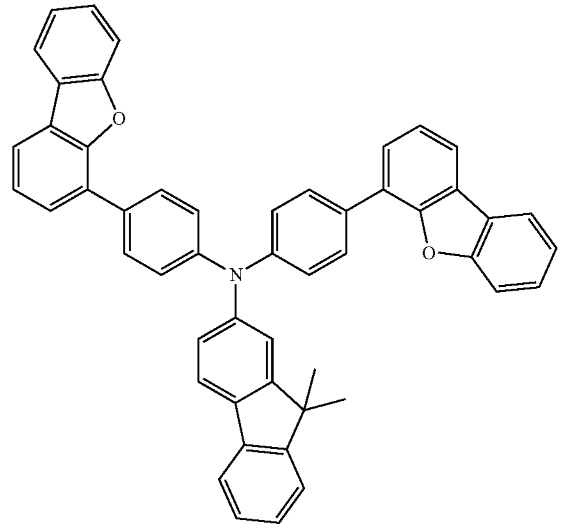
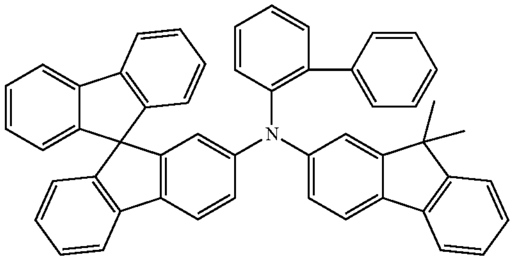
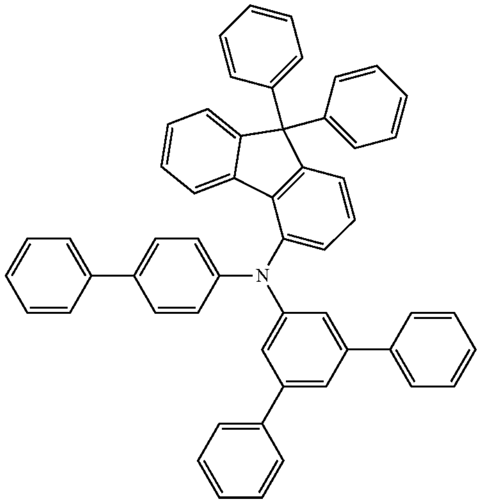
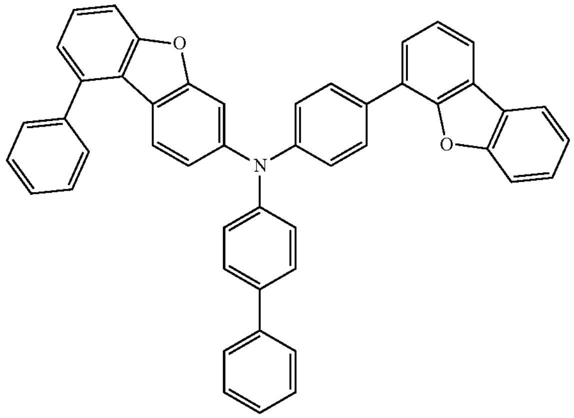
-continued
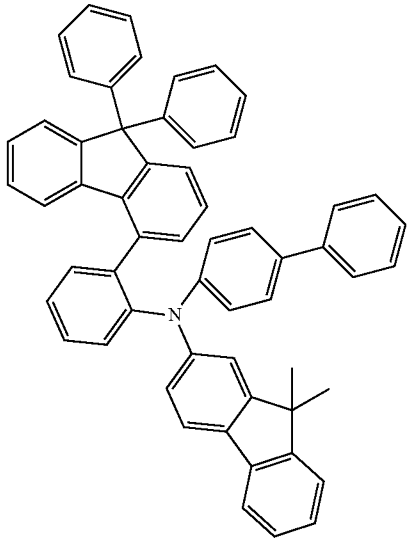
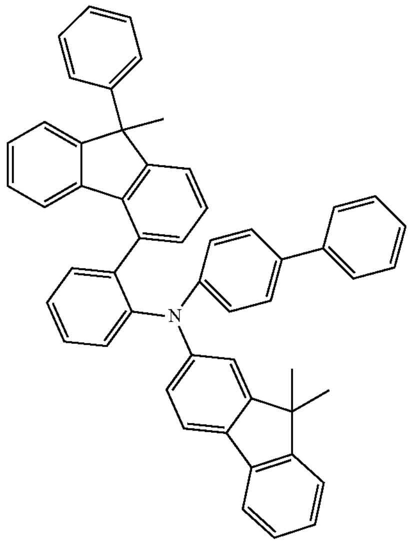
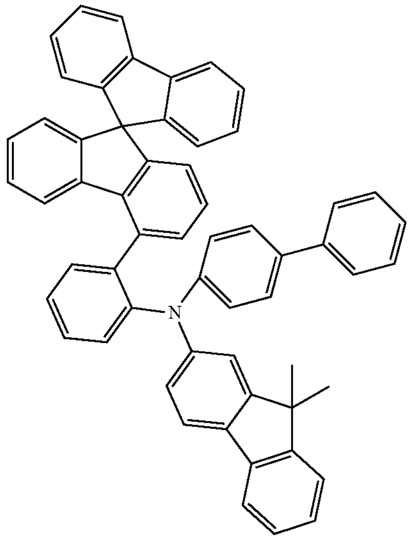

-continued
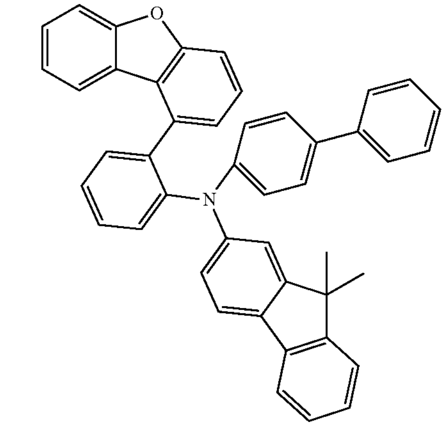
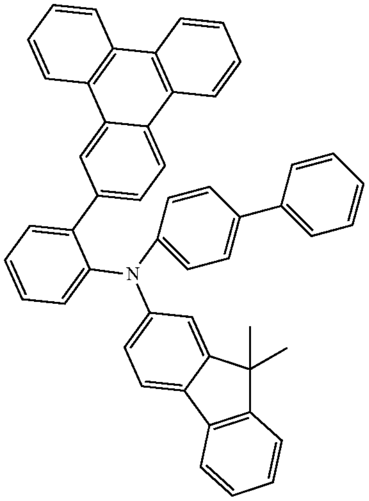
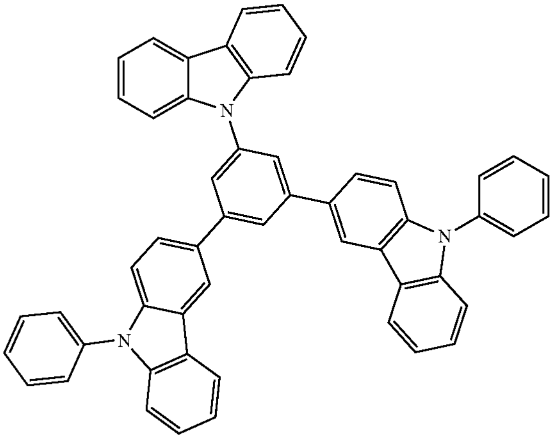
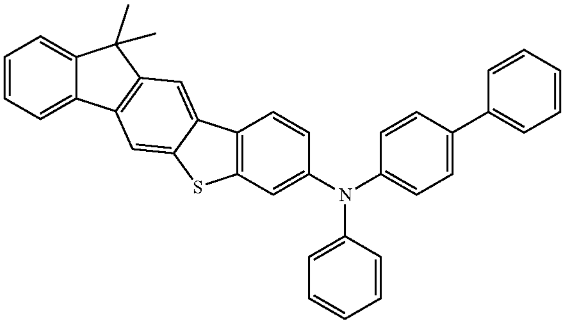
-continued
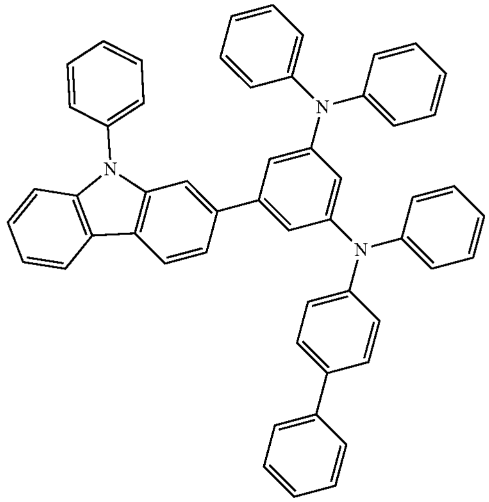
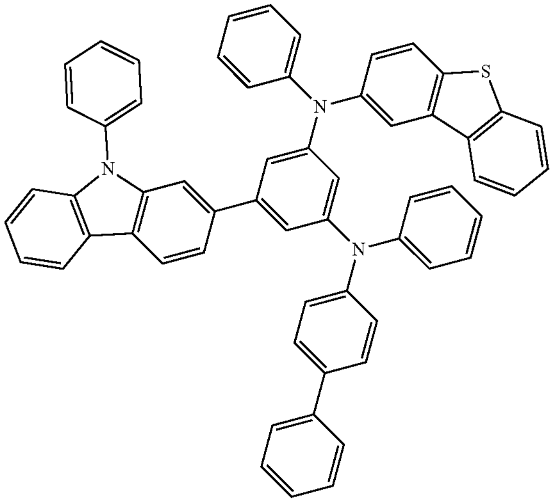
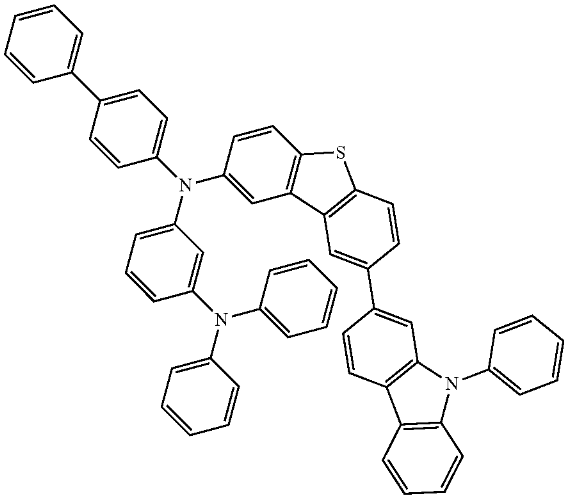

-continued
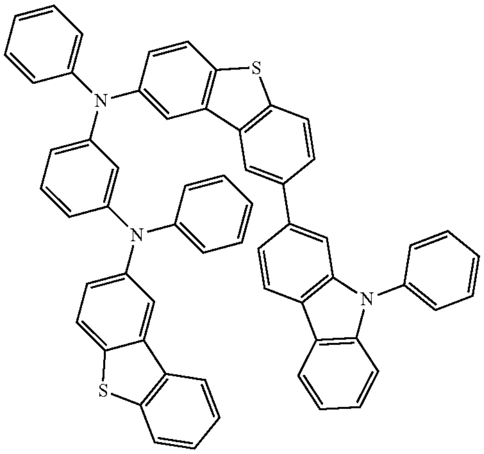
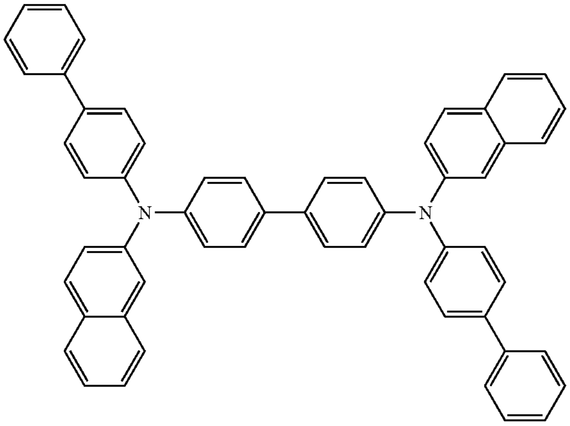
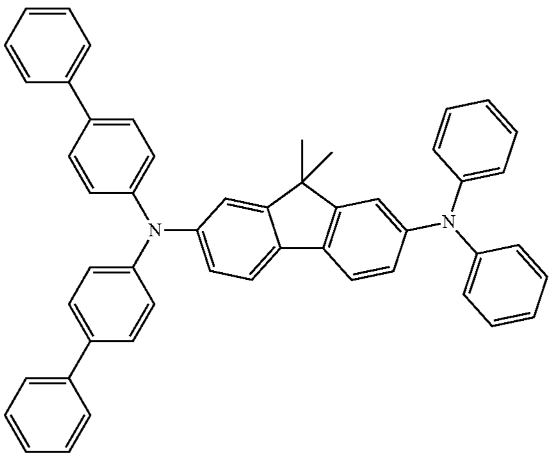
-continued
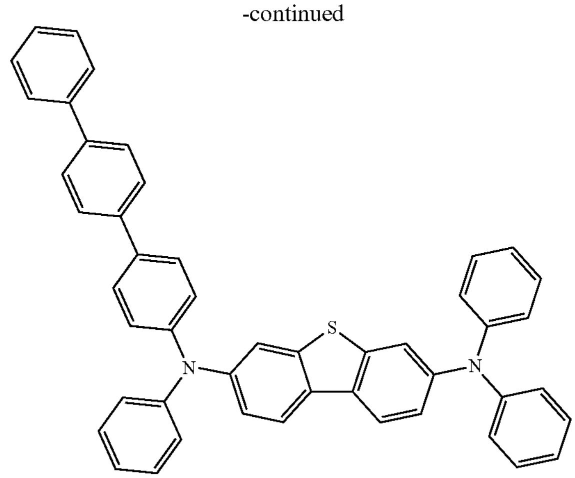
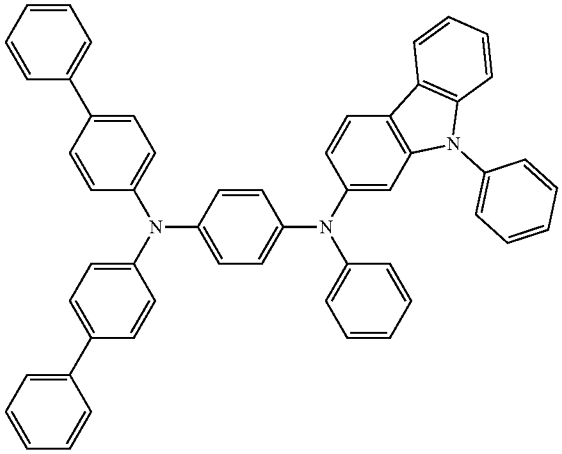
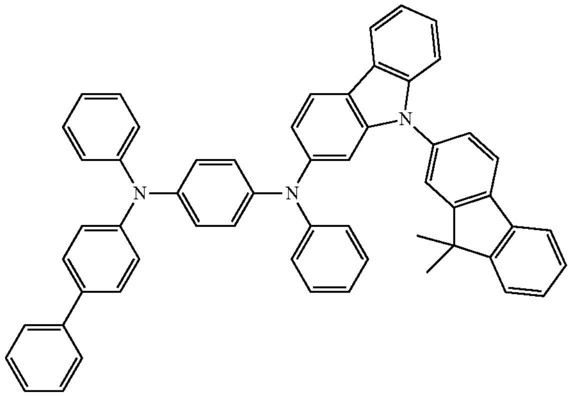
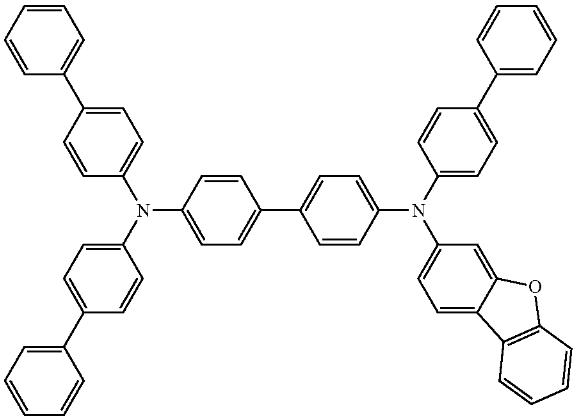

-continued
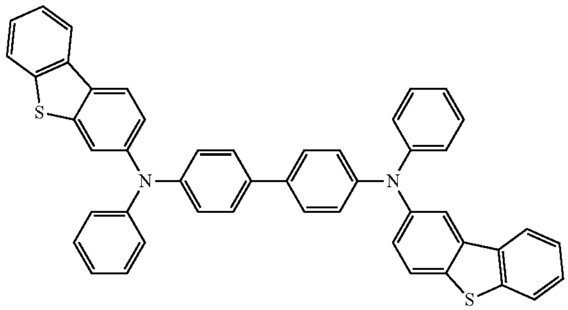
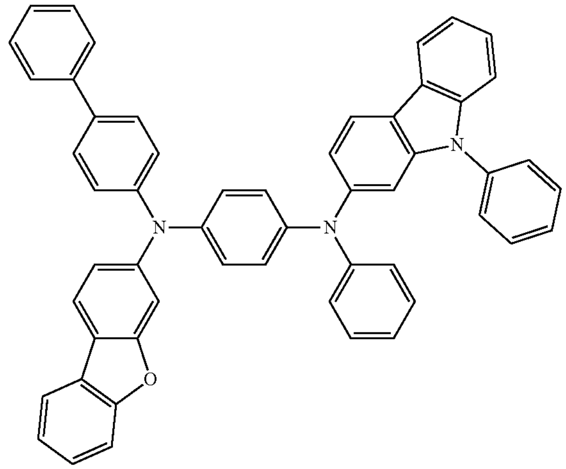
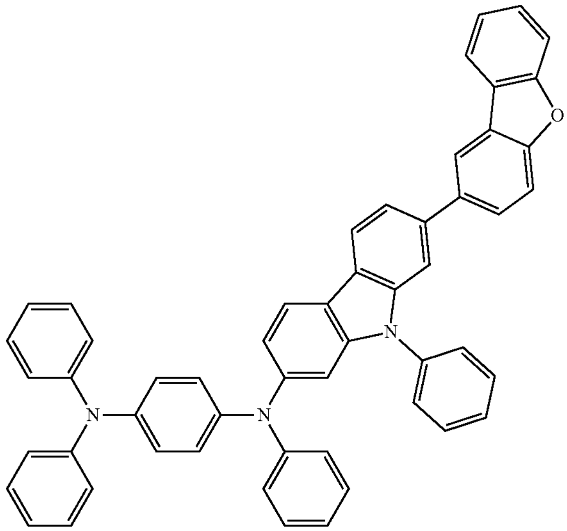
-continued
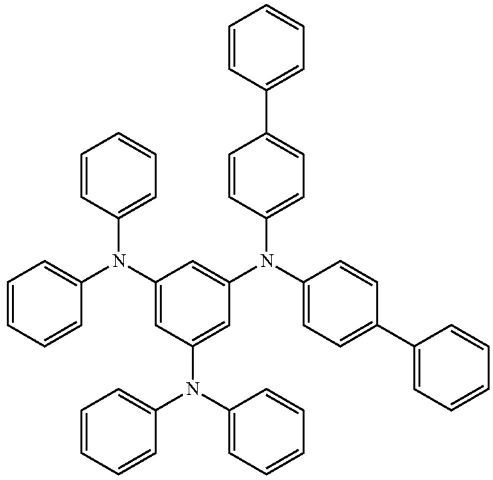
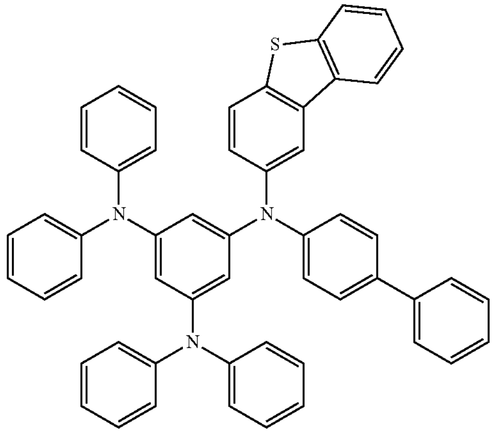
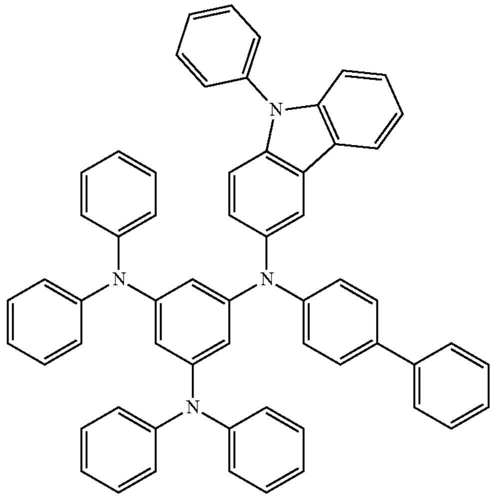

-continued
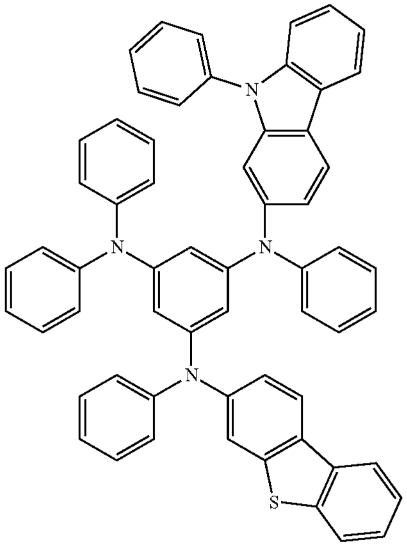
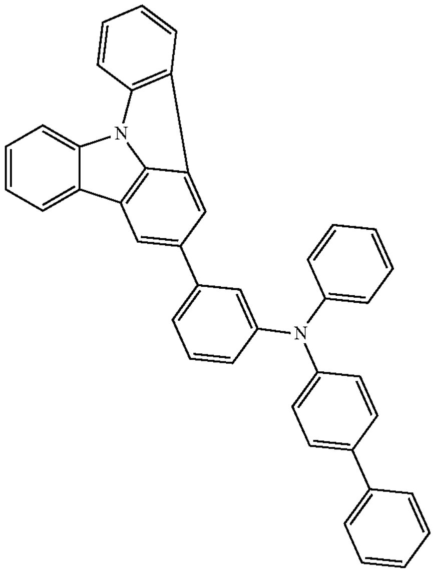
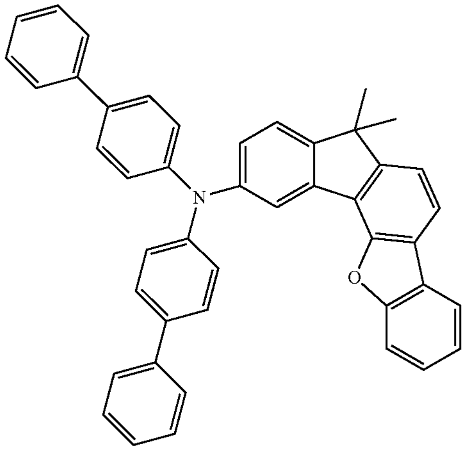
-continued
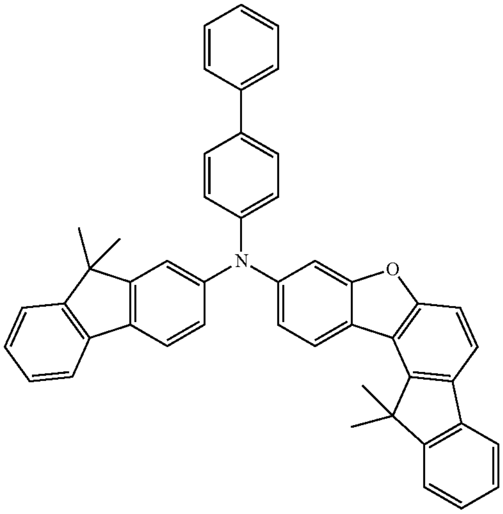
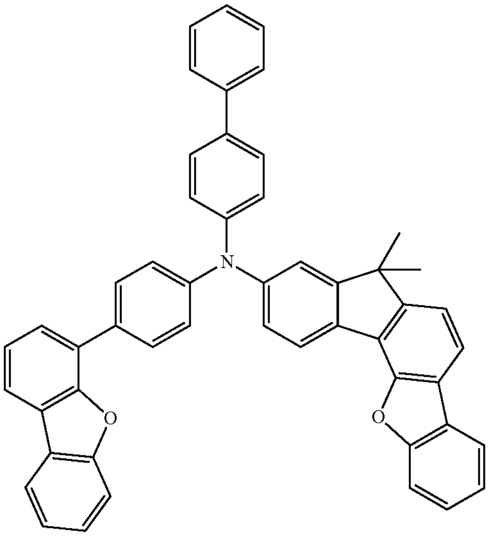
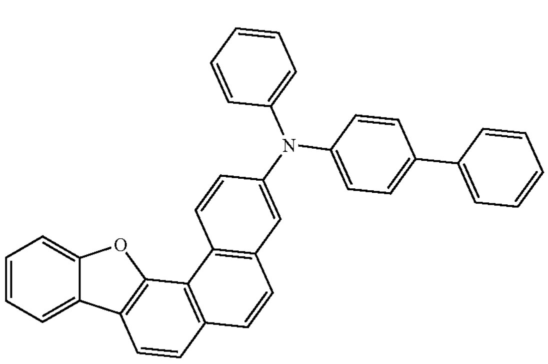

-continued
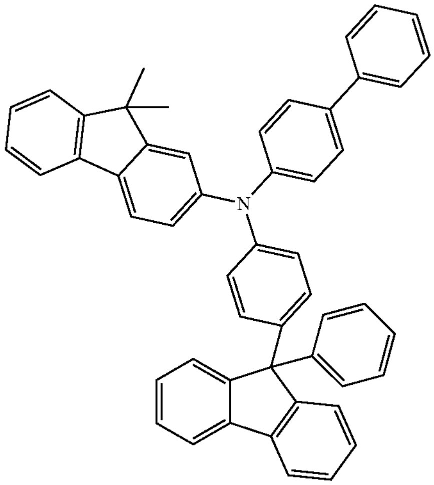
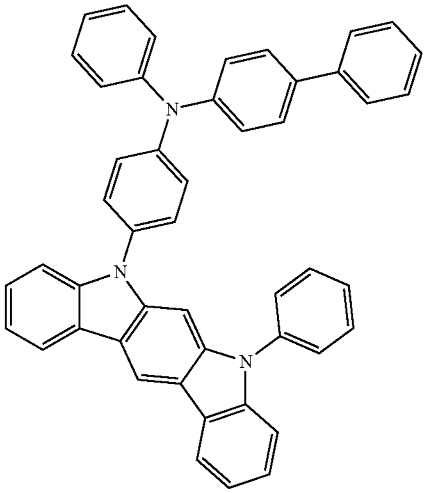
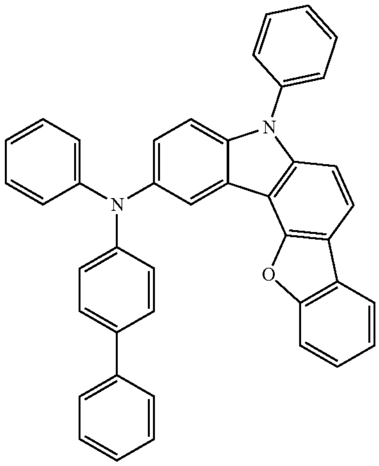
-continued
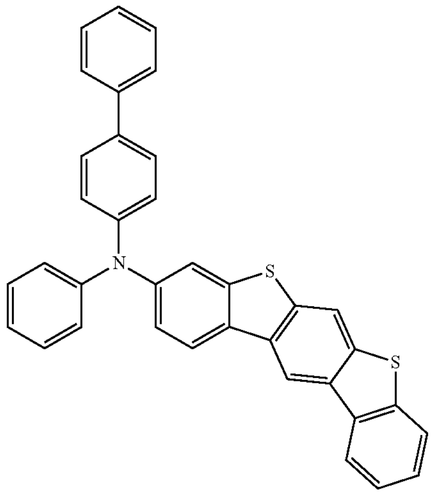
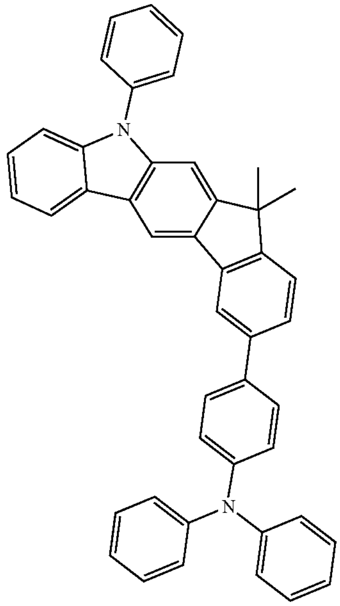
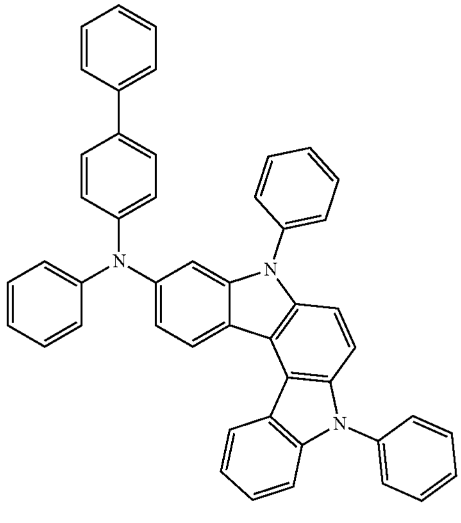

-continued
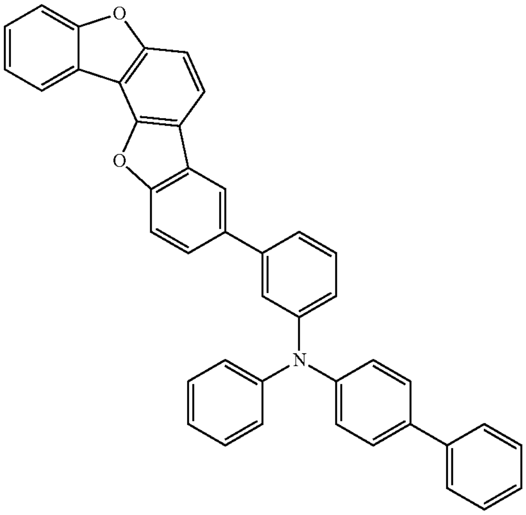
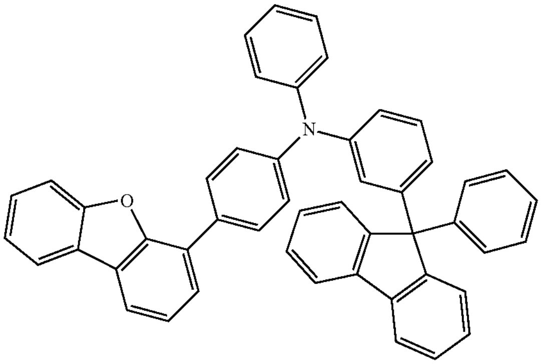
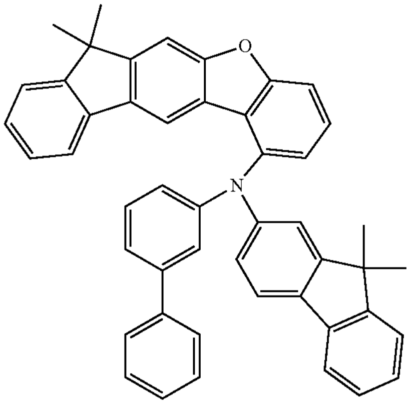
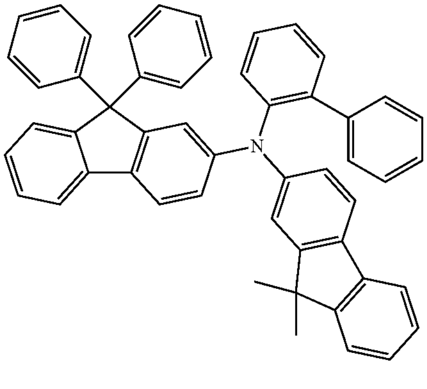
-continued
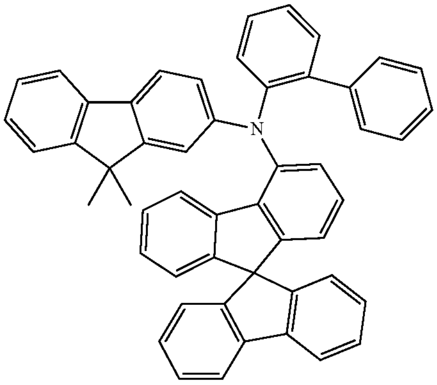
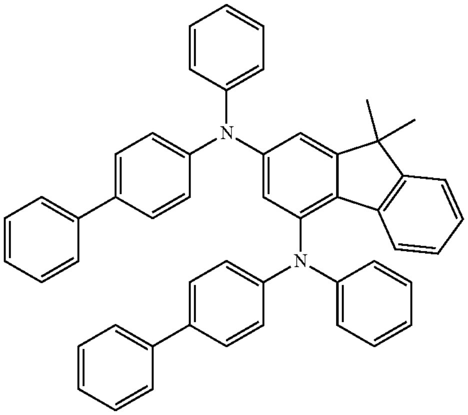
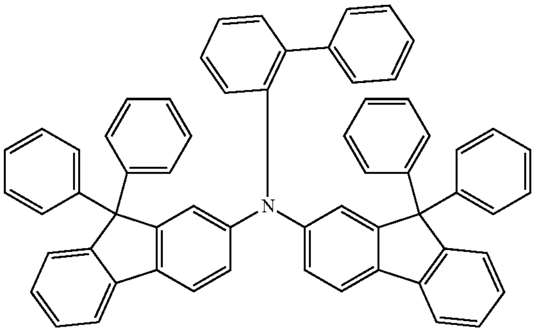
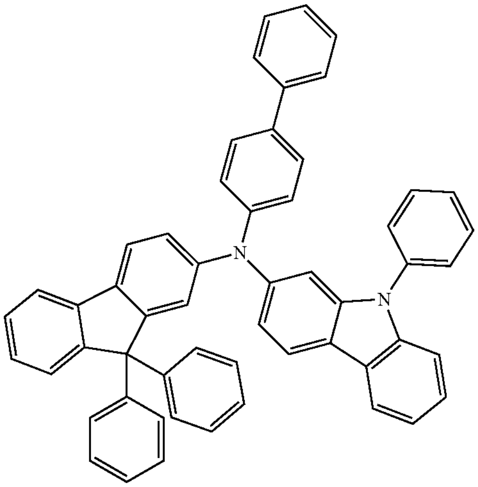

-continued
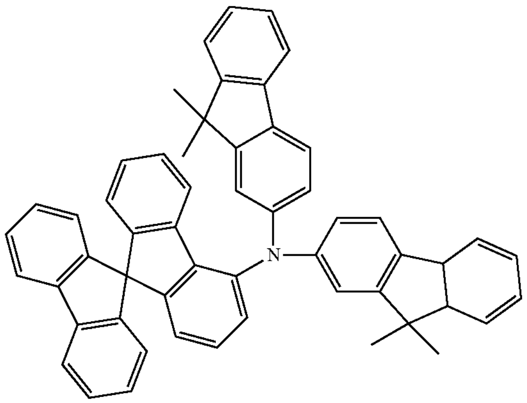
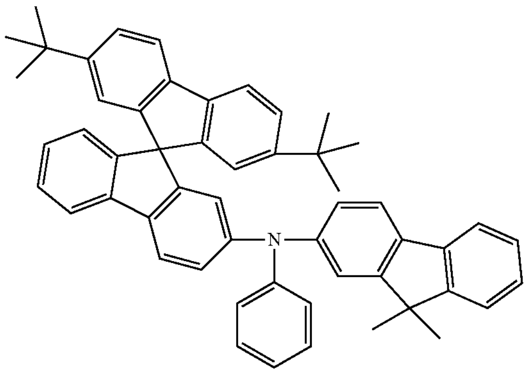
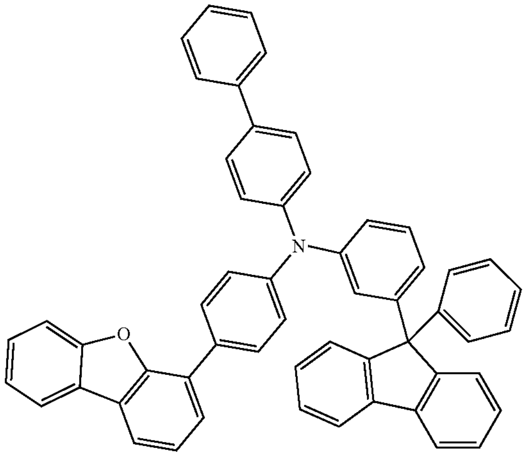
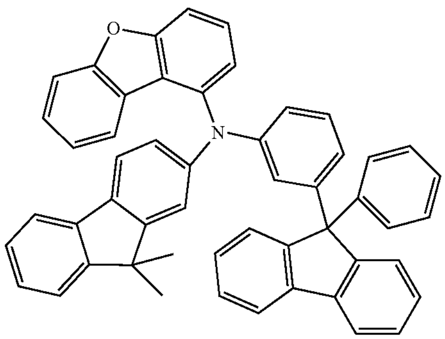
-continued
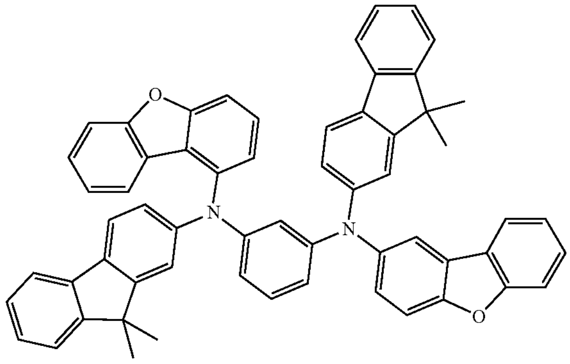
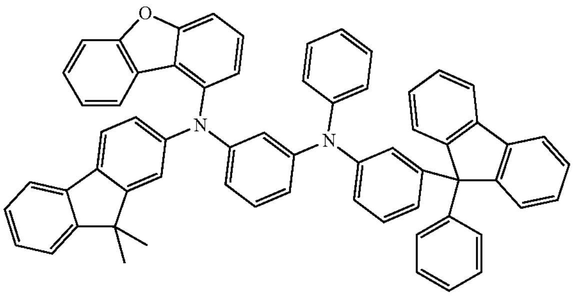
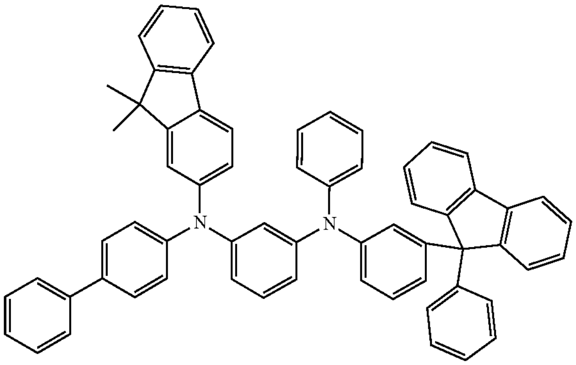
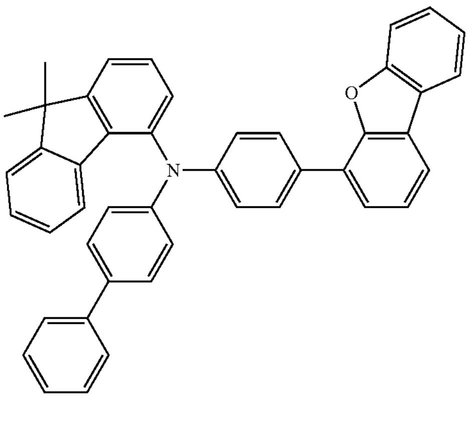

-continued

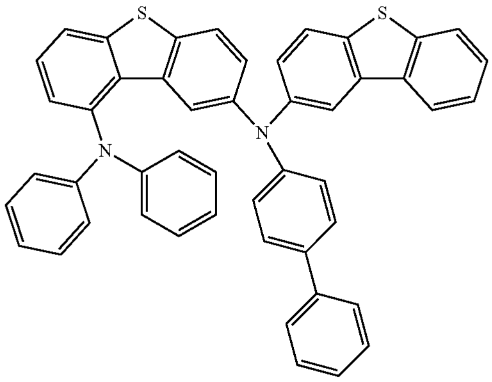

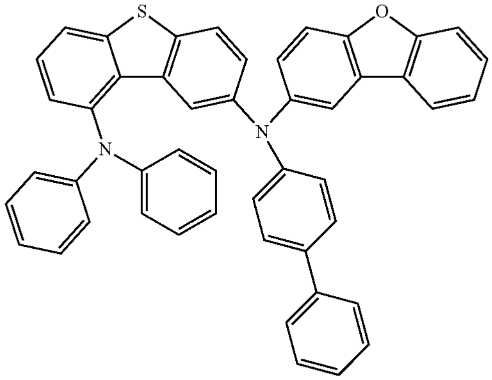

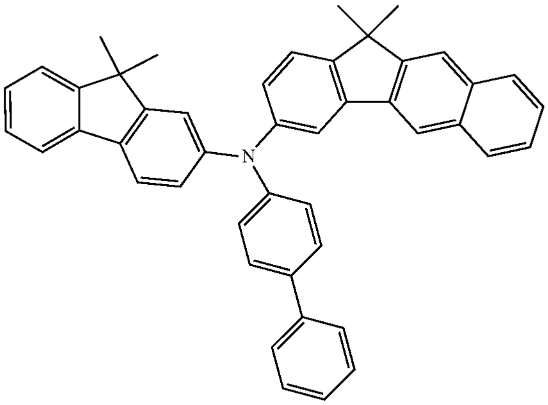

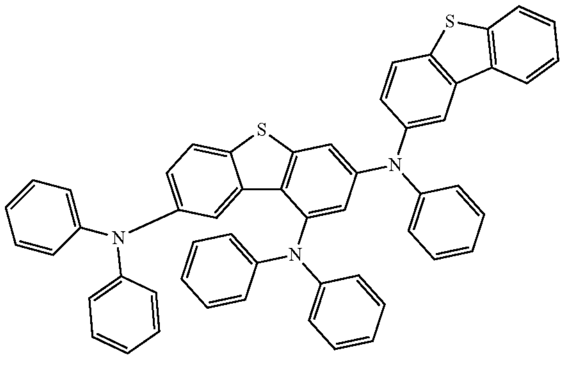

-continued

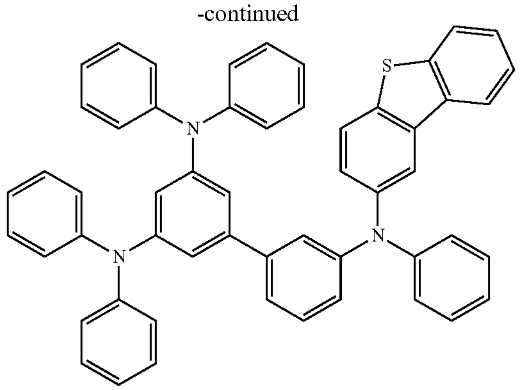

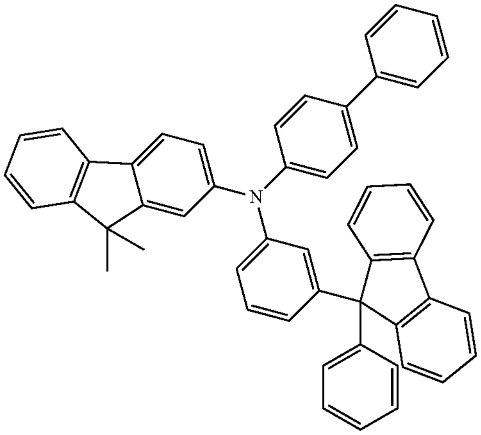

In the hole transport region 140, other suitable compounds may be used in addition to the compound.

In an implementation, the charge transport region may be, e.g., an electron transport region 150.

The electron transport region 150 may further increase electron injection and/or electron mobility and block holes between the cathode 110 and the light emitting layer 130.

In an implementation, the electron transport region 150 may include an electron transport layer between the cathode 110 and the light emitting layer 130, and an electron transport auxiliary layer between the light emitting layer 130 and the electron transport layer, and a compound of Group C may be included in at least one of the electron transport layer and the electron transport auxiliary layer.

[Group C]
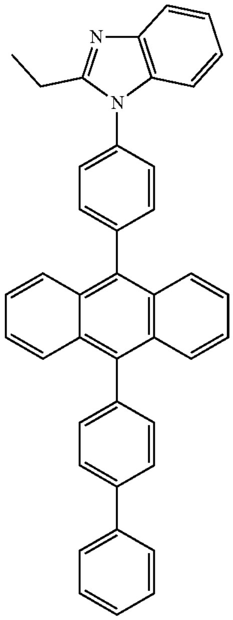
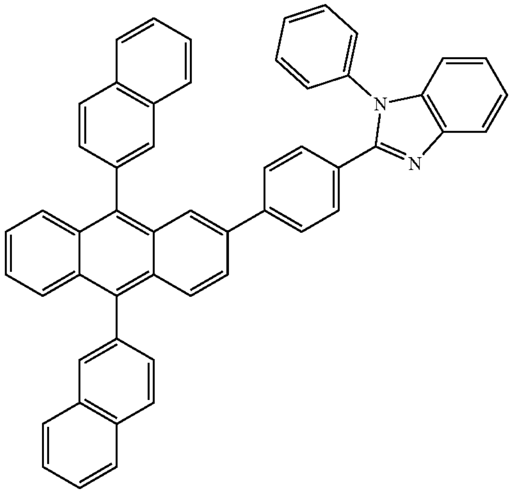
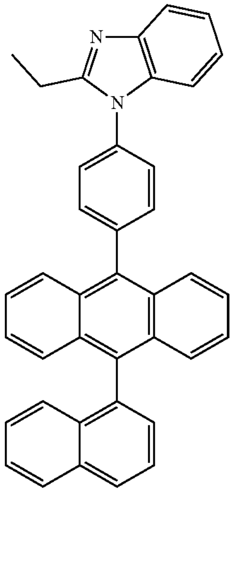
-continued
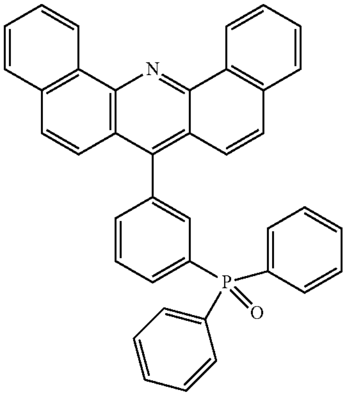
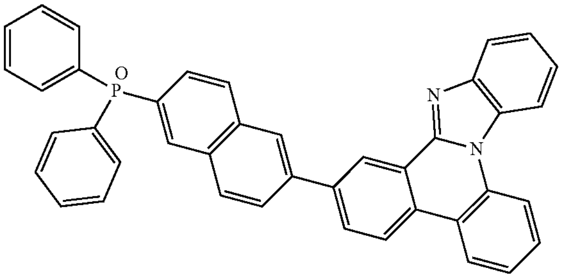
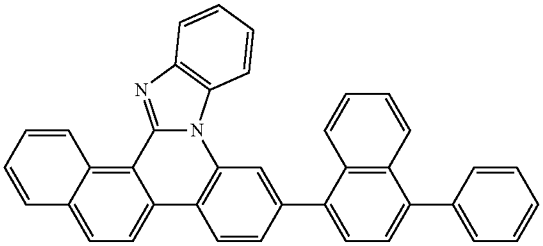
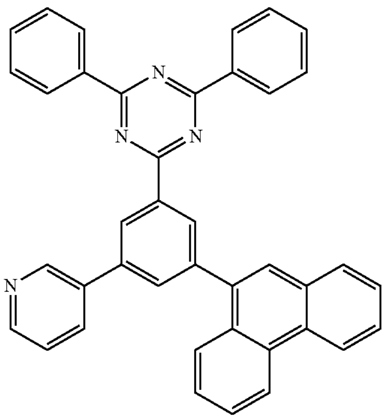

-continued
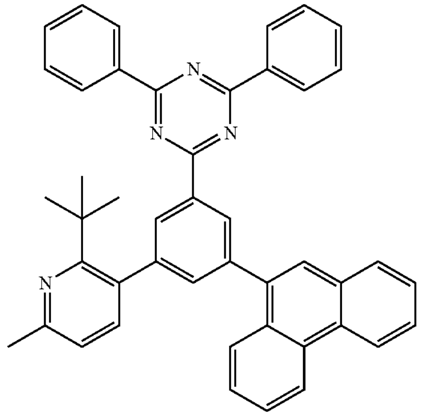
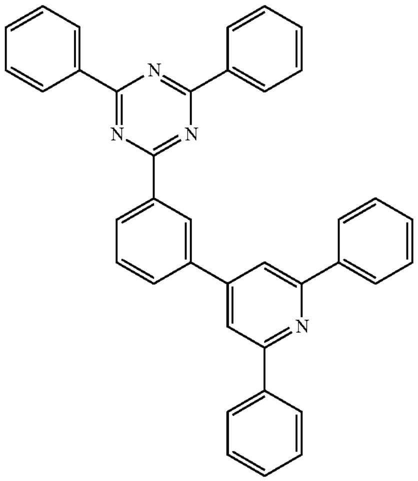
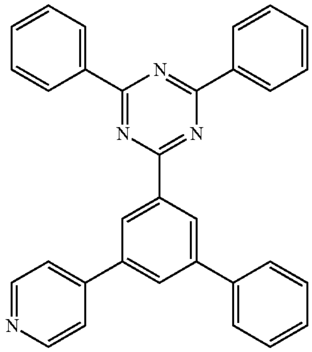
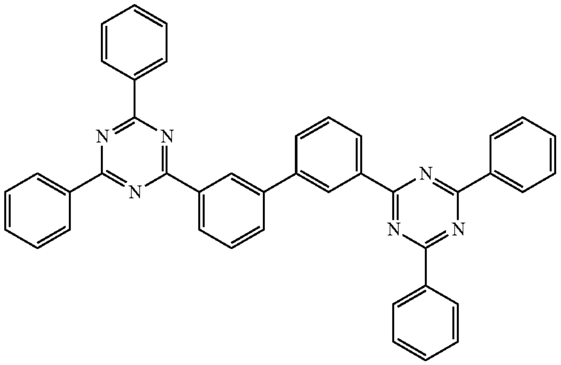
-continued
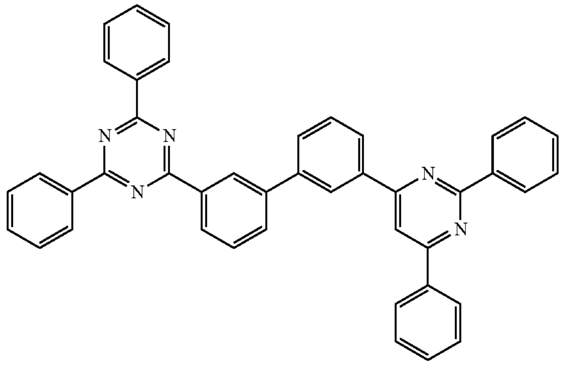
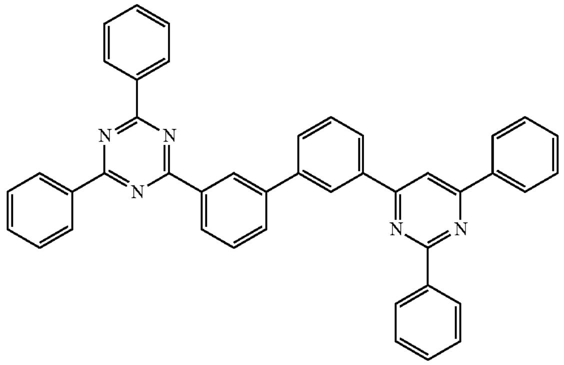
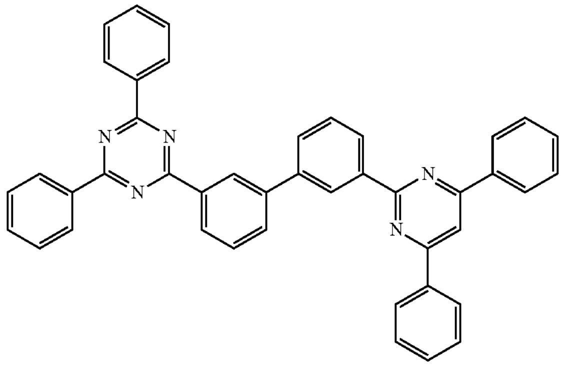
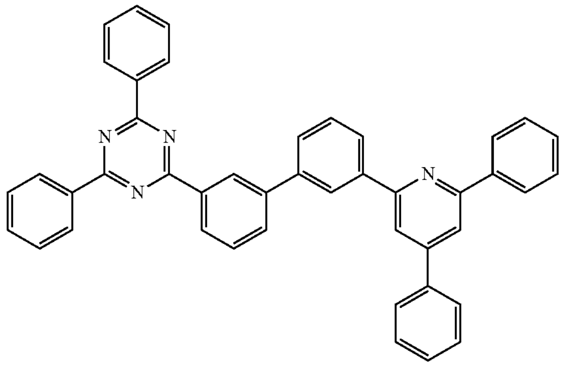

-continued
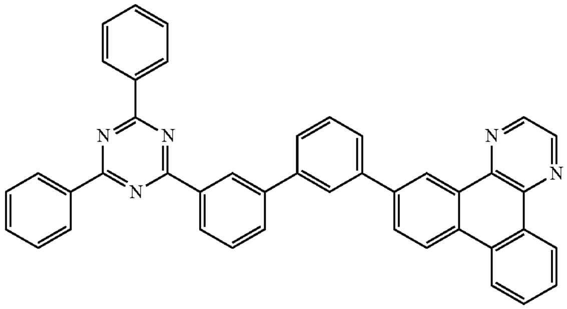
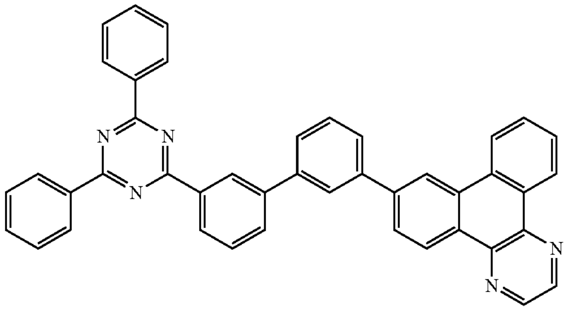
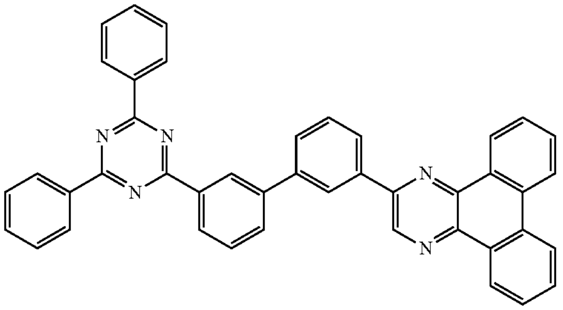
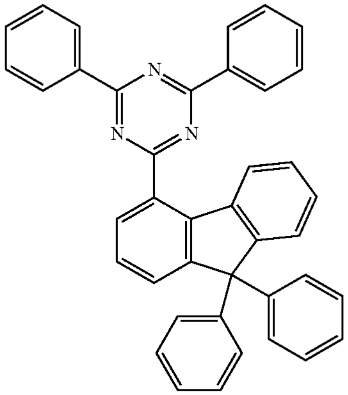
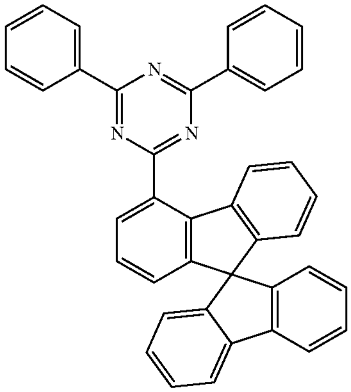
-continued
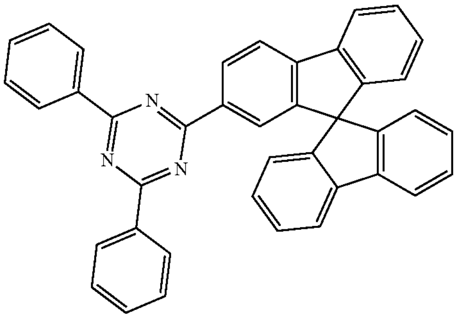
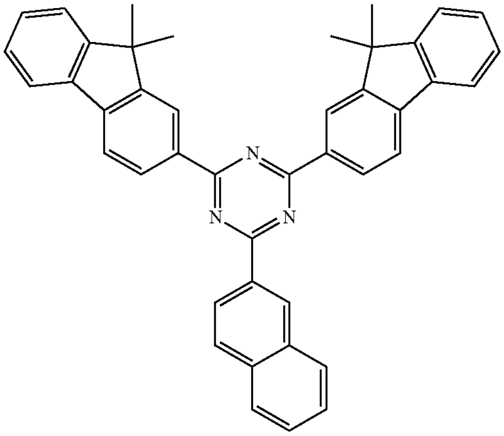
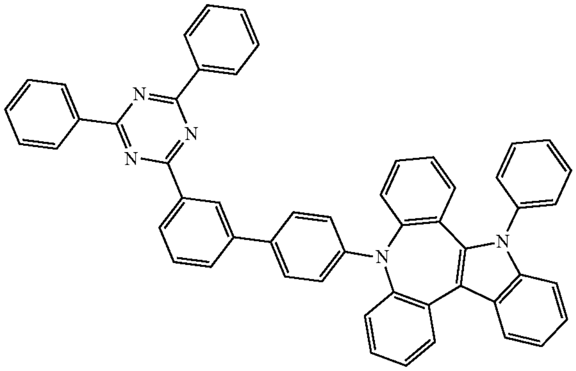
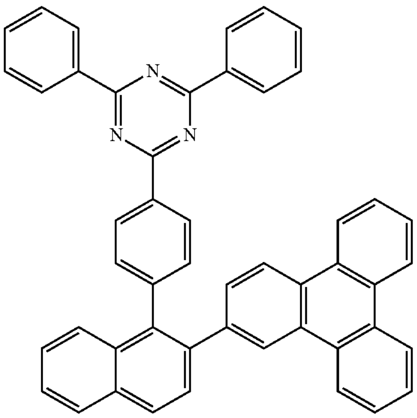

-continued
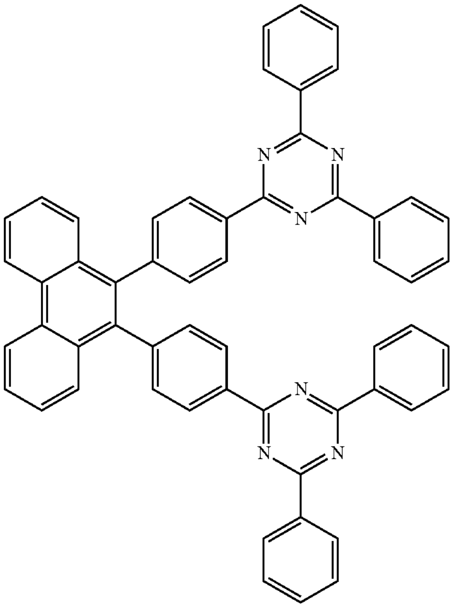
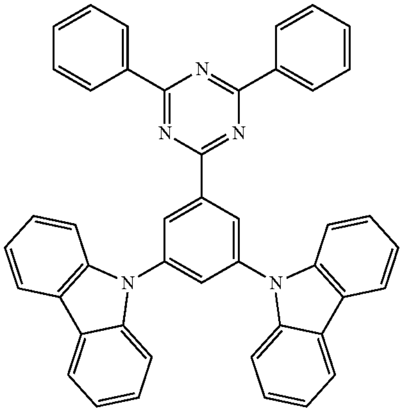
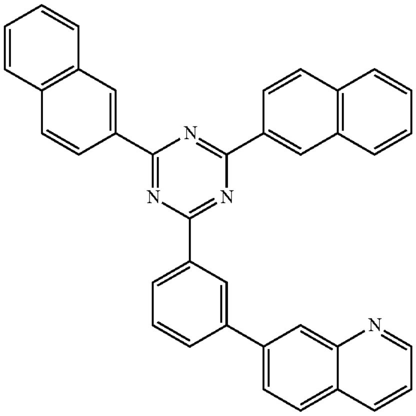
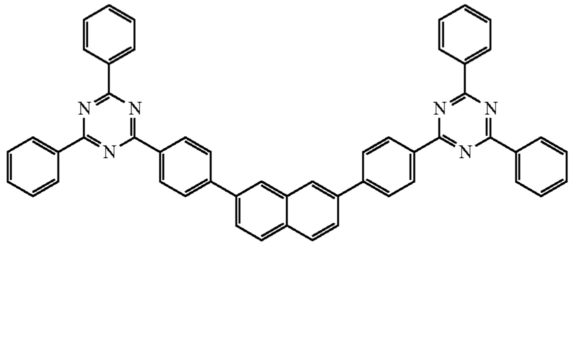
-continued
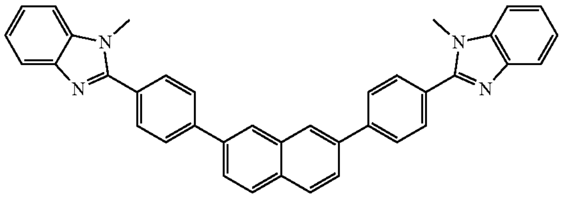
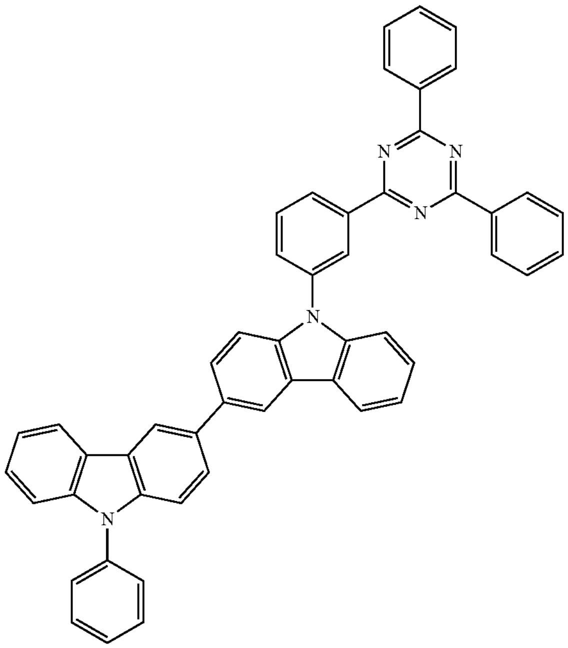
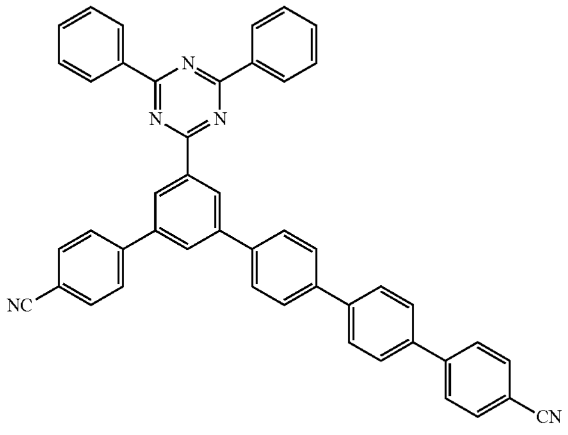

-continued
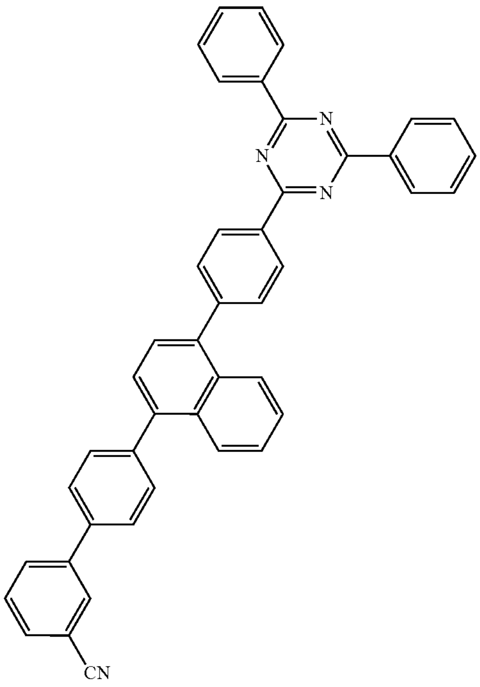
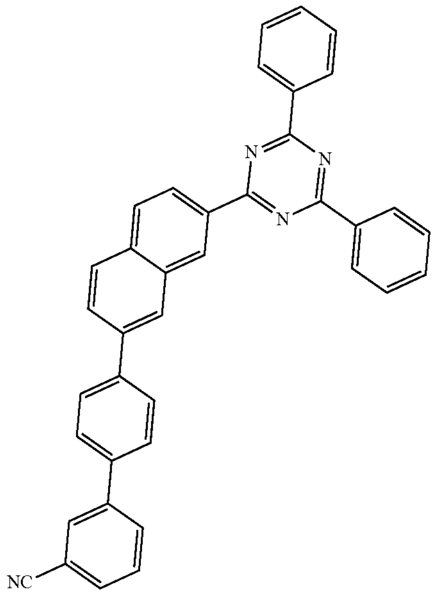
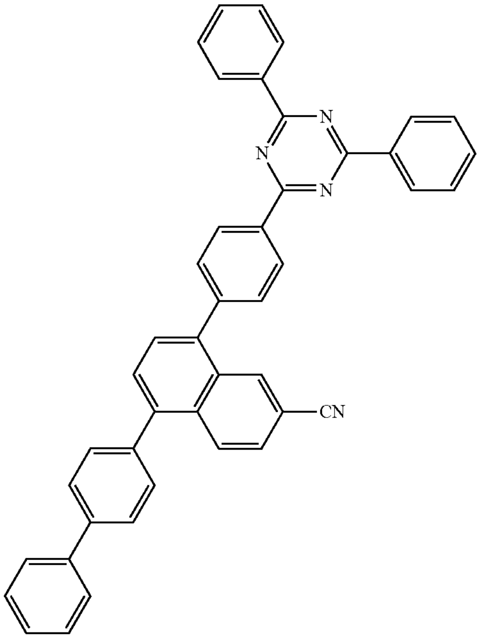
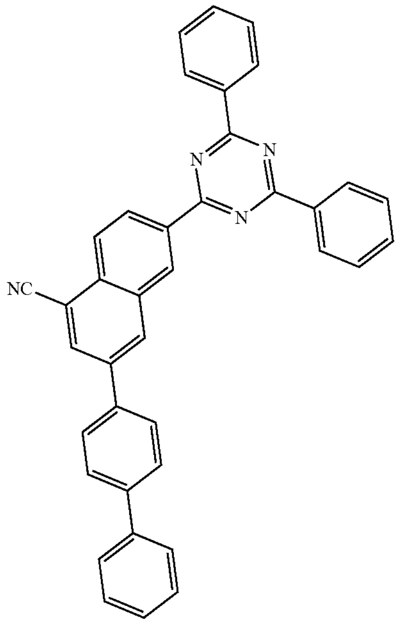
-continued

-continued
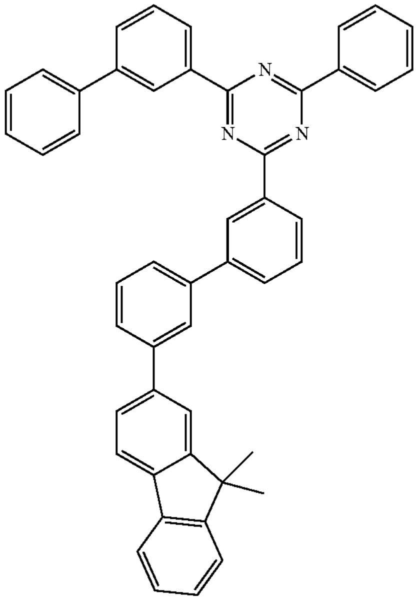
-continued
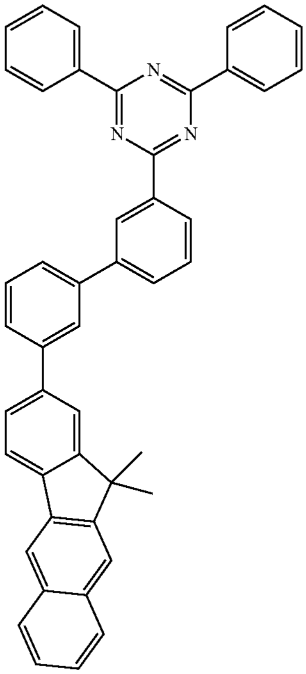
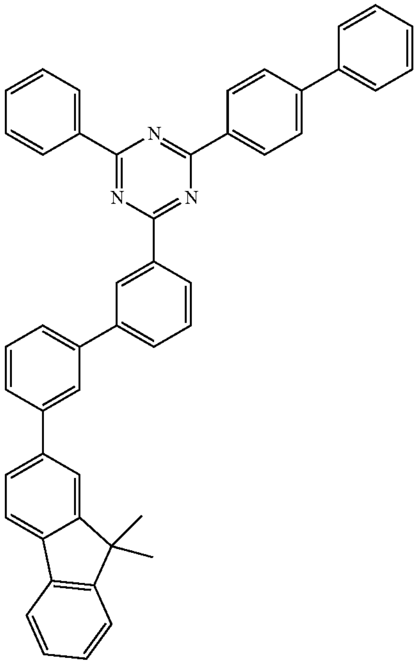
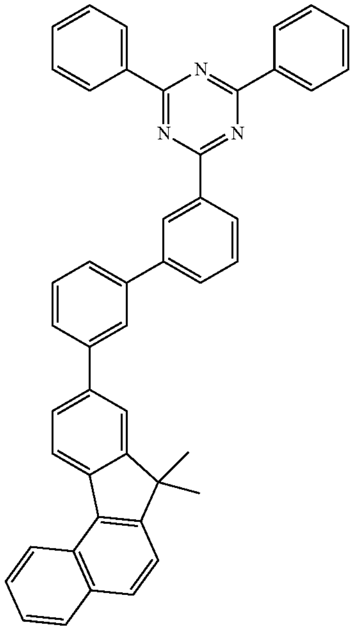

-continued
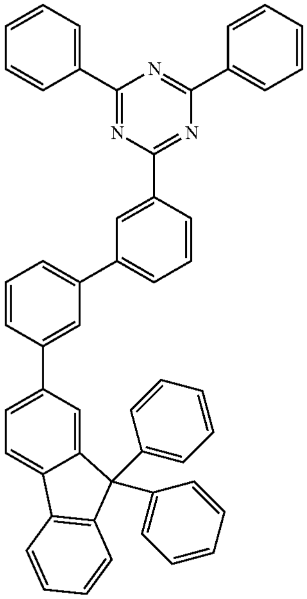
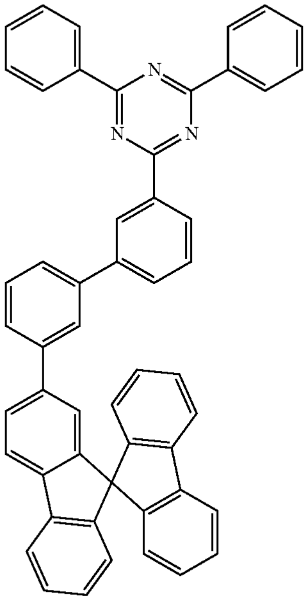
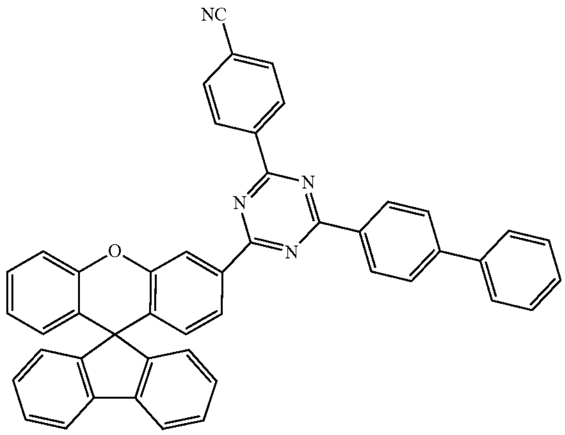
-continued
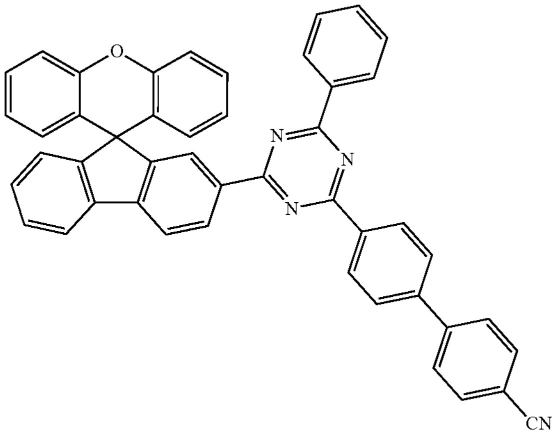
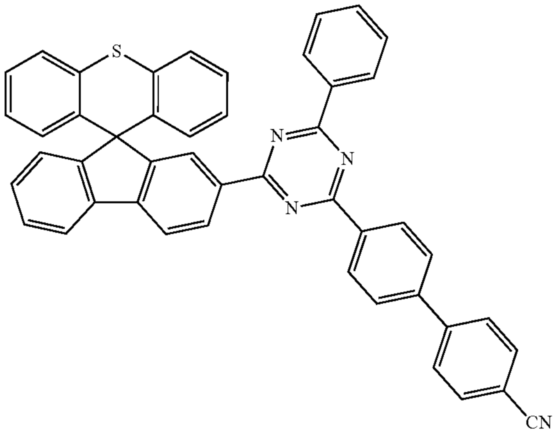
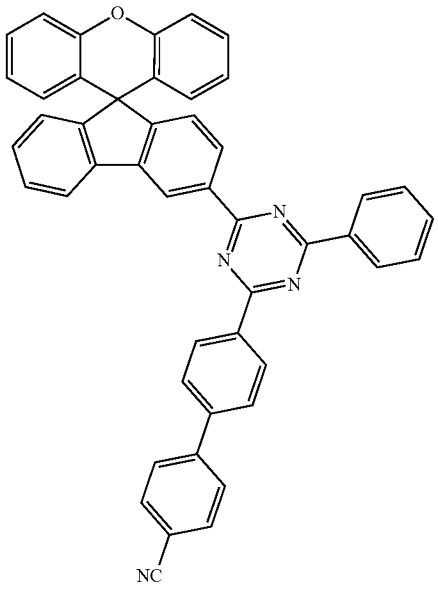

-continued
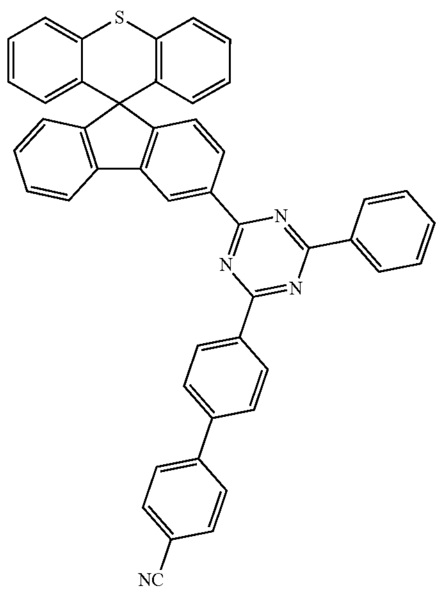
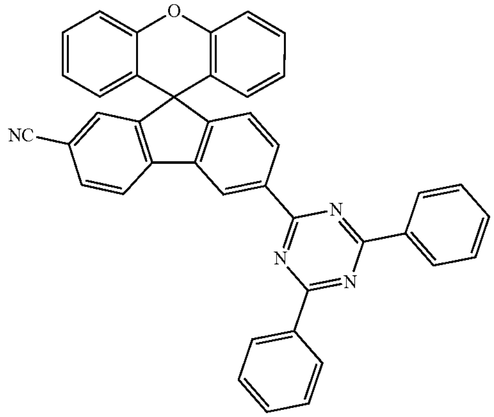
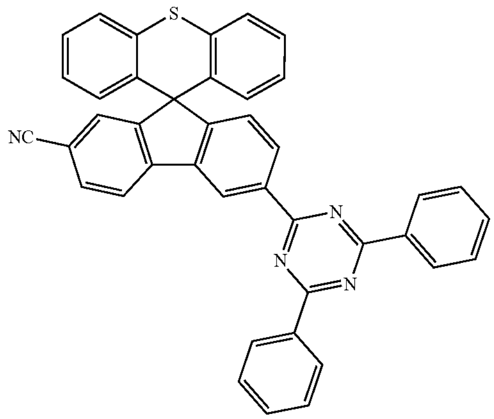
-continued
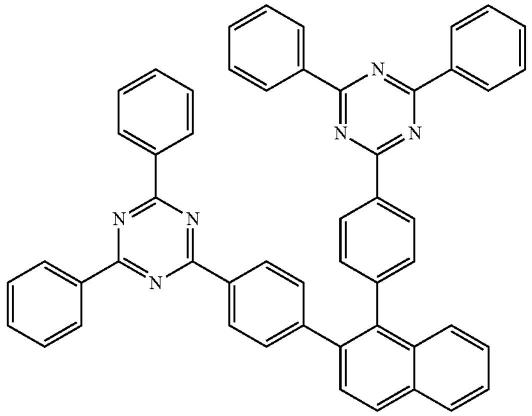
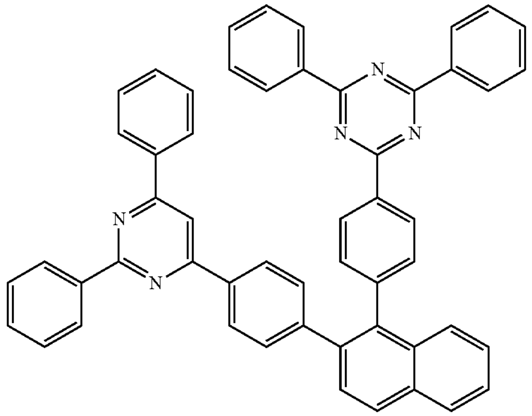
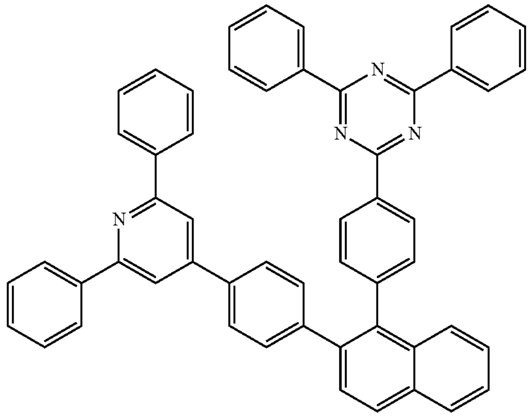
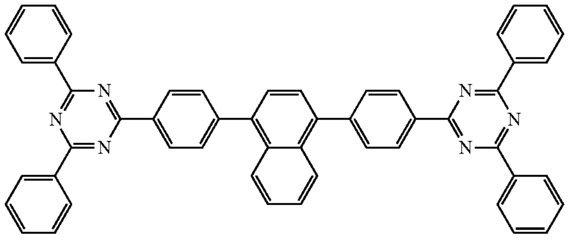

-continued

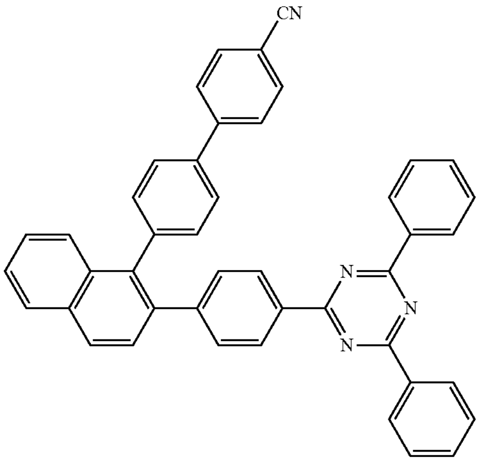

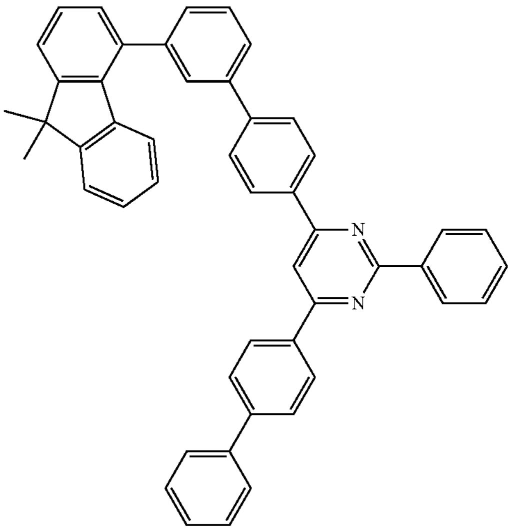

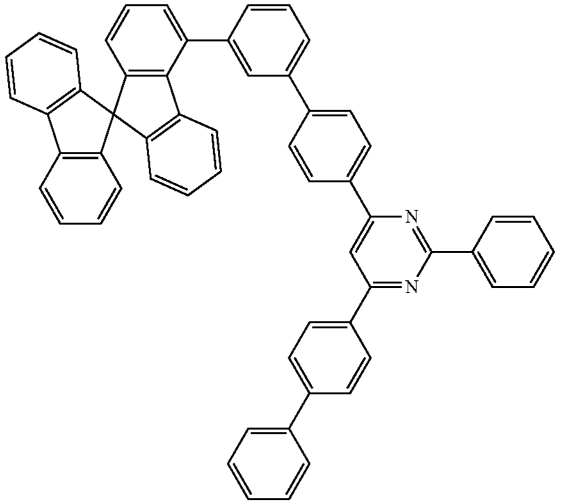

-continued

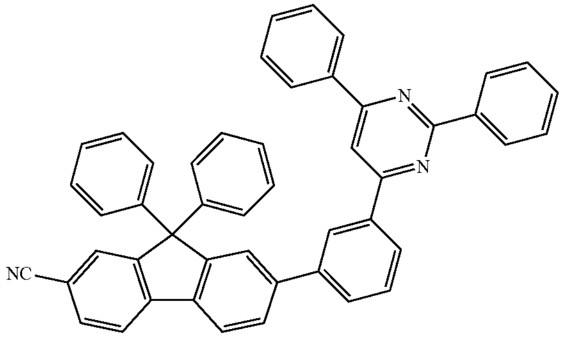

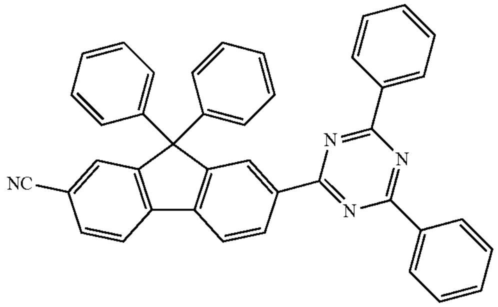

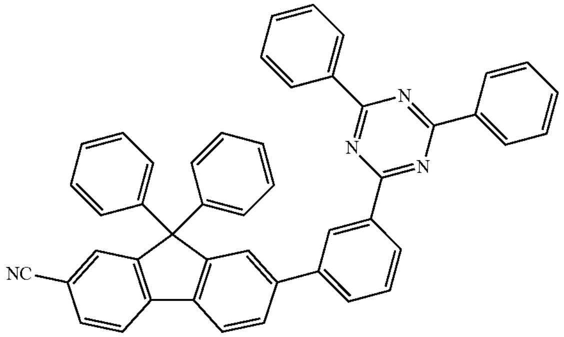

An embodiment may include an organic light emitting diode including a light emitting layer as an organic layer.

Another embodiment may include an organic light emitting diode including a light emitting layer and a hole transport region as an organic layer.

Another embodiment may include an organic light emitting diode including a light emitting layer and an electron transport region as an organic layer.

As shown in the FIGURE, the organic light emitting diode according to the embodiment may include a hole transport region 140 and an electron transport region 150 in addition to the light emitting layer 130 as the organic layer 105.

In an implementation, the organic light emitting diode may further include an electron injection layer, a hole injection layer, or the like, in addition to the light emitting layer as the aforementioned organic layer.

The organic light emitting diode 100 may be produced by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in examples and synthesis examples were purchased from Sigma-Aldrich Co. Ltd., TCI Inc., Tokyo chemical industry, or P&H Tech, or, as far as there in no particular comment or were synthesized by suitable methods.

(Preparation of Compound for Organic Optoelectronic Device)

A compound was synthesized through the following steps.

Synthesis Example 1: Synthesis of Compound 64

[Reaction Scheme 1]

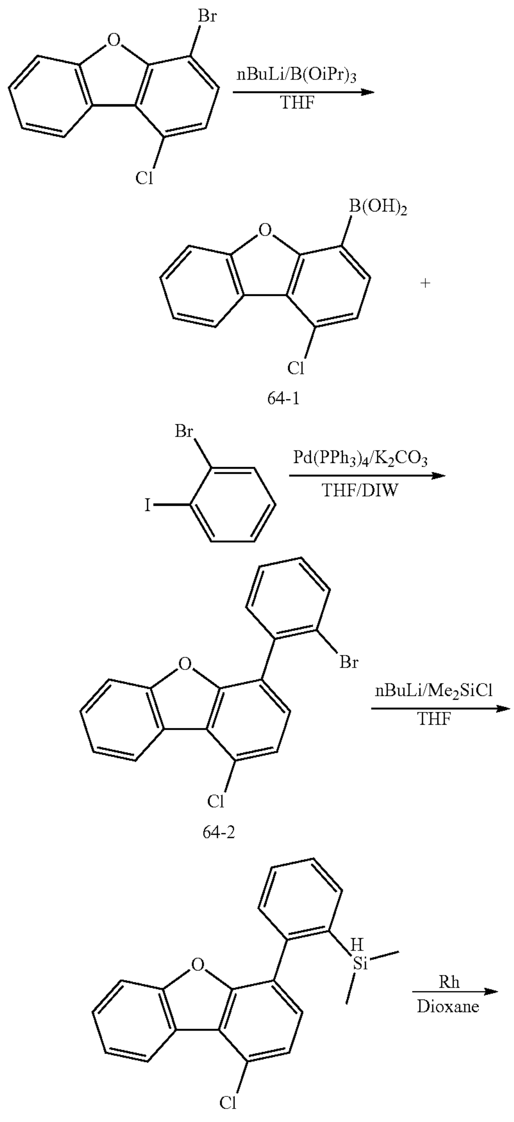

64-1

64-2

64-3

-continued

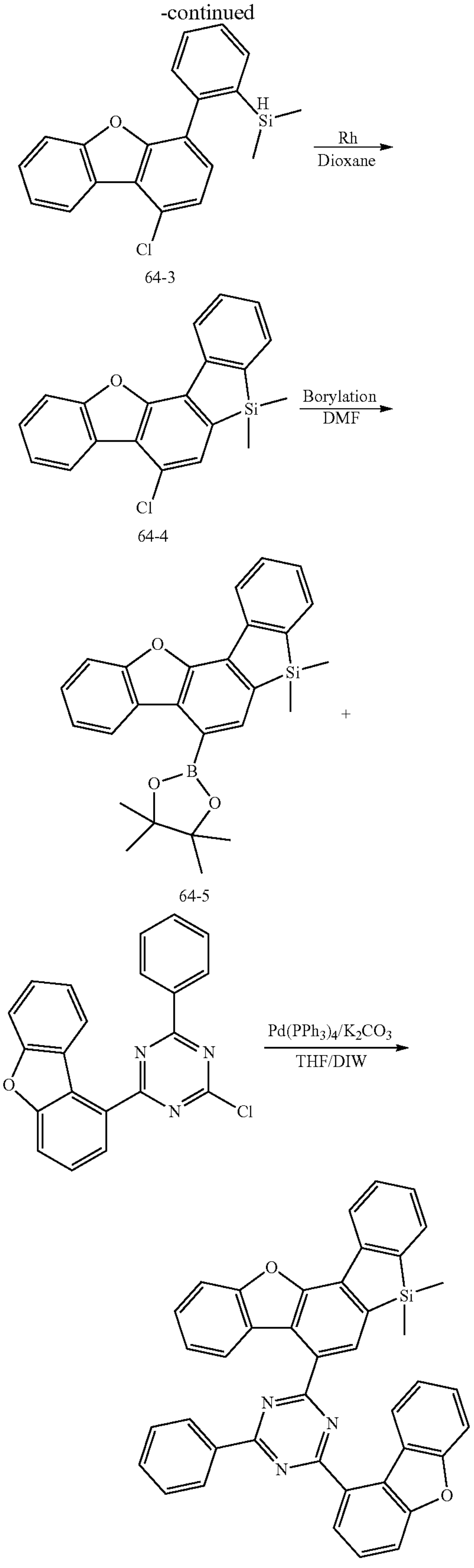

64-3

64-4

64-5

64

1st Step: Synthesis of Intermediate 64-1

4-bromo-1-chlorodibenzofuran (50.0 g, 178 mmol) and triisopropyl borate (40.1 g, 213 mmol) were dissolved in 1 L of anhydrous THE and then, stirred at −78° C. After 30 minutes, a 2.5 M n-butyllithium solution (85.2 mL, 213 mmol) was slowly added thereto in a dropwise fashion and then, stirred for 12 hours. When a reaction was completed, a small amount of diluted hydrochloric acid was added thereto and then, stirred for 1 hour. After separating an organic layer through two extractions with a mixed solvent of distilled water and dichloromethane, an organic solvent of the organic layer was concentrated by using a rotary evaporator. The concentrated organic layer was slurry-stirred/purified with n-hexane, obtaining 34.6 g (79.0%) of Intermediate 64-1.

2nd Step: Synthesis of Intermediate 64-2

Intermediate 64-1 (34.6 g, 140 mmol), 1-bromo-2-iodobenzene (41.7 g, 147 mmol), $Pd(PPh_3)_4$ (8.1 g, 7 mmol), and $K_2CO_3$ (58.2 g, 421 mmol) were dissolved in 700 mL of a mixed solvent of tetrahydrofuran:distilled water (2:1) and then, stirred under reflux at 80° C. for 12 hours. When a reaction was completed, the resultant was recrystallized with a mixed solvent of dichloromethane and n-hexane, obtaining 41.2 g (82.1%) of Intermediate 64-2.

3rd Step: Synthesis of Intermediate 64-3

Intermediate 64-2 (41.2 g, 115 mmol) was dissolved in 600 mL of anhydrous THE and then, stirred at −78° C. After 30 minutes, a 2.5 M n-butyllithium solution (55.2 mL, 138 mmol) was slowly added thereto in a dropwise fashion. After 30 minutes, dichlorodimethylsilane (12.0 g, 127 mmol) was slowly added thereto in a dropwise fashion and then, stirred for 12 hours. When a reaction was completed, the resultant was extracted twice with a mixed solvent of ethyl acetate and distilled water to separate an organic layer, and the organic layer was purified through silica gel column chromatography, obtaining 23.1 g (59.4%) of Intermediate 64-3.

4th Step: Synthesis of Intermediate 64-4

Intermediate 64-3 (23.1 g, 69 mmol) and tris(triphenylphosphine)rhodium(I) chloride (1.3 g, 1 mmol) were dissolved in 300 mL of 1,4-dioxane and stirred under reflux at 110° C. for 12 hours. When a reaction was completed, the resultant was purified through column chromatography with a mixed solvent of dichloromethane:n-hexane, obtaining 15.5 g (67.5%) of Intermediate 64-4.

5th Step: Synthesis of Intermediate 64-5

Intermediate 64-4 (15.5 g, 46 mmol), bis(pinacolato) diboron (15.3 g, 60 mmol), potassium acetate (13.6 g, 139 mmol), tricyclohexylphosphine (2.6 g, 9 mmol), and [1,1'-bis(diphenylphosphino)ferrocene]-dichloropalladium (II) (1.9 g, 2 mmol) were added to 250 mL of N,N-dimethylformamide and then, stirred under reflux at 150° C. for 12 hours. When a reaction was completed, the solution was put in an excess of DIW to form precipitates. The precipitates were filtered, dissolved in toluene by boiling, and filtered again through silica gel. The filtered solution was recrystallized as it was, obtaining 17.7 g (89.7%) of Intermediate 64-5.

6th Step: Synthesis of Compound 64

Compound 64 was synthesized/purified in the same manner as in the 2nd step of Intermediate 64-2 of Synthesis Example 1 except that Intermediate 64-5 and 2-chloro-4-(dibenzo[b,d]furan-1-yl)-6-phenyl-1,3,5-triazine were used as a starting material. LC/MS calculated for: C41H27N3O2Si Exact Mass: 621.19 found for 622.30 [M+H]

Synthesis Example 2: Synthesis of Compound 84

[Reaction Scheme 2]

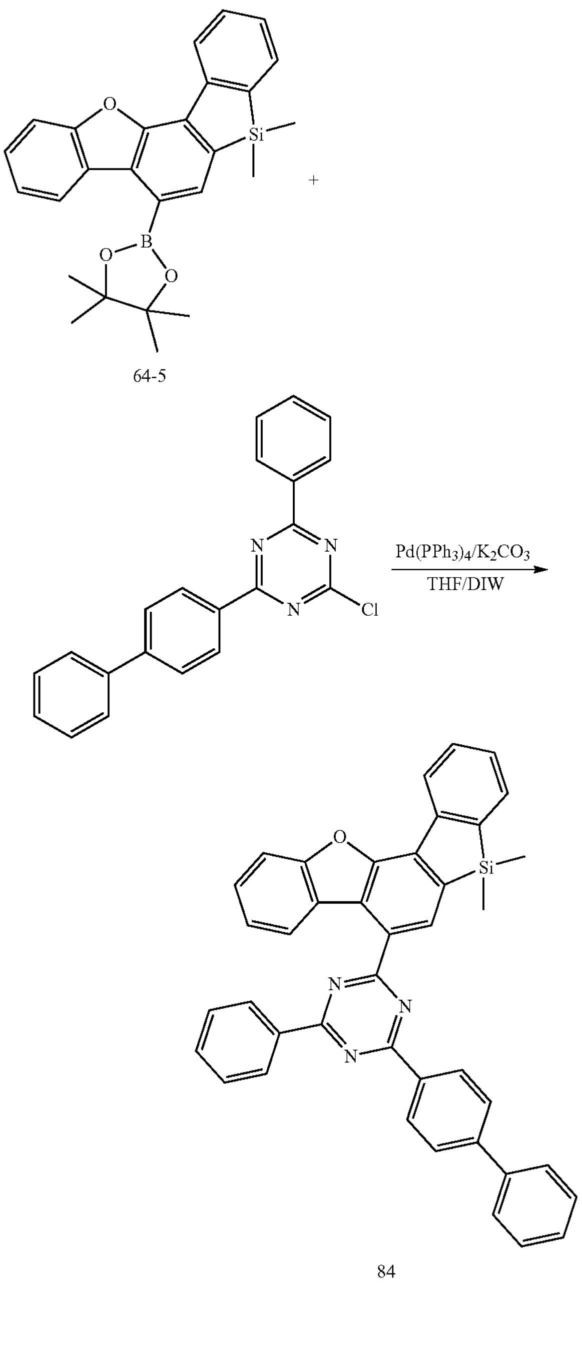

a) Synthesis of Compound 84

Compound 84 was synthesized in the same manner as in the 2nd step of Synthesis Example 1 except that Intermediate 64-5 and 2-([1,1'-biphenyl]-4-yl)-4-chloro-6-phenyl-1,3,5-triazine were used as a starting material. LC/MS calculated for: C41H29N3OSi Exact Mass: 607.21 found for 608.27 [M+H]

Synthesis Example 3: Synthesis of Compound 85

[Reaction Scheme 3]

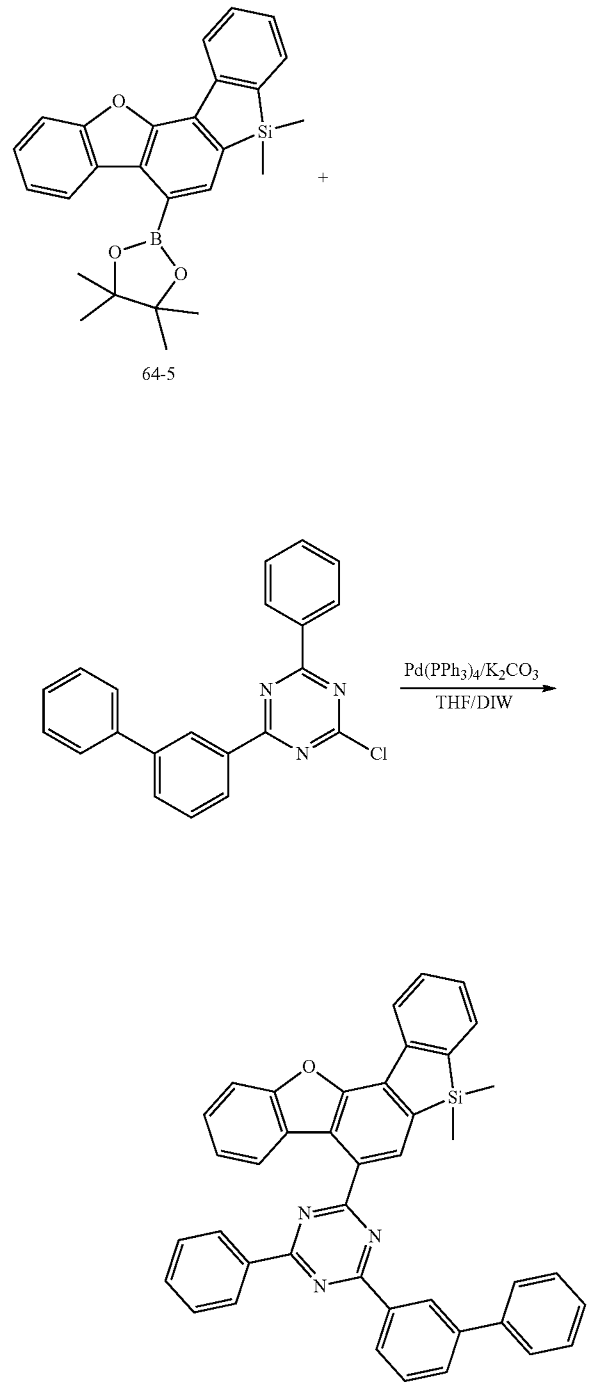

64-5

85 a) Synthesis of Compound 85

Compound 85 was synthesized/purified in the same manner as in the 2nd step of Synthesis Example 1 except that Intermediate 64-5 and 2-([1,1'-biphenyl]-3-yl)-4-chloro-6-phenyl-1,3,5-triazine were used as a starting material. LC/MS calculated for: C41H29N3OSi Exact Mass: 607.21 found for 608.43 [M+H]

Synthesis Example 4: Synthesis of Compound 134

[Reaction Scheme 4]

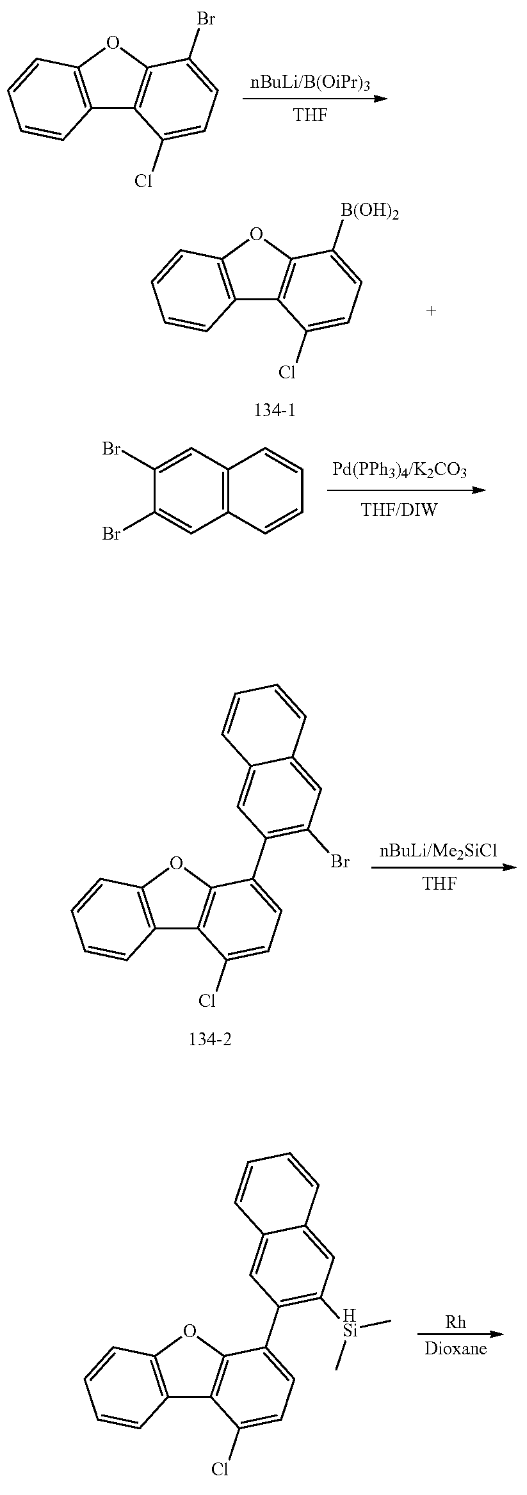

134-1

134-2

134-3

-continued

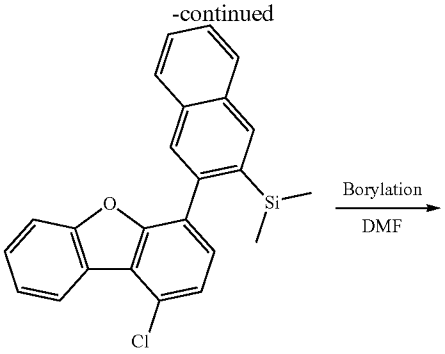

134-4

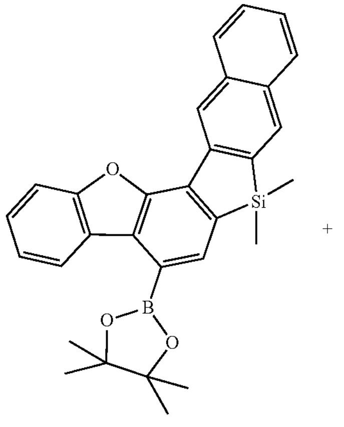

134-5

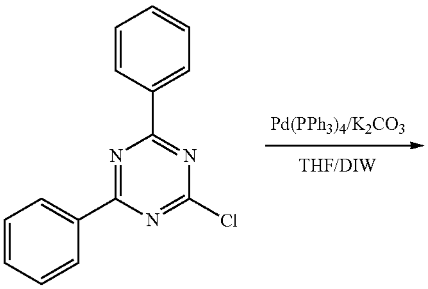

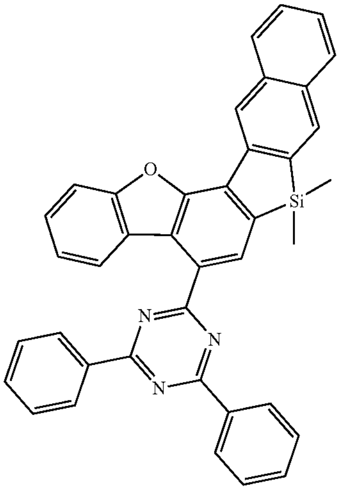

134

Intermediate 134-5 was synthesized in the same manner as in the 1st to 5th steps of Synthesis Example 1 except that 2,3-dibromonaphthalene instead of the 1-bromo-2-iodobenzene was used for the reaction in the 2nd step of Synthesis Example 1, and Compound 134 was synthesized/purified in the same manner as in the 2nd step of Synthesis Example 1 using Intermediate 134-5 and 2-chloro-4,6-diphenyl-1,3,5-triazine were used as a starting material. LC/MS calculated for: C39H27N3OSi Exact Mass: 581.19 found for 582.20 [M+H]

Synthesis Example 5: Synthesis of Compound 142

[Reaction Scheme 5]

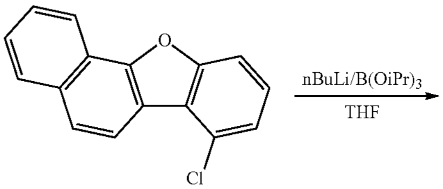

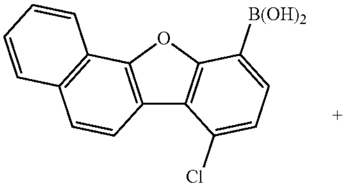

142-1

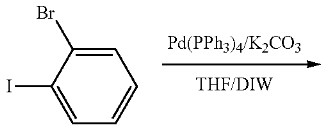

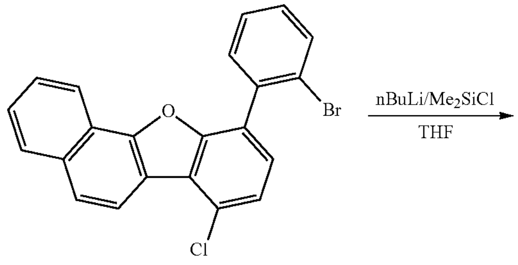

142-2

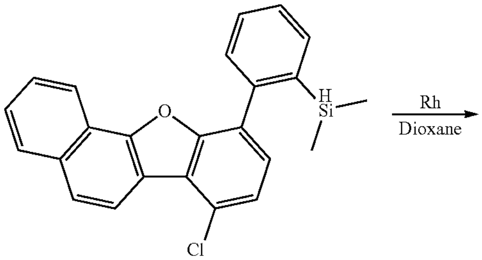

142-3

-continued

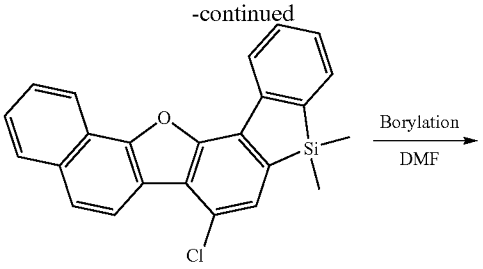

142-4

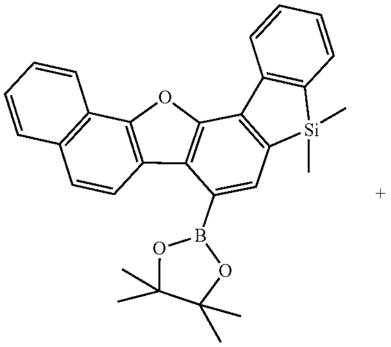

142-5

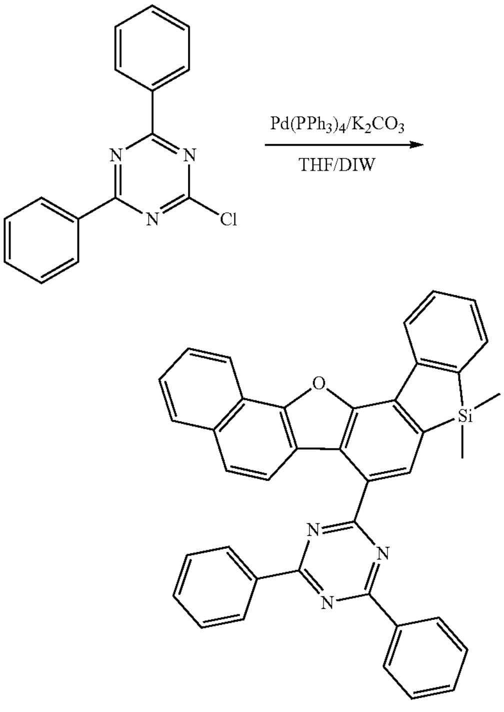

142

1st Step: Synthesis of Intermediate 142-1

7-chloronaphtho[1,2-b]benzofuran (50.0 g, 198 mmol) was dissolved in 1 L of anhydrous THF and then, stirred at −78° C. After 30 minutes, a 2.5 M n-butyllithium solution (95.0 mL, 237 mmol) was slowly added thereto and then, additionally stirred at ambient temperature for 8 hours. After the 8 hours, the resultant was cooled again to −78° C., and triisopropyl borate (44.7 g, 237 mmol) was slowly added thereto and then, stirred for 12 hours. When a reaction was completed, a small amount of diluted hydrochloric acid was added thereto and then, stirred for 1 hour. After separating an organic layer through two extractions with a mixed solvent of distilled water and dichloromethane, an organic solvent of the organic layer was concentrated by using a rotary evaporator. The concentrated organic layer was slurry-stirred/purified with n-hexane, obtaining 36.2 g (74.3%) of Intermediate 142-1.

2nd Step: Synthesis of Compound 142

Intermediate 142-5 was synthesized in the same manner as in the 1st to 5th steps of Synthesis Example 1 except that Intermediate 142-1 instead of Intermediate 64-1 was used for a reaction, and Compound 142 was synthesized/purified in the same manner as in the 2nd step of Synthesis Example 1 except that Intermediate 142-5 and 2-chloro-4,6-diphenyl-1,3,5-triazine were used as a starting material. LC/MS calculated for: C39H27N30Si Exact Mass: 581.19 found for 582.10 [M+H]

Comparative Synthesis Example 1: Synthesis of Compound C-1

[Reaction Scheme 6]

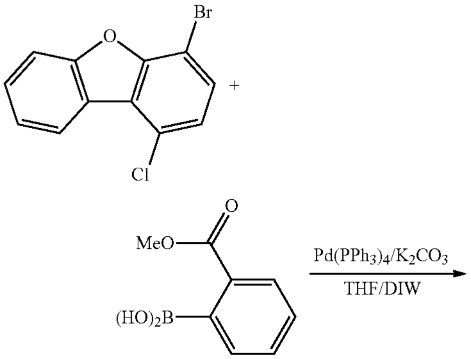

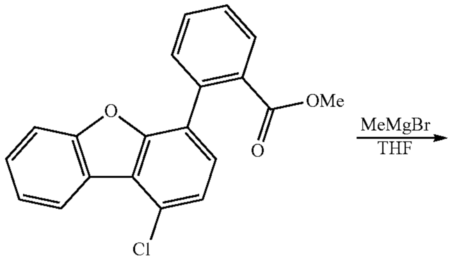

C-1-1

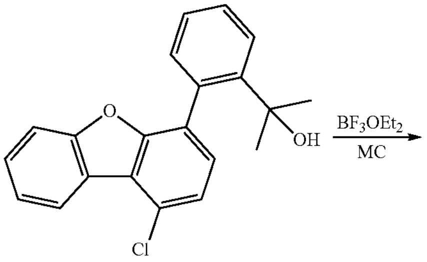

C-1-2

-continued

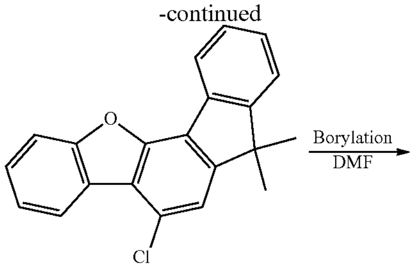

C-1-3

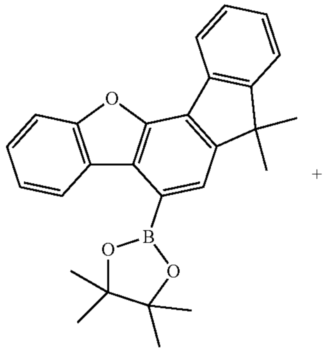

C-1-4

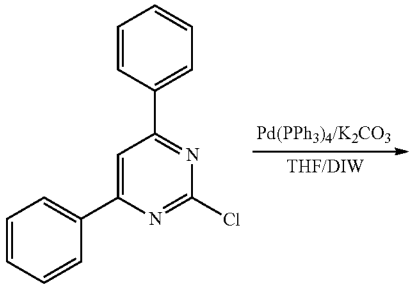

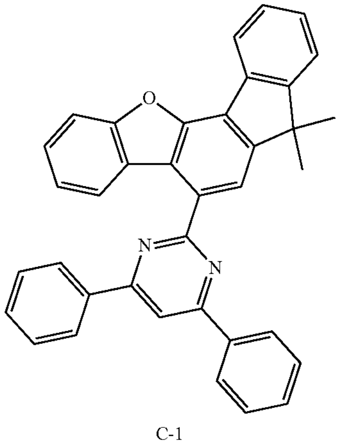

C-1

1st Step: Synthesis of Intermediate C-1-1

Intermediate C-1-1 was synthesized/purified in the same manner as in the 2nd step of Synthesis Example 1 except that 4-bromo-1-chlorodibenzofuran and (2-(methoxycarbonyl) phenyl)boronic acid were used as a starting material.

2nd Step: Synthesis of Intermediate C-1-2

Intermediate C-1-1 (85.4 g, 254 mmol) was dissolved in 500 mL of anhydrous THF, and a methyl magnesium bromide solution (211.8 mL, 634 mmol) was slowly added thereto in a dropwise fashion at −78° C. After 12 hours, when a reaction was completed, the solution was slowly poured into ice water. The obtained mixture was extracted twice with ethyl acetate and distilled water and then, filtered with silica gel. An organic layer therefrom was completely evaporated and dried without further purification, obtaining 72.6 g (85.0%) of Intermediate C-1-2.

c) Synthesis of Intermediate C-1-3

Intermediate C-1-2 (72.6 g, 216 mmol) was dissolved in 400 mL of dichloromethane, and boron trifluoride etherate (29.3 mL, 237 mmol) was slowly added thereto in a dropwise fashion at 0° C. After 12 hours, when a reaction was completed, the solution was slowly poured into distilled water. The mixture was twice extracted with dichloromethane and distilled water and then, filtered with silica gel. An organic layer therefrom was all evaporated and then, recrystallized with toluene, obtaining 37.3 g (54.3%) of Intermediate C-1-3.

d) Synthesis of Intermediate C-1-4

Intermediate C-1-4 was synthesized/purified in the same manner as in the 5th step of Synthesis Example 1 except that Intermediate C-1-3 was used as a starting material.

e) Synthesis of Compound C-1

Compound C-1 was synthesized in the same manner as in the 2nd step of Synthesis Example 1 except that Intermediate C-1-4 and 2-chloro-4,6-diphenylpyrimidine were used as a starting material. LC/MS calculated for: C37H26N2O Exact Mass: 514.20 found for 515.43 [M+H]

Comparative Synthesis Example 2: Synthesis of Compound C-2

[Reaction Scheme 7]

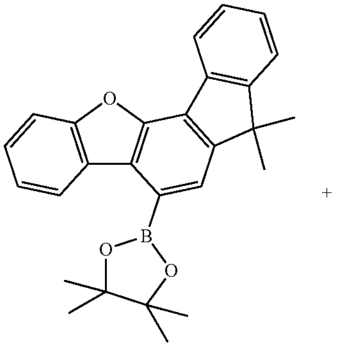

C-1-4

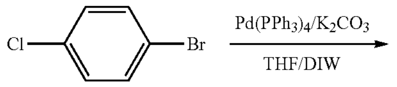

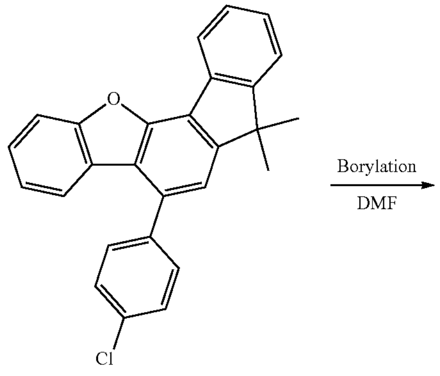

C-2-1

-continued

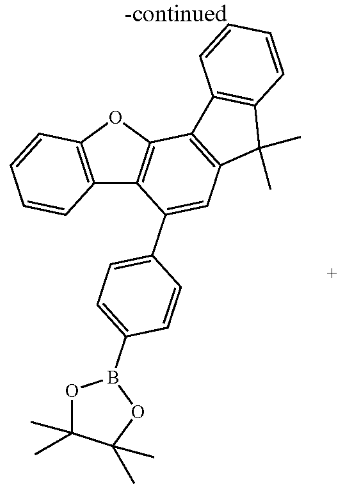

C-2-2

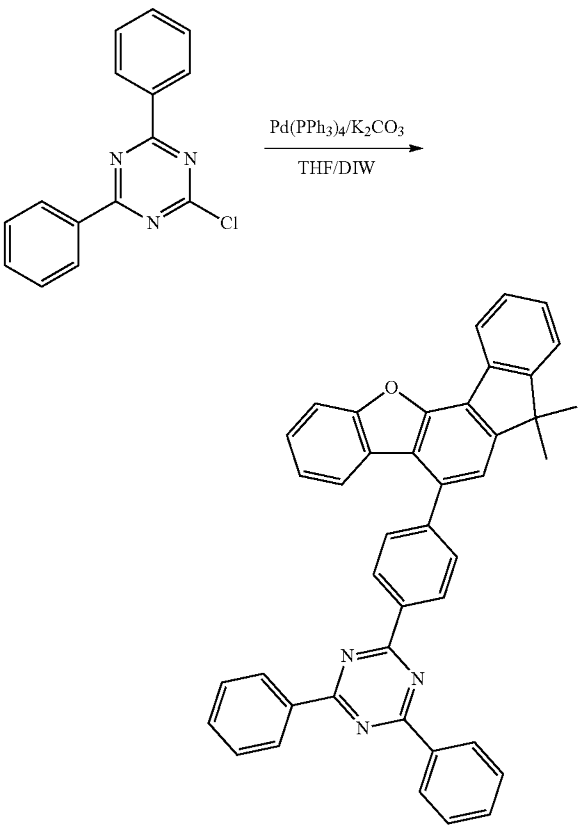

C-2

1st Step: Synthesis of Intermediate C-2-1

Intermediate C-2-1 was synthesized/purified in the same manner as in the 2nd step of Example 1 except that Intermediate C-1-4 and 1-bromo-4-chlorobenzene were used as a starting material.

2nd Step: Synthesis of Intermediate C-2-2

Intermediate C-2-2 was synthesized/purified in the same manner as in the 5th of Synthesis Example 1 except that Intermediate C-2-1 was used as a starting material.

c) Synthesis of Compound C-2

Compound C-2 was synthesized/purified in the same manner as in the 2nd step of Synthesis Example 1 except that Intermediate C-2-2 and 2-chloro-4,6-diphenyltriazine were used as a starting material. LC/MS calculated for: C42H29N3O Exact Mass: 591.23 found for 592.40 [M+H]

Comparative Synthesis Example 3: Synthesis of Compound C-3

[Reaction Scheme 8]

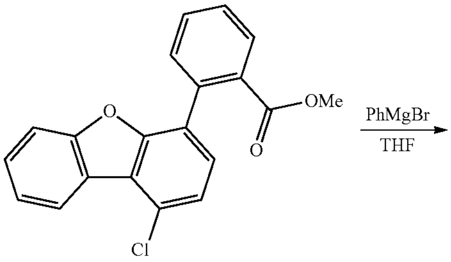

C-1-1

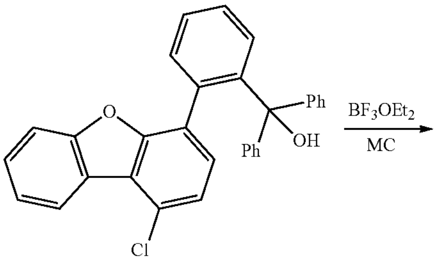

C-3-1

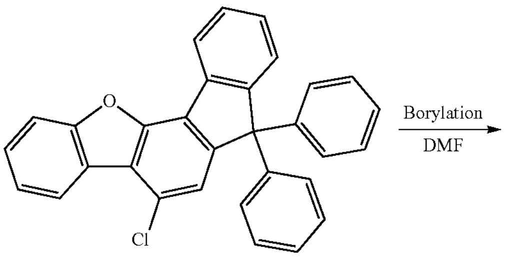

C-3-2

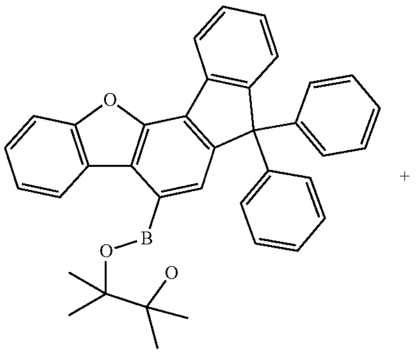

C-3-3

-continued

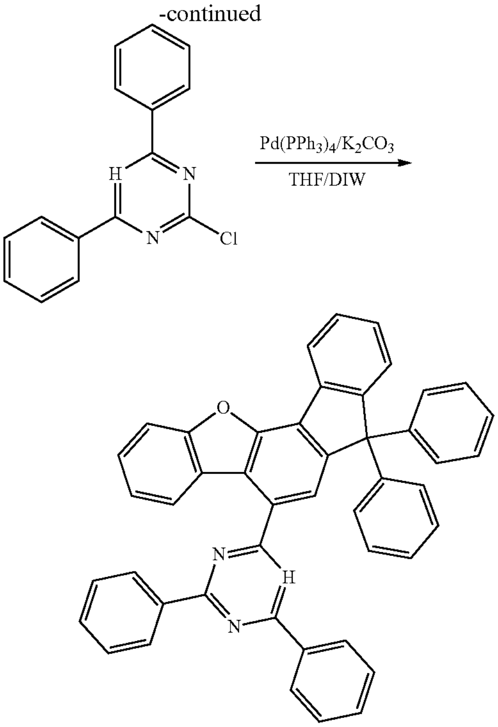

C-3

1st Step: Synthesis of Intermediate C-3-1

Intermediate C-3-1 was synthesized/purified in the same manner as in the 2nd step of Comparative Synthesis Example 1 except that Intermediate C-1-1 and phenyl magnesium bromide were used as a starting material.

2nd Step: Synthesis of Intermediate C-3-2

Intermediate C-3-2 was synthesized/purified in the same manner as in the 3rd step of Comparative Synthesis Example 1 except that Intermediate C-3-1 was used as a starting material.

3rd Step: Synthesis of Intermediate C-3-3

Intermediate C-3-3 was synthesized/purified in the same manner as in the 4th step of Comparative Synthesis Example 1 except that Intermediate C-3-2 was used as a starting material.

4th Step: Synthesis of Compound C-3

Compound C-3 was synthesized/purified in the same manner as in the 2nd step of Synthesis Example 1 except that Intermediate C-3-3 and 2-chloro-4,6-diphenyltriazine were used as a starting material. LC/MS calculated for: C46H29N3O Exact Mass: 639.23 found for 640.33 [M+H]

Comparative Synthesis Example 4: Synthesis of Compound C-4

[Reaction Scheme 9]

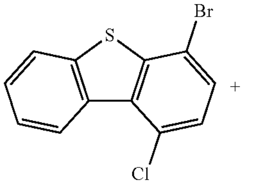

-continued

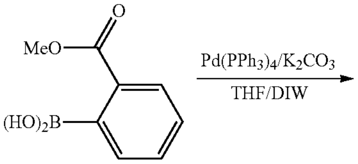

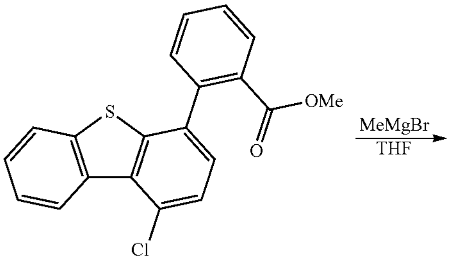

C-4-1

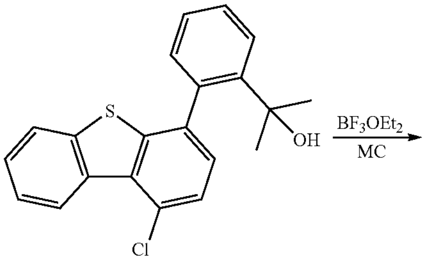

C-4-2

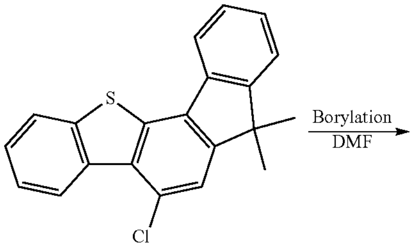

C-4-3

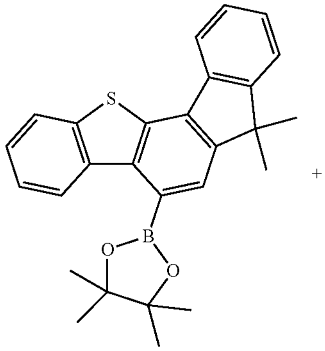

C-4-4

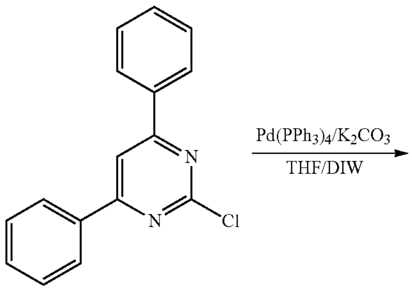

-continued

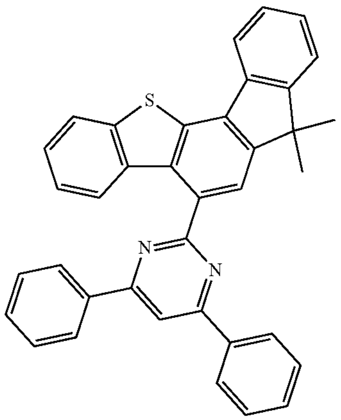

C-4

1st Step: Synthesis of Compound C-4

Intermediate C-4-4 was synthesized in the same manner as in the 1st to 4th steps of Comparative Synthesis Example 1, except that 4-bromo-1-chlorodibenzothiophene instead of the 4-bromo-1-chlorodibenzofuran was used for a reaction in the 1st step of Comparative Synthesis Example 1, and Compound C-4 was synthesized/purified in the same manner as in the 2nd step of Synthesis Example 1 except that Intermediate C-4-4 and 2-chloro-4,6-diphenylpyrimidine were used as a starting material. LC/MS calculated for: C37H26N2S Exact Mass: 530.18 found for 531.22 [M+H]

Comparative Synthesis Example 5: Synthesis of Compound C-5

[Reaction Scheme 10]

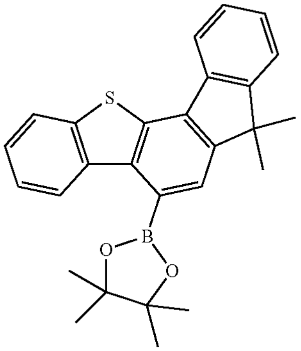

C-4-4

+

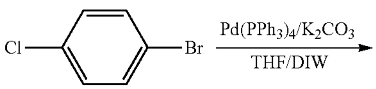

-continued

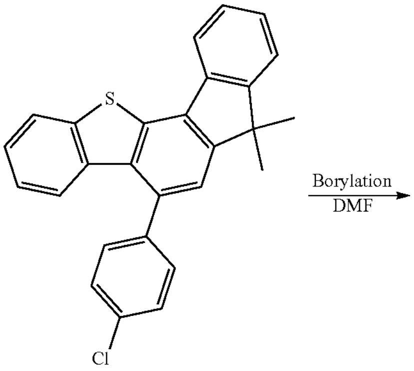

C-5-1

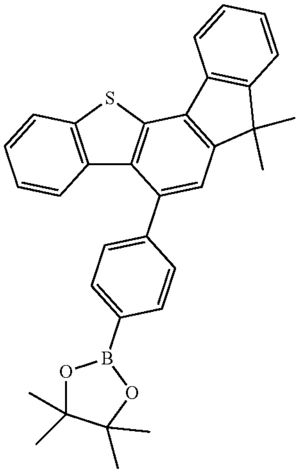

+

C-5-2

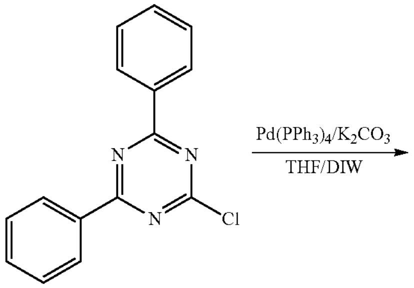

-continued

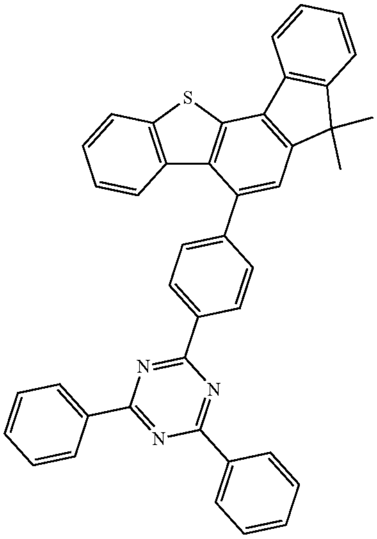

C-5

Intermediate C-5-2 was synthesized in the same manner as in the 1st and 2nd steps of Comparative Synthesis Example 2 except that Intermediate C-4-4 instead of Intermediate C-1-4 was used for a reaction in the 1st step of Comparative Synthesis Example 2, and Compound C-5 was synthesized/purified in the same manner as in the 2nd step of Synthesis Example 1 except that Intermediate C-5-2 and 2-chloro-4,6-diphenyltriazine were used as a starting material. LC/MS calculated for: C42H29N3S Exact Mass: 607.21 found for 608.47 [M+H]

Comparative Synthesis Example 6: Synthesis of Compound C-6

[Reaction Scheme 11]

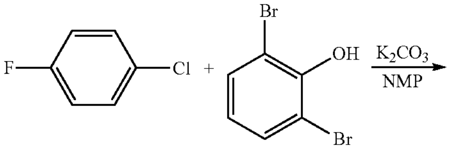

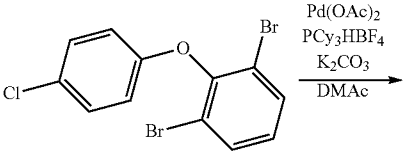

C-6-1

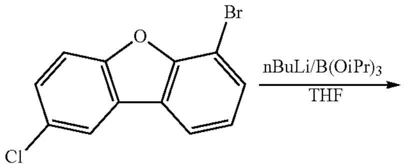

C-6-2

-continued

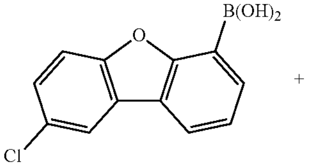

C-6-3

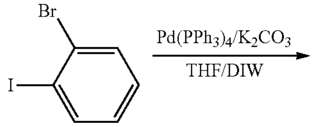

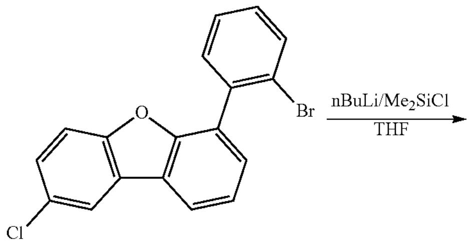

C-6-4

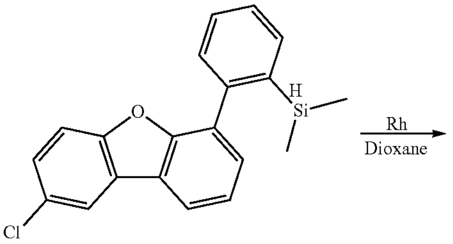

C-6-5

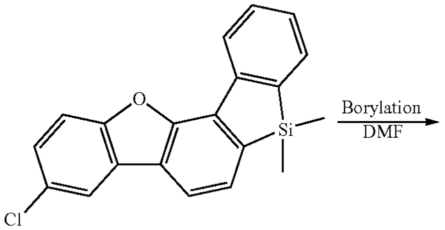

C-6-6

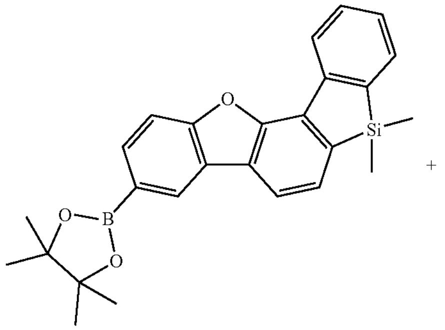

C-6-7

-continued

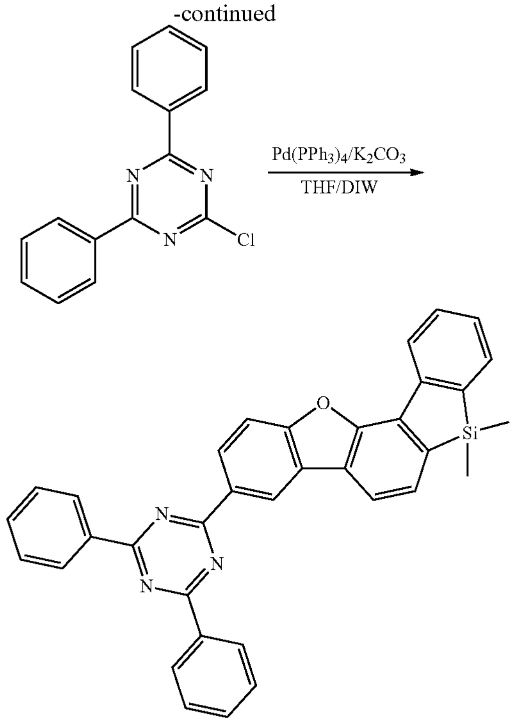

C-6

1st Step: Synthesis of Intermediate C-6-1

1-chloro-4-fluorobenzene (103.7 g, 794 mmol), 2,6-dibromophenol (50.0 g, 199 mmol), and $K_2CO_3$ (82.3 g, 596 mmol) were dissolved in 1 L of NMP and then, stirred under reflux at 180° C. After 12 hours, when a reaction was completed, the solution was slowly poured into distilled water. The mixture was extracted twice with dichloromethane and distilled water and then, filtered with silica gel. An organic layer therefrom was all evaporated and then, slurry-purified with methyl alcohol, obtaining 62.7 g (87.2%) of Intermediate C-6-1.

2nd Step: Synthesis of Intermediate C-6-2

Intermediate C-6-1 (62.7 g, 173 mmol), $Pd(OAc)_2$ (1.9 g, 9 mmol), $PCy_3HBF_4$ (10.0 g, 26 mmol), and $K_2CO_3$ (47.8 g, 346 mmol) were dissolved in 800 mL of DMAc and then, stirred under reflux at 180° C. After 12 hours, when a reaction was completed, the solution was slowly poured into distilled water. The mixture was extracted twice with dichloromethane and distilled water and then, filtered with silica gel. An organic layer therefrom was all evaporated and recrystallized with a mixed solution of dichloromethane:n-hexane, obtaining 20.0 g (41.1%) of Intermediate C-6-2.

3rd Step: Synthesis of Intermediate C-6-3

Intermediate C-6-3 was synthesized/purified in the same manner as in the 1st of Synthesis Example 1 except that Intermediate C-6-2 was used as a starting material.

4th Step: Synthesis of Intermediate C-6-4

Intermediate C-6-4 was synthesized/purified in the same manner as in the 2nd of Synthesis Example 1 except that Intermediate C-6-3 was used as a starting material.

5th Step: Synthesis of Intermediate C-6-5

Intermediate C-6-5 was synthesized/purified in the same manner as in the 3rd of Synthesis Example 1 except that Intermediate C-6-4 was used as a starting material.

6th Step: Synthesis of Intermediate C-6-6

Intermediate C-6-6 was synthesized/purified in the same manner as in the 4th of Synthesis Example 1 except that Intermediate C-6-5 was used as a starting material.

7th Step: Synthesis of Intermediate C-6-7

Intermediate C-6-7 was synthesized/purified in the same manner as in the 5th of Synthesis Example 1 except that Intermediate C-6-6 was used as a starting material.

8th Step: Synthesis of Compound C-6

Compound C-6 was synthesized/purified in the same manner as in the 2nd of Synthesis Example 1 except that Intermediate C-6-7 and 2-chloro-4,6-diphenyltriazine were used as a starting material. LC/MS calculated for: C35H25N3OSi Exact Mass: 531.18 found for 532.22 [M+H]

Synthesis Example 6: Synthesis of Compound A-84

[Reaction Scheme 12]

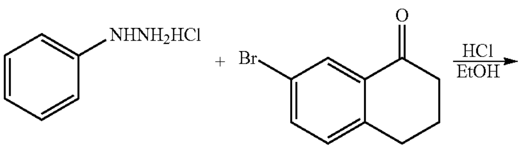

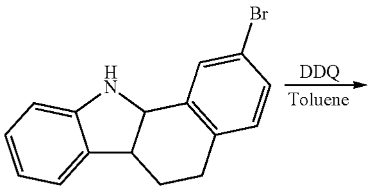

2-1a

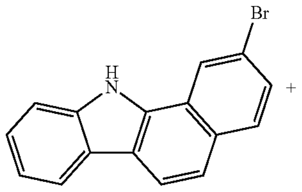

2-1b

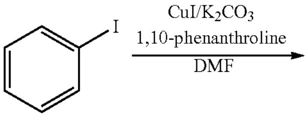

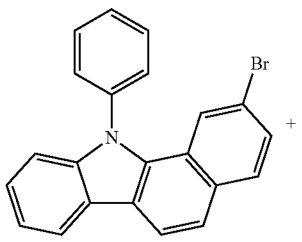

2-1c

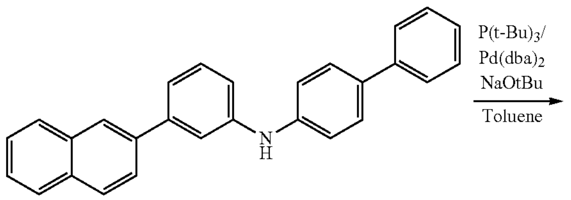

2-1d

-continued

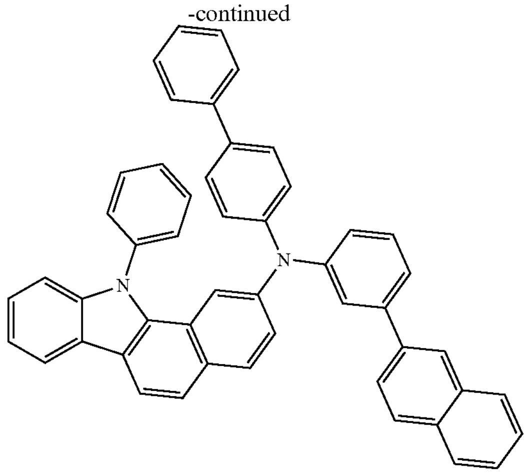

A-84

1st Step: Synthesis of Intermediate 2-1a

Phenylhydrazine hydrochloride (70.0 g, 484.1 mmol) and 7-bromo-3,4-dihydro-2H-naphthalen-1-one (108.9 g, 484.1 mmol) were dissolved in ethanol (1,200 ml) in a round-bottomed flask. 60 mL of hydrochloric acid was slowly added thereto in a dropwise fashion at ambient temperature and then, stirred at 90° C. for 12 hours. When a reaction was completed, after removing a solvent therefrom under a reduced pressure, an excess of EA was used for extraction. After removing an organic solvent therefrom under a reduced pressure, the residue was stirred in a small amount of methanol and then, filtered, obtaining 95.2 g (66%) of Intermediate 2-1a.

2nd Step: Synthesis of Intermediate 2-1b

Intermediate 2-1a (95.2 g, 319.3 mmol) and 2,3-dichloro-5,6-dicyano-1,4-benzoquinone (108.7 g, 478.9 mmol) were dissolved in 600 ml of toluene in a round-bottomed flask. The solution was stirred at 80° C. for 12 hours. When a reaction was completed, after removing a solvent, 41.3 g (44%) of Intermediate 2-1b was obtained through column chromatography.

3rd Step: Synthesis of Intermediate 2-1c

Intermediate 2-1b (41.3 g, 139.0 mmol), iodobenzene (199.2 g, 976.0 mmol), CuI (5.31 g, 28.0 mmol), $K_2CO_3$ (28.9 g, 209.0 mmol), and 1,10-phenanthroline (5.03 g, 28.0 mmol) were dissolved in 500 ml of DMF in a round-bottomed flask. The solution was stirred at 180° C. for 12 hours. When a reaction was completed, after removing a reaction solvent therefrom under a reduced pressure, the residue was dissolved in dichloromethane and then, filtered with silica gel. A product filtered therefrom was concentrated with dichloromethane and recrystallized with hexane, obtaining 39.0 g (75%) of Intermediate 2-1c.

4th Step: Synthesis of Compound A-84

5.0 g (13.46 mmol) of Intermediate 2-1c, 4.41 g (13.46 mmol) of an amine intermediate 2-1d, 1.94 g (20.19 mmol) of sodium t-butoxide, and 0.54 g (1.35 mmol) of tri-tert-butylphosphine were dissolved in 100 ml of toluene, and 0.37 g (0.4 mmol) of $Pd(dba)_2$ was added thereto and then, stirred under reflux for 12 hours under a nitrogen atmosphere. When a reaction was completed, after extraction with toluene and distilled water, an organic layer therefrom was dried with anhydrous magnesium sulfate and filtered, and a filtrate therefrom was concentrated under a reduced pressure. A product therefrom was purified with normal hexane/dichloromethane (volume ratio: 2:1) through silica gel column chromatography, obtaining 6.4 g (Yield: 82.0%) of Compound A-84.

Synthesis Example 7: Synthesis of Compound 2-92

[Reaction Scheme 13]

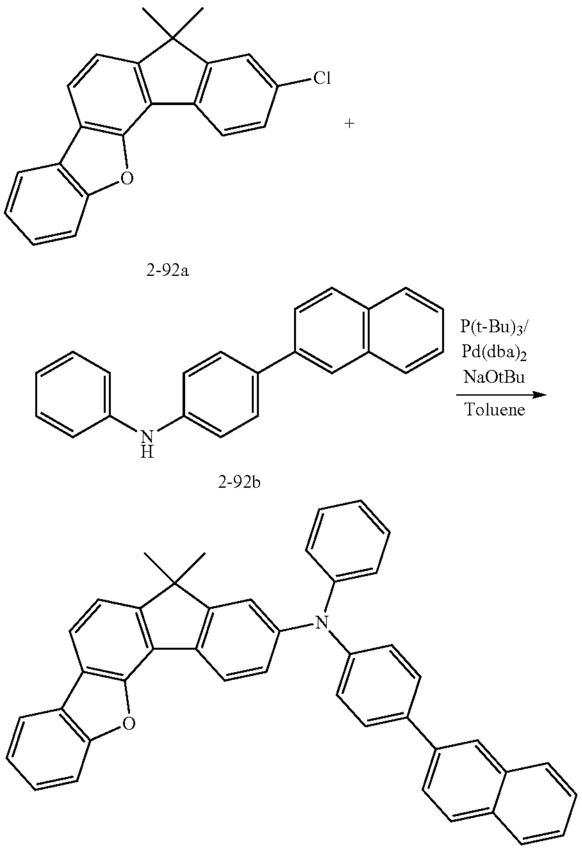

2-92a 2-92b 2-92

1st Step: Synthesis of Intermediate 2-92a

Intermediate 2-92a was synthesized as described in KR10-1423173 B1.

2nd Step: Synthesis of Compound 2-92

5.0 g (16.93 mmol) of Intermediate 2-92a, 5.4 g (16.93 mmol) of an amine intermediate 2-92b, 2.44 g (25.39 mmol) of sodium t-butoxide, and 0.68 g (1.69 mmol) of tri-tert-butylphosphine were dissolved in 100 ml of toluene, and 0.47 g (0.51 mmol) of $Pd(dba)_2$ was added thereto and then, stirred under reflux for 12 hours under a nitrogen atmosphere. When a reaction was completed, after extraction with toluene and distilled water, an organic layer therefrom was dried with anhydrous magnesium sulfate and filtered, and a filtrate therefrom was concentrated under a reduced pressure. A product therefrom was purified with normal hexane/dichloromethane (volume ratio: 2:1) through silica gel column chromatography, obtaining 8.2 g (Yield: 84.0%) of Compound 2-92.

(Manufacture of Organic Light Emitting Diode)

Example 1

The glass substrate coated with ITO (Indium tin oxide) at a thickness of 1,500 Å was washed with distilled water. After washing with the distilled water, the glass substrate was ultrasonically washed with isopropyl alcohol, acetone, or methanol, and dried and then, moved to a plasma cleaner, cleaned by using oxygen plasma for 10 minutes, and moved to a vacuum depositor. This obtained ITO transparent electrode was used as an anode, Compound A doped with 3% NDP-9 (available from Novaled) was vacuum-deposited on the ITO substrate to form a 100 Å-thick hole injection layer, and Compound A was deposited on the hole transport layer to form a 1,300 Å-thick hole transport layer. On the hole transport layer, Compound B was deposited at a thickness of 700 Å to form a hole transport auxiliary layer. On the hole transport auxiliary layer, 400 Å-thick light emitting layer was formed by using Compound 64 obtained in Synthesis Example 1 and doping 2 wt % of [Ir(piq)$_2$acac] as a dopant by vacuum-deposition. Subsequently, on the light emitting layer, Compound C was deposited at a thickness of 50 Å to form an electron transport auxiliary layer and Compound D and LiQ were simultaneously vacuum-deposited in a weight ratio of 1:1 to form a 300 Å-thick electron transport layer. On the electron transport layer, Liq and Al were sequentially vacuum-deposited to be 15 Å-thick and 1,200 Å-thick, manufacturing an organic light emitting diode.

The organic light emitting diode had a structure having a five-layered organic thin film layer, as follows.

ITO/Compound A (3% NDP-9 doping, 100 Å)/Compound A (1,300 Å) /Compound B (700 Å)/EML [Compound 64: Ir(piq)$_2$acac=98:2 (w/w)] (400 Å) /Compound C (50 Å)/Compound D: Liq (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-di ([1,1'-biphenyl]-4-yl)-7,7-dimethyl-7H-fluoreno[4,3-b]benzofuran-10-amine Compound C: 2-(3-(3-(9,9-dimethyl-9H-fluoren-2-yl) phenyl)phenyl)-4,6-diphenyl-1,3,5-triazine Compound D: 8-(4-(4,6-di(naphthalen-2-yl)-1,3,5-triazin-2-yl)phenyl)quinoline

Examples 2 to 5 and Comparative Examples 1 to 6

Diodes of Examples 2 to 5 and Comparative Examples 1 to 6 were respectively manufactured according to the same method as Example 1 except that the host was changed as shown in Table 1.

Examples 6 to 15 and Comparative Examples 7 to 12

Diodes of Examples 6 to 15 and Comparative Examples 7 to 12 were respectively manufactured according to the same method as Example 1 except that the hosts were changed as shown in Table 2 and the first host and the second host were mixed in a weight ratio of 5:5.

Evaluations

The luminous efficiency and life-span characteristics of the organic light emitting diodes according to Example 1 to Example 15, Comparative Example 1 to Comparative Example 12 were evaluated. Specific measurement methods are as follows, and the results are shown in Tables 1 and 2.

(1) Measurement of Current Density Change Depending on Voltage Change

The obtained organic light emitting diodes were measured regarding a current value flowing in the unit device, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Luminous Efficiency

The current efficiency (cd/A) of the same current density (10 mA/cm$^2$) was calculated using the luminance, current density, and voltage measured from the (1) and (2).

Relative values based on the luminous efficiency of Comparative Example 1 and Comparative Example 7 were calculated and shown in Tables 1 and 2.

(4) Measurement of Life-Span

T95 life-spans of the diodes according to Examples 1 to 15 and Comparative Examples 1 to 12 were measured as a time when their luminance decreased down to 95% relative to the initial luminance (cd/m$^2$) after emitting light with 6,000 cd/m$^2$ as the initial luminance (cd/m$^2$) and measuring their luminance decreases depending on a time with a Polanonix life-span measurement system.

The relative values based on the T95 life-spans of Comparative Examples 1 and 7 were calculated and shown in Tables 1 and 2.

(5) Measurement of Driving Voltage

The driving voltage of each diode was measured at 15 mA/cm$^2$ using a current-voltmeter (Keithley 2400), and the results were obtained.

Relative values based on the driving voltages of Comparative Example 1 and Comparative Example 7 were calculated and shown in Tables 1 and 2.

TABLE 1

| | Single host | Driving voltage (%) | Efficiency (%) |
|---|---|---|---|
| Example 1 | Compound 64 | 88 | 115 |
| Example 2 | Compound 84 | 88 | 115 |
| Example 3 | Compound 85 | 90 | 113 |
| Example 4 | Compound 134 | 90 | 113 |
| Example 5 | Compound 142 | 90 | 115 |
| Comparative Example 1 | Compound C-1 | 100 | 100 |
| Comparative Example 2 | Compound C-2 | 92 | 103 |
| Comparative Example 3 | Compound C-3 | 93 | 110 |
| Comparative Example 4 | Compound C-4 | 101 | 101 |
| Comparative Example 5 | Compound C-5 | 93 | 103 |
| Comparative Example 6 | Compound C-6 | 97 | 103 |

TABLE 2

| | Host | | T95 life-span | Driving voltage | Efficiency |
|---|---|---|---|---|---|
| | First host | Second host | (%) | (%) | (%) |
| Example 6 | Compound 64 | Compound A-84 | 350 | 85 | 120 |
| Example 7 | Compound 64 | Compound 2-92 | 250 | 92 | 130 |
| Example 8 | Compound 84 | Compound A-84 | 350 | 85 | 115 |

TABLE 2-continued

| | Host | | T95 life-span | Driving voltage | Efficiency |
|---|---|---|---|---|---|
| | First host | Second host | (%) | (%) | (%) |
| Example 9 | Compound 84 | Compound 2-92 | 260 | 91 | 130 |
| Example 10 | Compound 85 | Compound A-84 | 200 | 90 | 112 |
| Example 11 | Compound 85 | Compound 2-92 | 180 | 94 | 115 |
| Example 12 | Compound 134 | Compound A-84 | 300 | 89 | 112 |
| Example 13 | Compound 134 | Compound 2-92 | 250 | 94 | 115 |
| Example 14 | Compound 142 | Compound A-84 | 300 | 88 | 120 |
| Example 15 | Compound 142 | Compound 2-92 | 220 | 93 | 125 |
| Comparative Example 7 | Compound C-1 | Compound A-84 | 100 | 100 | 100 |
| Comparative Example 8 | Compound C-2 | Compound 2-92 | 120 | 102 | 103 |
| Comparative Example 9 | Compound C-3 | Compound A-84 | 150 | 99 | 99 |
| Comparative Example 10 | Compound C-4 | Compound 2-92 | 50 | 105 | 102 |
| Comparative Example 11 | Compound C-5 | Compound A-84 | 70 | 98 | 100 |
| Comparative Example 12 | Compound C-6 | Compound 2-92 | 50 | 105 | 105 |

Referring to Tables 1 and 2, when the compound of the Examples was used as a single host or a mixed host in combination with a second host, driving voltages, efficiency, and life-spans were significantly improved, compared to using the comparative compounds or compositions.

By way of summation and review, organic light emitting diodes (OLEDs) are attracting much attention in recent years due to increasing demands for flat panel display devices. The organic light emitting diode is a device that converts electrical energy into light, and the performance of the organic light emitting diode may be influenced by an organic material between electrodes.

One or more embodiments may provide a compound for an organic optoelectronic device capable of implementing a high efficiency and long life-span organic optoelectronic device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an organic optoelectronic device, the composition comprising:

a first compound; and a second compound, wherein:

the first compound is a compound for an organic optoelectronic device represented by Chemical Formula 1, and the second compound is a compound for an organic optoelectronic device represented by Chemical Formula 2:

[Chemical Formula 1]

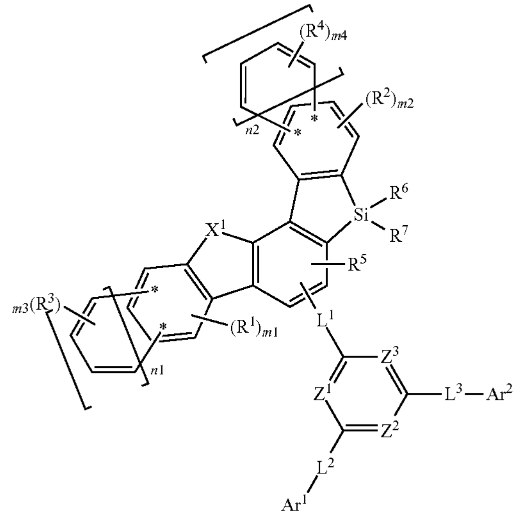

wherein, in Chemical Formula 1, $X^1$ is O or S, $Z^1$ to $Z^3$ are each independently N or $CR^a$, at least two of $Z^1$ to $Z^3$ being N, $L^1$ to $L^3$ are each independently a single bond or a substituted or unsubstituted C6 to C30 arylene group, $Ar^1$ and $Ar^2$ are each independently a substituted or unsubstituted C6 to C30 aryl group or a substituted or unsubstituted C2 to C30 heterocyclic group, $R^a$ and $R^1$ to $R^5$ are each independently hydrogen, deuterium, a substituted or unsubstituted C1 to C20 alkyl group, or a substituted or unsubstituted C6 to C20 aryl group, $R^6$ and $R^7$ are each independently a substituted or unsubstituted C1 to C20 alkyl group or a substituted or unsubstituted C6 to C20 aryl group, m1 and m2 are each independently an integer of 2 to 4, m3 and m4 are each independently an integer of 1 to 4, and n1 and n2 are each independently 0 or 1; and

[Chemical Formula 2]

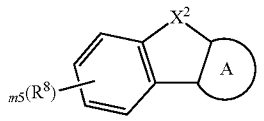

in Chemical Formula 2, $X^2$ is O, S, $NR^b$, $CR^cR^d$, or $SiR^eR^f$, $R^b$, $R^c$, $R^d$, $R^e$, $R^f$, and $R^8$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, m5 is an integer of 1 to 4, and ring A is a ring of Group II,

[Group II]

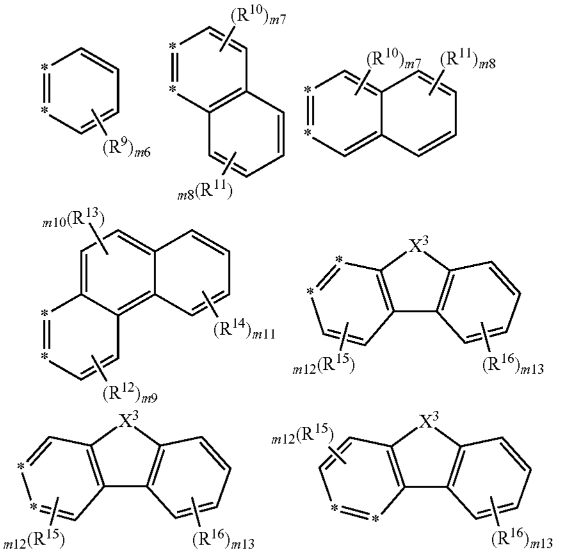

in Group II,

* is a linking carbon, $X^3$ is O, S, $NR^g$, $CR^hR^i$, or $SiR^jR^k$, $R^g$, $R^h$, $R^i$, $R^j$, $R^k$, and $R^9$ to $R^{16}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, m6, m8, m11, and m13 are each independently an integer of 1 to 4, m7, m9, m10, and m12 are each independently 1 or 2, and at least one of $R^8$ to $R^{16}$ is a substituted amine group represented by Chemical Formula a,

[Chemical Formula a]

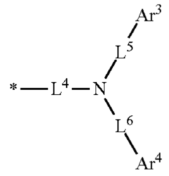

in Chemical Formula a, $L^4$ to $L^6$ are each independently a single bond or a substituted or unsubstituted C6 to C30 arylene group, $Ar^3$ and $Ar^4$ are each independently a substituted or unsubstituted amine group, a substituted or unsubstituted C6 to C30 aryl group, or a substituted or unsubstituted C2 to C30 heterocyclic group, and

* is a linking point.

2. The composition as claimed in claim 1, wherein:

Chemical Formula 1 is represented by Chemical Formula 1A or Chemical Formula 1B:

[Chemical Formula 1A]

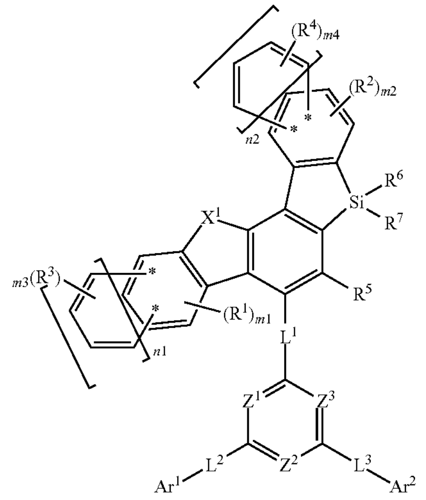

[Chemical Formula 1B]

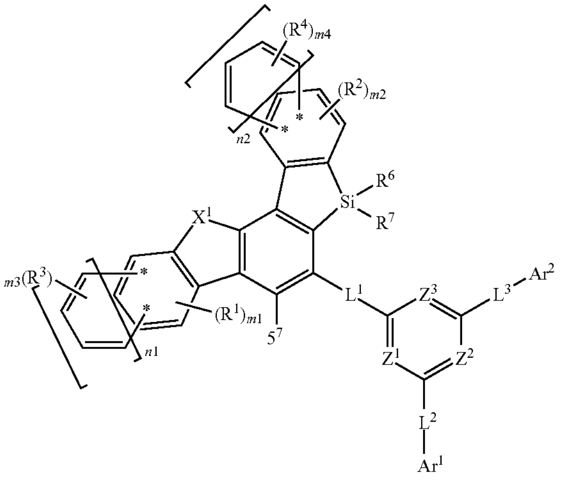

in Chemical Formula 1A and Chemical Formula 1B, $X^1$, $Z^1$ to $Z^3$, $L^1$ to $L^3$, $Ar^1$, $Ar^2$, $R^1$ to $R^7$, m1 to m4, n1, and n2 are defined the same as those of Chemical Formula 1.

3. The composition as claimed in claim 1, wherein:
Chemical Formula 1 is represented by one of Chemical Formula 1-1 to Chemical Formula 1-7:
[Chemical Formula 1-1]
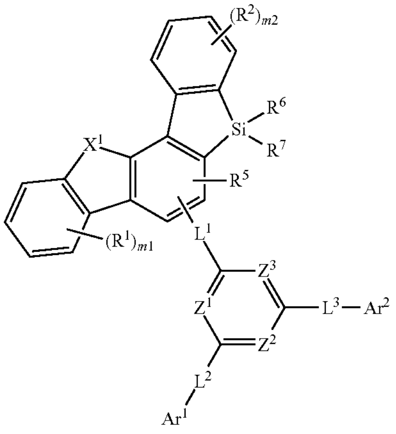
[Chemical Formula 1-2]
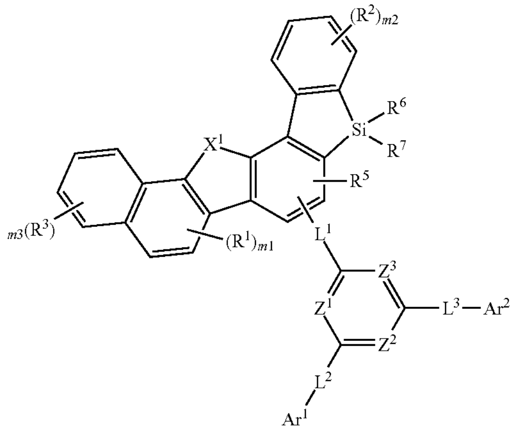
[Chemical Formula 1-3]
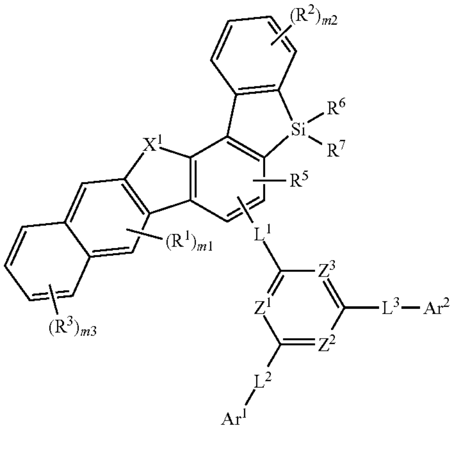
-continued
[Chemical Formula 1-4]
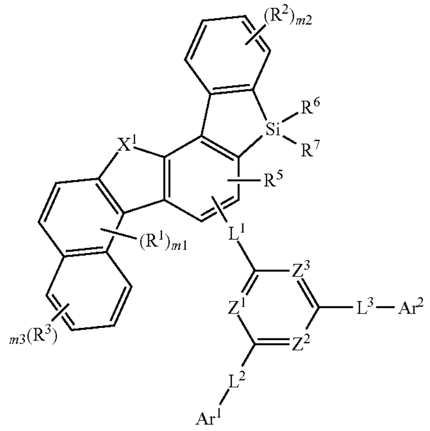
[Chemical Formula 1-5]
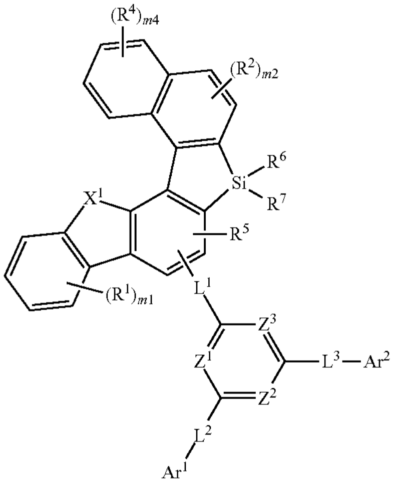
[Chemical Formula 1-6]
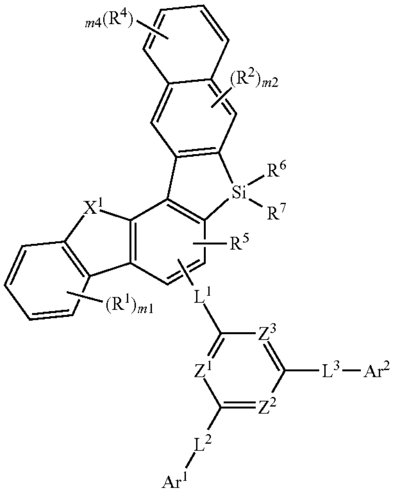

-continued

[Chemical Formula 1-7]

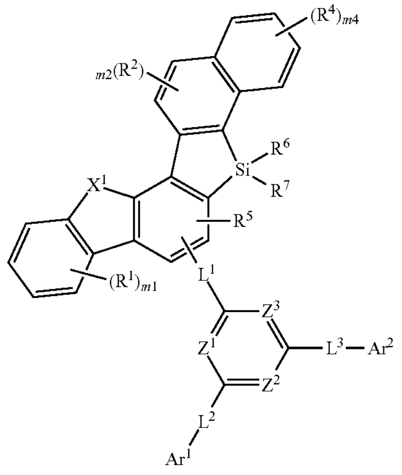

in Chemical Formula 1-1 to Chemical Formula 1-7, $X^1$, $Z^1$ to $Z^3$, $L^1$ to $L^3$, $Ar^1$, $Ar^2$, $R^1$ to $R^7$, and m1 to m4 are defined the same as those of Chemical Formula 1.

4. The composition as claimed in claim 1, wherein $L^1$ to $L^3$ are each independently a single bond, a substituted or unsubstituted phenylene group, or a substituted or unsubstituted naphthylene group.

5. The composition as claimed in claim 1, wherein $Ar^1$ and $Ar^2$ are each independently a substituted or unsubstituted phenyl group, a substituted or unsubstituted biphenyl group, a substituted or unsubstituted naphthyl group, a substituted or unsubstituted phenanthrenyl group, a substituted or unsubstituted carbazolyl group, a substituted or unsubstituted dibenzofuranyl group, a substituted or unsubstituted dibenzothiophenyl group, or a substituted or unsubstituted dibenzosilolyl group.

6. The composition as claimed in claim 1, wherein:

moieties $-L^2-Ar^1$ and $-L^3-Ar^2$ of Chemical Formula 1 are each independently a moiety of Group I:

[Group I]

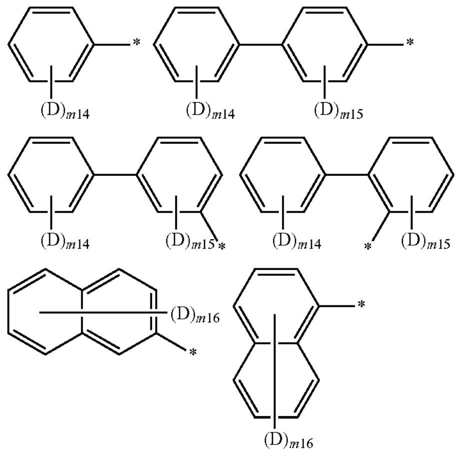

-continued

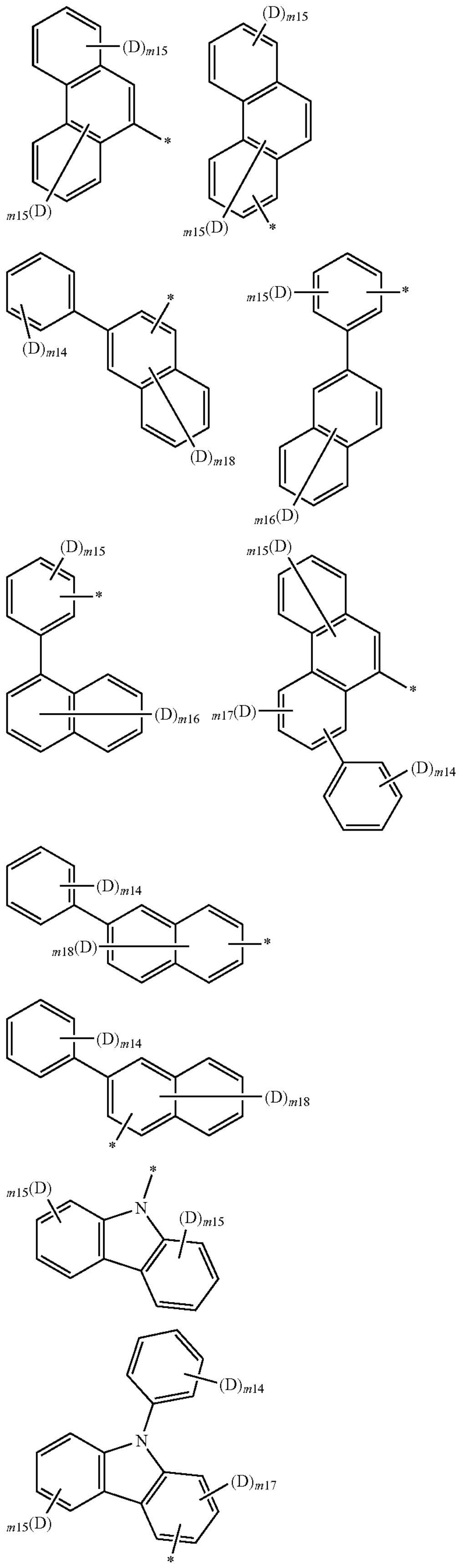

-continued
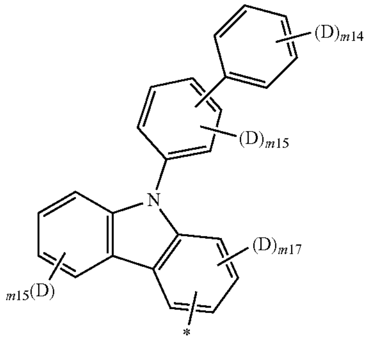
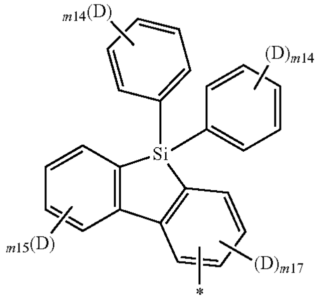
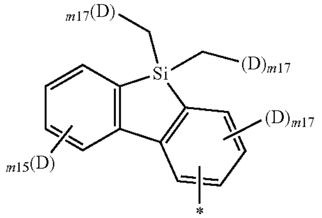
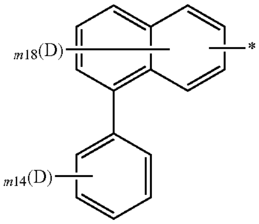
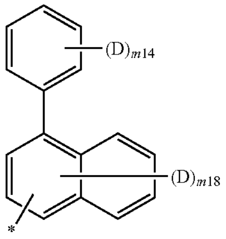
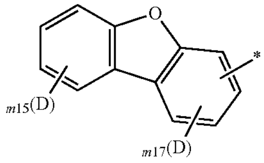
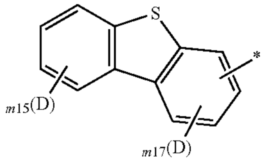
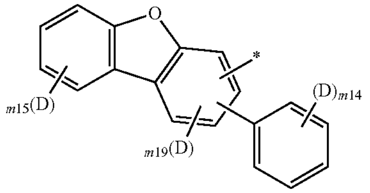
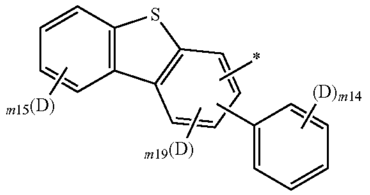
in Group I,
D is deuterium,
m14 is an integer of 0 to 5,
m15 is an integer of 0 to 4,
m16 is an integer of 0 to 7,
m17 is an integer of 0 to 3,
m18 is an integer of 0 to 6,
m19 is an integer of 0 to 2, and
* is a linking point.
7. The composition as claimed in claim 1, wherein the first compound is a compound of Group 1:
[Group 1]
[1]
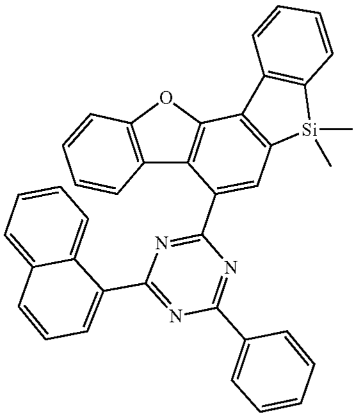
[2]
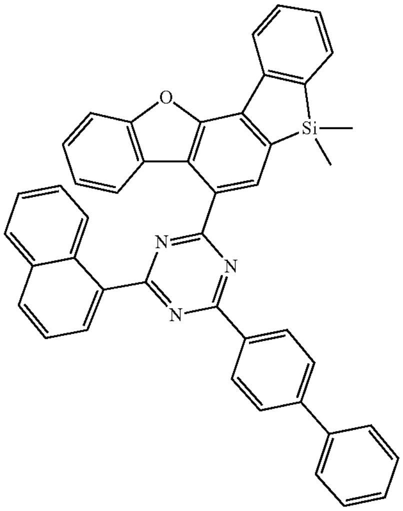
[3]
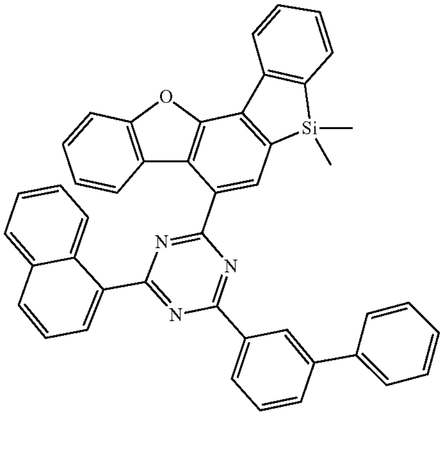

-continued
[4]
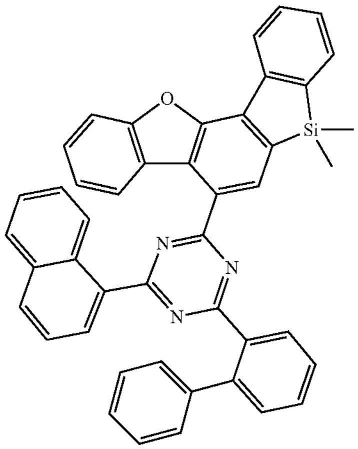
[5]
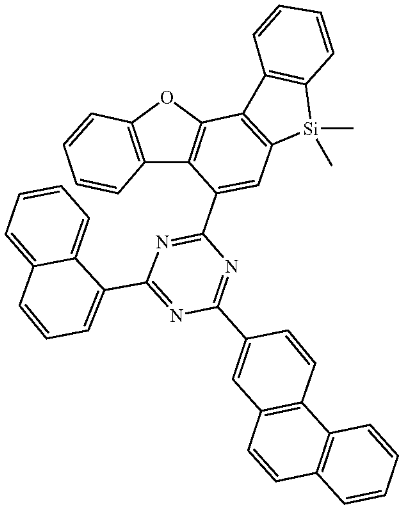
[6]
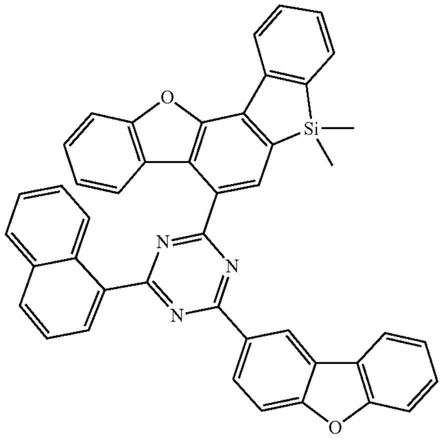
-continued
[7]
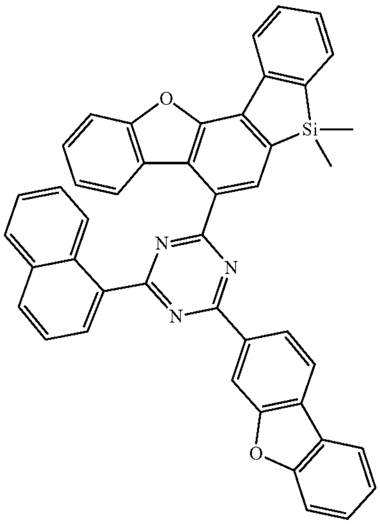
[8]
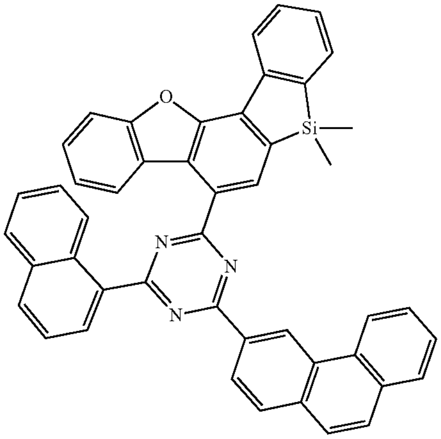
[9]
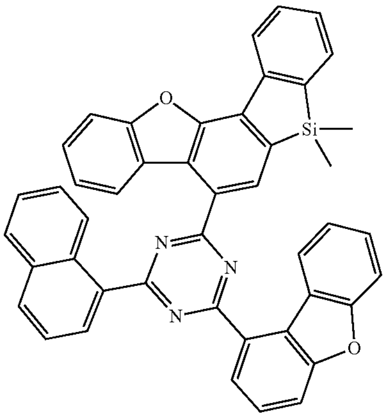

-continued
[10]
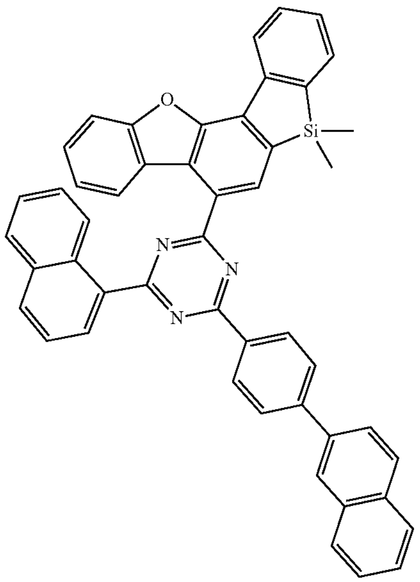
[11]
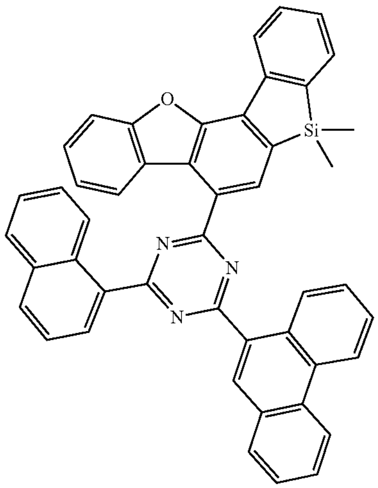
[12]
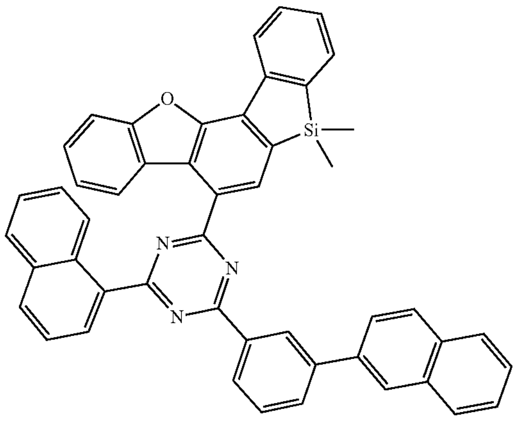
-continued
[13]
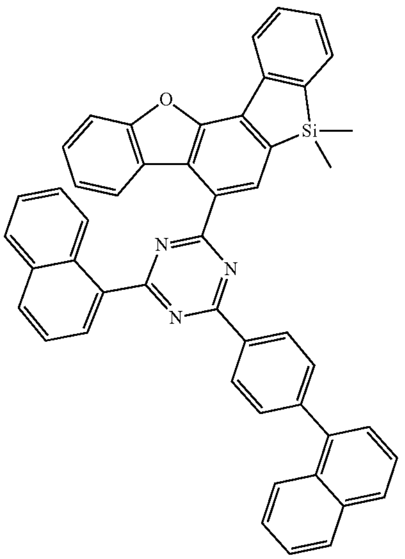
[14]
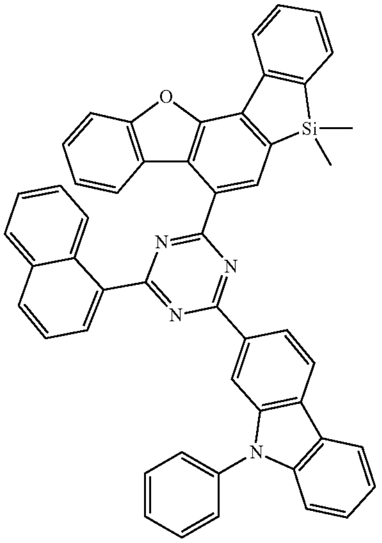
[15]
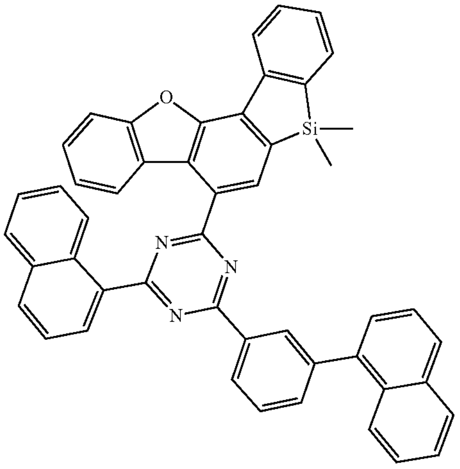

-continued
[16]
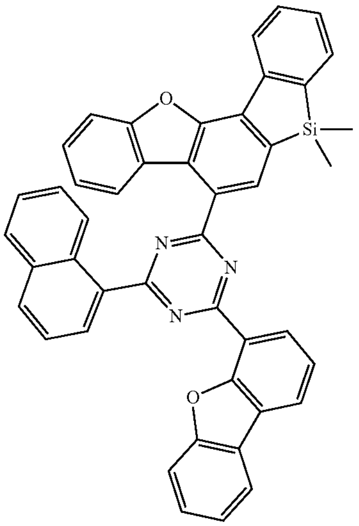
[17]
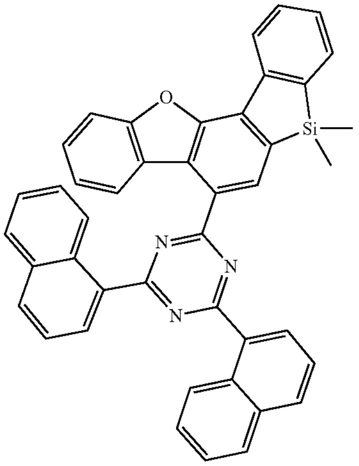
[18]
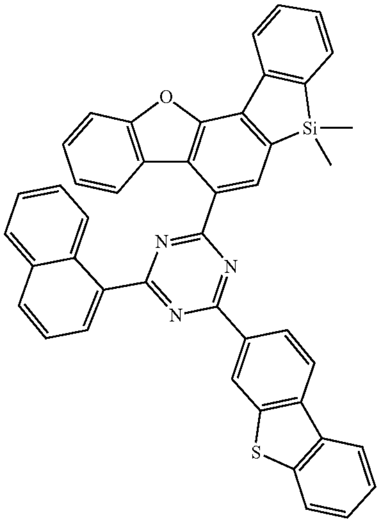
-continued
[19]
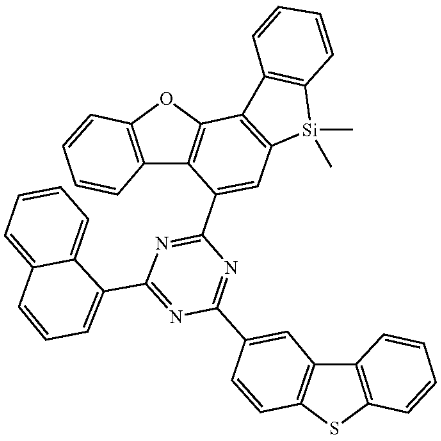
[20]
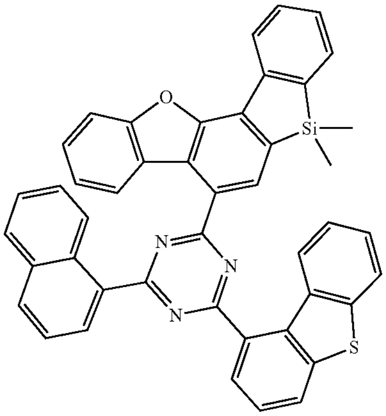
[21]
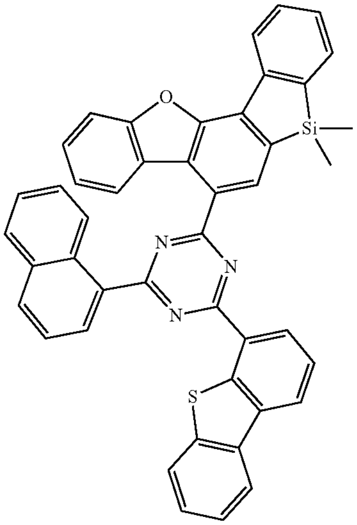

-continued
[22]
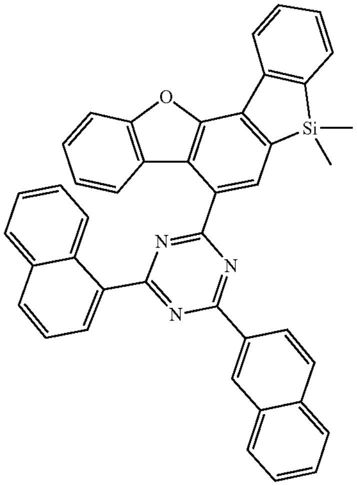
[23]
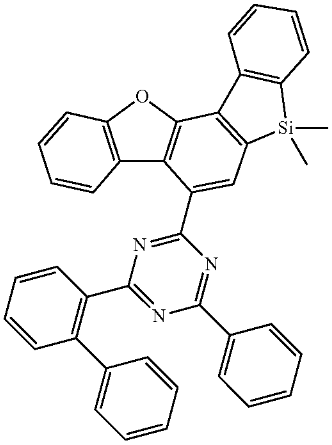
[24]
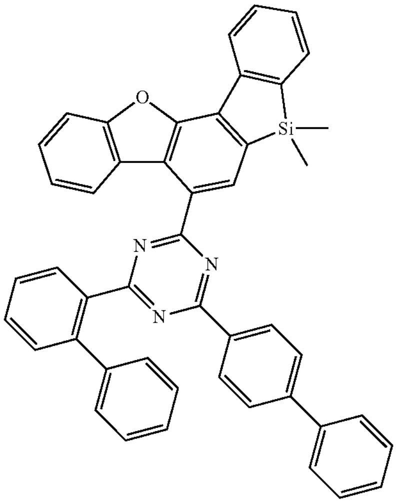
-continued
[25]
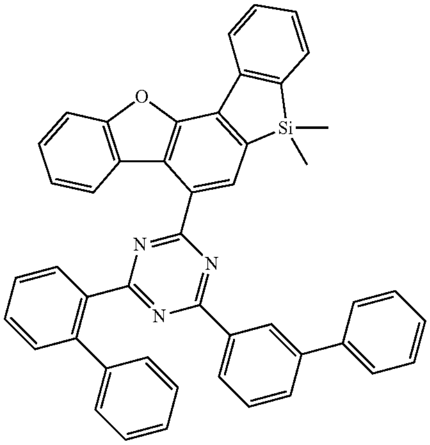
[26]
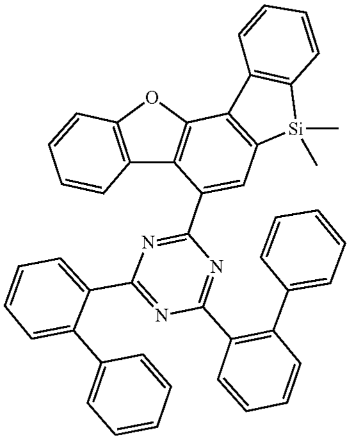
[27]
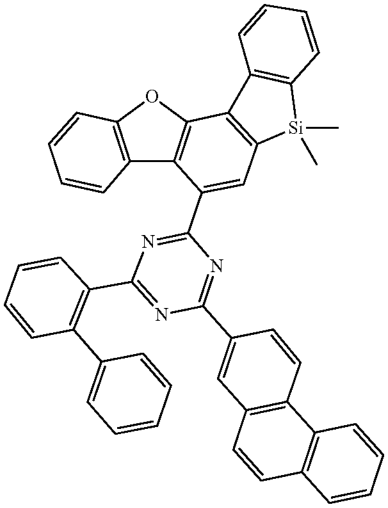

-continued
[28]
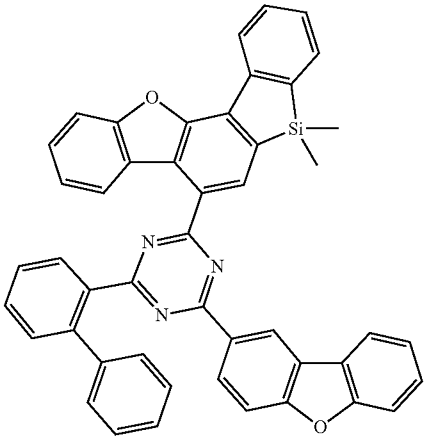
[29]
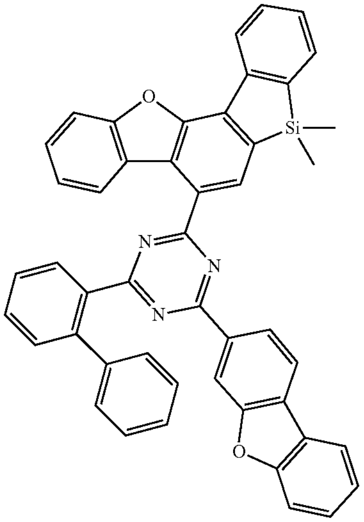
[30]
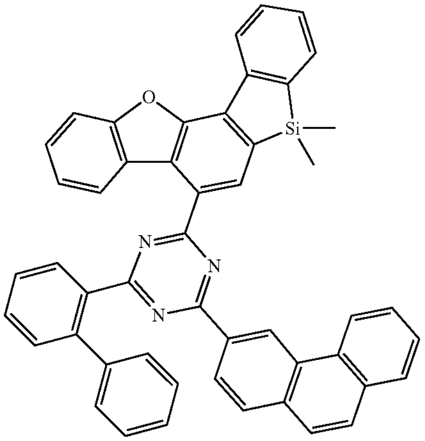
-continued
[31]
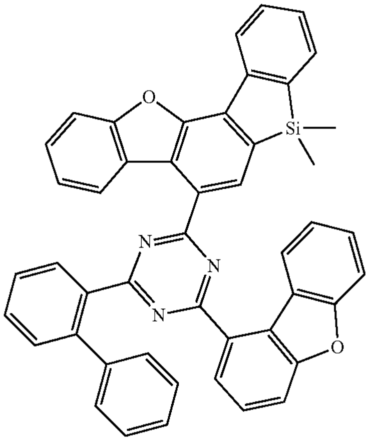
[32]
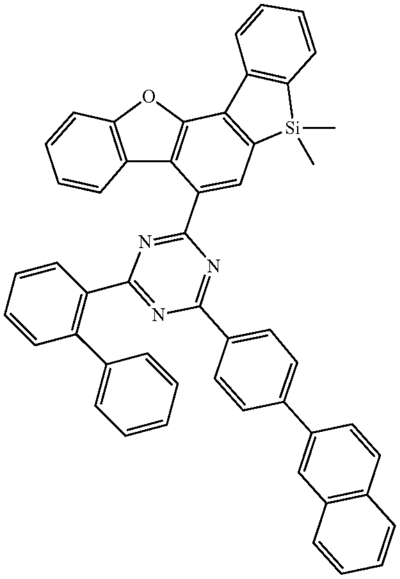
[33]
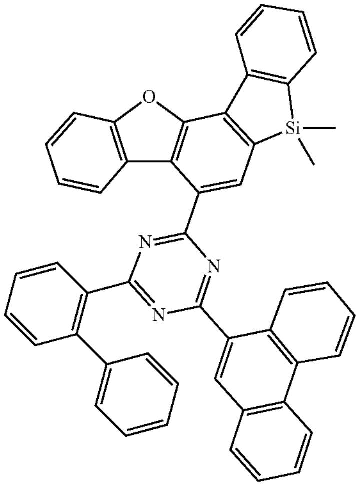

-continued
[34]
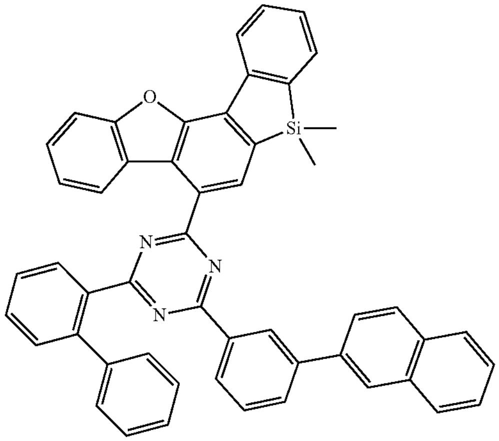
[35]
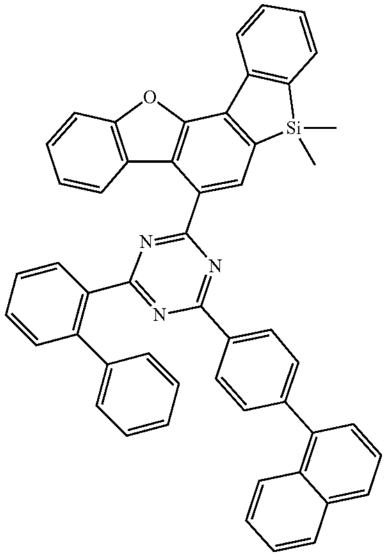
[36]
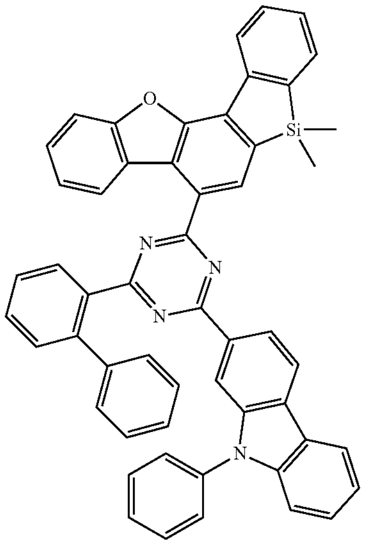
-continued
[37]
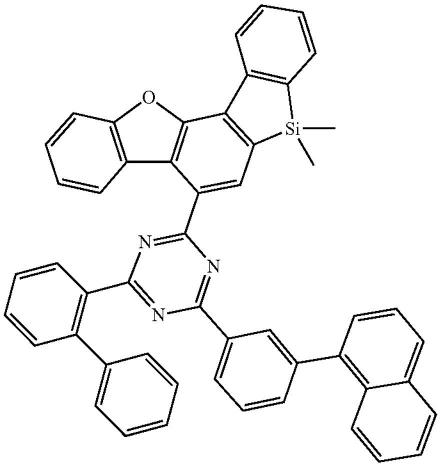
[38]
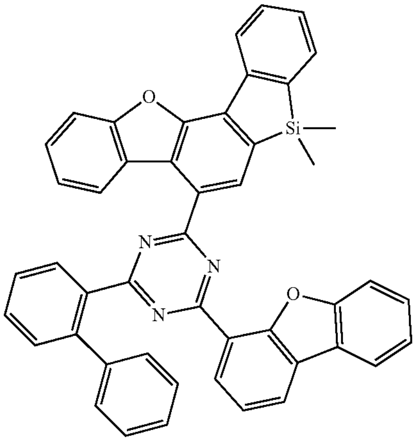
[39]
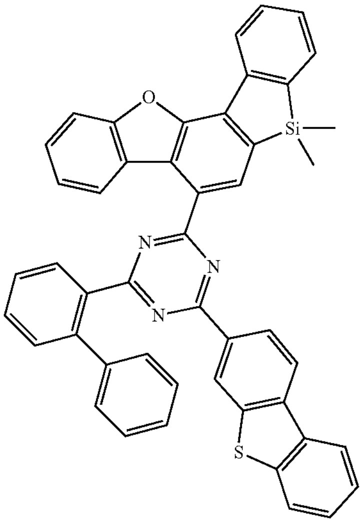

-continued
[40]
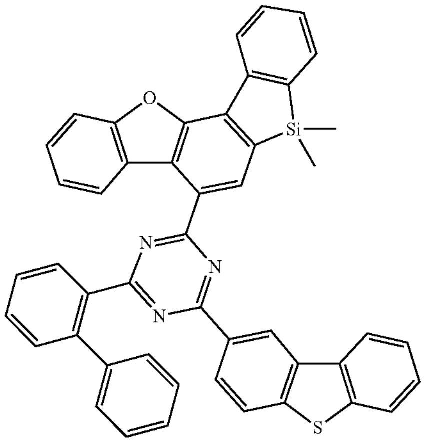
[41]
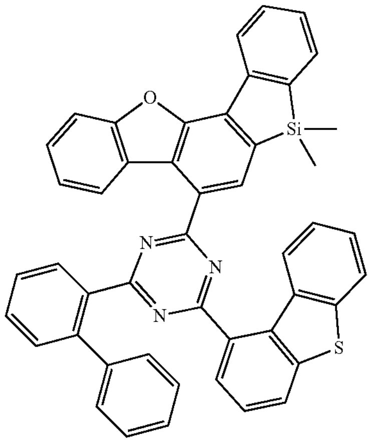
[42]
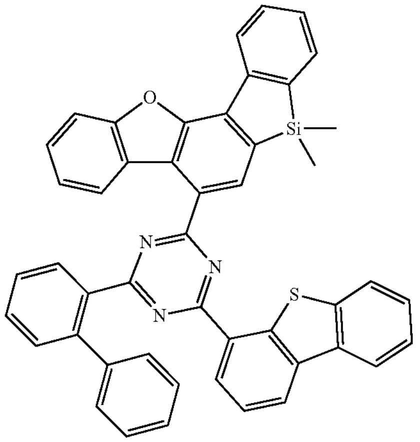
-continued
[43]
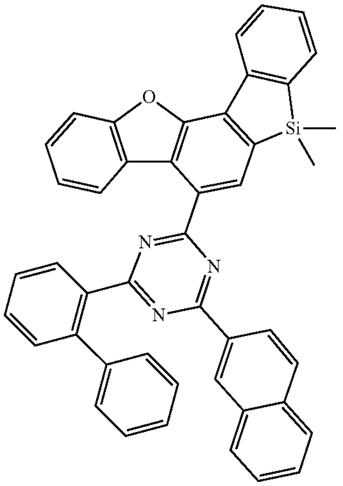
[44]
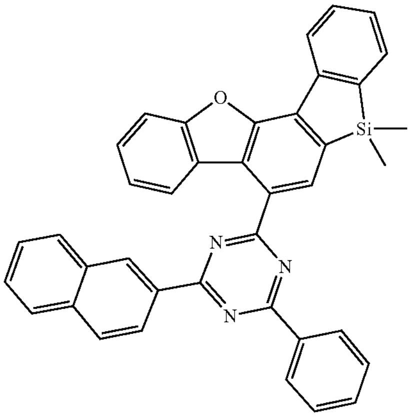
[45]
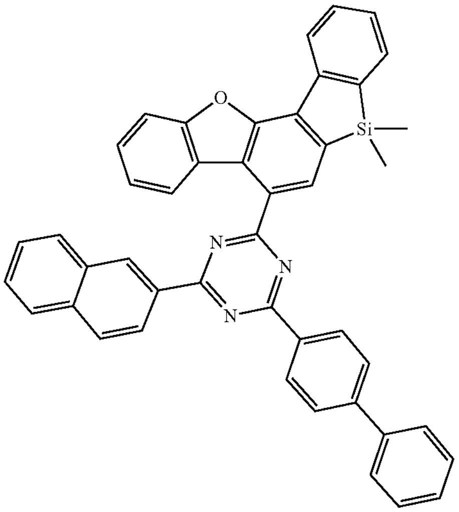

-continued
[46]
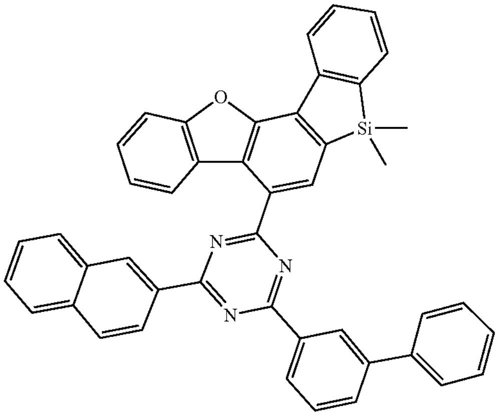
[47]
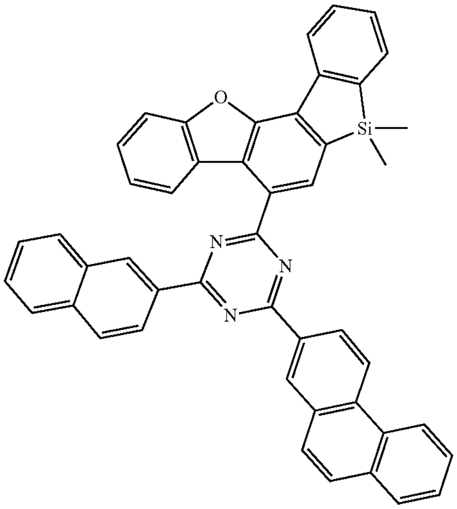
[48]
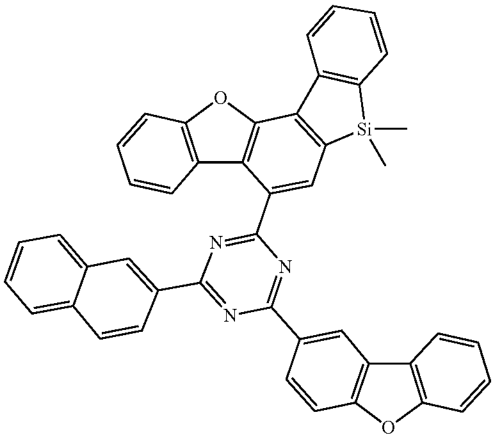
-continued
[49]
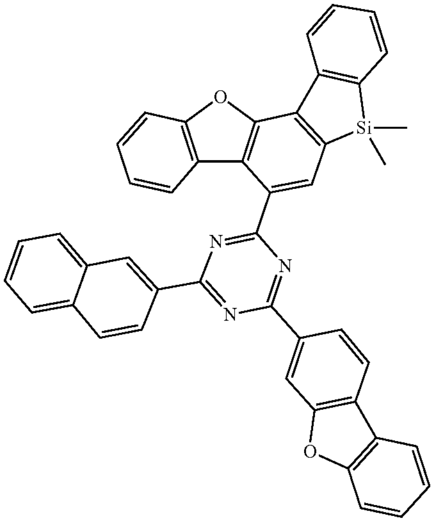
[50]
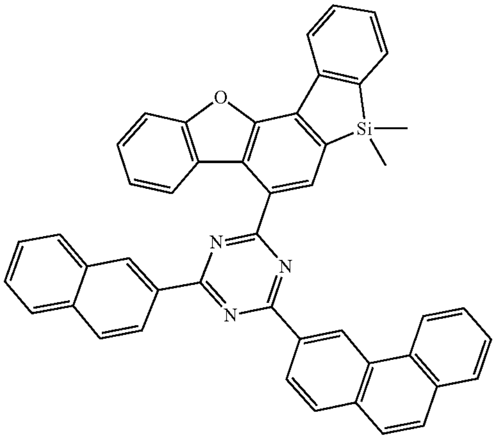
[51]
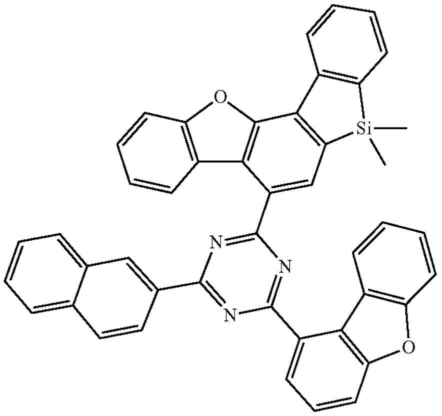

-continued
[52]
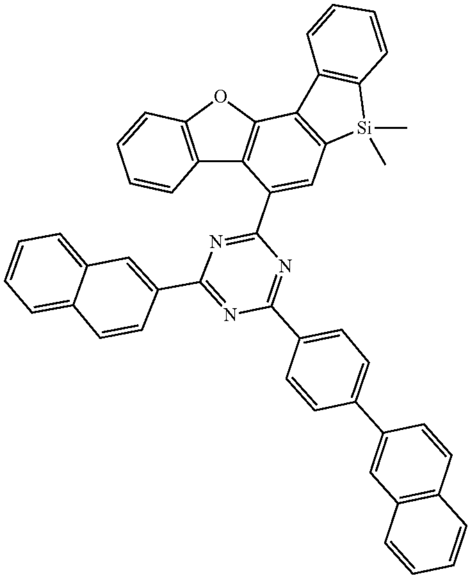
[53]
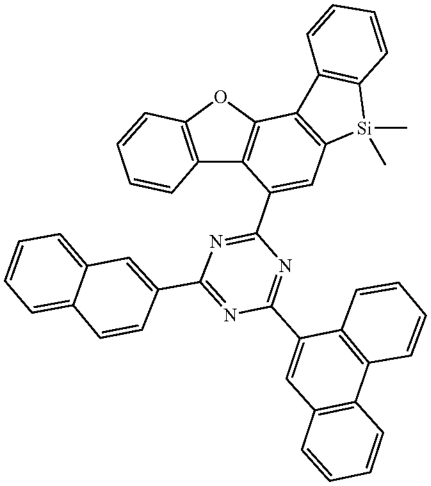
[54]
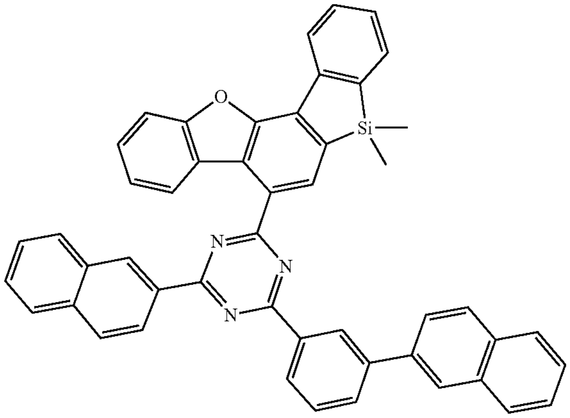
-continued
[55]
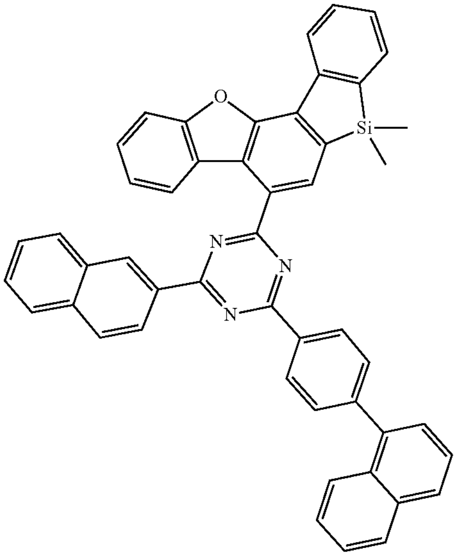
[56]
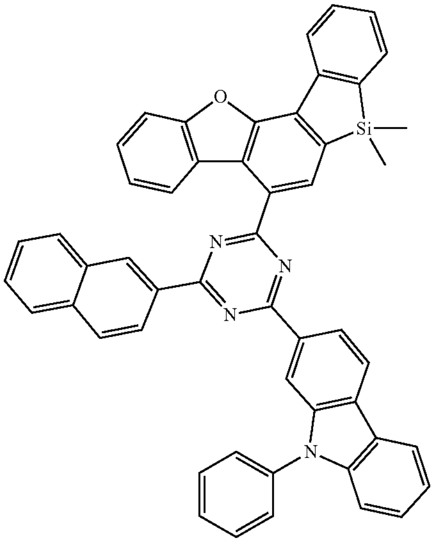
[57]
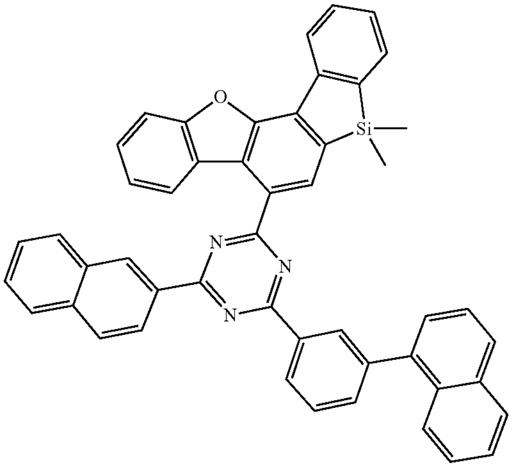

-continued
[58]
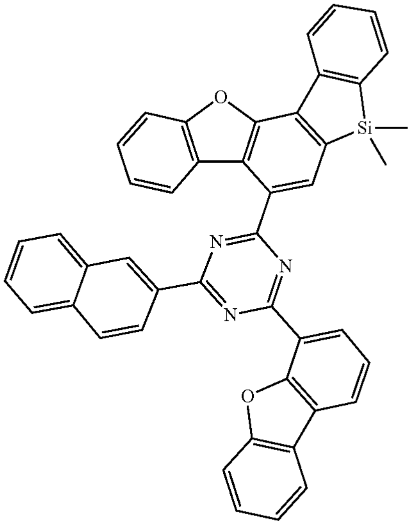
[59]
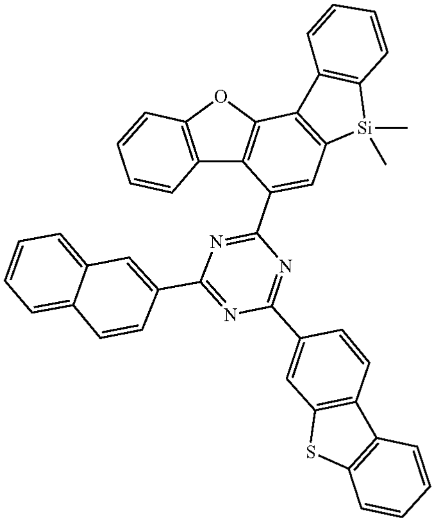
[60]
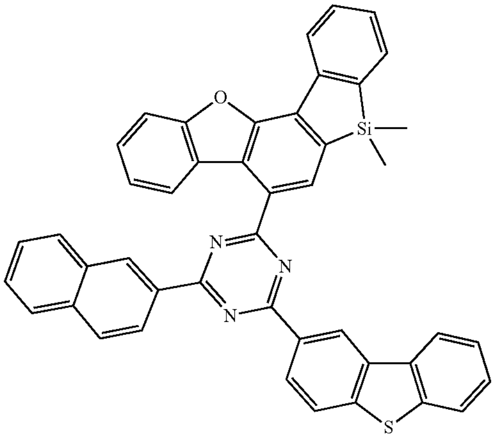
-continued
[61]
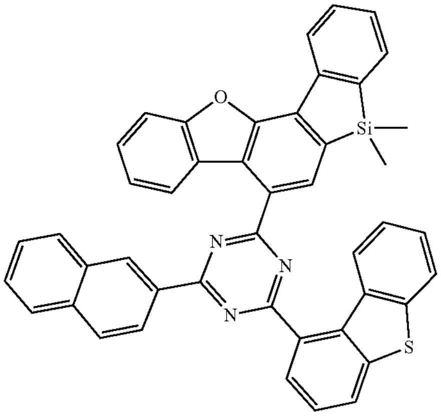
[62]
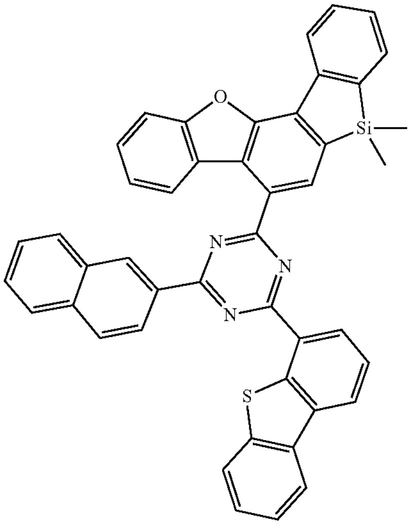
[63]
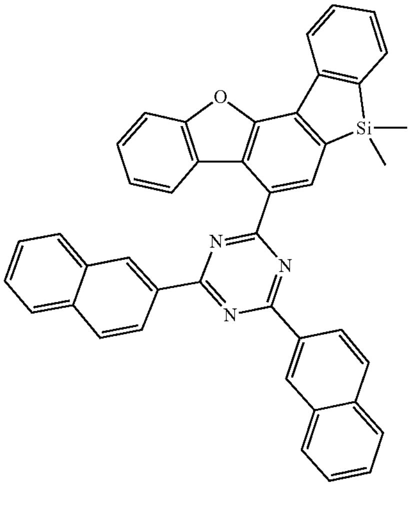

-continued
[64]
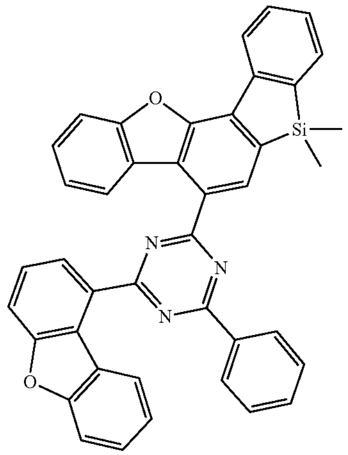
[65]
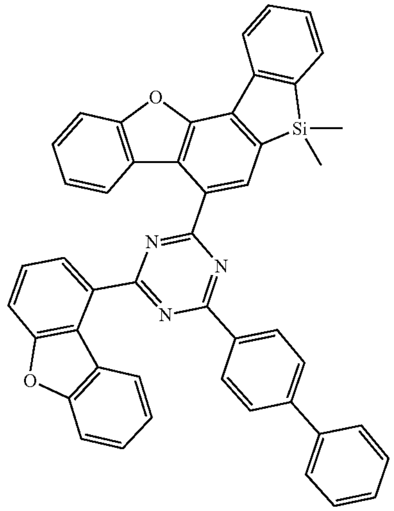
[66]
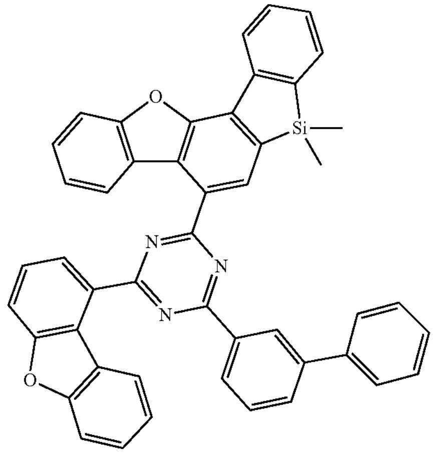
-continued
[67]
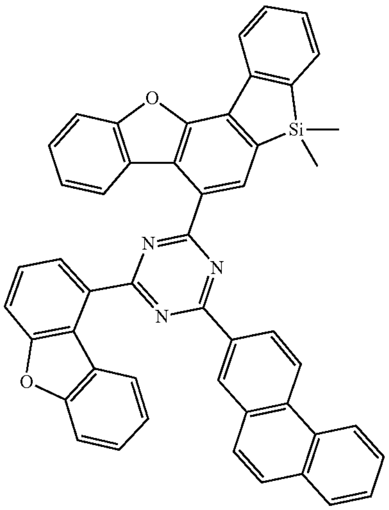
[68]
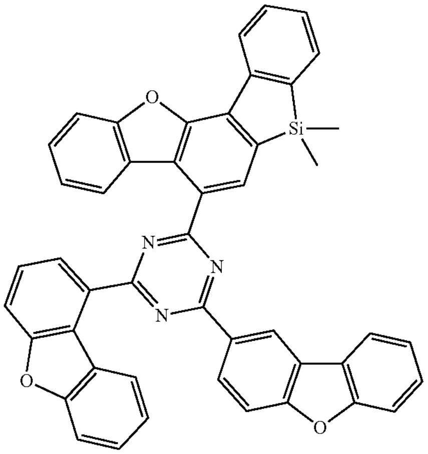
[69]
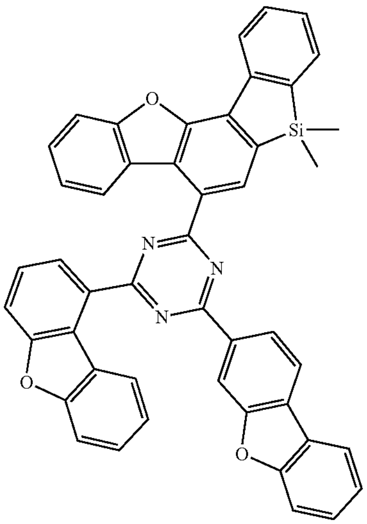

-continued
[70]
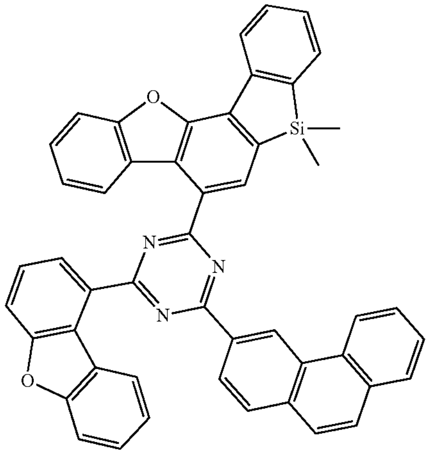
[71]
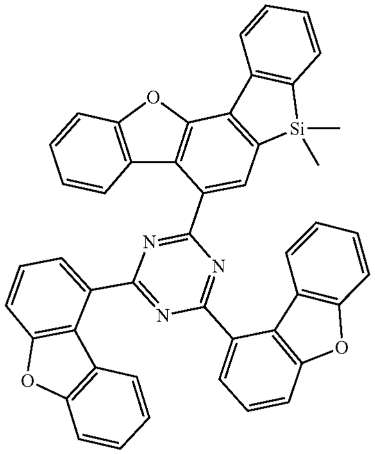
[72]
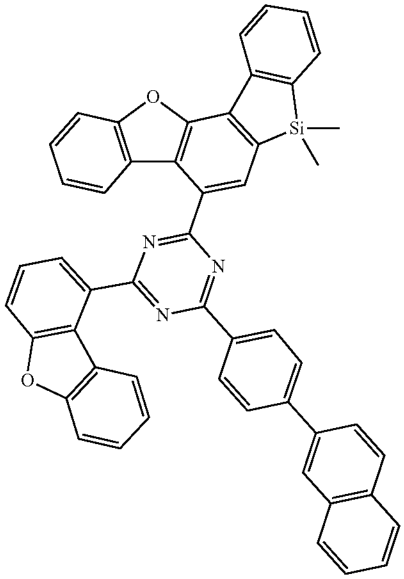
-continued
[73]
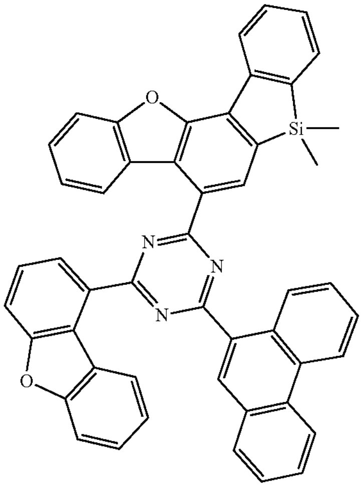
[74]
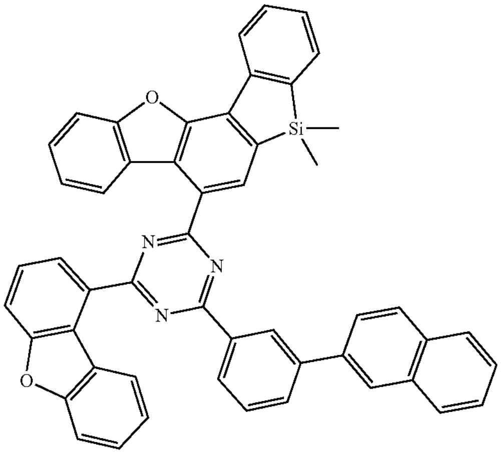
[75]
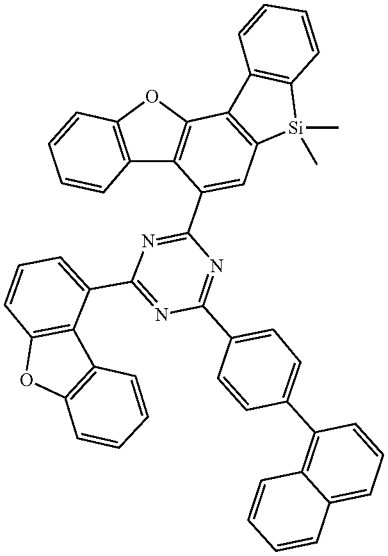

-continued
[76]
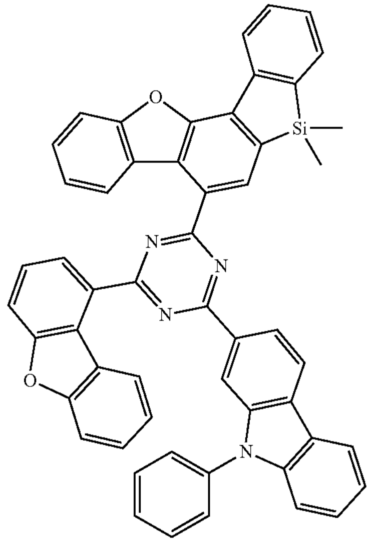
[77]
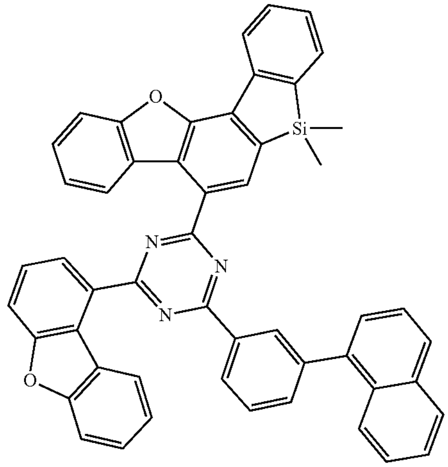
[78]
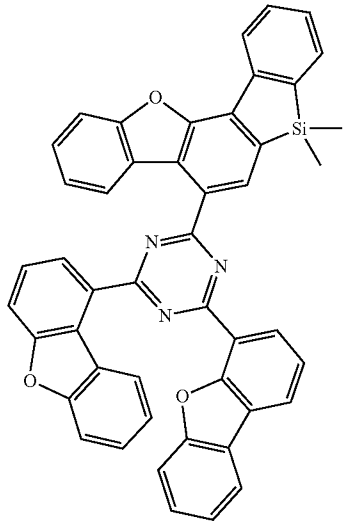
-continued
[79]
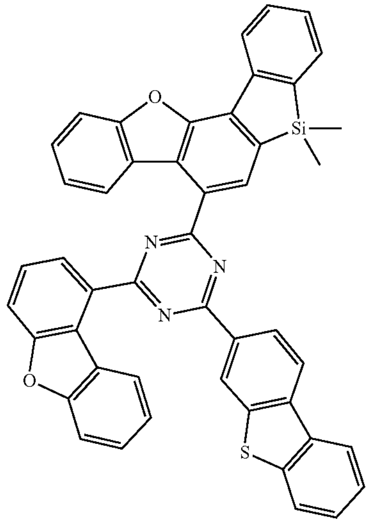
[80]
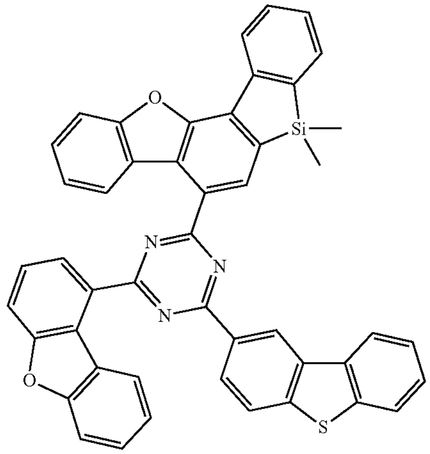
[81]
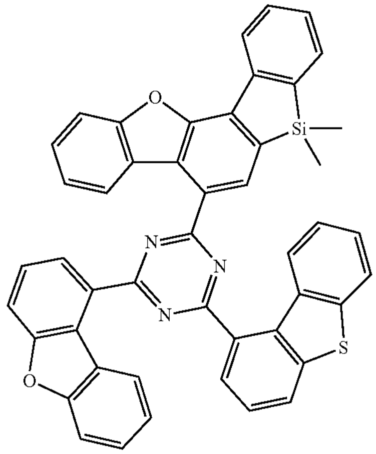

-continued
[82]
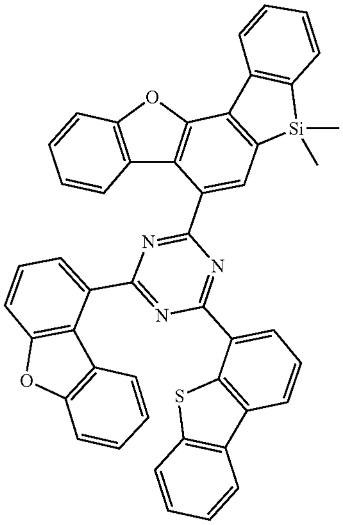
[83]
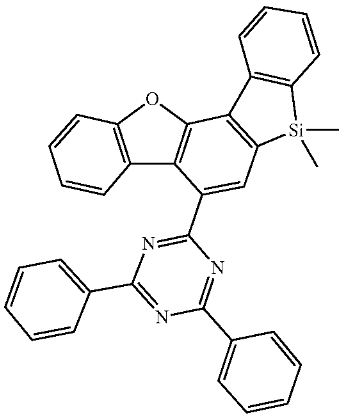
[84]
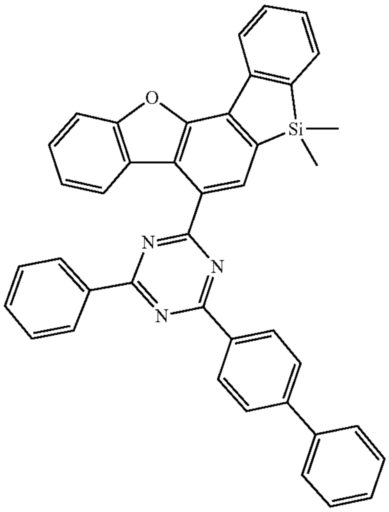
-continued
[85]
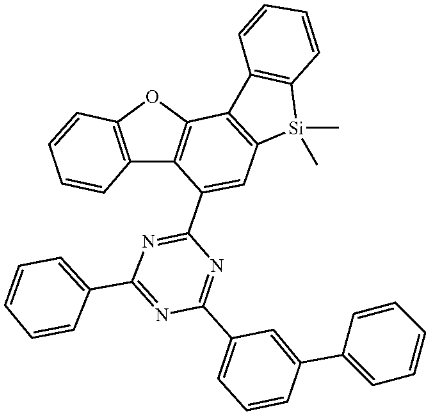
[86]
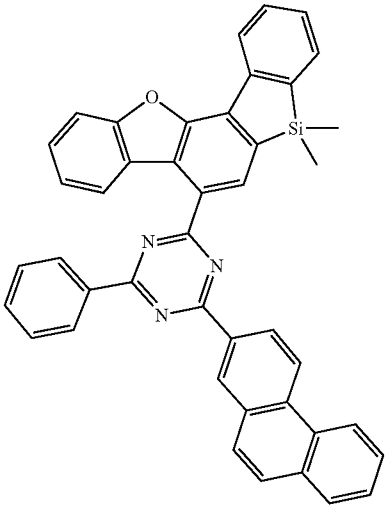
[87]
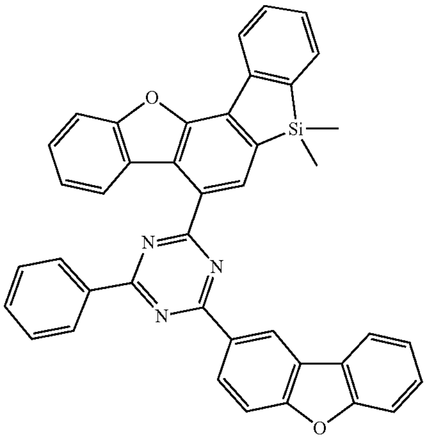

-continued
[88]
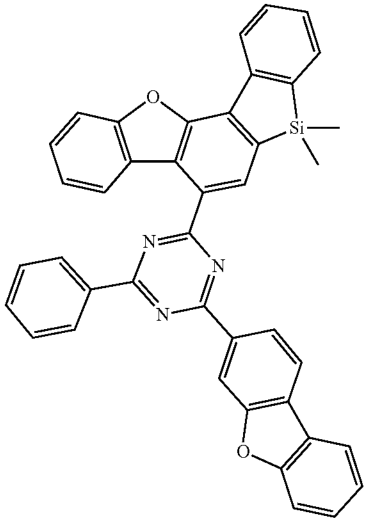
[89]
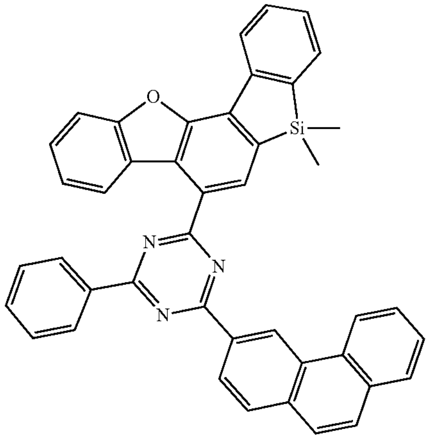
[90]
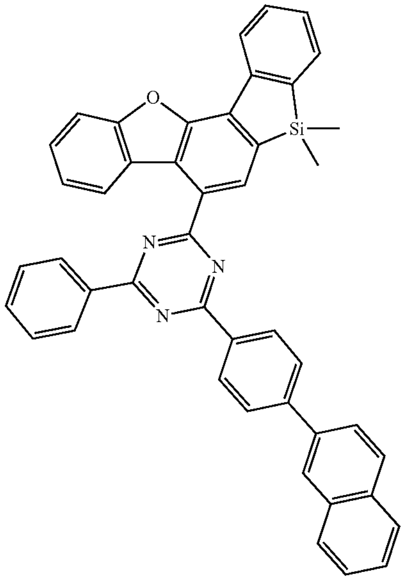
-continued
[91]
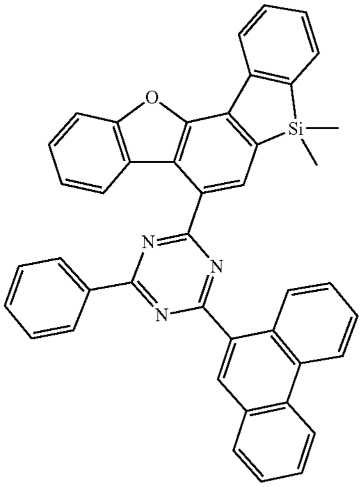
[92]
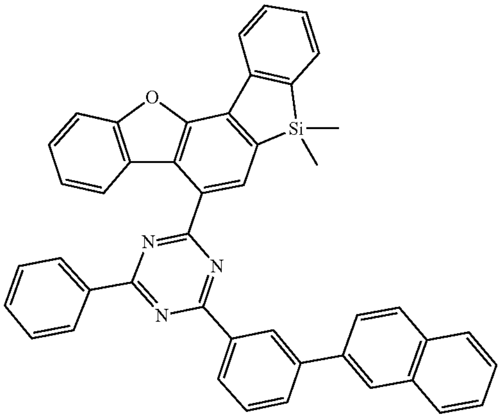
[93]
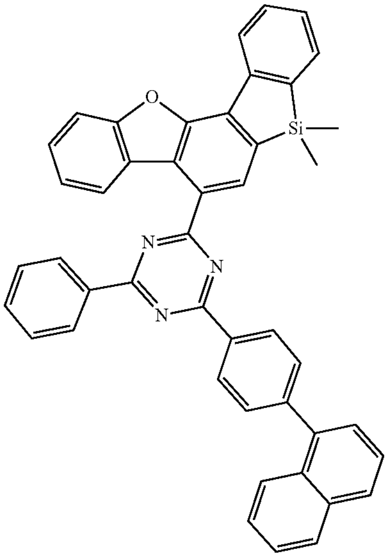

-continued
[94]
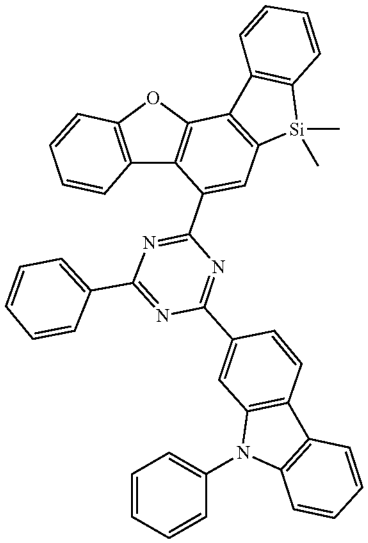
[95]
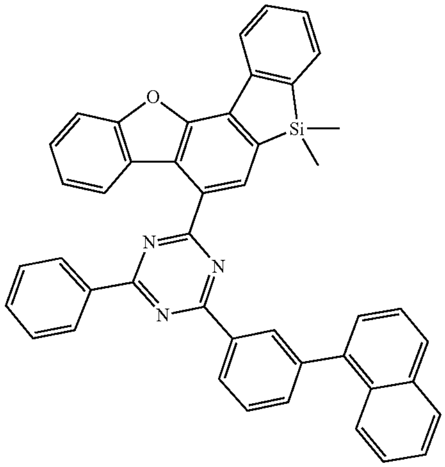
[96]
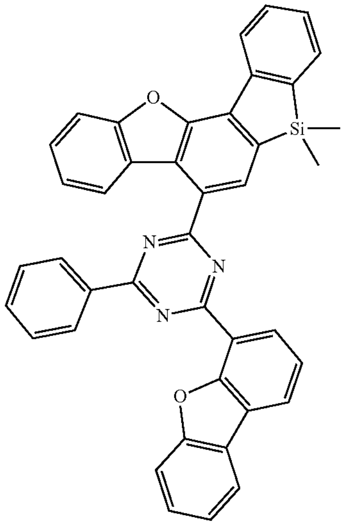
-continued
[97]
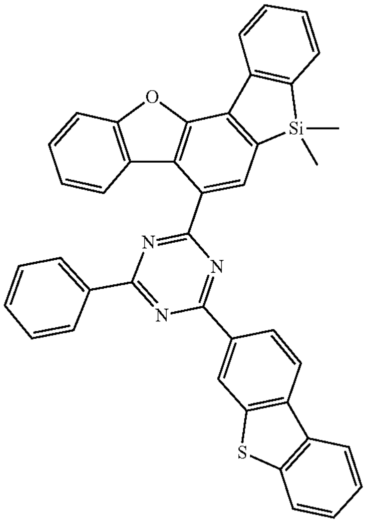
[98]
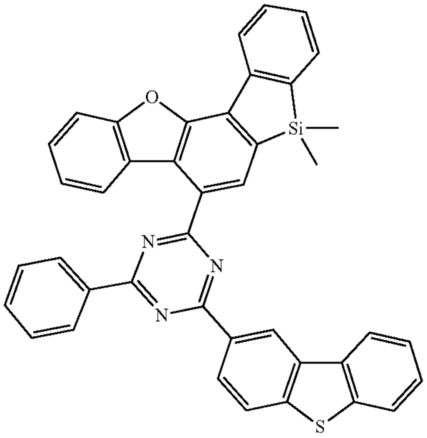
[99]
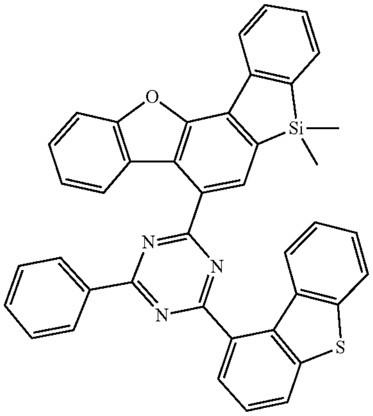

-continued
[100]
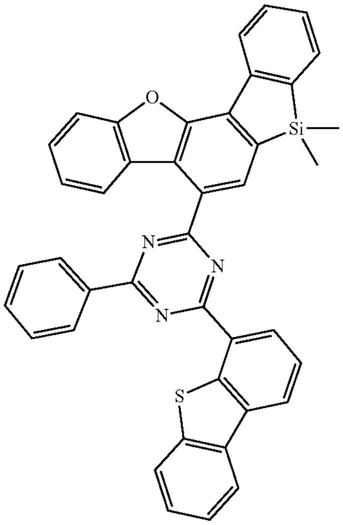
[101]
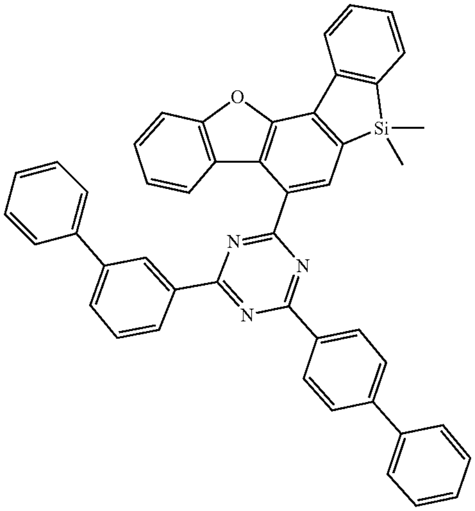
[102]
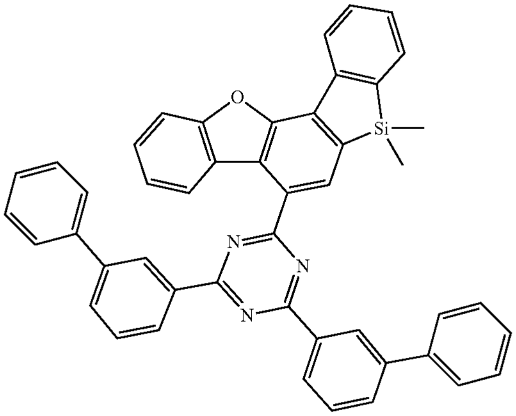
-continued
[103]
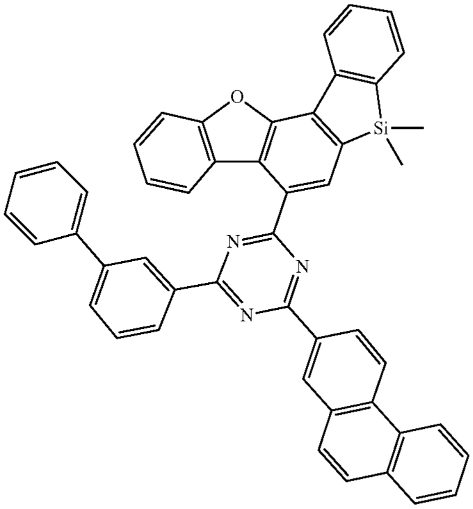
[104]
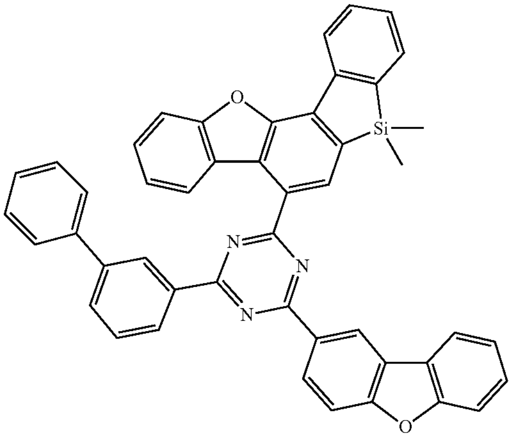
[105]
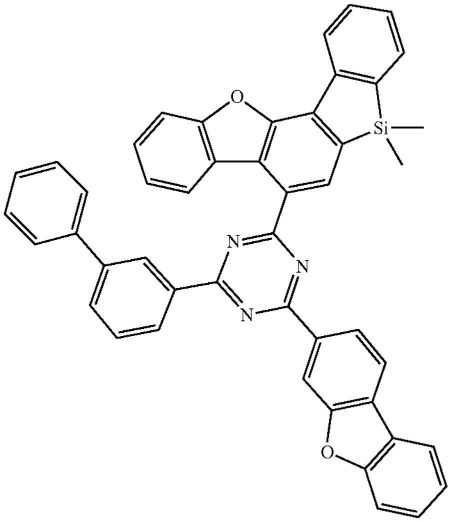

-continued
[106]
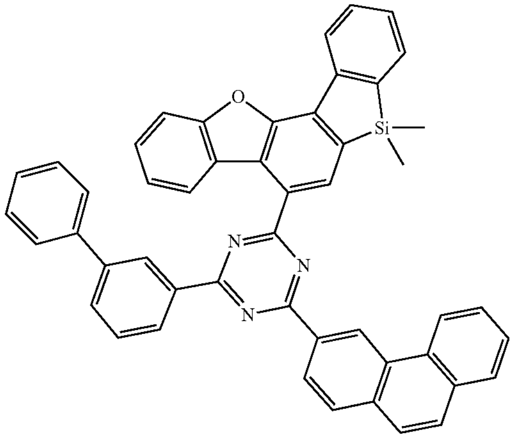
[107]
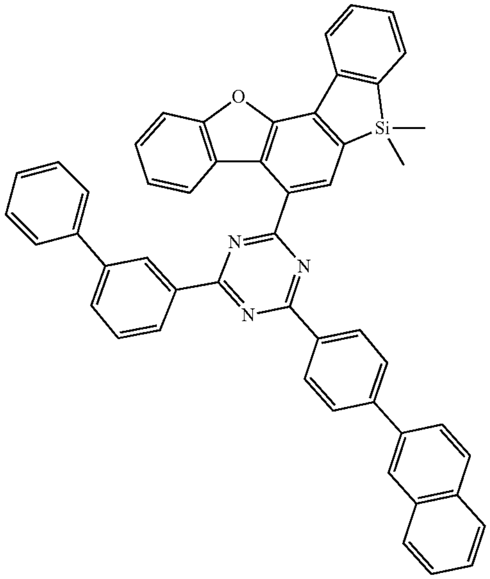
[108]
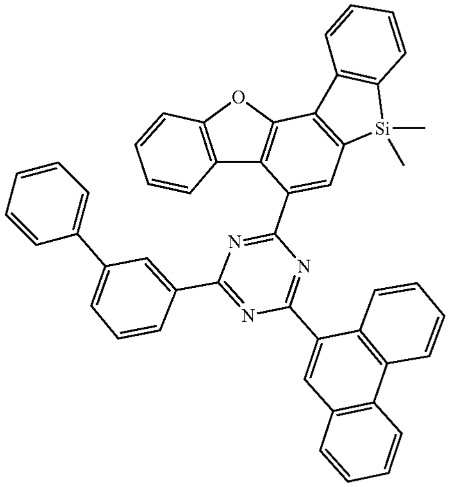
-continued
[109]
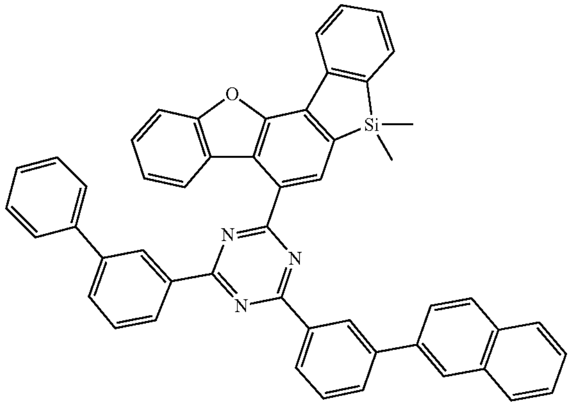
[110]
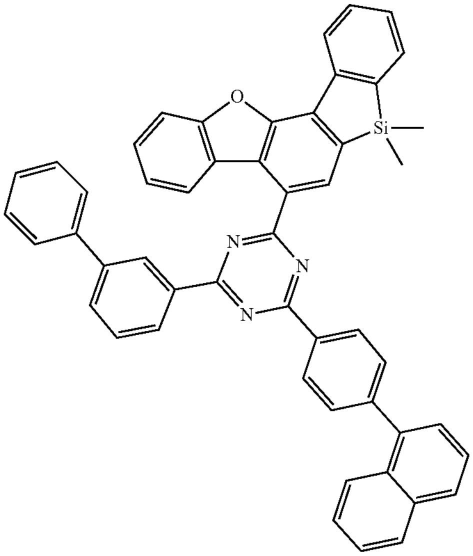
[111]
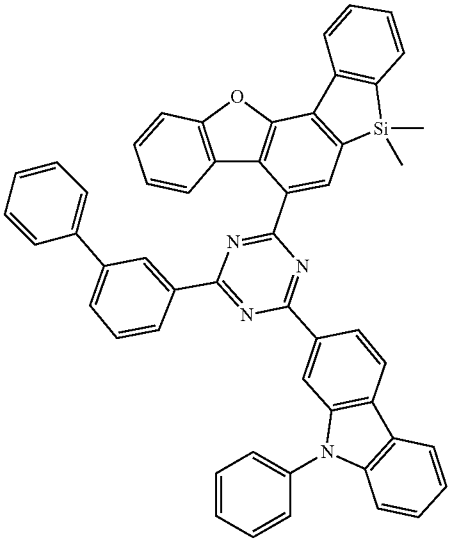

-continued
[112]
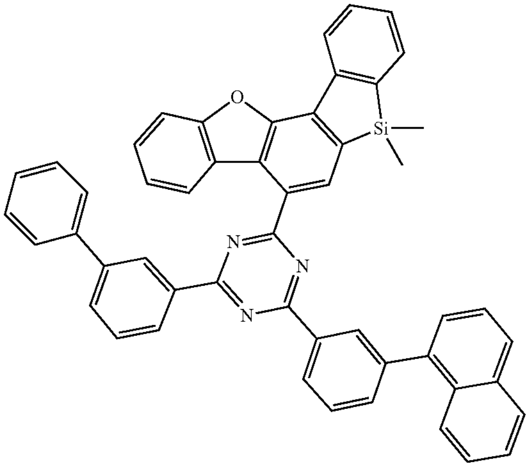
[113]
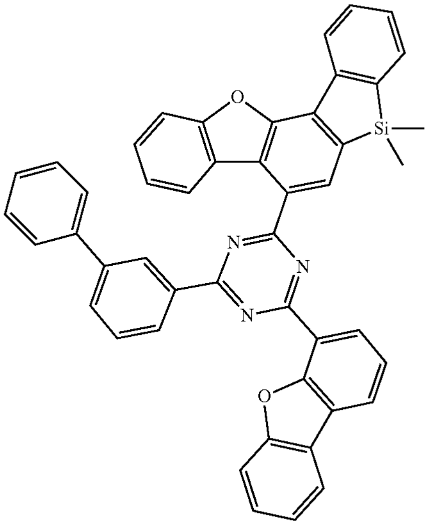
[114]
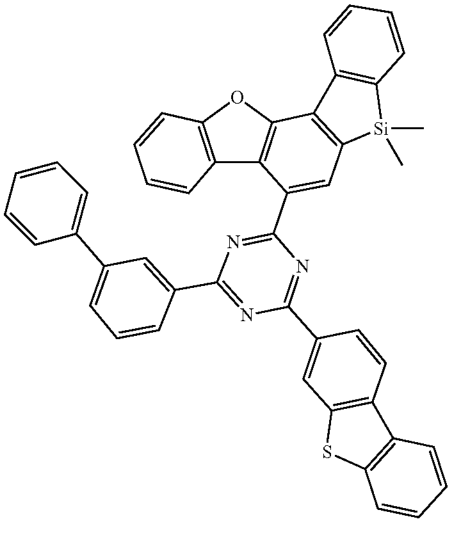
-continued
[115]
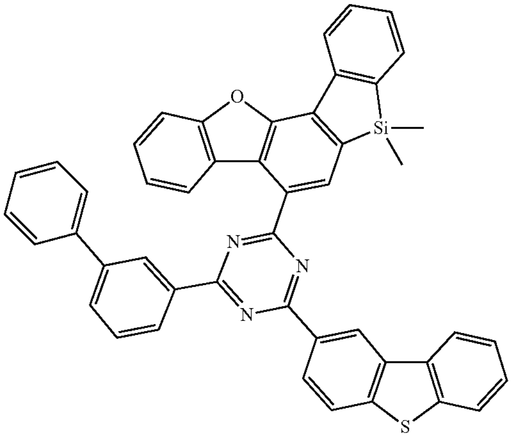
[116]
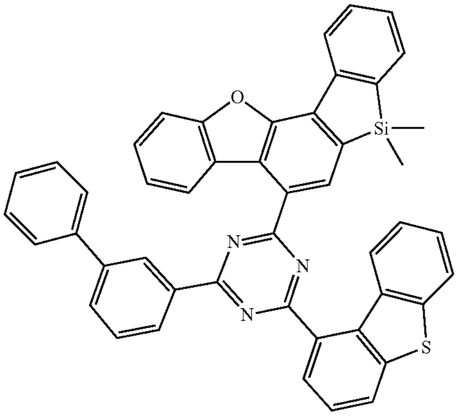
[117]
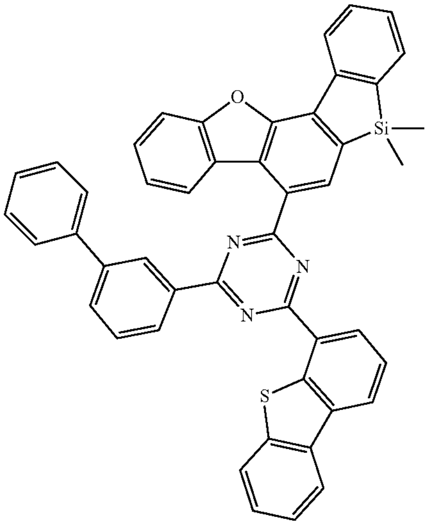

[118]
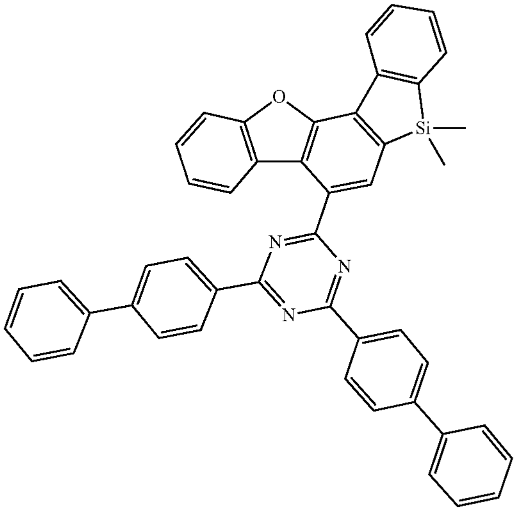
[119]
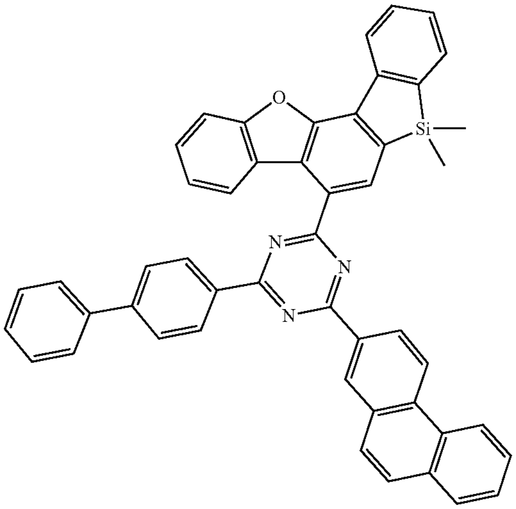
[120]
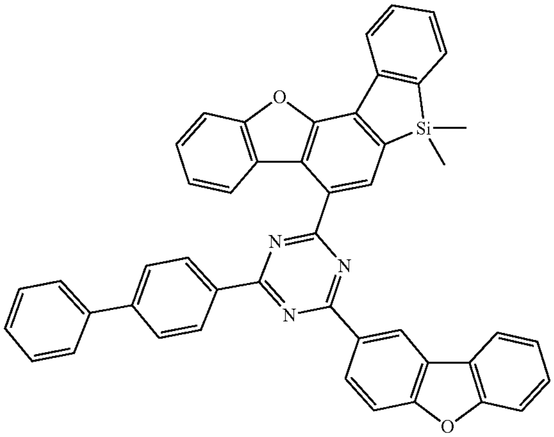
[121]
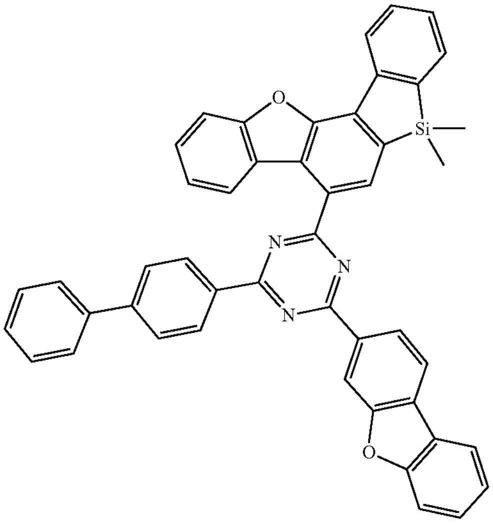
[122]
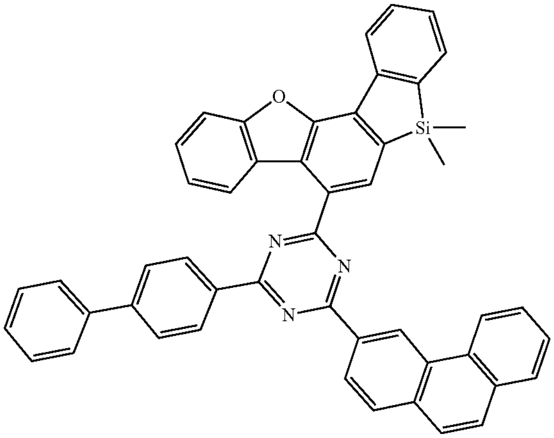
[123]
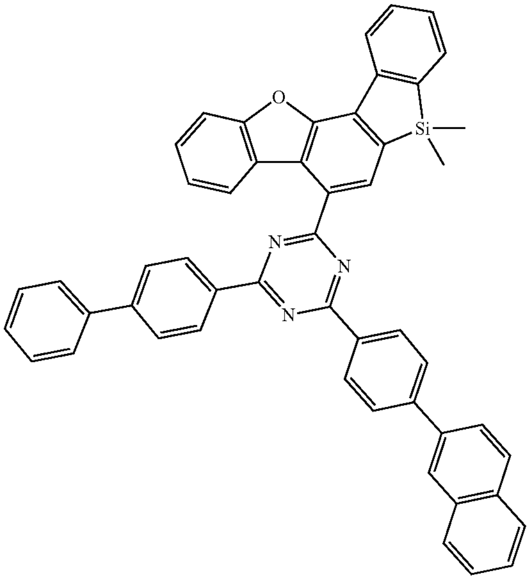

-continued
[124]
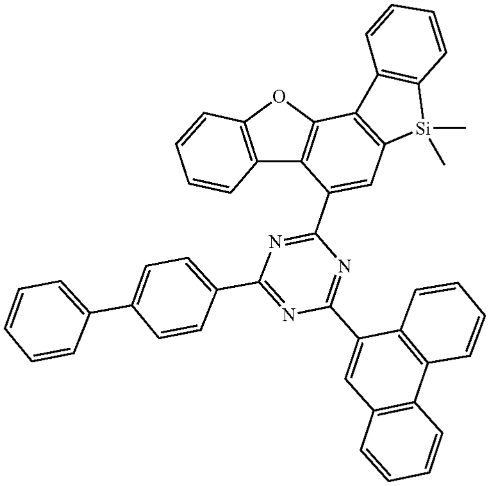
[125]
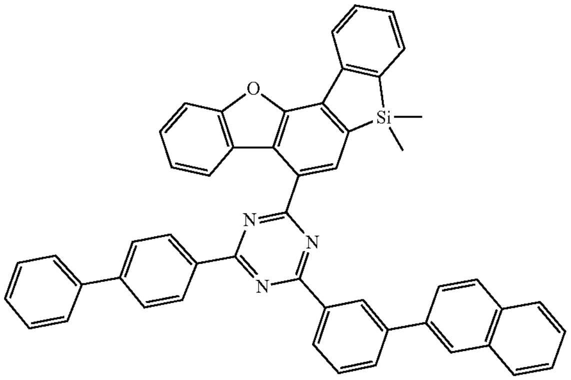
[126]
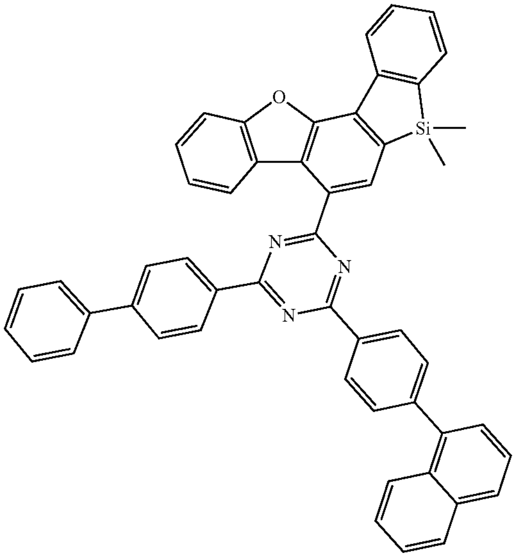
-continued
[127]
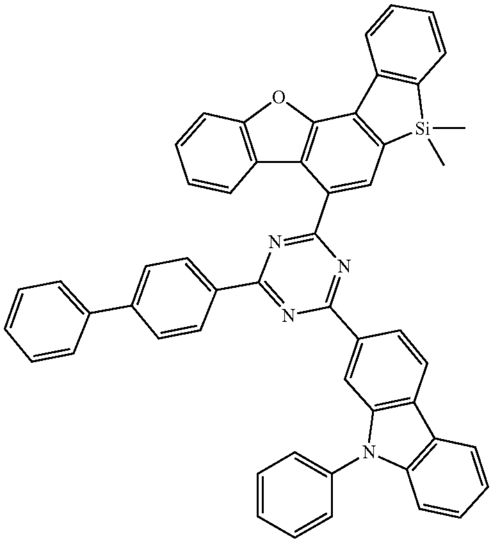
[128]
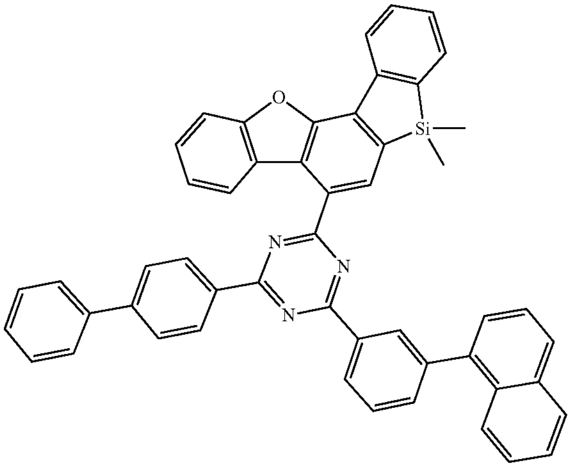
[129]
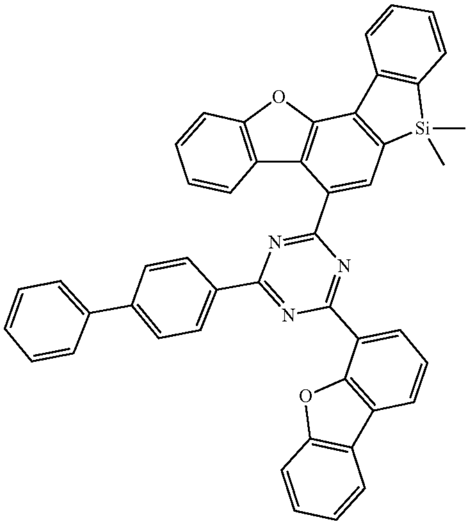

-continued
[130]
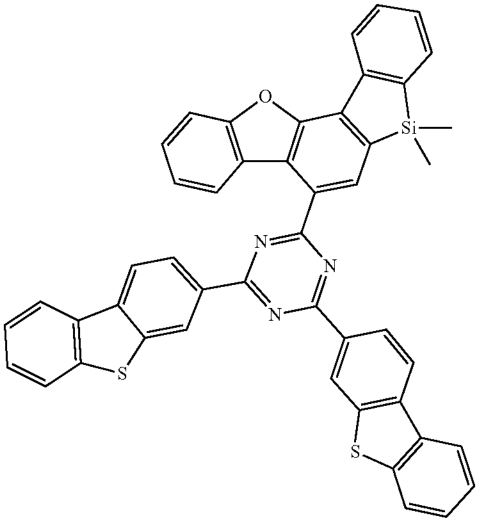
[131]
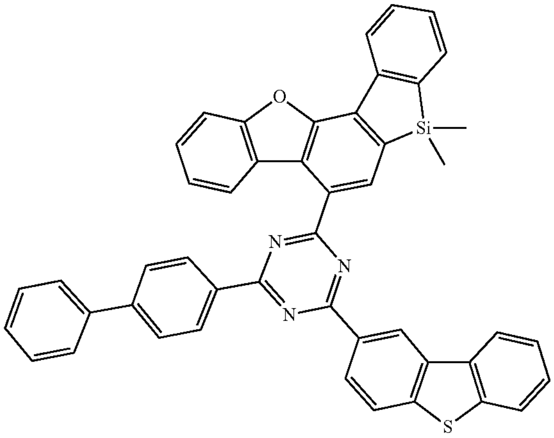
[132]
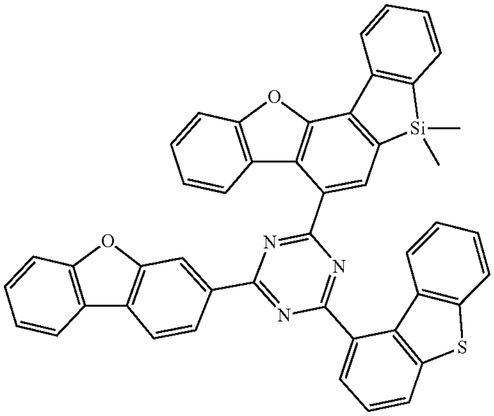
-continued
[133]
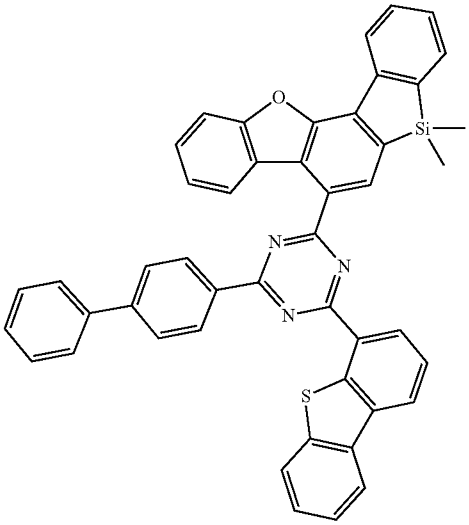
[134]
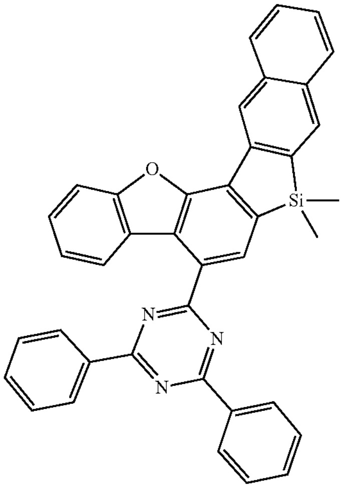
[135]
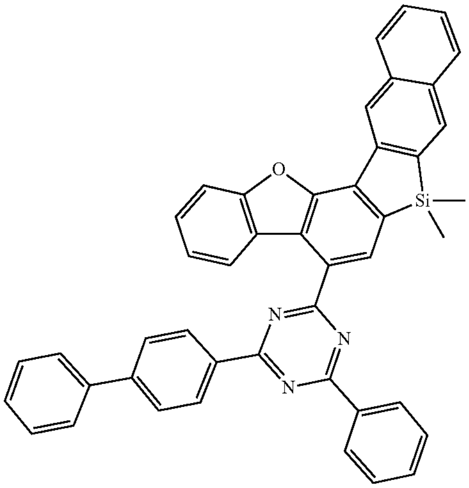

-continued
[136]
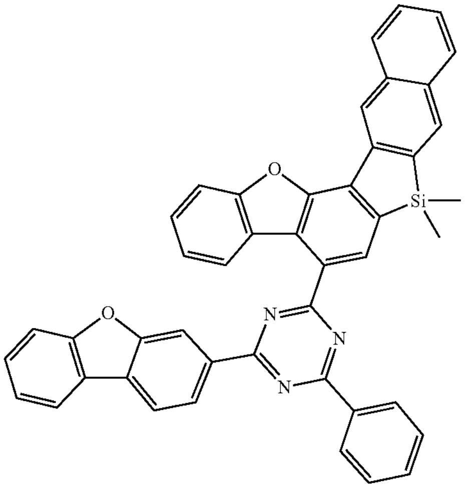
[137]
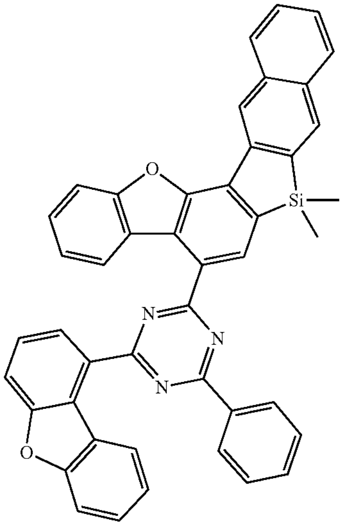
[138]
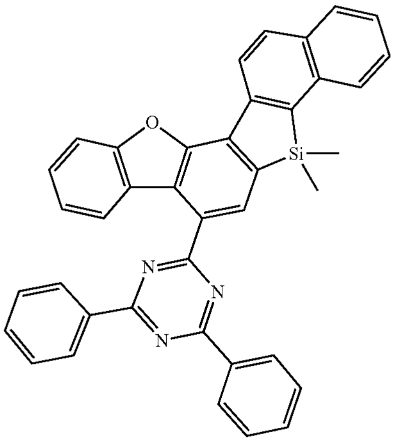
-continued
[139]
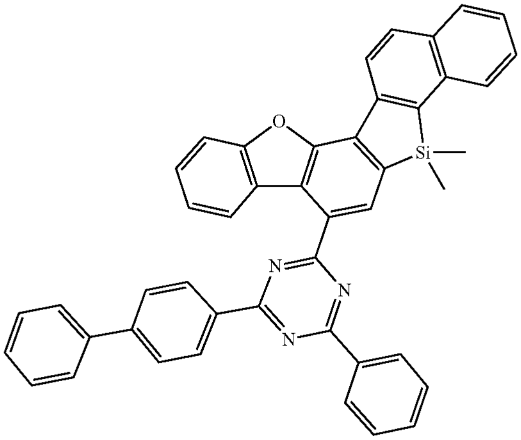
[140]
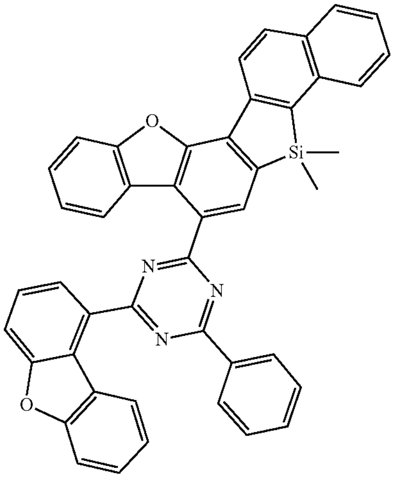
[141]
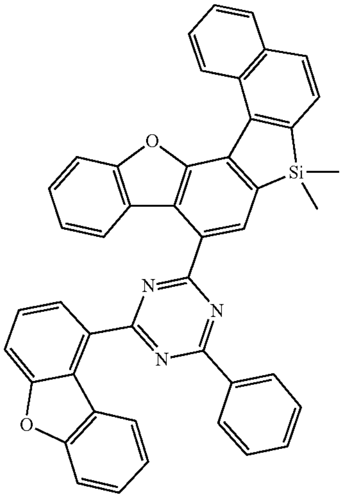

-continued
[142]
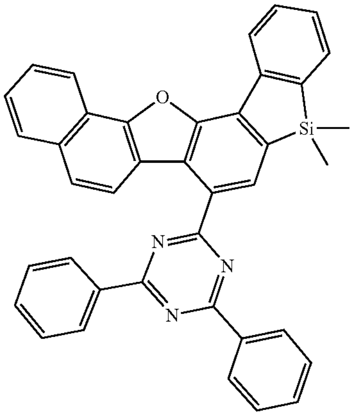
[143]
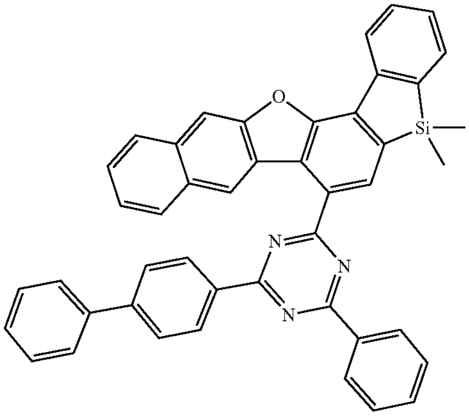
[144]
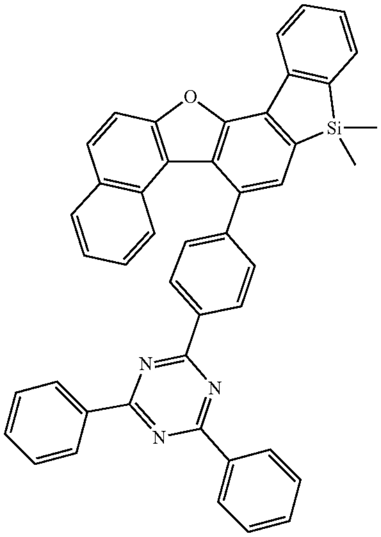
-continued
[145]
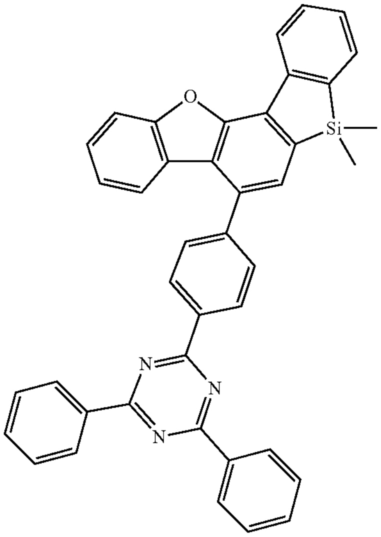
[146]
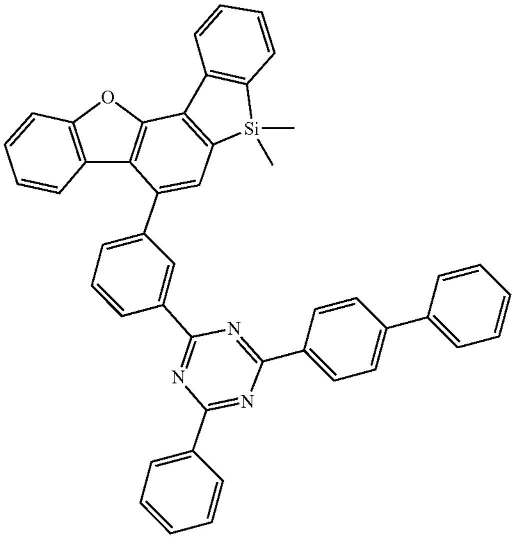
[147]
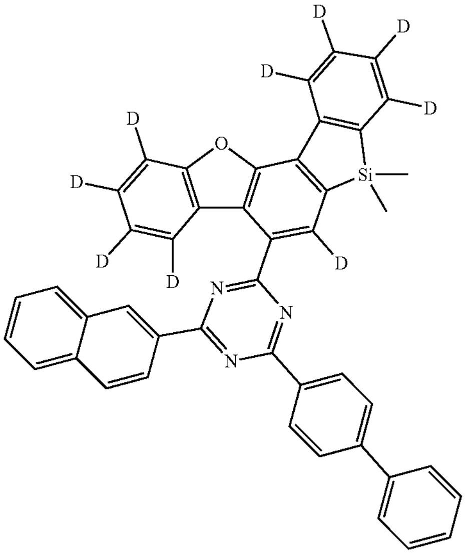

-continued
[148]
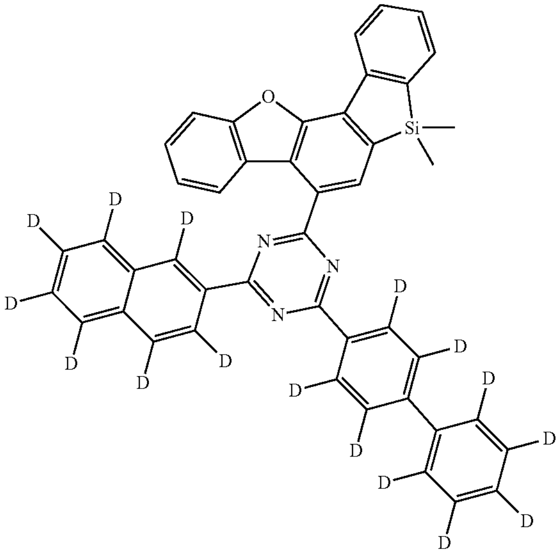
[149]
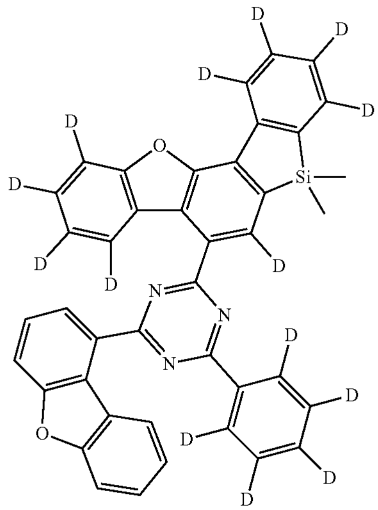
[150]
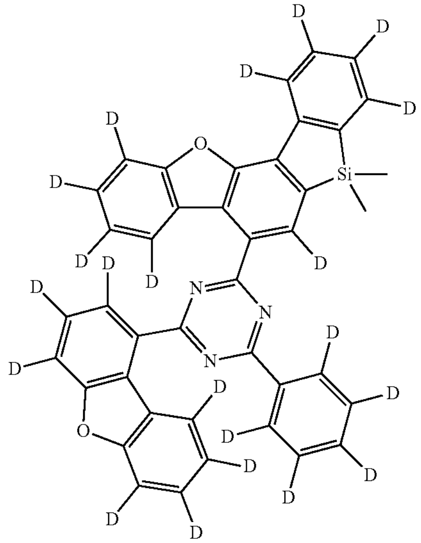
-continued
[151]
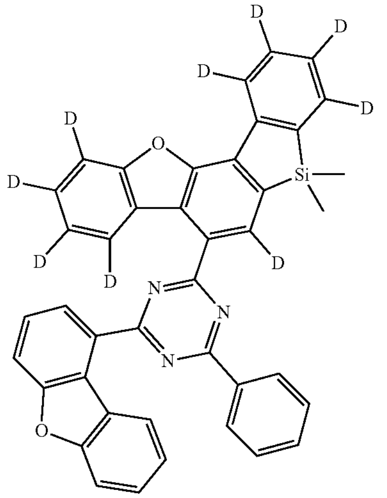
[152]
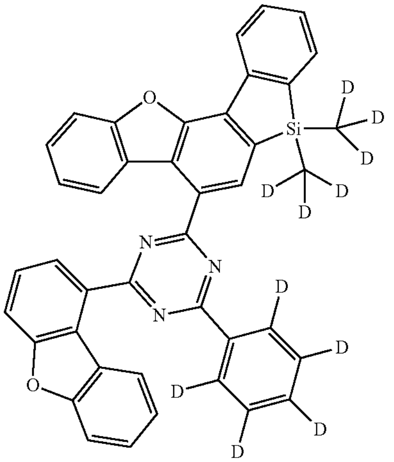
[153]
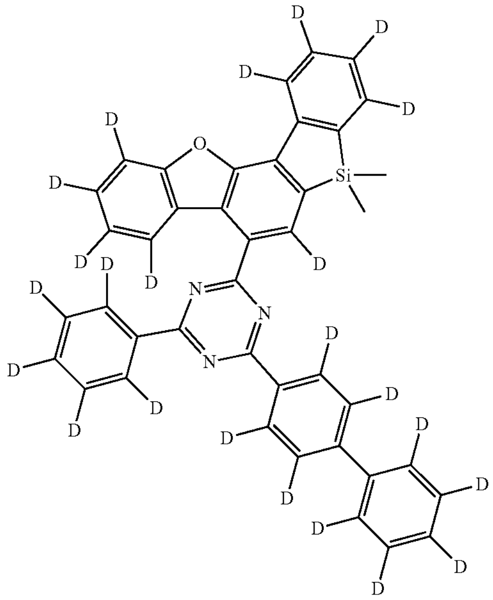

-continued
[154]
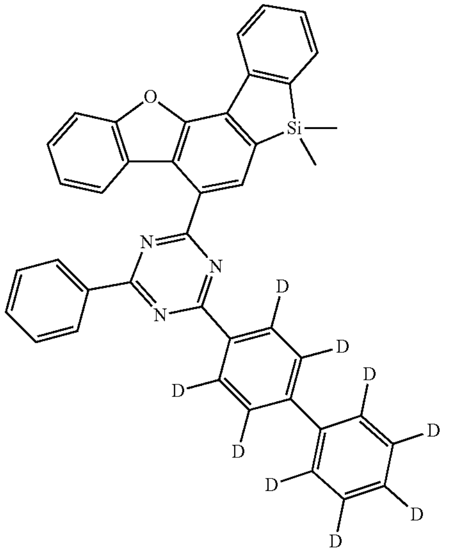
[155]
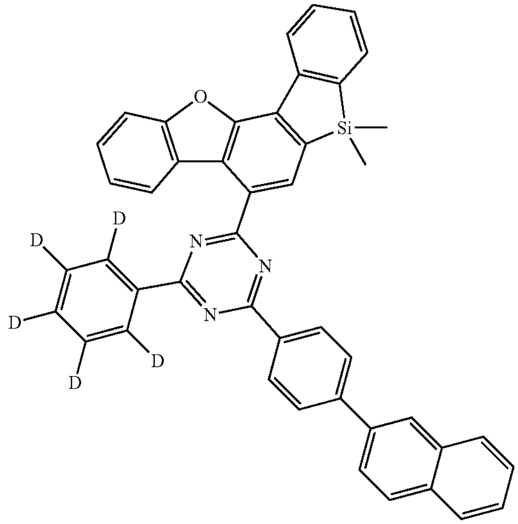
[156]
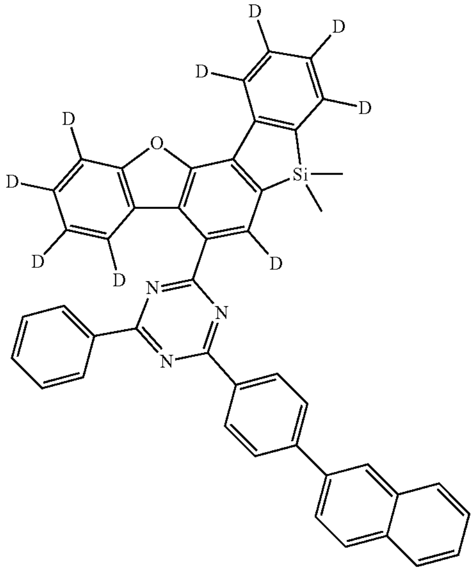
-continued
[157]
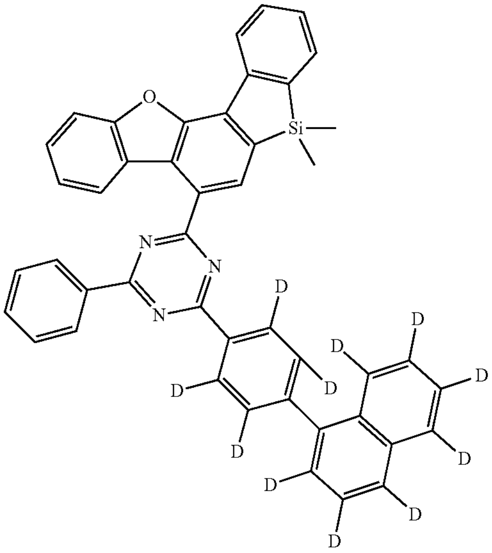
[158]
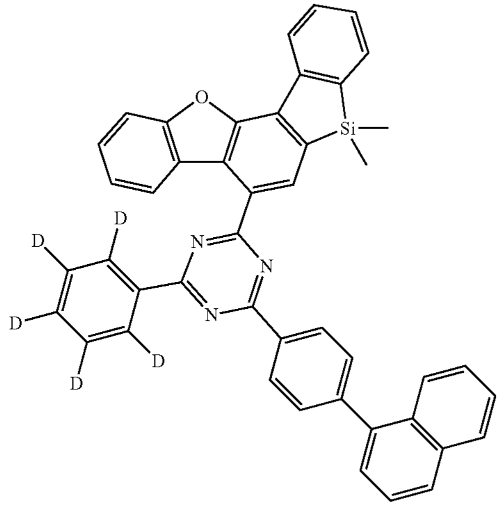
[159]
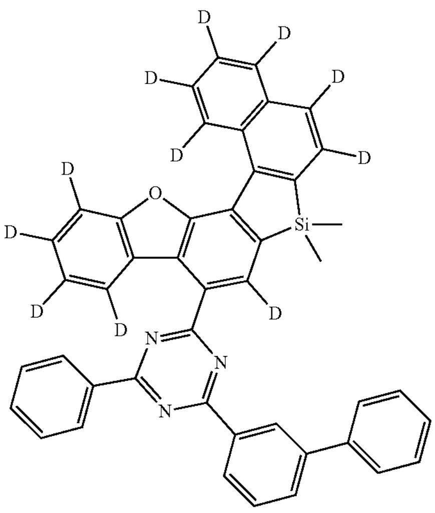

-continued
[160]
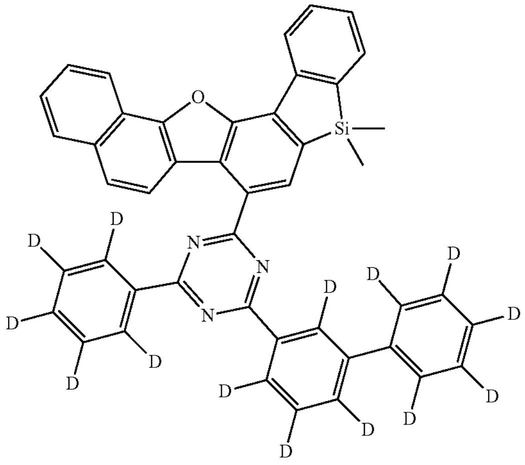
[161]
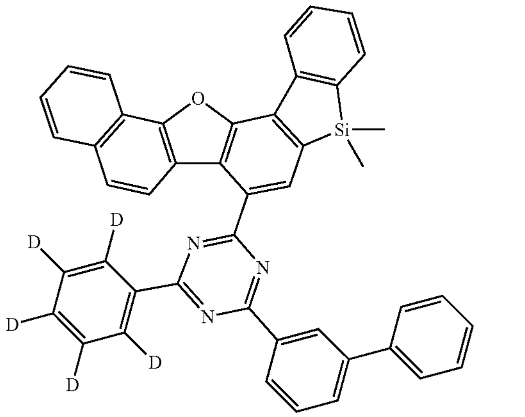
[162]
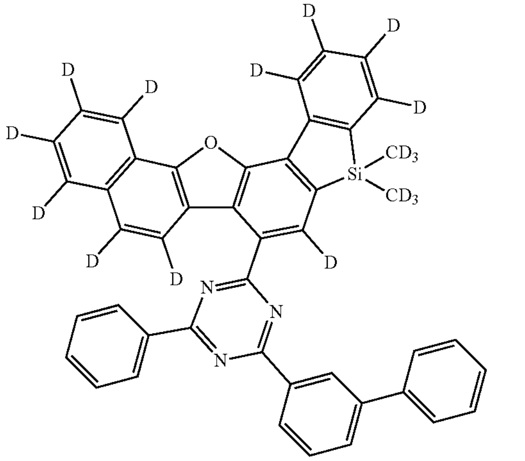
-continued
[163]
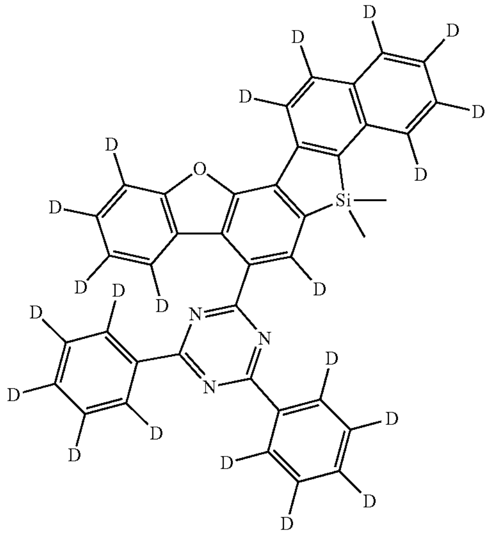
[164]
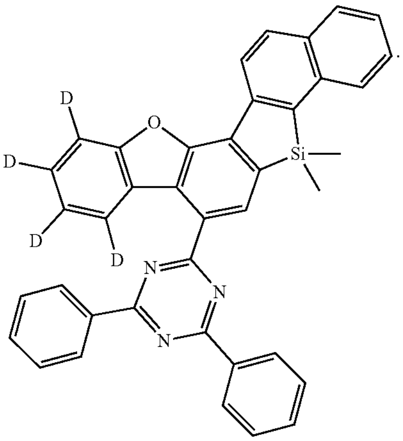
8. The composition as claimed in claim 1, wherein:
Chemical Formula 2 is represented by one of Chemical Formula 2-I to Chemical Formula 2-IX:
[Chemical Formula 2-I]
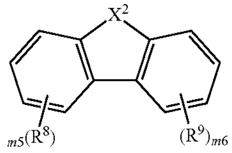
[Chemical Formula 2-II]
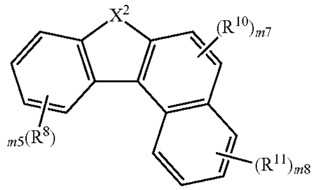

-continued

[Chemical Formula 2-III]

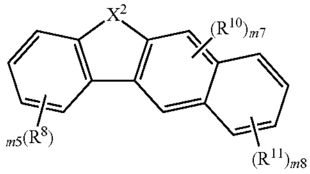

[Chemical Formula 2-IV]

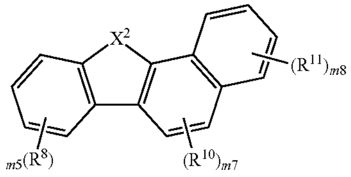

[Chemical Formula 2-V]

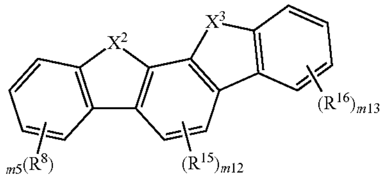

[Chemical Formula 2-VI]

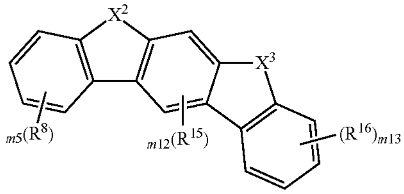

[Chemical Formula 2-VII]

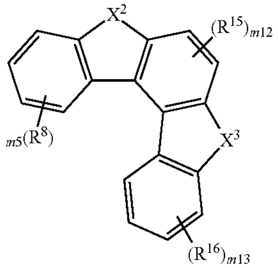

[Chemical Formula 2-VIII]

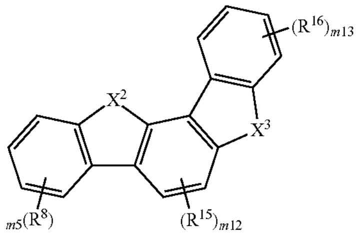

[Chemical Formula 2-XI]

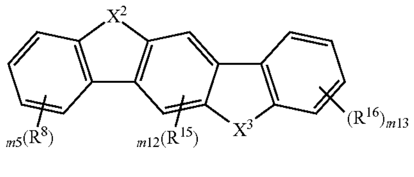

in Chemical Formula 2-I to Chemical Formula 2-IX, $X^2$, $X^3$, $R^8$ to $R^{11}$, $R^{15}$, $R^{16}$, m5 to m8, m12, and m13 are defined the same as those of Chemical Formula 2.

9. The composition as claimed in claim 8, wherein:

the second compound is represented by one of Chemical Formula 2-IA to Chemical Formula 2-IXA, Chemical Formula 2-IIB to Chemical Formula 2-IXB, and Chemical Formula 2-IIC to Chemical Formula 2-IXC:

[Chemical Formula 2-IA]

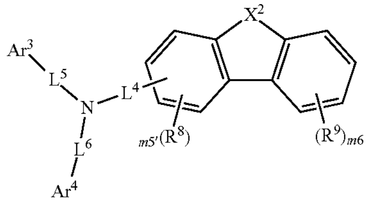

[Chemical Formula 2-IIA]

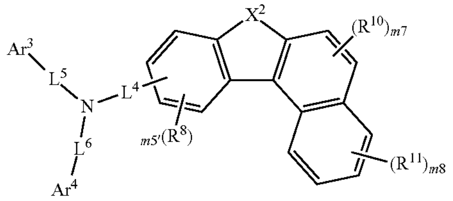

[Chemical Formula 2-IIIA]

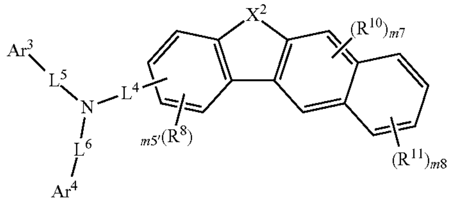

[Chemical Formula 2-IVA]

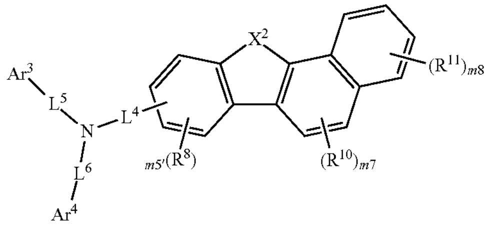

[Chemical Formula 2-VA]

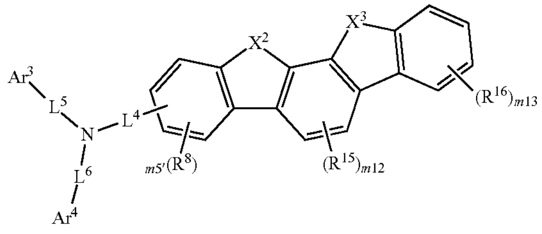

[Chemical Formula 2-VIA]

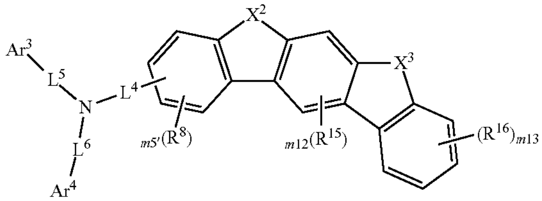

-continued

[Chemical Formula 2-VIIA]

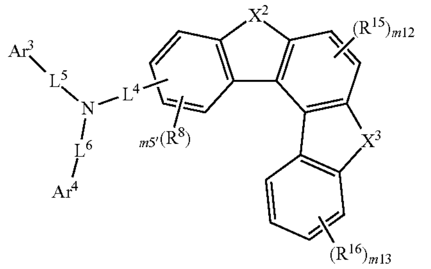

[Chemical Formula 2-VIIIA]

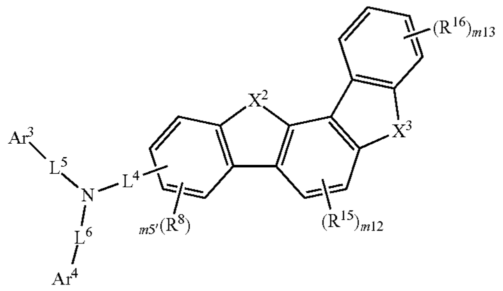

[Chemical Formula 2-IXA]

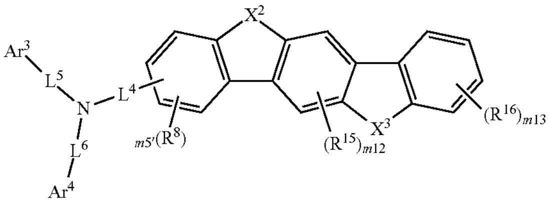

in Chemical Formula 2-IA to Chemical Formula 2-IXA, $X^2$, $X^3$, $L^4$ to $L^6$, $Ar^3$, $Ar^4$, $R^8$ to $R^{11}$, $R^{15}$, $R^{16}$, m6 to m8, m12, and m13 are defined the same as those of Chemical Formula 2, and m5' is an integer of 1 to 3;

[Chemical Formula 2-IIB]

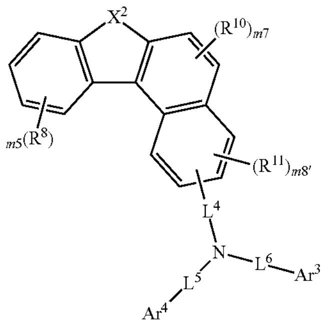

[Chemical Formula 2-IIIB]

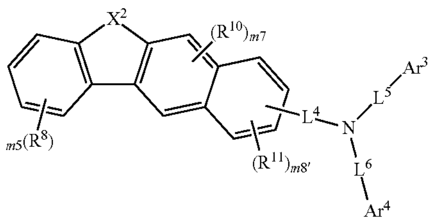

-continued

[Chemical Formula 2-IVB]

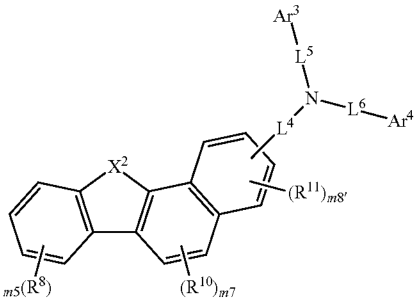

[Chemical Formula 2-VB]

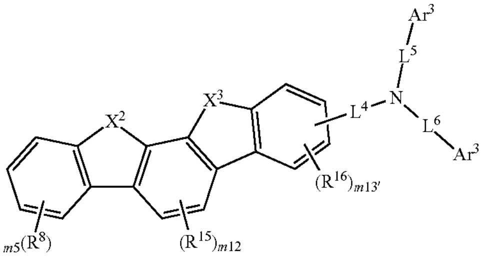

[Chemical Formula 2-VIB]

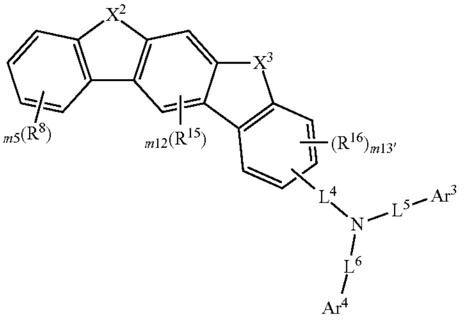

[Chemical Formula 2-VIIB]

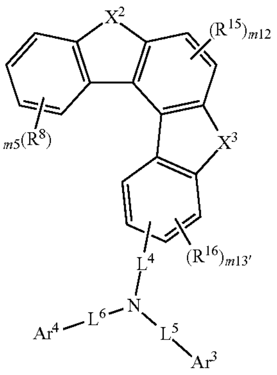

-continued

[Chemical Formula 2-VIIIB]

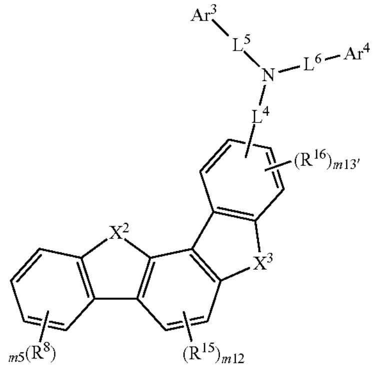

[Chemical Formula 2-IXB]

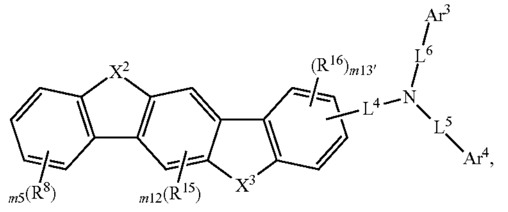

$X^2$, $X^3$, $L^4$ to $L^6$, $R^8$, $R^{10}$, $R^{11}$, $R^{15}$, $R^{16}$, $Ar^3$, $Ar^4$, m5, m7, and m12 are defined the same as those of Chemical Formula 2, and m8' and m13' are each independently an integer of 1 to 3;

[Chemical Formula 2-IIC]

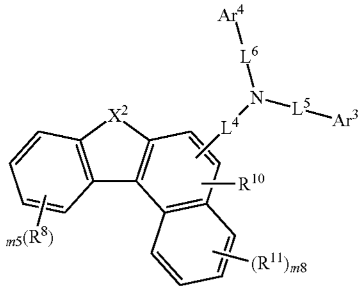

[Chemical Formula 2-IIIC]

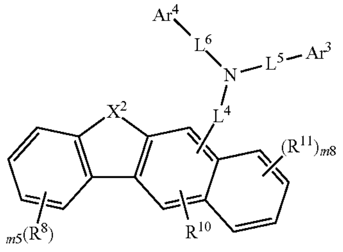

-continued

[Chemical Formula 2-IVC]

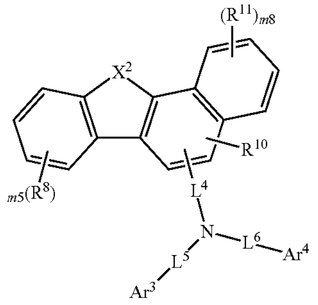

[Chemical Formula 2-VC]

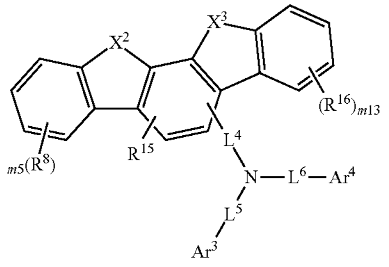

[Chemical Formula 2-VIC]

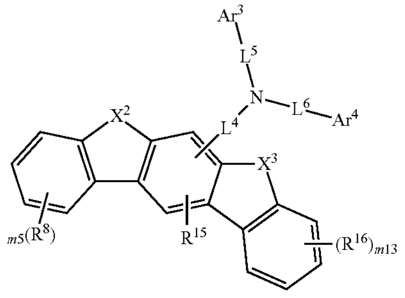

[Chemical Formula 2-VIIC]

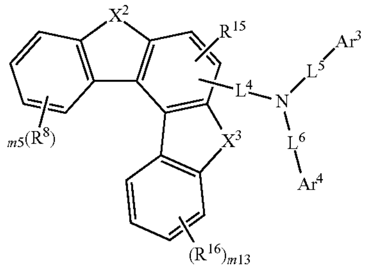

[Chemical Formula 2-VIIIC]

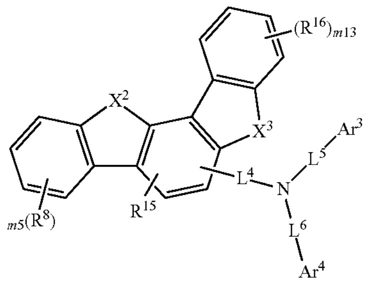

-continued

[Chemical Formula 2-IXC]

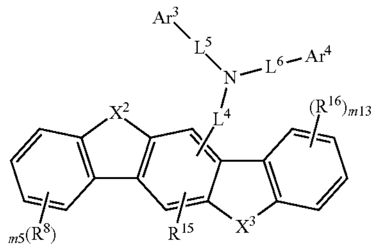

in Chemical Formula 2-IIC to Chemical Formula 2-IXC, $X^2$, $X^3$, $L^4$ to $L^6$, $Ar^3$, $Ar^4$, $R^8$, $R^{10}$, $R^{11}$, $R^{15}$, $R^{16}$, m5, m8, and m13 are defined the same as those of Chemical Formula 2.

10. The composition as claimed in claim 1, wherein $R^8$ to $R^{16}$ are each independently hydrogen, deuterium, a substituted or unsubstituted amine group, a substituted or unsubstituted C1 to C30 alkyl group, or a substituted or unsubstituted C6 to C30 aryl group.

11. The composition as claimed in claim 8, wherein the second compound is represented by Chemical Formula 2-IVB-2 or Chemical Formula 2-VIIIB-2:

[Chemical Formula 2-IVB-2]

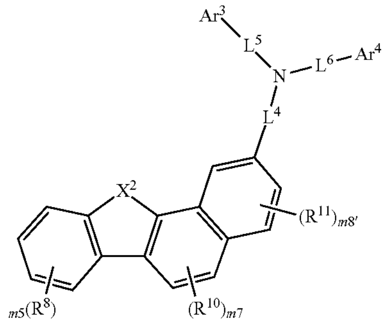

[Chemical Formula 2-VIIIB-2]

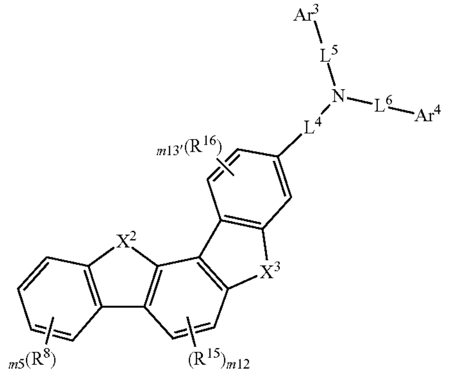

in Chemical Formula 2-IVB-2 and Chemical Formula 2-VIIIB-2, $L^4$ to $L^6$ are each independently a single bond or a substituted or unsubstituted phenylene group, $Ar^3$ and $Ar^4$ are each independently a substituted or unsubstituted phenyl group, a substituted or unsubstituted biphenyl group, or a substituted or unsubstituted naphthyl group, $X^2$ is $NR^b$, O, or S, $X^3$ is $CR^hR^i$ or $SiR^jR^k$, $R^b$, $R^h$, $R^i$, $R^j$, and $R^k$ are each independently a substituted or unsubstituted C1 to C10 alkyl group or a substituted or unsubstituted C6 to C20 aryl group, $R^8$, $R^{10}$, $R^{11}$, $R^{15}$, and $R^{16}$ are each independently hydrogen, deuterium, a substituted or unsubstituted C1 to C30 alkyl group, or a substituted or unsubstituted C6 to C30 aryl group, m5 is an integer of 1 to 4, m7 and m12 are each independently 1 or 2, and m8' and m13' are each independently an integer of 1 to 3.

12. An organic optoelectronic device, comprising:

an anode and a cathode facing each other, and at least one organic layer between the anode and the cathode, wherein the at least one organic layer includes a light emitting layer, and the light emitting layer includes the composition for the organic optoelectronic device as claimed in claim 1.

13. The organic optoelectronic device as claimed in claim 12, wherein the composition for the organic optoelectronic device is a host of the light emitting layer.

14. A display device comprising the organic optoelectronic device as claimed in claim 12.

15. A compound for an organic optoelectronic device, the compound being represented by Chemical Formula 1:

[Chemical Formula 1]

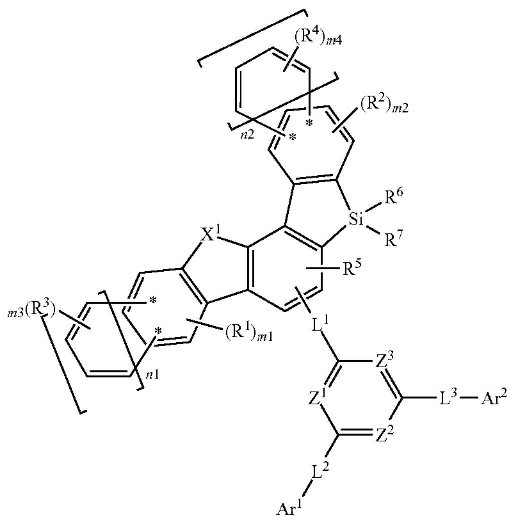

wherein, in Chemical Formula 1, $X^1$ is O or S, $Z^1$ to $Z^3$ are each independently N or $CR^a$, at least two of $Z^1$ to $Z^3$ being N, $L^1$ to $L^3$ are each independently a single bond or a substituted or unsubstituted C6 to C30 arylene group, $Ar^1$ and $Ar^2$ are each independently a substituted or unsubstituted C6 to C30 aryl group or a substituted or unsubstituted C2 to C30 heterocyclic group, $R^a$ and $R^1$ to $R^5$ are each independently hydrogen, deuterium, a substituted or unsubstituted C1 to C20 alkyl group, or a substituted or unsubstituted C6 to C20 aryl group, $R^6$ and $R^7$ are each independently a substituted or unsubstituted C1 to C20 alkyl group or a substituted or unsubstituted C6 to C20 aryl group, m1 and m2 are each independently an integer of 2 to 4, m3 and m4 are each independently an integer of 1 to 4, and n1 and n2 are each independently 0 or 1, provided that at least one of n1 and n2 is 1.

16. An organic optoelectronic device, comprising:

an anode and a cathode facing each other, and at least one organic layer between the anode and the cathode, wherein the at least one organic layer includes a light emitting layer, and the light emitting layer includes the compound for the organic optoelectronic device as claimed in claim 15.

17. The organic optoelectronic device as claimed in claim 16, wherein the compound for the organic optoelectronic device is a host of the light emitting layer.

18. A display device comprising the organic optoelectronic device as claimed in claim 16.

* * * * *